US009760003B2

United States Patent

(12) United States Patent
Iwato et al.

(10) Patent No.: US 9,760,003 B2
(45) Date of Patent: Sep. 12, 2017

(54) PATTERN FORMING METHOD AND ACTINIC-RAY- OR RADIATION-SENSITIVE RESIN COMPOSITION

(75) Inventors: Kaoru Iwato, Shizuoka (JP); Hidenori Takahashi, Shizuoka (JP); Shuji Hirano, Shizuoka (JP); Sou Kamimura, Shizuoka (JP); Keita Kato, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 13/642,751

(22) PCT Filed: May 20, 2011

(86) PCT No.: PCT/JP2011/062159

§ 371 (c)(1),
(2), (4) Date: Oct. 22, 2012

(87) PCT Pub. No.: WO2011/149035

PCT Pub. Date: Dec. 1, 2011

(65) Prior Publication Data

US 2013/0040096 A1 Feb. 14, 2013

(30) Foreign Application Priority Data

May 25, 2010 (JP) ................................ 2010-119755

(51) Int. Cl.

| | |
|---|---|
| ***G03F 7/039*** | (2006.01) |
| ***G03F 7/004*** | (2006.01) |
| ***G03F 7/11*** | (2006.01) |
| ***G03F 7/20*** | (2006.01) |
| ***G03F 7/32*** | (2006.01) |
| ***G03F 7/40*** | (2006.01) |
| *G03F 7/075* | (2006.01) |

(52) U.S. Cl.

CPC .......... *G03F 7/0045* (2013.01); *G03F 7/0046* (2013.01); *G03F 7/11* (2013.01); *G03F 7/2041* (2013.01); *G03F 7/325* (2013.01); *G03F 7/40* (2013.01); *G03F 7/0397* (2013.01); *G03F 7/0758* (2013.01); *Y10T 428/24* (2015.01)

(58) Field of Classification Search

CPC .......... C08F 2/50; C08F 4/6096; C08L 33/08; G03F 7/0005; G03F 7/325

USPC ........ 522/15, 17–18; 430/322, 270.1, 285.1; 458/98

See application file for complete search history.

(56) References Cited

U.S. PATENT DOCUMENTS 3,779,778 A * 12/1973 Smith et al. ............... 430/270.1
4,609,615 A 9/1986 Yamashita et al.
4,736,055 A 4/1988 Dietliker et al.
4,801,518 A 1/1989 Yamashita et al.
5,585,222 A * 12/1996 Kaimoto ................. G03F 7/039 430/270.1
6,008,265 A 12/1999 Vallée et al.
6,008,267 A 12/1999 Vallée et al.
6,391,520 B1 5/2002 Nakano et al.
8,034,547 B2 10/2011 Tsubaki et al.
8,241,840 B2 8/2012 Tsubaki et al.
8,492,078 B2 * 7/2013 Hatakeyama ......... G03F 7/0397 430/270.1
2001/0049073 A1 12/2001 Hada et al.
2003/0008233 A1 1/2003 Hada et al.
2004/0202966 A1 10/2004 Hada et al.
2005/0065312 A1 3/2005 Hada et al.
2005/0266337 A1 12/2005 Kishimura et al.
2008/0187860 A1 8/2008 Tsubaki et al.
2008/0318171 A1 12/2008 Tsubaki
2009/0011366 A1 1/2009 Tsubaki et al.
2009/0069521 A1 * 3/2009 Nagai et al. .................. 526/243
2009/0142693 A1 6/2009 Iwashita
2009/0142696 A1 6/2009 Furuya et al.
2010/0021847 A1 1/2010 Masuyama et al.
2010/0047710 A1 2/2010 Yamagishi et al.
2010/0055608 A1 3/2010 Ohashi et al.
2010/0075256 A1 3/2010 Joo et al.
2010/0099042 A1 * 4/2010 Ohashi .................. C07C 309/12 430/270.1

(Continued)

FOREIGN PATENT DOCUMENTS

CN 101473268 A 7/2009
EP 0 473 547 A1 3/1992

(Continued)

OTHER PUBLICATIONS

European Search Report issued in application No. 11786732.5 dated Feb. 5, 2014.
Japanese Office Action dated Feb. 12, 2014, issued in corresponding application No. 2010-119755.
Chinese Office Action dated May 19, 2014 issued in application No. 201180025664.8.
Taiwanese Office Action issued in application No. 100118279 dated Oct. 28, 2014.
Japanese Office Action dated Jan. 20, 2015 issued in application No. 2014-083206.
Korean Office Action issued in 2012 Pat. Appln. 7030606 dated Feb. 24, 2015.
Communication dated Jun. 17, 2015 from the Taiwanese Patent Office in counterpart application No. 103140232.

(Continued)

*Primary Examiner* — Michael Pepitone
(74) *Attorney, Agent, or Firm* — Sughrue Mion, PLLC

(57) ABSTRACT

Provided is a method of forming a pattern and an actinic-ray- or radiation-sensitive resin composition that excels in the limiting resolving power, roughness characteristics, exposure latitude (EL) and bridge defect performance. The method of forming a pattern includes (1) forming an actinic-ray- or radiation-sensitive resin composition into a film, (2) exposing the film to light, and (3) developing the exposed film with a developer containing an organic solvent. The actinic-ray- or radiation-sensitive resin composition contains (A) a resin containing a repeating unit with a structural moiety that is configured to decompose when exposed to actinic rays or radiation to thereby generate an acid, and (B) a solvent.

36 Claims, No Drawings

(56) References Cited

U.S. PATENT DOCUMENTS

| | | | | |
|---|---|---|---|---|
| 2010/0167178 | A1* | 7/2010 | Yamato | C07C 309/00 430/2 |
| 2010/0233617 | A1 | 9/2010 | Wada | |
| 2010/0255420 | A1 | 10/2010 | Sakakibara et al. | |
| 2010/0330507 | A1 | 12/2010 | Tsubaki et al. | |
| 2011/0236826 | A1 | 9/2011 | Hatakeyama et al. | |
| 2011/0236831 | A1 | 9/2011 | Hasegawa et al. | |
| 2012/0058436 | A1 | 3/2012 | Tsubaki et al. | |
| 2012/0315449 | A1 | 12/2012 | Tsubaki et al. | |

FOREIGN PATENT DOCUMENTS

| | | | | |
|---|---|---|---|---|
| EP | 1 897 869 | A1 | 3/2008 | |
| EP | 2 003 505 | A2 | 12/2008 | |
| JP | S4889003 | A | 11/1973 | |
| JP | 59-181535 | A | 10/1984 | |
| JP | 61-241745 | A | 10/1986 | |
| JP | 7-28242 | A | 1/1995 | |
| JP | 10-221852 | A | 8/1998 | |
| JP | 10-226707 | A | 8/1998 | |
| JP | 2000-122295 | A | 4/2000 | |
| JP | 2000-206694 | A | 7/2000 | |
| JP | 2006-131739 | A | 5/2006 | |
| JP | 2006-195050 | A | 7/2006 | |
| JP | 2006-259582 | A | 9/2006 | |
| JP | 2006-317803 | A | 11/2006 | |
| JP | 2007-114613 | A | 5/2007 | |
| JP | 2008-138176 | A | 6/2008 | |
| JP | 2008-203639 | A | 9/2008 | |
| JP | 2008-281974 | A | 11/2008 | |
| JP | 2008-281975 | A | 11/2008 | |
| JP | 2008-292975 | A | 12/2008 | |
| JP | 2008-309879 | A | 12/2008 | |
| JP | 2009-25723 | A | 2/2009 | |
| JP | 2009-93137 | A | 4/2009 | |
| JP | 2009-98509 | A | 5/2009 | |
| JP | 2009-192617 | A | 8/2009 | |
| JP | 2010-77404 | A | 4/2010 | |
| JP | 2011-219742 | A | 11/2011 | |
| JP | 2011-221513 | A | 11/2011 | |
| KR | 10-2008-0008415 | A | 1/2008 | |
| KR | 10-2008-0059516 | A | 6/2008 | |
| KR | 10-2009-0023720 | A | 3/2009 | |
| TW | 200907576 | A | 2/2009 | |
| TW | 200923577 | A | 6/2009 | |
| TW | 201012784 | A1 | 4/2010 | |
| WO | 2007/147782 | A2 | 12/2007 | |
| WO | WO 2009038148 | A1 * | 3/2009 | G03F 7/039 |
| WO | 2009/057484 | A1 | 5/2009 | |

OTHER PUBLICATIONS

Communication dated Oct. 27, 2015 from the Taiwanese Intellectual Property Office issued in corresponding application No. 103140232.

Communication dated Apr. 11, 2016 from the Taiwanese Intellectual Property Office in counterpart application No. 103140232.

* cited by examiner

PATTERN FORMING METHOD AND ACTINIC-RAY- OR RADIATION-SENSITIVE RESIN COMPOSITION

CROSS-REFERENCE TO RELATED APPLICATIONS

This application is based upon and claims the benefit of priority from prior Japanese Patent Application No. 2010-119755, filed May 25, 2010, the entire contents of which are incorporated herein by reference.

TECHNICAL FIELD

The present invention relates to a method of forming a pattern and an actinic-ray- or radiation-sensitive resin composition. More specifically, the present invention relates to a method of forming a negative pattern that is suitable for use in lithography operations employed in a semiconductor production process for an IC or the like, the production of a circuit board for a liquid crystal, a thermal head or the like and other photofabrication, and relates to a composition for use in the method. Further more specifically, the present invention relates to a method of forming a negative pattern that is suitable for exposure using an ArF exposure apparatus, ArF liquid-immersion projection exposure apparatus or EUV exposure apparatus in which a far-ultraviolet light of wavelength 300 nm or shorter is employed as a light source, and relates to a composition for use in the method.

In the present invention, the terms "actinic rays" and "radiation" mean, for example, a mercury lamp bright line spectrum, far ultraviolet rays represented by an excimer laser, extreme ultraviolet rays, X-rays, electron beams and the like. In the present invention, the term "light" means actinic rays or radiation.

The expression "exposure" used herein, unless otherwise noted, means not only light irradiation using a mercury lamp, far ultraviolet, X-rays, EUV light, etc. but also lithography using particle beams, such as an electron beam and an ion beam.

BACKGROUND ART

Since the emergence of the resist for a KrF excimer laser (248 nm), it has been of common practice to employ a pattern forming method in which chemical amplification is utilized in order to compensate for any sensitivity decrease caused by light absorption. For example in a positive chemical amplification method, first, a photoacid generator contained in exposed areas is decomposed by light irradiation to thereby generate an acid. Then, in the stage of, for example, the bake after the exposure (Post-Exposure Bake: PEB), the generated acid exerts a catalytic action so that the alkali-insoluble group contained in the photosensitive composition is converted to an alkali-soluble group. Thereafter, development is carried out using, for example, an alkali solution. Thus, the exposed areas are removed to obtain a desired pattern.

For use in the above method, various alkali developers have been proposed. For example, an aqueous alkali developer containing 2.38 mass % TMAH (aqueous solution of tetramethylammonium hydroxide) is generally used.

The wavelength shortening of the exposure light source and the realization of high numerical apertures (high NA) for projector lenses have been advanced in order to cope with the miniaturization of semiconductor elements. To now, an exposure unit using an ArF excimer laser of 193 nm wavelength as a light source has been developed. Further, a method in which the space between a projector lens and a sample is filled with a liquid of high refractive index (hereinafter also referred to as an "immersion liquid"), namely liquid-immersion method has been proposed as a technology for enhancing the resolving power. Still further, an EUV lithography in which exposure is carried out using an ultraviolet of further shorter wavelength (13.5 nm) has been proposed.

However, the current situation is that it is extremely difficult to discover an appropriate combination of resist composition, developer, rinse liquid, etc., required for the formation of a pattern realizing comprehensively excellent performance. In particular, in accordance with the decrease of the resolved line width of resists, there is a demand for an enhancement of line pattern roughness performance and an enhancement of pattern dimension in-plane uniformity.

In this current situation, in recent years, various formulations have been proposed as a positive resist composition (see, for example, patent references 1 to 4). Moreover, the development of negative resist compositions for use in the pattern formation by alkali development is progressing (see, for example, patent references 5 to 8). These reflect the situation in which in the production of semiconductor elements and the like, while there is a demand for the formation of a pattern with various configurations, such as a line, a trench and a hole, there exist patterns whose formation is difficult with the use of current positive resists.

In recent years, also, a pattern forming method using a negative developer, namely, a developer containing an organic solvent is being exploited (see, for example, patent references 9 to 11). For example, patent reference 11 discloses a pattern forming method comprising the operations of applying onto a substrate a positive resist composition that when exposed to actinic rays or radiation, increases its solubility in a positive developer and decreases its solubility in a negative developer, exposing the applied resist composition and developing the exposed resist composition using a negative developer. This method realizes the stable formation of a high-precision fine pattern.

On the other hand, in recent years, photosensitive compositions comprising resins containing groups that are configured to decompose when exposed to actinic rays or radiation to thereby generate acids are also being studied (for example, see patent references 12 and 13). When these photosensitive compositions are used, for example, patterns of favorable shapes can be formed.

PRIOR ART REFERENCE

Patent Reference

Patent reference 1: Jpn. Pat. Appln. KOKAI Publication No. (hereinafter referred to as JP-A-) 2008-203639,
Patent reference 2: JP-A-2007-114613,
Patent reference 3: JP-A-2006-131739,
Patent reference 4: JP-A-2000-122295,
Patent reference 5: JP-A-2006-317803,
Patent reference 6: JP-A-2006-259582,
Patent reference 7: JP-A-2006-195050,
Patent reference 8: JP-A-2000-206694,
Patent reference 9: JP-A-2008-281974,
Patent reference 10: JP-A-2008-281975,
Patent reference 11: JP-A-2008-292975,
Patent reference 12: JP-A-2009-093137, and
Patent reference 13: JP-A-H10-221852.

DISCLOSURE OF INVENTION

An object of the present invention is to provide a method of forming a pattern and an actinic-ray- or radiation-sensitive resin composition that excels in the limiting resolving power, roughness characteristics, exposure latitude (EL) and bridge defect performance.

Some aspects according to the present invention are as follows.

[1] A method of forming a pattern, comprising: (1) forming an actinic-ray- or radiation-sensitive resin composition into a film, (2) exposing the film to light, and (3) developing the exposed film with a developer containing an organic solvent, the actinic-ray- or radiation-sensitive resin composition comprising: (A) a resin containing a repeating unit with a structural moiety that is configured to decompose when exposed to actinic rays or radiation to thereby generate an acid, and (B) a solvent.

[2] The method according to [1], wherein the structural moiety has a nonionic structure.

[3] The method according to [1] or [2], wherein the structural moiety has a structure that generates an acid group on a side chain of the resin when exposed to actinic rays or radiation.

[4] The method according to [2] or [3], wherein the structural moiety has an oxime structure.

[5] The method according to any of [1] to [4], wherein the resin further contains a repeating unit with a group that is configured to decompose when acted on by an acid to thereby produce an alcoholic hydroxyl group.

[6] The method according to any of [1] to [5], wherein the composition further comprises a hydrophobic resin.

[7] The method according to [6], wherein a content of the hydrophobic resin in the composition based on total solids thereof is in the range of 0.01 to 10 mass %.

[8] The method according to [6] or [7], wherein the hydrophobic resin contains at least one of fluorine atom and silicone atom.

[9] The method according to any of [1] to [8], wherein the exposure is performed through an immersion liquid.

[10] The method according to any of [1] to [9], wherein an amount of the organic solvent used in the developer is in the range of 80 to 100 mass %.

[11] The method according to any of [1] to [10], further comprising: (4) rinsing the developed film with a rinse liquid containing an organic solvent.

[12] An actinic-ray- or radiation-sensitive resin composition comprising: (a) a resin containing a first repeating unit containing a structural moiety that is configured to decompose when exposed to actinic rays or radiation to thereby generate an acid and a second repeating unit containing a group that is configured to decompose when acted on by an acid to thereby produce an alcoholic hydroxyl group, and (b) a solvent.

[13] A resist film formed from the composition of [12].

The present invention has made it feasible to provide a method of forming a pattern and an actinic-ray- or radiation-sensitive resin composition that excels in the limiting resolving power, roughness characteristics, exposure latitude (EL) and bridge defect performance.

BEST MODE FOR CARRYING OUT THE INVENTION

The present invention will be described below.

Note that, with respect to the expression of a group (or an atomic group) used in this specification, the expression without explicitly referring to whether the group is substituted or unsubstituted encompasses not only groups with no substituents but also groups having one or more substituents. For example, the expression "alkyl group" encompasses not only alkyl groups having no substituents (viz. unsubstituted alkyl groups) but also alkyl groups having one or more substituents (viz. substituted alkyl groups).

<Actinic-Ray- or Radiation-Sensitive Resin Composition>

First, the composition according to the present invention will be described. The composition is, for example, a resist composition. The composition according to the present invention may be used in negative development and also in positive development. Namely, this resist composition may be used in development using a developer containing an organic solvent and also in development using an alkali developer. The resist composition according to the present invention is typically used in negative development, namely, development using a developer containing an organic solvent. That is, the composition according to the present invention is typically a negative resist composition.

The composition according to the present invention contains [A] a resin and [B] a solvent. The composition may further contain at least one of [C] a compound that generates an acid when exposed to actinic rays or radiation (hereinafter also referred to as an acid generator), [D] a basic compound, [E] a hydrophobic resin, [F] a surfactant, and [G] other additives. Each of these components will be sequentially described below.

[A] Resin

The composition according to the present invention contains a resin. The resin contains a repeating unit containing a structural moiety that is configured to decompose when exposed to actinic rays or radiation to thereby generate an acid (hereinafter also referred to as a repeating unit (R)).

The inventors have found that the limiting resolving power, roughness characteristics, exposure latitude (EL) and bridge defect performance can be strikingly enhanced by using the composition comprising the above-mentioned resin in the method of forming a pattern with a developer containing an organic solvent. The reason therefor is not necessarily apparent. However, the inventors presume the following.

Namely, when only a low-molecular compound that is configured to decompose when exposed to actinic rays or radiation to thereby generate an acid is used as an acid generator, there is the possibility of the aggregation of the acid generator in the composition and the film formed from the composition. In contrast, when the resin containing the repeating unit (R) is used, that aggregation can be inhibited. Therefore, in that instance, the structural moiety that is configured to decompose when exposed to actinic rays or radiation to thereby generate an acid can be relatively uniformly distributed in the composition and the film formed from the composition. Consequently, in that instance, for example, the roughness characteristic of the composition can be enhanced. Further, when the resin containing the repeating unit (R) is used, the diffusion of an acid in the film of the composition can be caused to be lower than when only the above low-molecular compound is used as an acid generator. Therefore, when the resin containing the repeating unit (R) is used, for example, the exposure latitude (EL) can be enhanced. As a result of the combination of these effects, a strikingly high resolving power can be realized.

Still further, when the resin containing the repeating unit (R) is used, the amount of low-molecular-weight acid in exposed areas can be reduced. Accordingly, if so, when use is made of a developer containing an organic solvent, it is easy to lower the solubility of exposed areas in the developer. Therefore, when the resin containing the repeating unit (R) is used, the dissolution contrast in the developer containing an organic solvent can be strikingly enhanced. Incidentally, when an alkali developer is used, the exposed areas will be dissolved. Therefore, the enhancement of the dissolution contrast by this mechanism does not occur.

[1] Repeating Unit (R)

The structure of the repeating unit (R) is not limited as long as the structural moiety that is configured to decompose when exposed to actinic rays or radiation to thereby generate an acid is contained in the repeating unit (R).

However, the repeating unit (R) is preferably expressed by any of general formulae (III) to (VII) below, more preferably any of general formulae (III), (VI) and (VII) below, and further more preferably general formula (III) below.

(III)

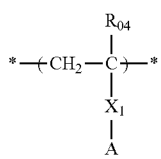

(IV)

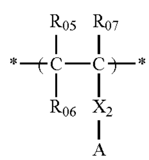

(V)

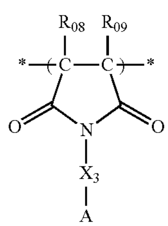

(VI)

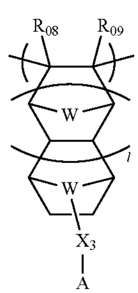

(VII)

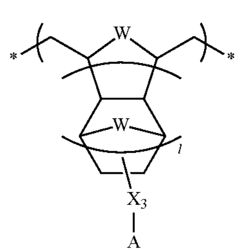

In the formulae, each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group.

$R_{06}$ represents a cyano group, a carboxyl group, —CO—$OR_{25}$ or —CO—$N(R_{26})(R_{27})$. When $R_{06}$ is —CO—$N(R_{26})(R_{27})$, $R_{26}$ and $R_{27}$ may be bonded to each other to thereby form a ring in cooperation with N atom.

Each of $X_1$ to $X_3$ independently represents a single bond, or an arylene group, an alkylene group, a cycloalkylene group, —O—, —$SO_2$—, —CO—, —$N(R_{33})$— or a bivalent connecting group composed of a combination of these.

$R_{25}$ represents an alkyl group, a cycloalkyl group, an alkenyl group, a cycloalkenyl group, an aryl group or an aralkyl group.

Each of $R_{26}$, $R_{27}$ and $R_{33}$ independently represents a hydrogen atom, an alkyl group, a cycloalkyl group, an alkenyl group, a cycloalkenyl group, an aryl group or an aralkyl group.

W represents —O—, —S— or a methylene group.

$l$ is 0 or 1.

A represents a structural moiety that is configured to decompose when exposed to actinic rays or radiation to thereby generate an acid.

Each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group. Preferably, each of $R_{04}$, $R_{05}$ and $R_{07}$ to $R_{09}$ is a hydrogen atom or an alkyl group.

The alkyl group represented by each of $R_{04}$, $R_{05}$ and $R_{07}$ to $R_{09}$ may be in the form of a linear chain or a branched chain. This alkyl group preferably has 20 or less carbon atoms, more preferably 8 or less carbon atoms. As the alkyl group, there can be mentioned, for example, a methyl group, an ethyl group, a propyl group, an isopropyl group, an n-butyl group, a sec-butyl group, a hexyl group, a 2-ethylhexyl group, an octyl group or a dodecyl group.

The cycloalkyl group represented by each of $R_{04}$, $R_{05}$ and $R_{07}$ to $R_{09}$ may be monocyclic or polycyclic. This cycloalkyl group preferably has 3 to 8 carbon atoms. As the cycloalkyl group, there can be mentioned, for example, a cyclopropyl group, a cyclopentyl group or a cyclohexyl group.

As the halogen atom represented by each of $R_{04}$, $R_{05}$ and $R_{07}$ to $R_{09}$, there can be mentioned a fluorine atom, a chlorine atom, a bromine atom or an iodine atom. Among these, a fluorine atom is especially preferred.

The alkyl group moiety of the alkoxycarbonyl group represented by each of $R_{04}$, $R_{05}$ and $R_{07}$ to $R_{09}$ is preferably any of those set forth above as the alkyl group represented by each of $R_{04}$, $R_{05}$ and $R_{07}$ to $R_{09}$.

$R_{06}$ represents a cyano group, a carboxyl group, —CO—$OR_{25}$ or —CO—$N(R_{25})(R_{27})$. $R_{06}$ is preferably a carboxyl group or —CO—$OR_{25}$.

Each of $X_1$ to $X_3$ independently represents a single bond, or an arylene group, an alkylene group, a cycloalkylene group, —O—, —$SO_2$—, —CO—, —$N(R_{33})$— or a bivalent connecting group composed of a combination of these. Each of $X_1$ to $X_3$ preferably contains —COO— or an arylene group, more preferably —COO—.

The arylene group that may be contained in the bivalent connecting group represented by each of $X_1$ to $X_3$ preferably has 6 to 14 carbon atoms. As this arylene group, there can be mentioned, for example, a phenylene group, a tolylene group or a naphthylene group.

The alkylene group that may be contained in the bivalent connecting group represented by each of $X_1$ to $X_3$ preferably has 1 to 8 carbon atoms. As this alkylene group, there can be mentioned, for example, a methylene group, an ethylene group, a propylene group, a butylene group, a hexylene group or an octylene group.

The cycloalkylene group that may be contained in the bivalent connecting group represented by each of $X_1$ to $X_3$ preferably has 5 to 8 carbon atoms. As this cycloalkylene group, there can be mentioned, for example, a cyclopentylene group or a cyclohexylene group.

$R_{25}$ represents an alkyl group, a cycloalkyl group, an alkenyl group, a cycloalkenyl group, an aryl group or an aralkyl group. $R_{25}$ is preferably an alkyl group.

Each of $R_{26}$, $R_{27}$ and $R_{33}$ independently represents a hydrogen atom, an alkyl group, a cycloalkyl group, an alkenyl group, a cycloalkenyl group, an aryl group or an aralkyl group. Each of $R_{26}$, $R_{27}$ and $R_{33}$ is preferably a hydrogen atom or an alkyl group.

As the alkyl groups represented by $R_{25}$ to $R_{27}$ and $R_{33}$, there can be mentioned, for example, those set forth above as being represented by $R_{04}$, $R_{05}$ and $R_{07}$ to $R_{09}$.

As the cycloalkyl groups represented by $R_{25}$ to $R_{27}$ and $R_{33}$, there can be mentioned, for example, those set forth above as being represented by $R_{04}$, $R_{05}$ and $R_{07}$ to $R_{09}$.

The alkenyl group represented by each of $R_{25}$ to $R_{27}$ and $R_{33}$ may be in the form of a linear chain or a branched chain. This alkenyl group preferably has 2 to 6 carbon atoms. As this alkenyl group, there can be mentioned, for example, a vinyl group, a propenyl group, an allyl group, a butenyl group, a pentenyl group or a hexenyl group.

The cycloalkenyl group represented by each of $R_{25}$ to $R_{27}$ and $R_{33}$ may be monocyclic or polycyclic. This cycloalkenyl group preferably has 3 to 6 carbon atoms. As this cycloalkenyl group, there can be mentioned, for example, a cyclohexenyl group.

The aryl group represented by each of $R_{25}$ to $R_{27}$ and $R_{33}$ may be monocyclic or polycyclic. This aryl group is preferably an aromatic group having 6 to 14 carbon atoms. As this aryl group, there can be mentioned, for example, a phenyl group, a tolyl group, a chlorophenyl group, a methoxyphenyl group or a naphthyl group. These aryl groups may be bonded to each other to thereby form plural rings.

The aralkyl group represented by each of $R_{25}$ to $R_{27}$ and $R_{33}$ preferably has 7 to 15 carbon atoms. As this aralkyl group, there can be mentioned, for example, a benzyl group, a phenethyl group or a cumyl group.

As mentioned above, $R_{26}$ and $R_{27}$ may be bonded to each other to thereby form a ring in cooperation with a nitrogen atom. This ring is preferably a 5- to 8-membered ring. As this ring, there can be mentioned, for example, a pyrrolidine ring, a piperidine ring or a piperazine ring.

W represents —O—, —S— or a methylene group, preferably a methylene group; and 1 is 0 or 1, preferably 0.

Substituents may be introduced in these groups. As the substituents, there can be mentioned, for example, a hydroxyl group; a halogen atom (a fluorine, chlorine, bromine or iodine atom); a nitro group; a cyano group; an amido group; a sulfonamido group; any of the alkyl groups mentioned above with respect to, for example, $R_{04}$ to $R_{09}$, $R_{25}$ to $R_{27}$ and $R_{33}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. Each of the substituents preferably has 8 or less carbon atoms.

A represents a structural moiety that is configured to decompose when exposed to actinic rays or radiation to thereby generate an acid. This structural moiety will be described in detail below.

As the structural moiety that is configured to decompose when exposed to actinic rays or radiation to thereby generate an acid (for example, the above structural moiety represented by A), there can be mentioned, for example, the structural moieties introduced in a photoinitiator for photocationic polymerization, a photoinitiator for photoradical polymerization, a photo-achromatic agent and photo-discoloring agent for dyes and any of compounds that generate an acid when exposed to light being employed in microresists, etc.

It is preferred for this structural moiety to have a structure that generates an acid group on a side chain of the resin when exposed to actinic rays or radiation. When this structure is employed, the diffusion of generated acid is more effectively inhibited, so that the resolution, exposure latitude (EL) and pattern shape can be enhanced.

This structural moiety may have an ionic structure or a nonionic structure. It is preferred to employ a nonionic structural moiety as the structural moiety. If so, the roughness characteristic can be more effectively enhanced than when an ionic structural moiety is employed as the structural moiety. The reason therefor is not necessarily apparent. However, the inventors presume the following. Namely, when a developer containing an organic solvent is used, the solubility of nonexposed areas in the developer is enhanced due to the employment of the nonionic structure. Accordingly, the dissolution contrast in the developer containing an organic solvent is enhanced. Further, even when an alkali developer is used, film thinning can be more effectively suppressed because the nonexposed areas have a nonionic structure. As a result, the pattern shape can be further bettered.

(Nonionic Structural Moiety)

As mentioned above, it is preferred for the repeating unit (R) to contain a nonionic structural moiety that is configured to decompose when exposed to actinic rays or radiation to thereby generate an acid. As a preferred example of such a nonionic structural moiety, there can be mentioned a structural moiety with an oxime structure.

As the nonionic structural moiety, there can be mentioned, for example, any of the structural moieties of general formula (N1) below. These structural moieties each have an oxime sulfonate structure.

(N1)

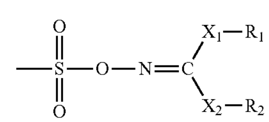

In the formula, each of $R_1$ and $R_2$ independently represents a hydrogen atom, a halogen atom, a cyano group, an alkyl group, a cycloalkyl group, an alkenyl group, a cycloalkenyl group, an aryl group or an aralkyl group. The aromatic ring of each of the aryl group and aralkyl group may be an aromatic heterocycle.

Each of $X_1$ and $X_2$ independently represents a single bond or a bivalent connecting group. $X_1$ and $X_2$ may be bonded to each other to thereby form a ring.

The alkyl group represented by each of $R_1$ and $R_2$ may be in the form of a linear chain or a branched chain. This alkyl group preferably has 30 or less carbon atoms, more preferably 18 or less carbon atoms. As the alkyl group, there can be mentioned, for example, a methyl group, an ethyl group, a propyl group, an isopropyl group, an n-butyl group, a sec-butyl group, a hexyl group, a 2-ethylhexyl group, an octyl group or a dodecyl group.

The cycloalkyl group represented by each of $R_1$ and $R_2$ may be monocyclic or polycyclic. This cycloalkyl group preferably has 3 to 30 carbon atoms. As the cycloalkyl group, there can be mentioned, for example, a cyclopropyl group, a cyclopentyl group or a cyclohexyl group.

The alkenyl group represented by each of $R_1$ and $R_2$ may be in the form of a linear chain or a branched chain. This alkenyl group preferably has 2 to 30 carbon atoms. As this alkenyl group, there can be mentioned, for example, a vinyl group, a propenyl group, an allyl group, a butenyl group, a pentenyl group or a hexenyl group.

The cycloalkenyl group represented by each of $R_1$ and $R_2$ may be monocyclic or polycyclic. This cycloalkenyl group preferably has 3 to 30 carbon atoms. As this cycloalkenyl group, there can be mentioned, for example, a cyclohexenyl group.

The aryl group represented by each of $R_1$ and $R_2$ may be monocyclic or polycyclic. This aryl group is preferably an aromatic group having 6 to 30 carbon atoms. As this aryl group, there can be mentioned, for example, a phenyl group, a tolyl group, a chlorophenyl group, a methoxyphenyl group, a naphthyl group, a biphenyl group or a terphenyl group. These aryl groups may be bonded to each other to thereby form plural rings.

The aralkyl group represented by each of $R_1$ and $R_2$ preferably has 7 to 15 carbon atoms. As this aralkyl group, there can be mentioned, for example, a benzyl group, a phenethyl group or a cumyl group.

As mentioned above, the aromatic ring of each of the aryl group and aralkyl group may be an aromatic heterocycle. Namely, each of these groups may have a heterocyclic structure containing a heteroatom, such as an oxygen atom, a nitrogen atom or a sulfur atom.

Substituents may be introduced in these groups. As the substituents, there can be mentioned, for example, a hydroxyl group; a halogen atom (a fluorine, chlorine, bromine or iodine atom); a nitro group; a cyano group; an amido group; a sulfonamido group; any of the alkyl groups mentioned above with respect to, for example, $R_1$ and $R_2$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. Each of the substituents preferably has 8 or less carbon atoms.

As the bivalent connecting groups represented by $X_1$ and $X_2$, there can be mentioned, for example, the groups shown below and the groups composed of a combination of at least two of the shown structural units. Substituents may be introduced in these connecting groups. Each of the bivalent connecting groups represented by $X_1$ and $X_2$ preferably has 40 or less carbon atoms.

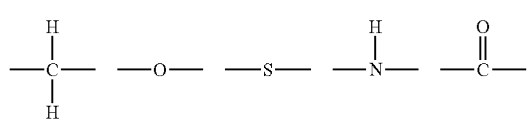

-continued

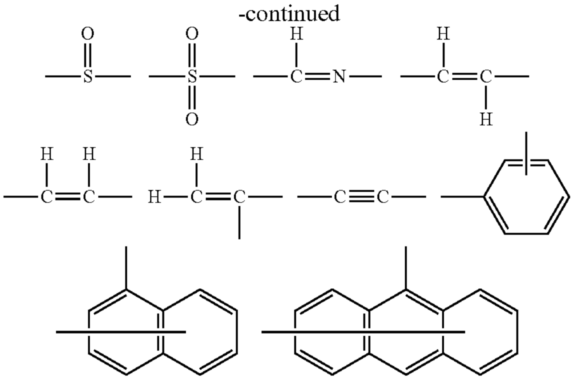

As the substituents that may be introduced in these bivalent connecting groups, there can be mentioned, for example, those set forth above in connection with $R_1$ and $R_2$.

As mentioned above, $X_1$ and $X_2$ may be bonded to each other to thereby form a ring. This ring is preferably a 5- to 7-membered ring. A sulfur atom or an unsaturated bond may be introduced in this ring.

The structural moieties of general formula (N1) above are more preferably expressed by either general formula (N1-I) below or general formula (N1-II) below.

(N1-I)

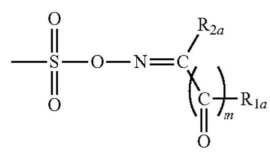

(N1-II)

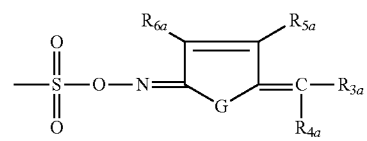

In the formulae, $R_{1a}$ represents a hydrogen atom, an alkyl group (preferably having 1 to 18 carbon atoms; a bivalent connecting group may be introduced in the chain), a cycloalkyl group (preferably having 3 to 30 carbon atoms; a bivalent connecting group may be introduced in the ring), a monocyclic or polycyclic aryl group (preferably having 6 to 30 carbon atoms; a plurality of aryl groups may be bonded to each other through a single bond, an ether group or a thioether bond), a heteroaryl group (preferably having 6 to 30 carbon atoms), an alkenyl group (preferably having 2 to 12 carbon atoms), a cycloalkenyl group (preferably having 4 to 30 carbon atoms), an aralkyl group (preferably having 7 to 15 carbon atoms; a heteroatom may be introduced therein), a halogen atom, a cyano group, an alkoxycarbonyl group (preferably having 2 to 6 carbon atoms) or a phenoxycarbonyl group.

$R_{2a}$ represents a hydrogen atom, an alkyl group (preferably having 1 to 18 carbon atoms; a bivalent connecting group may be introduced in the chain), a cycloalkyl group (preferably having 3 to 30 carbon atoms; a bivalent connecting group may be introduced in the ring), a monocyclic or polycyclic aryl group (preferably having 6 to 30 carbon atoms; a plurality of aryl groups may be bonded to each other through a single bond, an ether group or a thioether bond), a heteroaryl group (preferably having 6 to 30 carbon atoms), an alkenyl group (preferably having 2 to 12 carbon atoms), a cycloalkenyl group (preferably having 4 to 30 carbon atoms), an aralkyl group (preferably having 7 to 15 carbon atoms; a heteroatom may be introduced therein), a halogen atom, a cyano group, an alkoxycarbonyl group (preferably having 2 to 6 carbon atoms), a phenoxycarbonyl group, an alkanoyl group (preferably having 2 to 18 carbon atoms), a benzoyl group, a nitro group, —$S(O)_p$-alkyl group (preferably having 1 to 18 carbon atoms; in the formula, p is 1 or 2), —$S(O)_p$-aryl group (preferably having 6 to 12 carbon atoms; in the formula, p is 1 or 2), —$SO_2O$-alkyl group (preferably having 1 to 18 carbon atoms) or —$SO_2O$-aryl group (preferably having 6 to 12 carbon atoms).

$R_{1a}$ and $R_{2a}$ may be bonded to each other to thereby form a ring (preferably a 5- to 7-membered ring); and m is 0 or 1.

Each of $R_{3a}$ and $R_{4a}$ independently represents a hydrogen atom, an alkyl group (preferably having 1 to 18 carbon atoms; a bivalent connecting group may be introduced in the chain), a cycloalkyl group (preferably having 3 to 30 carbon atoms; a bivalent connecting group may be introduced in the ring), a monocyclic or polycyclic aryl group (preferably having 6 to 30 carbon atoms; a plurality of aryl groups may be bonded to each other through a single bond, an ether group or a thioether bond), a heteroaryl group (preferably having 6 to 30 carbon atoms), an alkenyl group (preferably having 2 to 12 carbon atoms), a cycloalkenyl group (preferably having 4 to 30 carbon atoms), a cyano group, an alkoxycarbonyl group (preferably having 2 to 6 carbon atoms), a phenoxycarbonyl group, an alkanoyl group (preferably having 2 to 18 carbon atoms), a benzoyl group, a nitro group, —$S(O)_p$-alkyl group (preferably having 1 to 18 carbon atoms; in the formula, p is 1 or 2), —$S(O)_p$-aryl group (preferably having 6 to 12 carbon atoms; in the formula, p is 1 or 2), —$SO_2O$-alkyl group (preferably having 1 to 18 carbon atoms) or —$SO_2O$-aryl group (preferably having 6 to 12 carbon atoms).

$R_{3a}$ and $R_{4a}$ may be bonded to each other to thereby form a ring (preferably a 5- to 7-membered ring).

Each of $R_{5a}$ and $R_{6a}$ independently represents a hydrogen atom, an alkyl group (preferably having 1 to 18 carbon atoms), a cycloalkyl group (preferably having 3 to 30 carbon atoms; a bivalent connecting group may be introduced in the ring), a halogen atom, a nitro group, a cyano group, an aryl group (preferably having 6 to 30 carbon atoms) or a heteroaryl group (preferably having 6 to 30 carbon atoms).

As the bivalent connecting groups contained in $R_{1a}$ to $R_{6a}$, there can be mentioned the same bivalent connecting groups as represented by $X_1$ and $X_2$ of general formula (N1) above. An ether group and a thioether group are preferred.

G represents an ether group or a thioether group.

Substituents may be introduced in these groups. As the substituents, there can be mentioned, for example, a hydroxyl group; a halogen atom (a fluorine, chlorine, bromine or iodine atom); a nitro group; a cyano group; an amido group; a sulfonamido group; any of the alkyl groups mentioned above with respect to, for example, $R_1$ and $R_2$ of general formula (N1); an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. Each of the substituents preferably has 8 or less carbon atoms.

Specific examples of the groups of general formula (N1-I) and general formula (N1-II) are shown below.

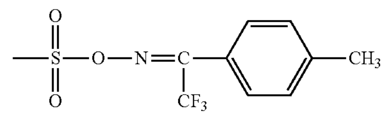

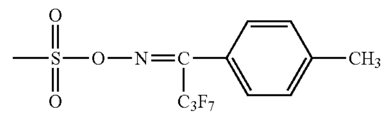

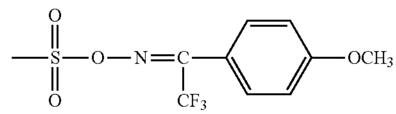

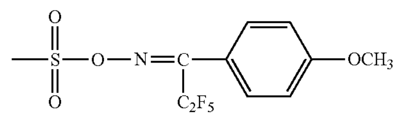

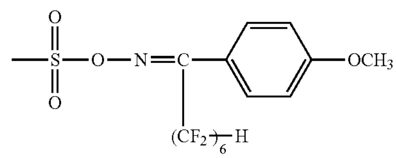

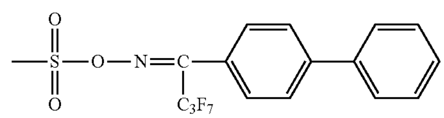

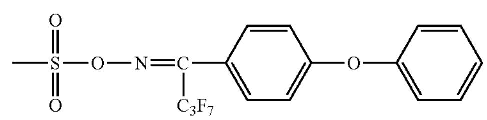

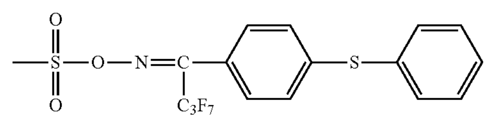

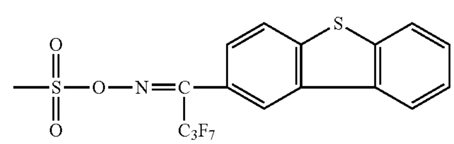

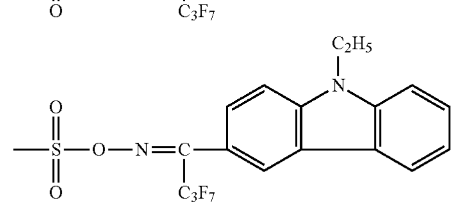

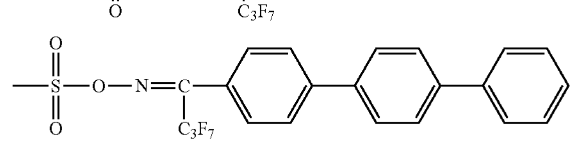

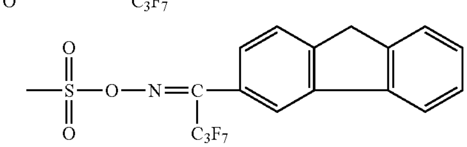

-continued
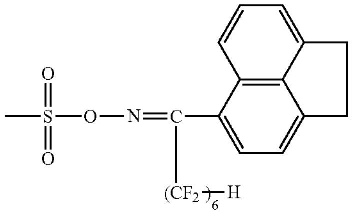
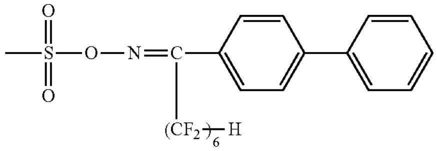
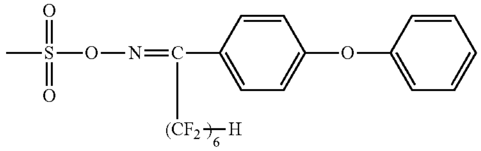
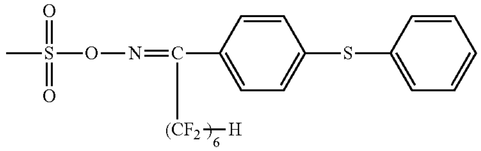
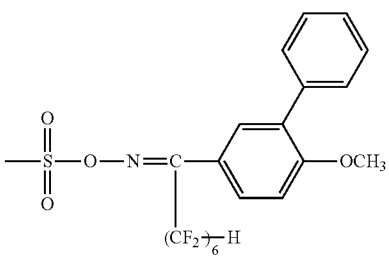
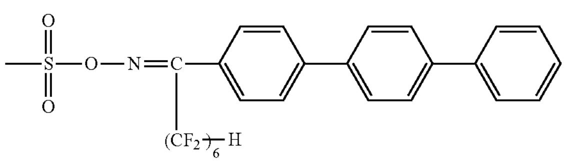
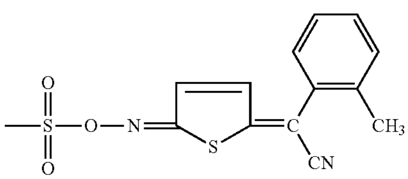
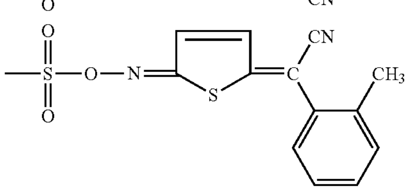
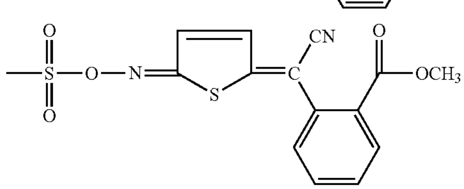
-continued
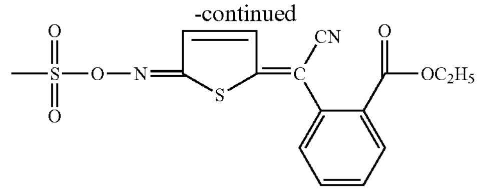
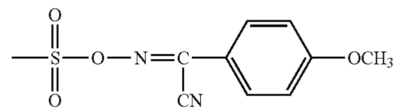
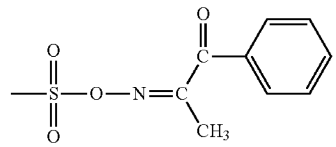
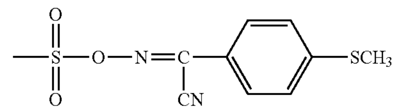
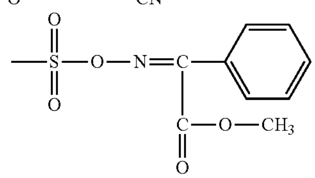
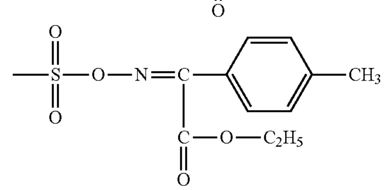
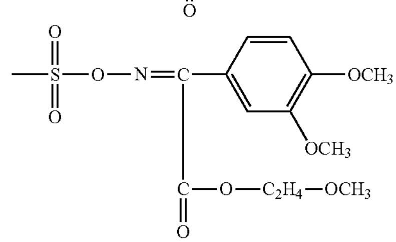
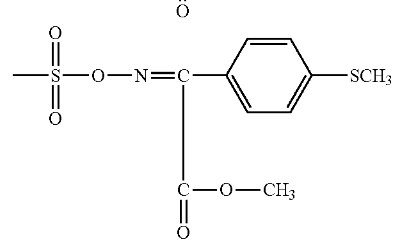
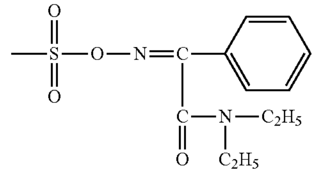
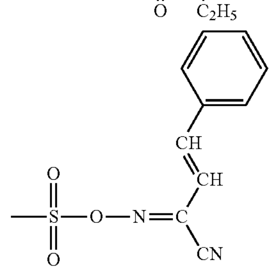

-continued

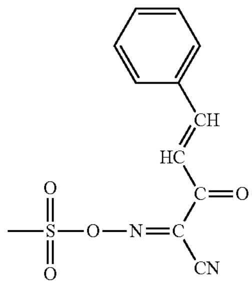

Further, as the nonionic structural moieties, there can be mentioned the structural moieties of any of general formulae (N2) to (N9) below. As the nonionic structural moieties, the structural moieties of any of general formulae (N1) to (N4) are preferred, and the structural moieties of general formula (N1) are more preferred.

(N2)

$$—SO_2—SO_2—Ar^6$$

(N3)

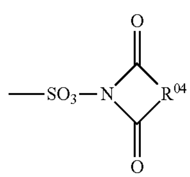

(N4)

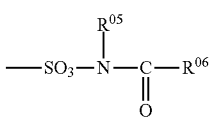

(N5)

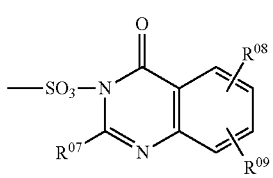

(N6)

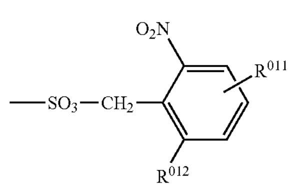

(N7)

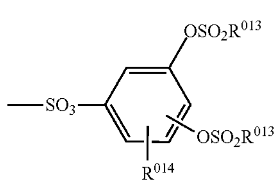

(N8)

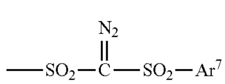

(N9)

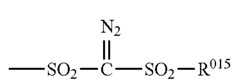

In the formulae, each of $Ar^6$ and $Ar^7$ independently represents an aryl group. As this aryl group, there can be mentioned, for example, any of those set forth above in connection with $R_{25}$ to $R_{27}$ and $R_{33}$.

$R^{04}$ represents an arylene group, an alkylene group or an alkenylene group. This alkenylene group preferably has 2 to 6 carbon atoms. As the alkenylene group, there can be mentioned, for example, an ethenylene group, a propenylene group or a butenylene group. A substituent may be introduced in the alkenylene group. As the arylene group and alkylene group represented by $R^{04}$ and substituents that may be introduced in the groups represented by $R^{04}$, there can be mentioned, for example, those set forth above in connection with the bivalent connecting groups represented by $X_1$ to $X_3$.

Each of $R^{05}$ to $R^{09}$, $R^{013}$ and $R^{015}$ independently represents an alkyl group, a cycloalkyl group, an aryl group or an aralkyl group. As these groups, there can be mentioned, for example, those set forth above in connection with $R_{25}$ to $R_{27}$ and $R_{33}$. When substituents have been introduced in the alkyl groups represented by $R^{05}$ to $R^{09}$, $R^{013}$ and $R^{015}$, it is preferred for the alkyl groups to be haloalkyl groups.

Each of $R^{011}$ and $R^{014}$ independently represents a hydroxyl group, a halogen atom (a fluorine, chlorine, bromine or iodine atom), or, an alkyl group, an alkoxy group, an alkoxycarbonyl group or an acyloxy group mentioned above as a preferred substituent.

$R^{012}$ represents a nitro group, a cyano group or a perfluoroalkyl group. As this perfluoroalkyl group, there can be mentioned, for example, a trifluoromethyl group or a pentafluoroethyl group.

As particular examples of the nonionic structural moieties, there can be mentioned the corresponding moieties appearing in the particular examples of repeating units (R) to be shown hereinafter.

(Ionic Structural Moiety)

As mentioned above, the repeating unit (R) may contain an ionic structural moiety that is configured to decompose when exposed to actinic rays or radiation to thereby generate an acid.

As the ionic structural moiety, there can be mentioned, for example, a structural unit containing an onium salt. As such a structural unit, there can be mentioned, for example, the structural unit expressed by either general formula (ZI) below or general formula (ZII) below. The structural units of general formulae (ZI) and (ZII) below respectively contain a sulfonium salt and an iodonium salt.

ZI

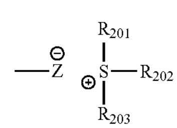

ZII

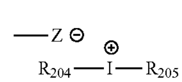

First, the structural unit represented by general formula (ZI) will be explained.

In the above general formula (ZI), each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other via a single bond or a connecting group to thereby form a ring structure. As the connecting group, there can be mentioned, for example, an ether bond, a thioether bond, an ester bond, an amido bond, a carbonyl group, a methylene group or an ethylene group. As the group formed by the mutual bonding of two of $R_{201}$ to $R_{203}$, there can be mentioned, for example, an alkylene group, such as a butylene group or a pentylene group.

$Z^-$ represents an acid anion generated by the decomposition upon exposure to actinic rays or radiation. $Z^-$ is preferably a nonnucleophilic anion. As the nonnucleophilic anion, there can be mentioned, for example, a sulfonate anion (—$SO_3^-$), a carboxylate anion (—$CO_2^-$), an imidate anion or a methide anion. The imidate anion is preferably expressed by general formula (AN-1) below. The methide anion is preferably expressed by general formula (AN-2) below.

(AN-1)

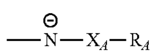

(AN-2)

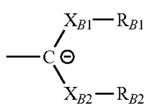

In the formulae, each of $X_A$, $X_{B1}$ and $X_{B2}$ independently represents —CO— or —$SO_2$—.

Each of $R_A$, $R_{B1}$ and $R_{B2}$ independently represents an alkyl group. Substituents may be introduced in this alkyl group. The substituent is most preferably a fluorine atom.

$R_{B1}$ and $R_{B2}$ may be bonded to each other to thereby form a ring. Further, each of $R_A$, $R_{B1}$ and $R_{B2}$ may be bonded to an arbitrary atom among the atoms constituting a side chain of the repeating unit (R) to thereby form a ring. In that instance, each of $R_A$, $R_{B1}$ and $R_{B2}$ is, for example, a single bond or an alkylene group.

The nonnucleophilic anion means an anion whose capability of inducing a nucleophilic reaction is extremely low and is an anion capable of inhibiting any temporal decomposition by intramolecular nucleophilic reaction. This enhances the temporal stability of the resin and thus enhances the temporal stability of the composition.

As the organic groups represented by $R_{201}$, $R_{202}$ and $R_{203}$ in the structural unit (ZI), there can be mentioned, for example, the corresponding groups of compounds (ZI-1), (ZI-2), (ZI-3) or (ZI-4) to be described hereinafter.

The structural units (ZI-1) are arylsulfonium units of the general formula (ZI) wherein at least one of $R_{201}$ to $R_{203}$ is an aryl group, namely, the structural units containing an arylsulfonium as a cation.

In the structural units (ZI-1), all of the $R_{201}$ to $R_{203}$ may be aryl groups. It is also appropriate that the $R_{201}$ to $R_{203}$ are partially an aryl group and the remainder is an alkyl group or a cycloalkyl group.

As the structural units (ZI-1), there can be mentioned, for example, those corresponding to a triarylsulfonium, a diarylalkylsulfonium, an aryldialkylsulfonium, a diarylcycloalkylsulfonium and an aryldicycloalkylsulfonium structure.

The aryl group of the arylsulfonium structure is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, a pyrrole residue, a furan residue, a thiophene residue, an indole residue, a benzofuran residue, and a benzothiophene residue can be exemplified. When the arylsulfonium compound has two or more aryl groups, the two or more aryl groups may be identical to or different from each other.

The alkyl group or cycloalkyl group contained in the arylsulfonium structure according to necessity is preferably a linear or branched alkyl group having 1 to 15 carbon atoms or a cycloalkyl group having 3 to 15 carbon atoms. As such, a methyl group, an ethyl group, a propyl group, an n-butyl group, a sec-butyl group, a t-butyl group, a cyclopropyl group, a cyclobutyl group, and a cyclohexyl group can be exemplified.

The aryl group, alkyl group or cycloalkyl group represented by $R_{201}$ to $R_{203}$ may have one or more substituents. As the substituent, an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxy group, and a phenylthio group can be exemplified. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the phenyl group.

Now, the structural units (ZI-2) will be described.

The structural units (ZI-2) are compounds represented by the formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group, and a vinyl group. More preferred groups include a linear or branched 2-oxoalkyl group, 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, a linear or branched alkyl group having 1 to 10 carbon atoms (for example, a methyl group, an ethyl group, a propyl group, a butyl group or a pentyl group) and a cycloalkyl group having 3 to 10 carbon atoms (for example, a cyclopentyl group, a cyclohexyl group or a norbornyl group) can be exemplified. As more preferred alkyl groups, a 2-oxoalkyl group and an alkoxycarbonylmethyl group can be exemplified. As more preferred cycloalkyl group, a 2-oxocycloalkyl group can be exemplified.

The 2-oxoalkyl group may be linear or branched. A group having >C═O at the 2-position of the above-described alkyl group can be preferably exemplified.

The 2-oxocycloalkyl group is preferably a group having >C═O at the 2-position of the above-described cycloalkyl group.

As preferred alkoxy groups of the alkoxycarbonylmethyl group, alkoxy groups having 1 to 5 carbon atoms can be exemplified. As such, there can be mentioned, for example, a methoxy group, an ethoxy group, a propoxy group, a butoxy group and a pentoxy group.

The organic groups containing no aromatic ring represented by $R_{201}$ to $R_{203}$ may further have one or more substituents. As the substituents, a halogen atom, an alkoxy group (having, for example, 1 to 5 carbon atoms), a hydroxy group, a cyano group and a nitro group can be exemplified.

Now the structural units (ZI-3) will be described. The structural units (ZI-3) are those represented by the following general formula (ZI-3) which have a phenacylsulfonium salt structure.

(ZI-3)

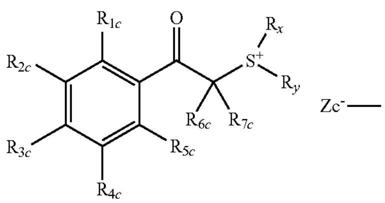

In the formula (ZI-3), each of $R_{1c}$ to $R_{5c}$ independently represents a hydrogen atom, an alkyl group, a cycloalkyl group, an alkoxy group, a halogen atom, or a phenylthio group. Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having >C═O at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Specific examples of the cation part in the structural unit (ZI-3) will be described below.

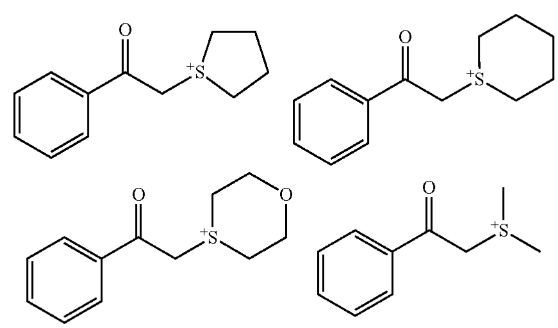

-continued
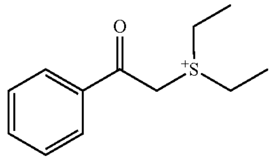
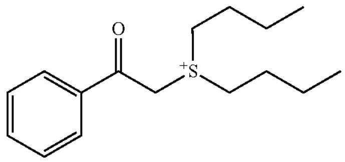
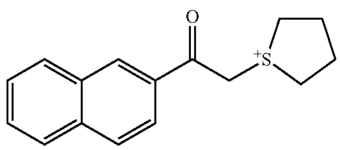
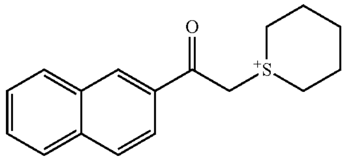
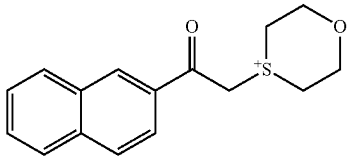
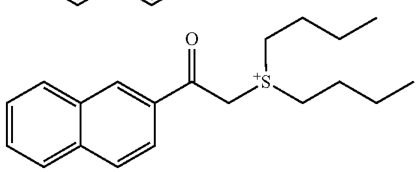
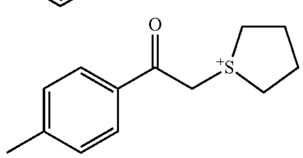
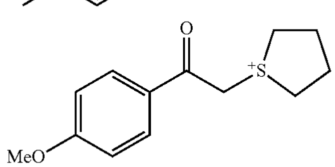
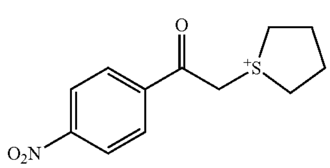
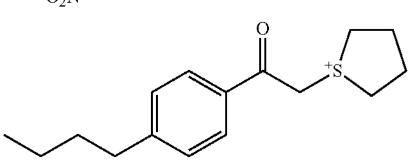
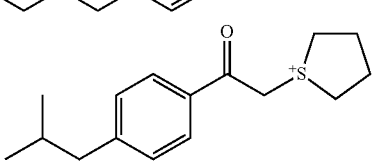
-continued
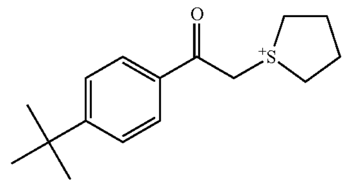
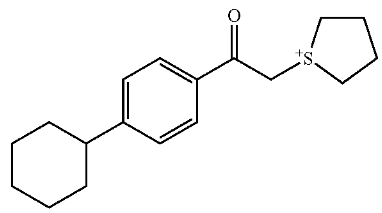
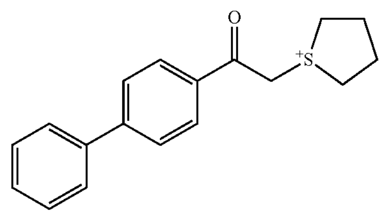
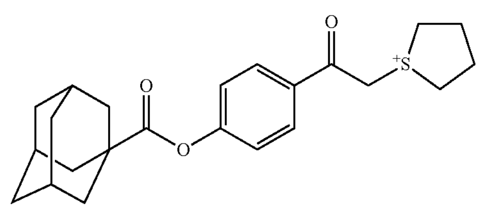
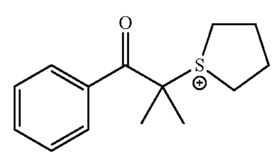
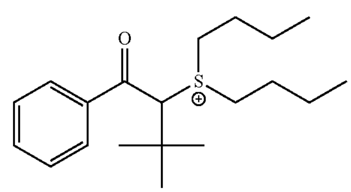
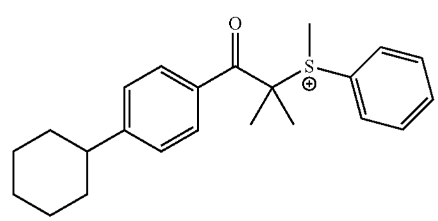
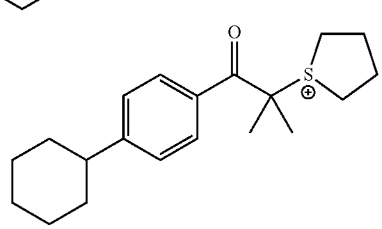

-continued
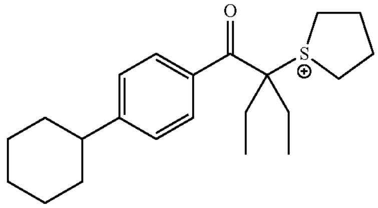
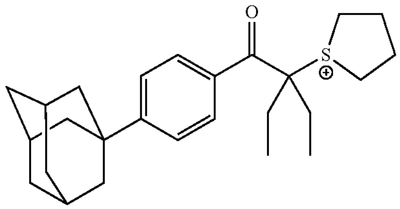
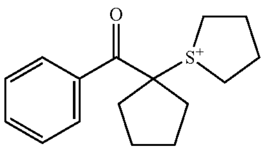
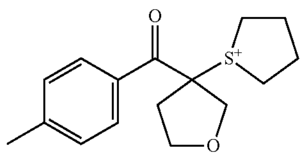
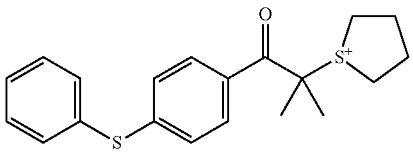
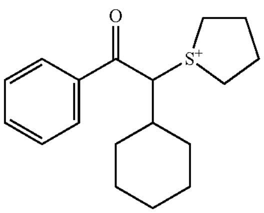
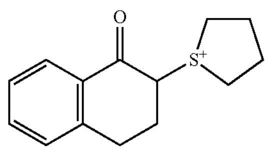
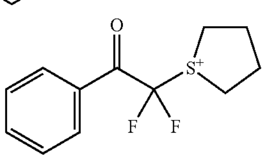
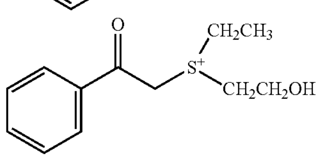
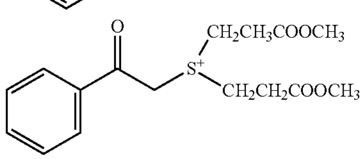
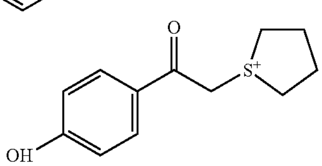
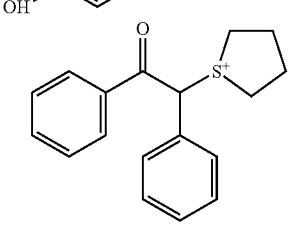
-continued
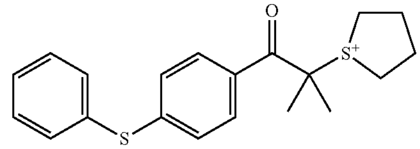
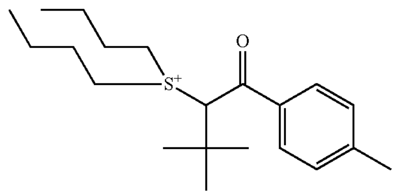
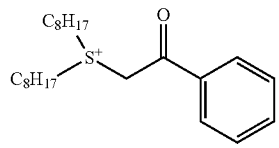
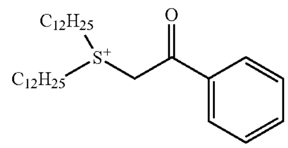
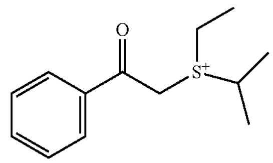
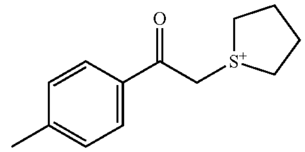
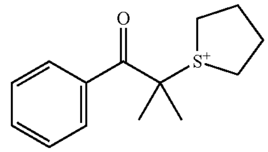
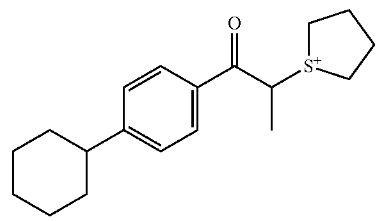
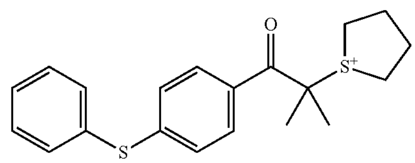
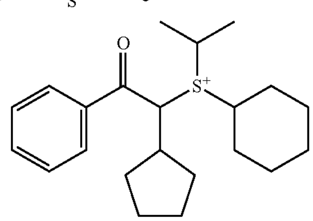
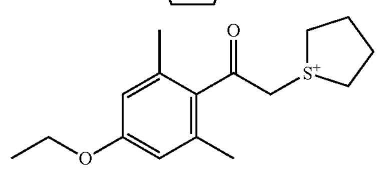
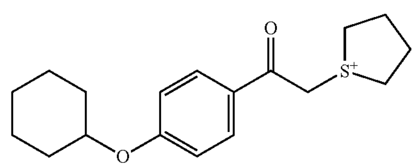

-continued

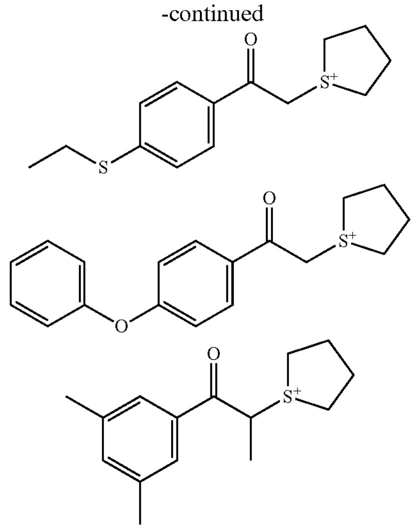

The structural units (ZI-4) are those of general formula (ZI-4) below.

(ZI-4)

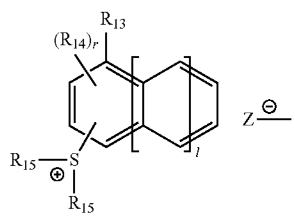

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have one or more substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have one or more substituents.

Each of $R_{15}$s independently represents an alkyl group, a cycloalkyl group or a naphthyl group, provided that the two $R_{15}$s may be bonded to each other to thereby form a ring. These groups may have one or more substituents.

In the formula, l is an integer of 0 to 2, and r is an integer of 0 to 8.

$Z^-$ represents an acid anion generated by the decomposition upon exposure to actinic rays or radiation, and preferably represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have one or more substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have one or more substituents. As such substituents, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have one or more substituents. As such substituents, there can be mentioned, for example, a hydroxyl group, an alkoxy group, an alkoxycarbonyl group, a halogen atom (especially, a fluorine atom) or the like.

In the formula, 1 is preferably 0 or 1, more preferably 1, and r is preferably 0 to 2.

Specific examples of the cation part in the structural unit (ZI-4) will be shown below.

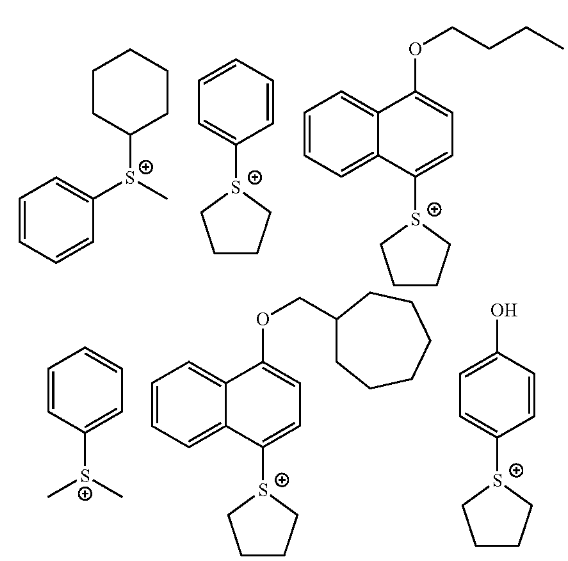

-continued
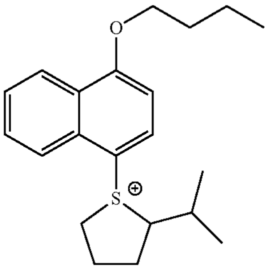
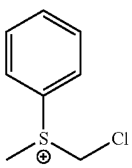
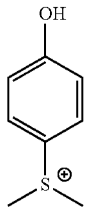
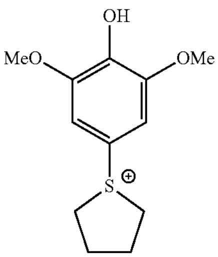
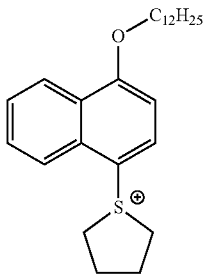
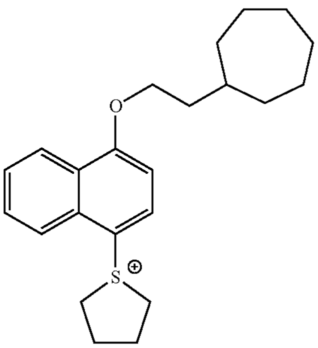
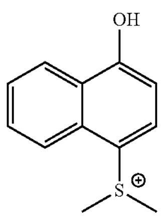
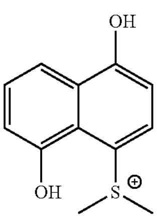
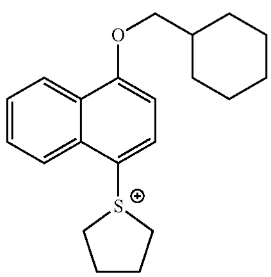
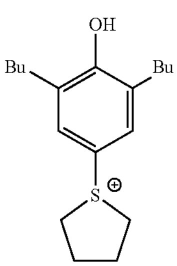
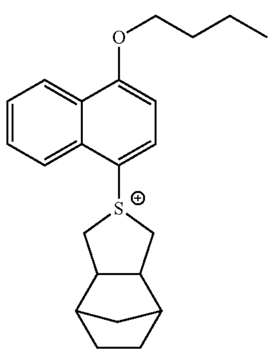
-continued
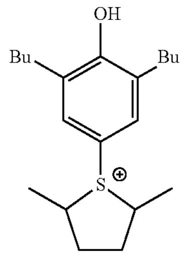
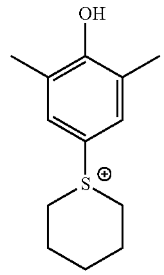
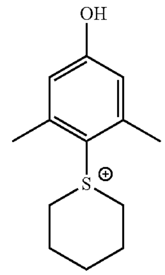
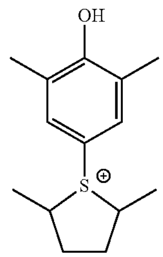
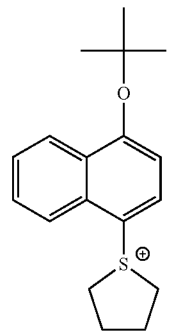
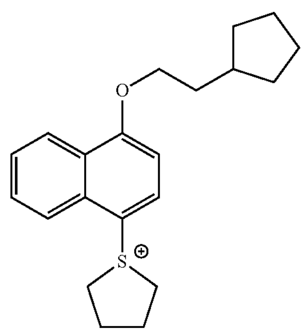
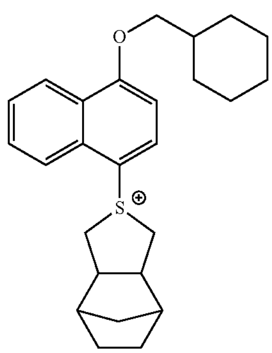
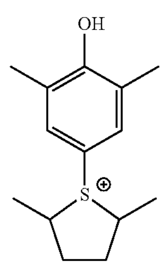
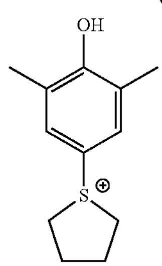
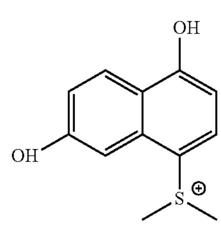
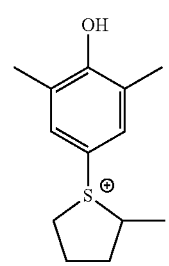

-continued
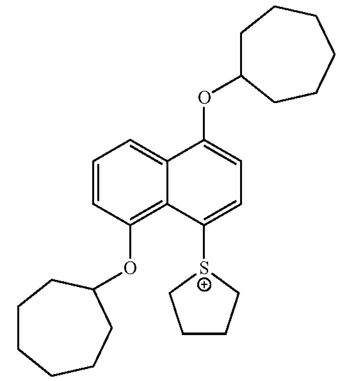
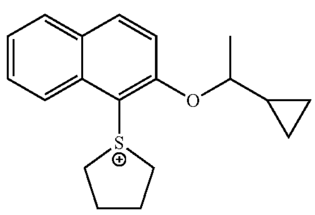
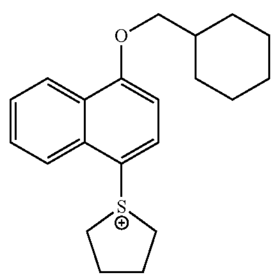
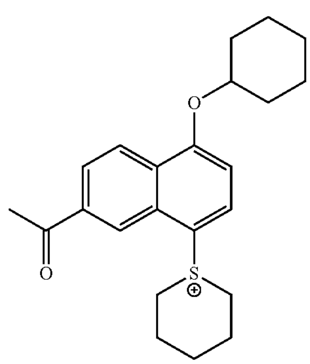
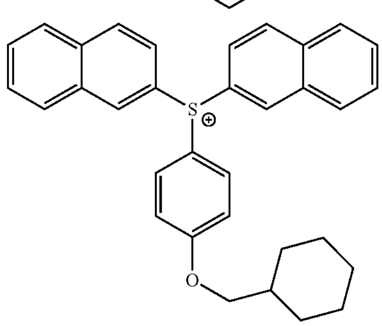
-continued
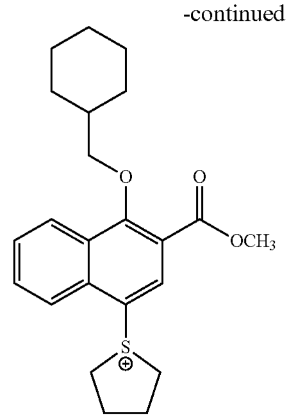
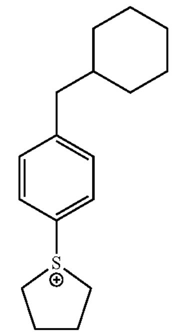
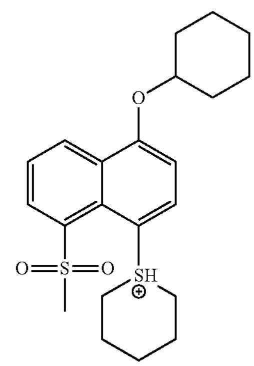
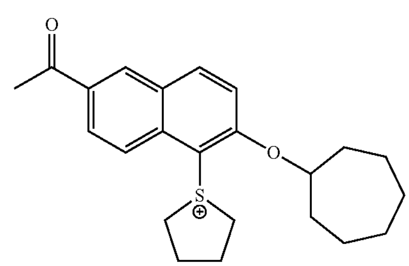
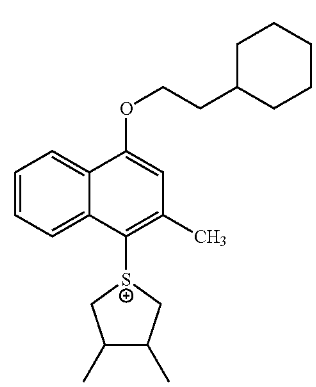

-continued
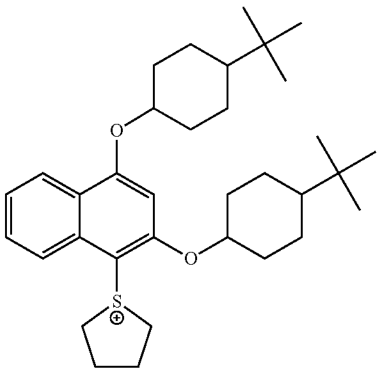
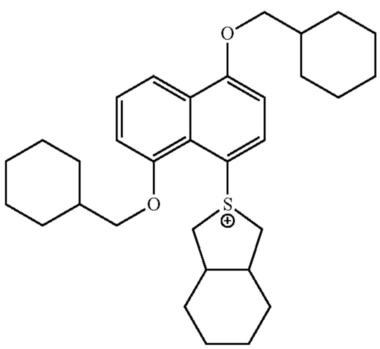
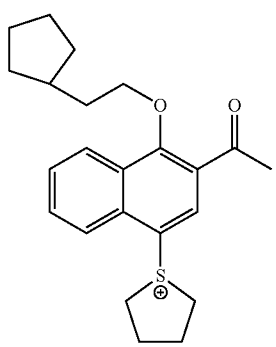
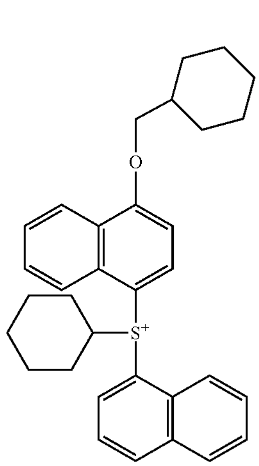
-continued
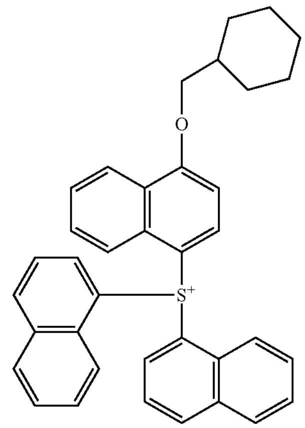
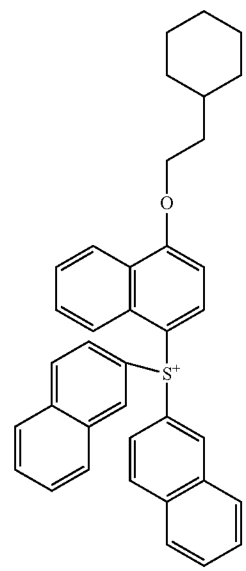
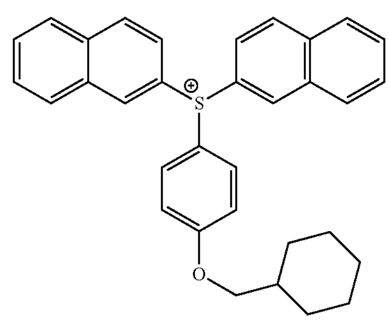
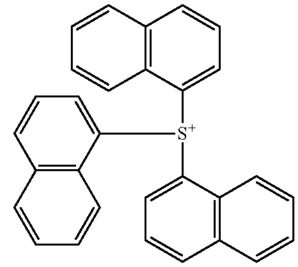

-continued

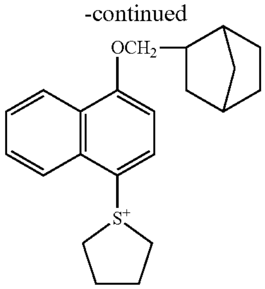

Now, the structural units represented by general formula (ZII) will be explained.

In general formula (ZII), each of $R_{204}$ to $R_{205}$ independently represents an aryl group, an alkyl group or a cycloalkyl group.

As the specific examples or preferred embodiments of the aryl group, the alkyl group or the cycloalkyl group represented by $R_{204}$ to $R_{205}$, those explained with respect to $R_{201}$ to $R_{203}$ in structural unit (ZI-1) can be exemplified.

The aryl group, the alkyl group or the cycloalkyl group represented by $R_{204}$ to $R_{205}$ may contain substituents. As such, those explained with respect to $R_{201}$ to $R_{203}$ in structural unit (ZI-1) can be exemplified.

$Z^-$ represents an acid anion generated by the decomposition upon exposure to actinic rays or radiation, and preferably represents a nonnucleophilic anion. As such, there can be mentioned any of the same nonnucleophilic anions as mentioned with respect to the $Z^-$ of the general formula (ZI).

It is also preferred for the ionic structural unit to be any of the structural units of general formulae (ZCI) and (ZCII) below.

ZCI

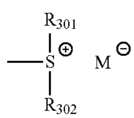

ZCII

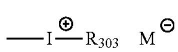

In the formulae, each of $R_{301}$ and $R_{302}$ independently represents an organic group.

Each of the organic groups represented by $R_{301}$ and $R_{302}$ has generally 1 to 30 carbon atoms, preferably 1 to 20 carbon atoms.

$R_{301}$ and $R_{302}$ may be bonded to each other to thereby form a ring structure. An oxygen atom, a sulfur atom, an ester bond, an amido bond or a carbonyl group may be contained in the ring. As the group formed by the bonding, there can be mentioned an alkylene group (for example, a butylene group or a pentylene group).

As particular examples of the organic groups represented by $R_{301}$ and $R_{302}$, there can be mentioned, for example, the aryl groups, alkyl groups, cycloalkyl groups, etc. mentioned above as examples of $R_{201}$ to $R_{203}$ of general formula (ZI).

M represents an atomic group capable of forming an acid with the addition of a proton.

$R_{303}$ represents an organic group. The organic group represented by $R_{303}$ has generally 1 to 30 carbon atoms, preferably 1 to 20 carbon atoms. As particular examples of the organic groups represented by $R_{303}$, there can be mentioned, for example, the aryl groups, alkyl groups, cycloalkyl groups, etc. mentioned above as examples of $R_{204}$ and $R_{205}$ of general formula (ZII).

Specific examples of the ionic structural units are shown below.

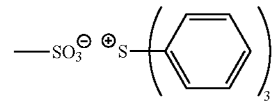

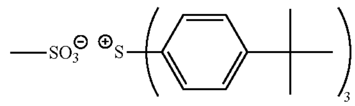

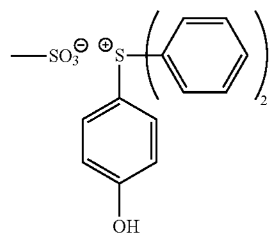

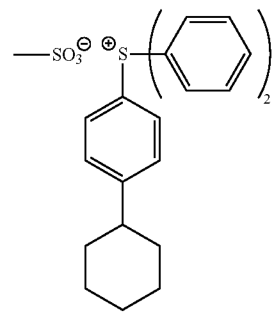

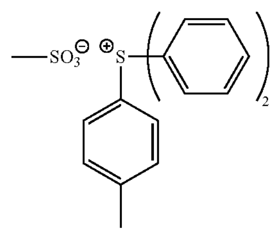

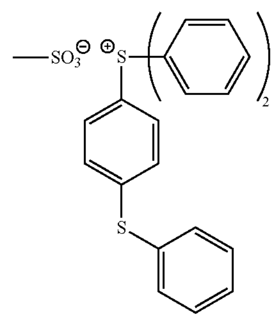

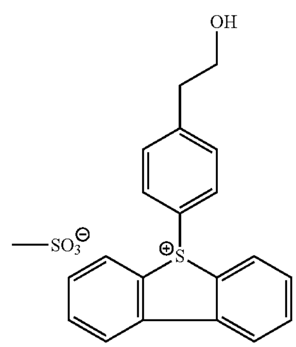

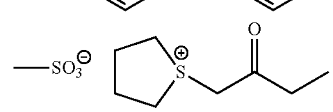

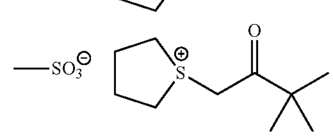

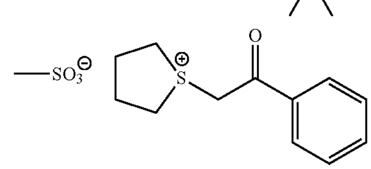

-continued
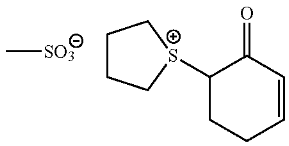
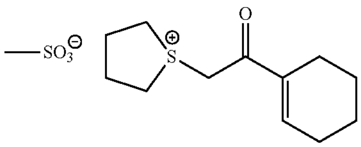
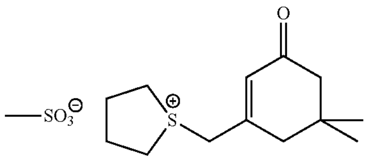
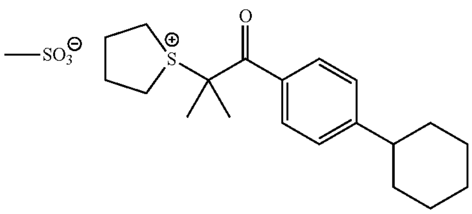
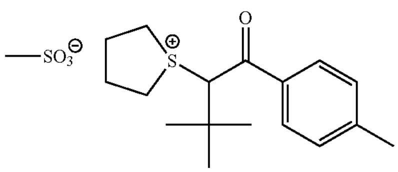
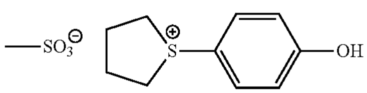
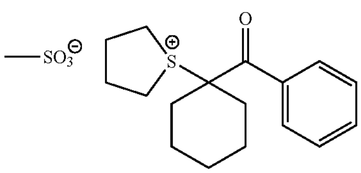
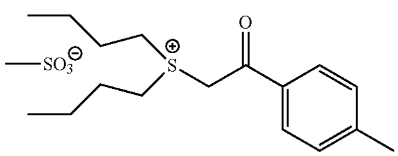
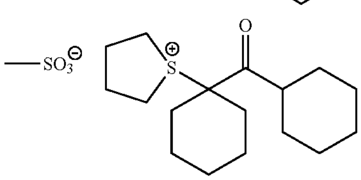
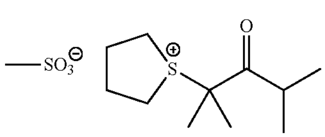
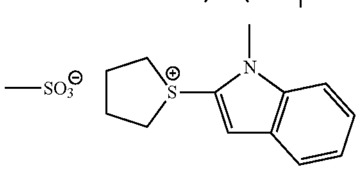
-continued
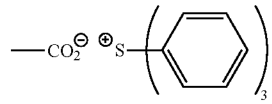
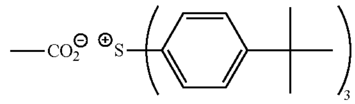
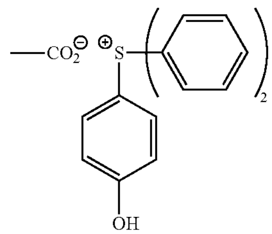
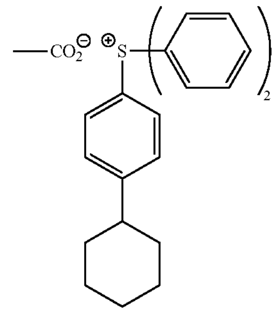
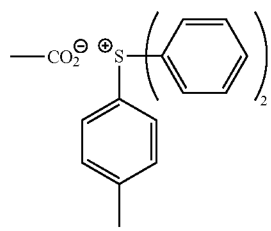
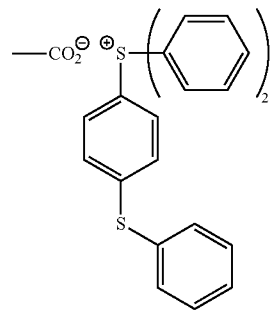
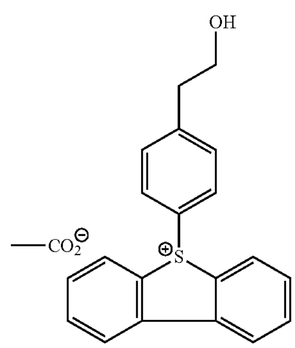
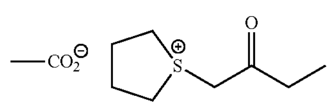
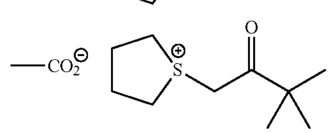
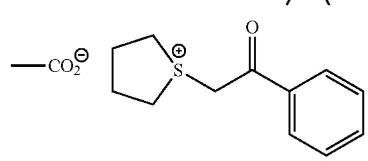
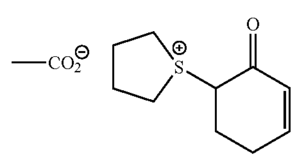

-continued
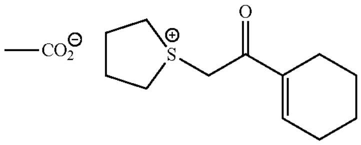
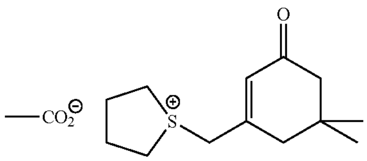
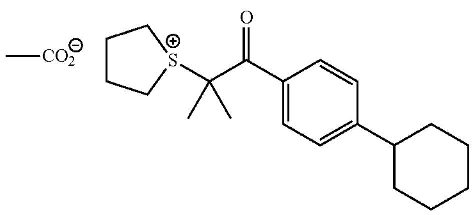
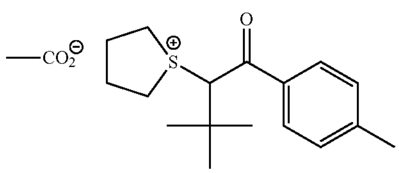
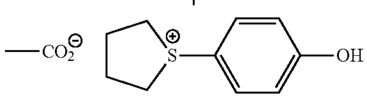
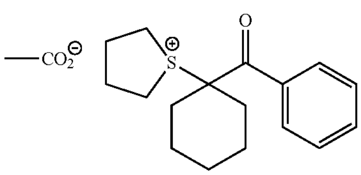
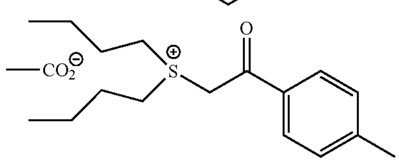
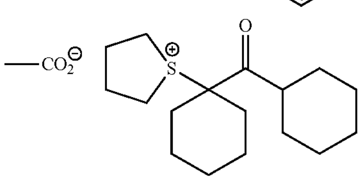
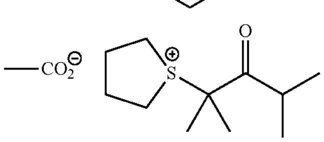
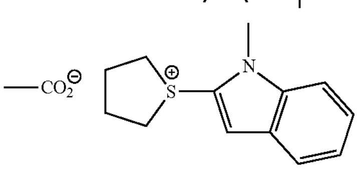
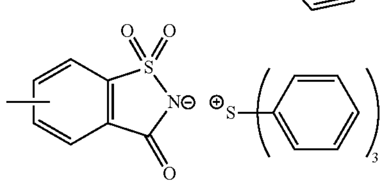
-continued
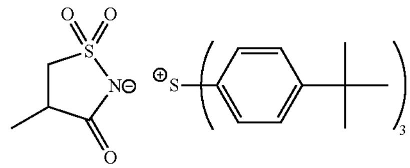
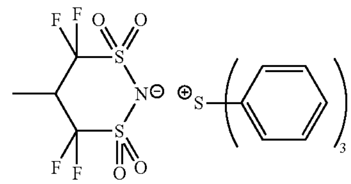
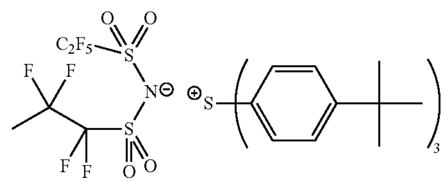
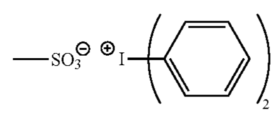
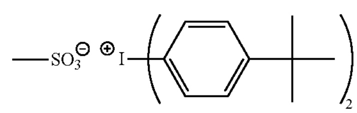
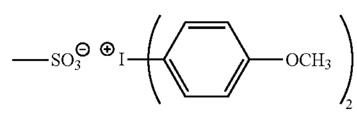
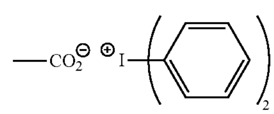
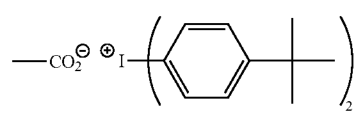
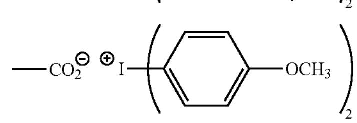
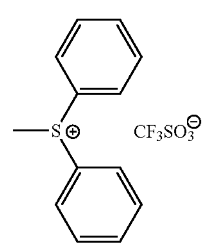
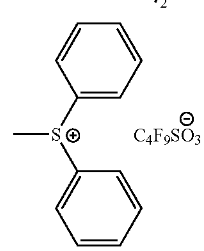
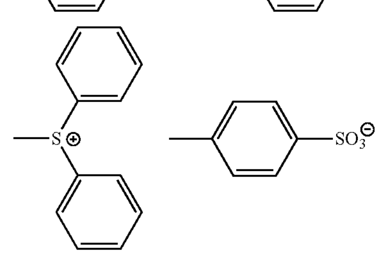

-continued
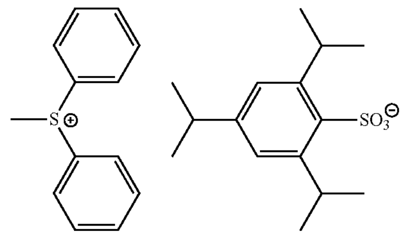
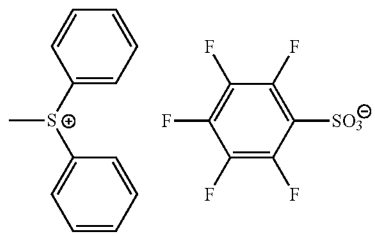
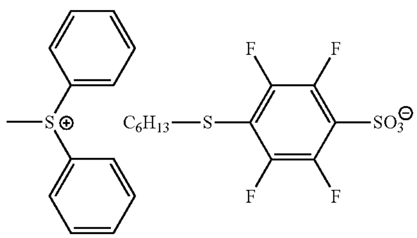
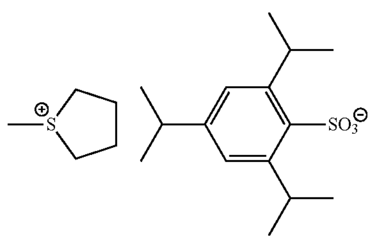
As the repeating unit (R), there can be mentioned, for example, the repeating units expressed by any of the following general formulae (III-1) to (III-6), general formulae (IV-1) to (IV-4) and general formulae (V-1) and (V-2).
(III-1)
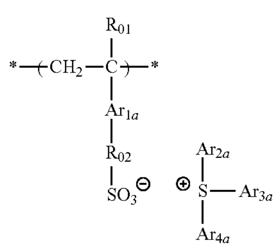
(III-2)
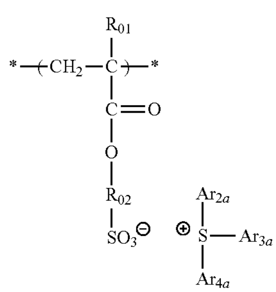
-continued
(III-3)
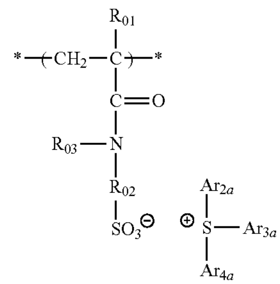
(III-4)
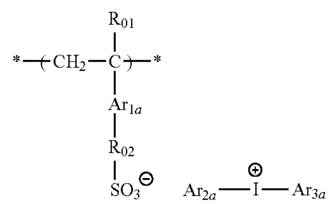
(III-5)
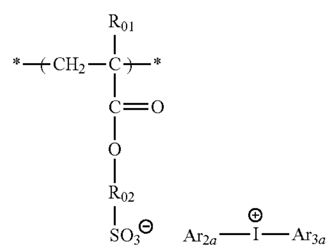
(III-6)
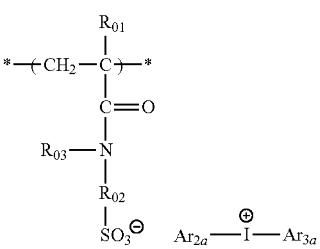
(IV-1)
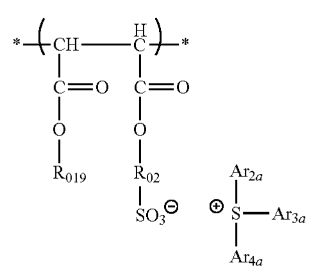
(IV-2)
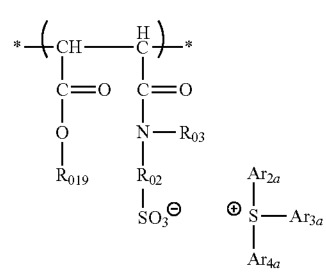

-continued (IV-3)

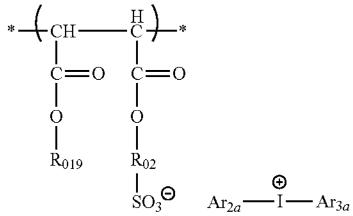

(IV-4)

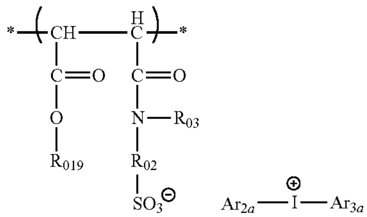

(V-1)

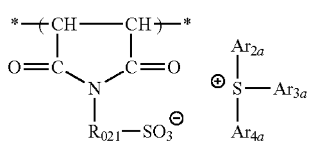

(V-2)

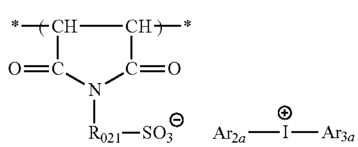

In these general formulae, $Ar_{1a}$ represents the same arylene group as mentioned above in connection with $X_1$ to $X_3$.

Each of $Ar_{2a}$ to $Ar_{4a}$ represents the same aryl group as mentioned above in connection with $R_{201}$ to $R_{203}$ and $R_{204}$ to $R_{205}$ of general formulae (ZI) and (ZII).

$R_{01}$ represents a hydrogen atom, a methyl group, a chloromethyl group, a trifluoromethyl group or a cyano group.

Each of $R_{02}$ and $R_{021}$ represents the same single bond, arylene group, alkylene group, cycloalkylene group, —O—, —$SO_2$—, —CO—, —$N(R_{33})$— or bivalent connecting group composed of a combination of these as mentioned above in connection with $X_1$ to $X_3$.

Each of $R_{03}$ and $R_{019}$ independently represents a hydrogen atom, an alkyl group, a cycloalkyl group, an aryl group or an aralkyl group. As these groups, there can be mentioned, for example, those set forth above in connection with $R_{25}$.

As preferred repeating units (R), further, there can be mentioned the repeating units expressed by any of the following general formulae (I-7) to (I-34).

(I-7)

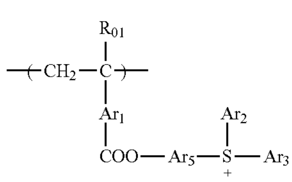

-continued (I-8)

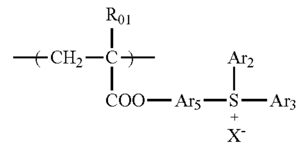

(I-9)

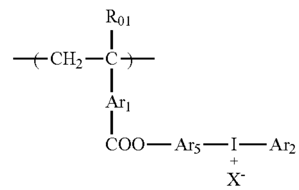

(I-10)

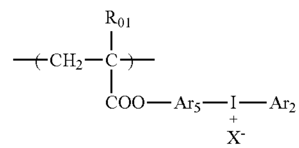

(I-11)

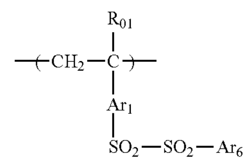

(I-12)

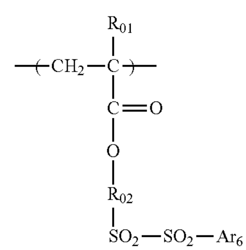

(I-13)

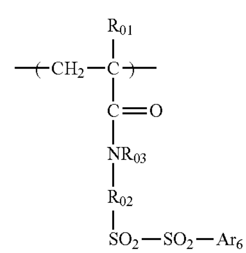

(I-14)

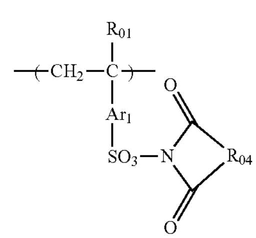

-continued
(I-15)
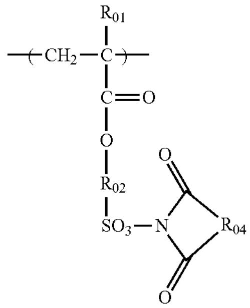
(I-16)
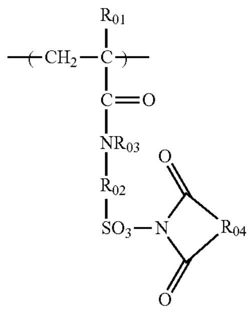
(I-17)
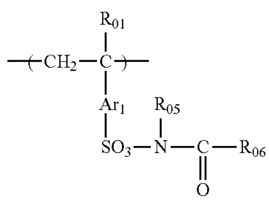
(I-18)
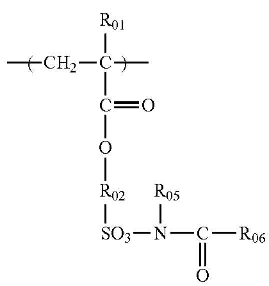
(I-19)
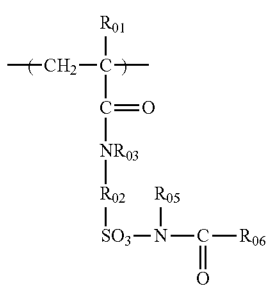
(I-20)
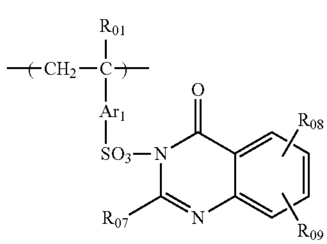
-continued
(I-21)
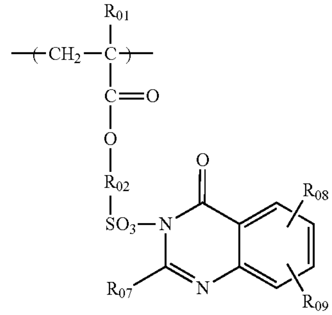
(I-22)
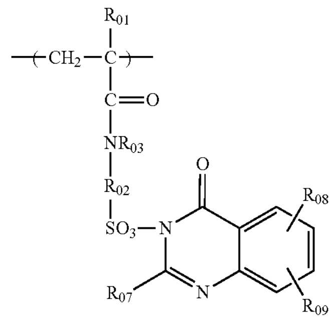
(I-23)
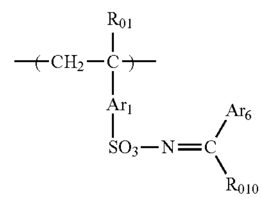
(I-24)
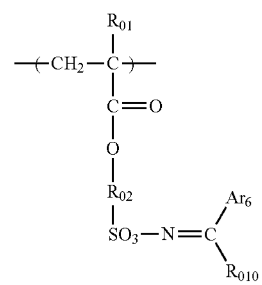
(I-25)
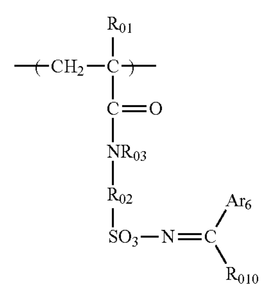
(I-26)
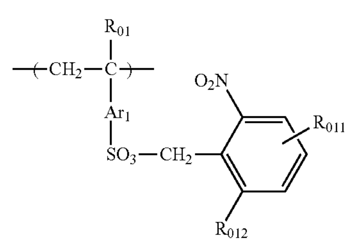

-continued (I-27)

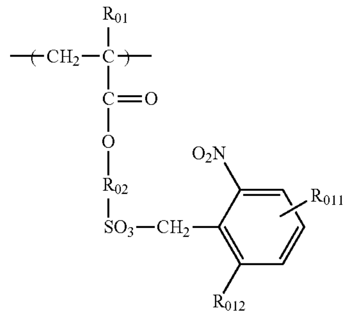

(I-28)

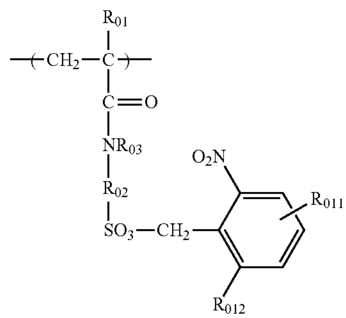

(I-29)

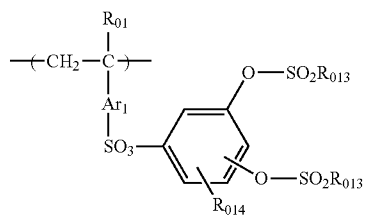

(I-30)

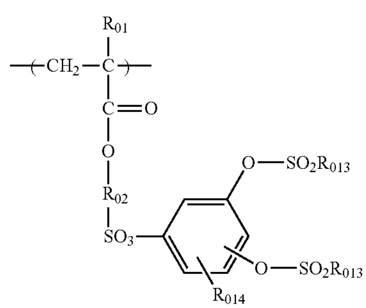

(I-31)

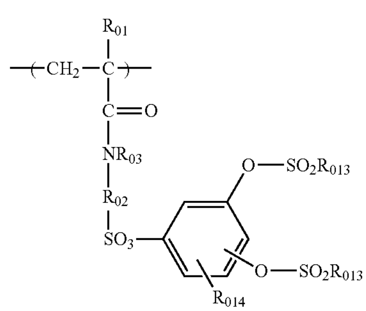

(I-32)

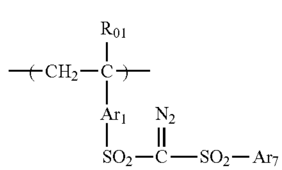

-continued (I-33)

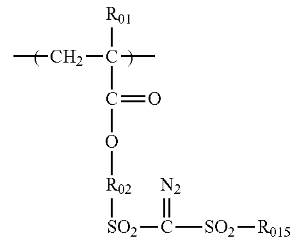

(I-34)

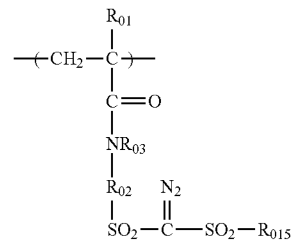

In these general formulae, each of $Ar_1$ and $Ar_5$ represents, for example, the same arylene group as mentioned above in connection with $X_1$ to $X_3$. Each of $Ar_2$ to $Ar_3$ and $Ar_6$ to $Ar_7$ represents, for example, the same aryl group as mentioned above in connection with $R_{25}$ to $R_{27}$ and $R_{33}$. $R_{01}$ is as defined above in connection with general formulae (III-1) to (III-6), general formulae (IV-1) to (IV-4) and general formulae (V-1) and (V-2).

$R_{02}$ represents, for example, the same arylene group, alkylene group or cycloalkylene group as mentioned above in connection with $X_1$ to $X_3$. Each of $R_{03}$, $R_{05}$ to $R_{010}$, $R_{013}$ and $R_{015}$ represents an alkyl group, a haloalkyl group, a cycloalkyl group, an aryl group or an aralkyl group. $R_{04}$ represents an arylene group, an alkylene group or an alkenylene group. This alkenylene group is preferably an alkenylene group having 2 to 6 carbon atoms, such as an ethenylene group, a propenylene group or a butenylene group, in which a substituent may be introduced.

Each of $R_{011}$ and $R_{014}$ represents a hydroxyl group, a halogen atom (fluorine, chlorine, bromine or iodine), or, for example, mentioned above as a preferred further substituent, an alkyl group, an alkoxy group, an alkoxycarbonyl group or an acyloxy group.

$R_{012}$ represents a nitro group, a cyano group, or a perfluoroalkyl group, such as a trifluoromethyl group or a pentafluoroethyl group.

$X^-$ represents an acid anion. $X^-$ is preferably a nonnucleophilic anion. As $X^-$, there can be mentioned, for example, an arylsulfonate, heteroarylsulfonate, alkylsulfonate, cycloalkylsulfonate or perfluoroalkylsulfonate anion.

The content of repeating unit (R) in the resin, based on all the repeating units of the resin, is preferably in the range of 0.5 to 80 mol %, more preferably 1 to 60 mol % and most preferably 3 to 40 mol %.

The method of synthesizing the monomer corresponding to the repeating unit (R) is not particularly limited. For example, there can be mentioned a synthetic method in which an acid anion containing a polymerizable unsaturated bond corresponding to the repeating unit is exchanged with a halide of a known onium salt.

More specifically, a metal ion salt (for example, a salt of sodium ion, potassium ion or the like) or ammonium salt (an ammonium or triethylammonium salt or the like) of an acid containing a polymerizable unsaturated bond corresponding to the repeating unit and an onium salt containing a halide ion (chloride ion, bromide ion, iodide ion or the like) are agitated together in the presence of water or methanol to thereby accomplish an anion exchange reaction. The reaction liquid is subjected to liquid separation/washing operations using water and an organic solvent, such as dichloromethane, chloroform, ethyl acetate, methyl isobutyl ketone or tetrahydroxyfuran. Thus, the desired monomer corresponding to the repeating unit (R) can be obtained.

Alternatively, the synthesis can be accomplished by agitating the mixture in the presence of water and an organic solvent capable of separation from water, such as dichloromethane, chloroform, ethyl acetate, methyl isobutyl ketone or tetrahydroxyfuran, to thereby accomplish an anion exchange reaction and subjecting the reaction liquid to liquid separation with water/washing operations.

Specific examples of the repeating units (R) are shown below.

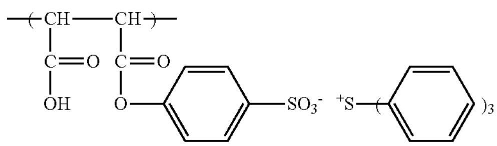
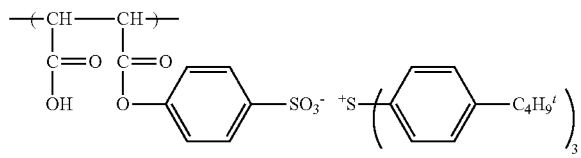
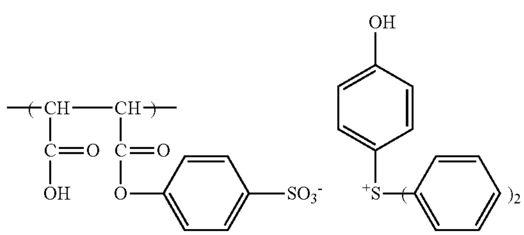
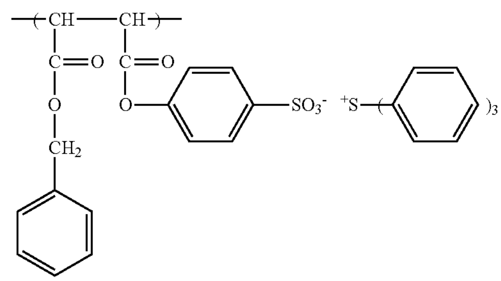
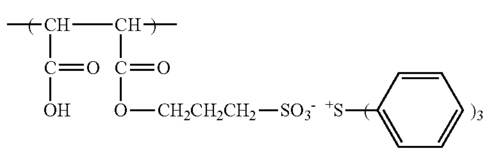
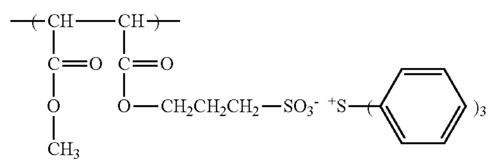
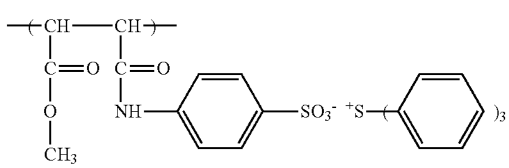
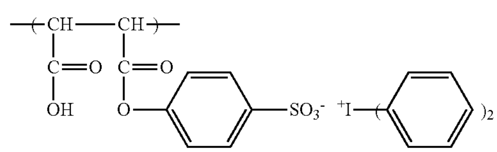
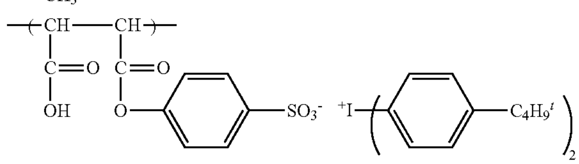
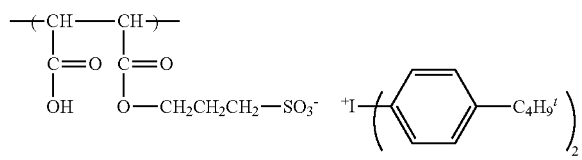
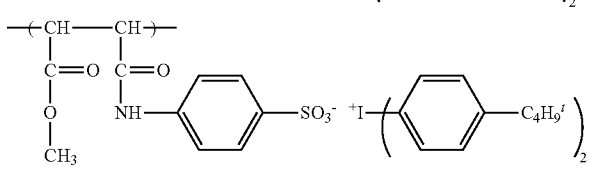
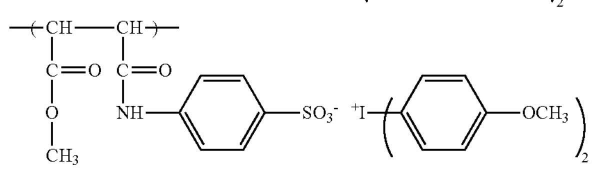
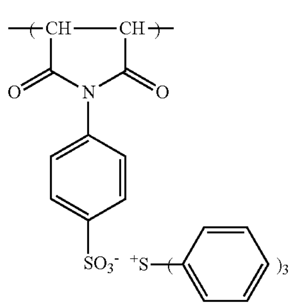
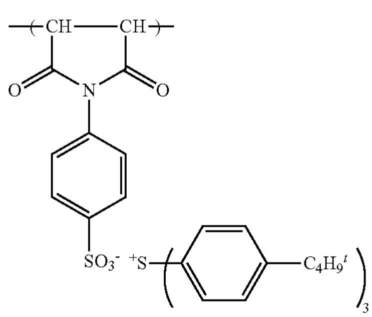
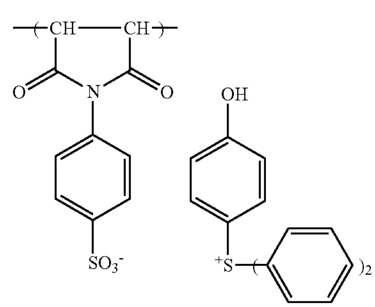

-continued
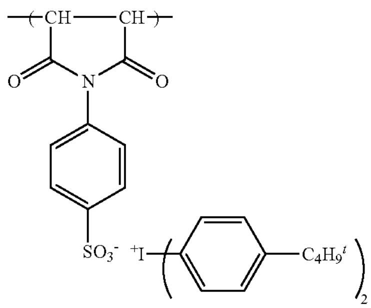
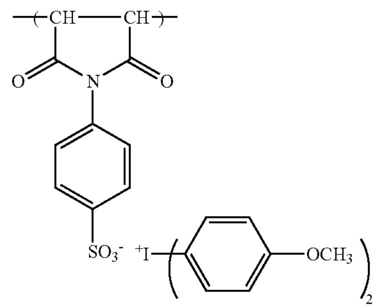
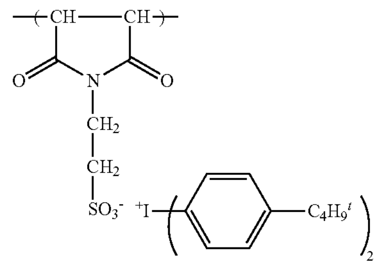
(a15)
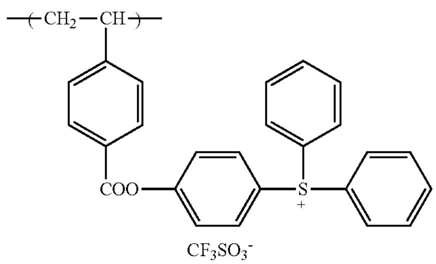
(a16)
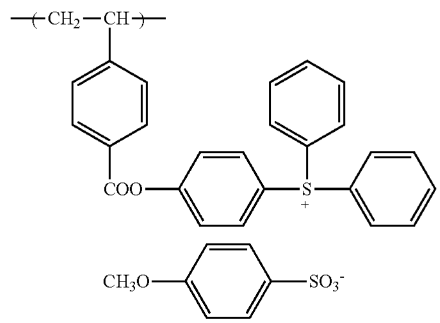
(a17)
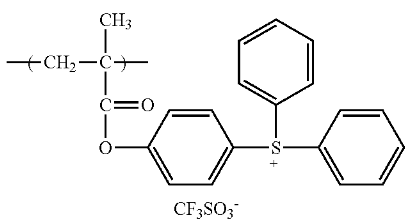
(a18)
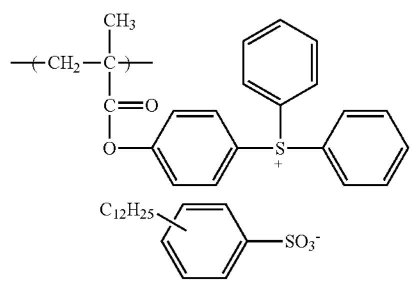
(a19)
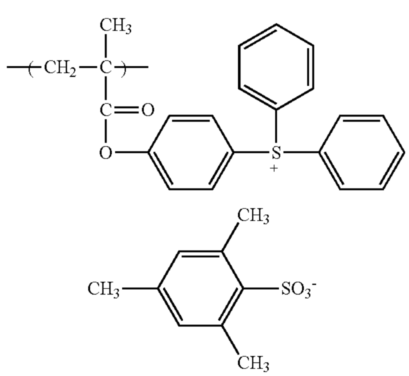
(a20)
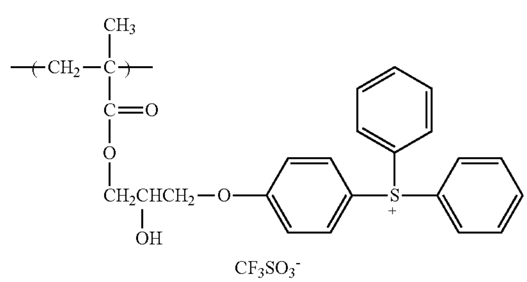
(a21)
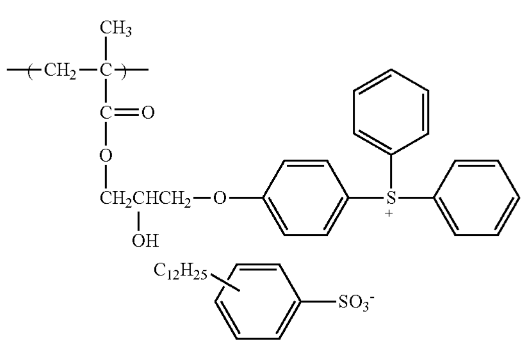
(a22)
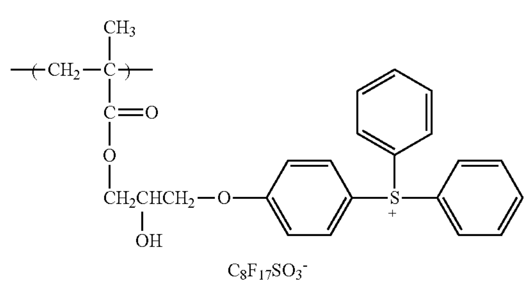

-continued
(a23)
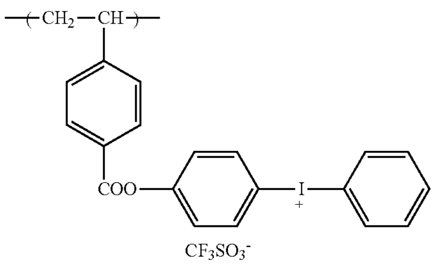
(a24)
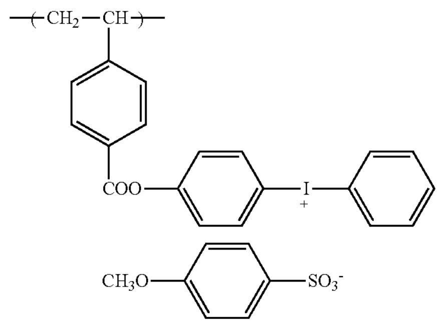
(a25)
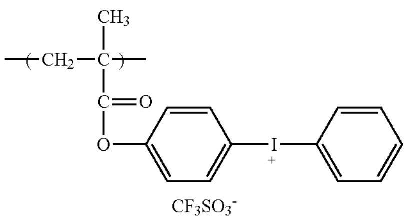
(a26)
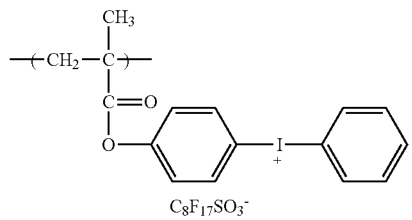
(a27)
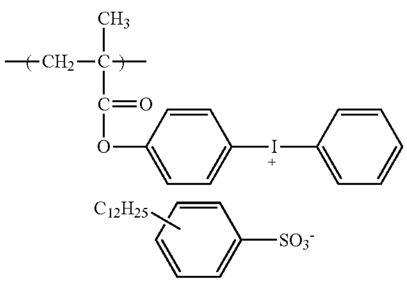
(a28)
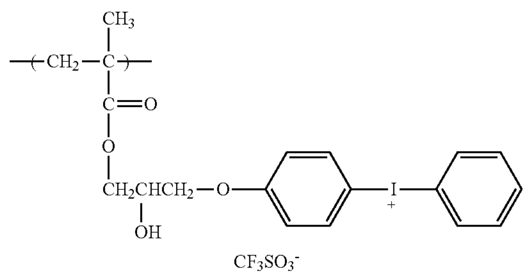
(a29)
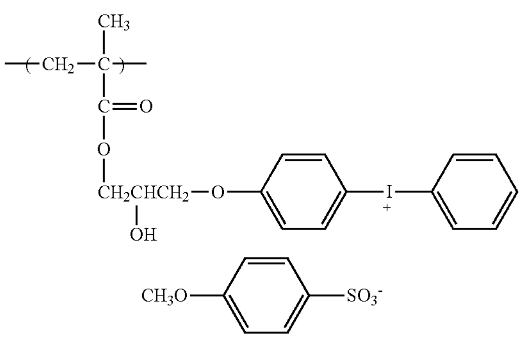
(a30)
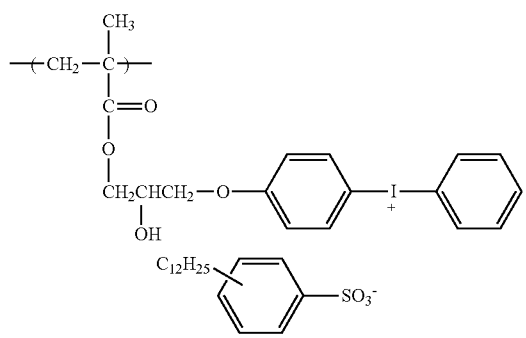
(a31)
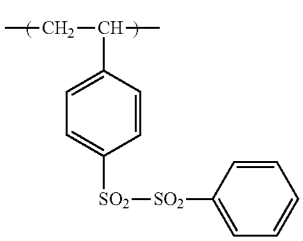
(a32)
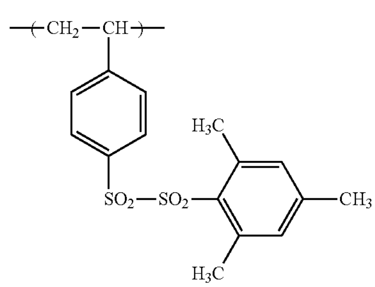

-continued
(a33)
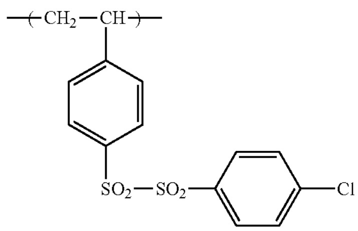
(a34)
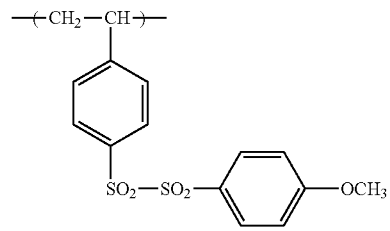
(a35)
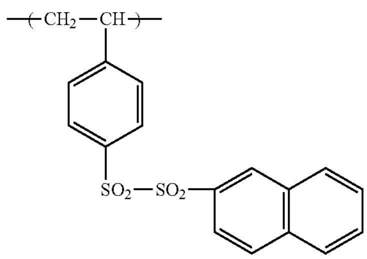
(a36)
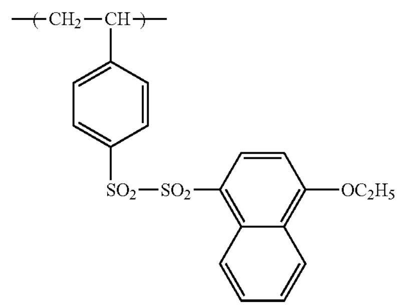
(a37)
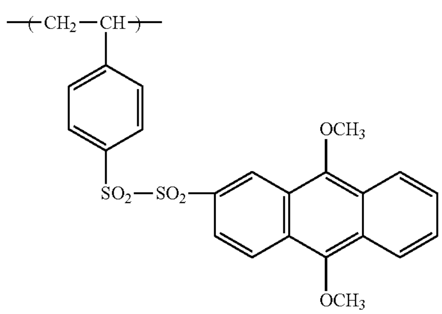
(a38)
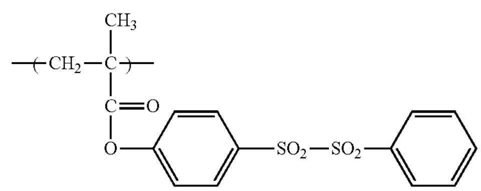
(a39)
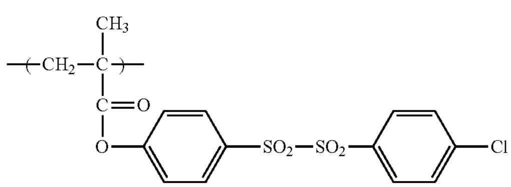
(a40)
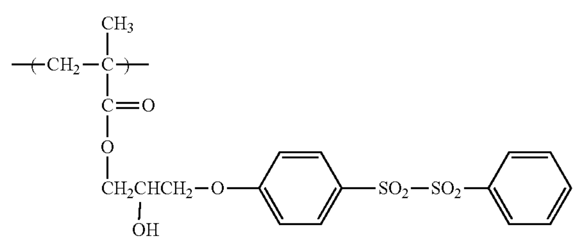
(a41)
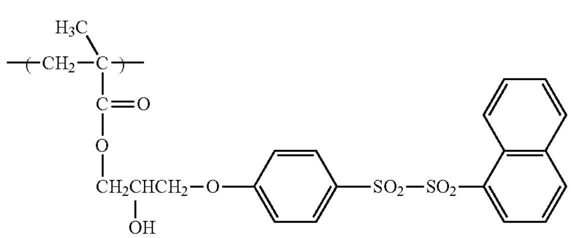
(a42)
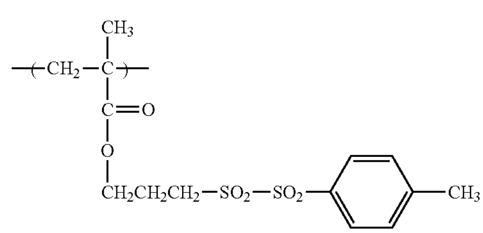
(a43)
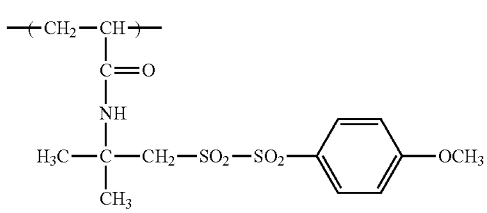
(a44)
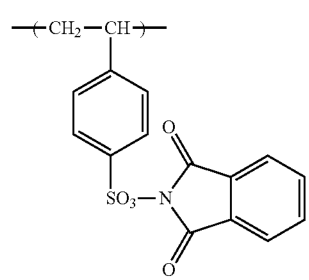

-continued
(a45)
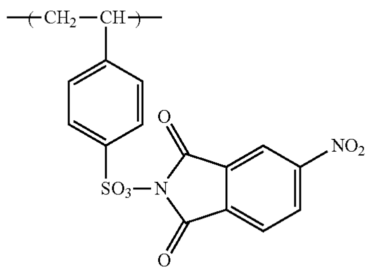
(a46)
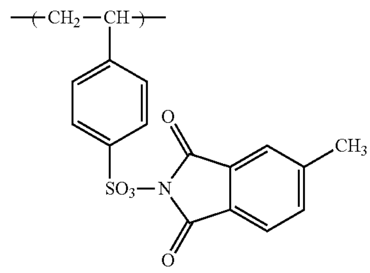
(a47)
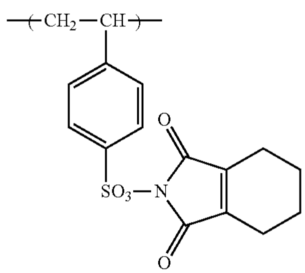
(a48)
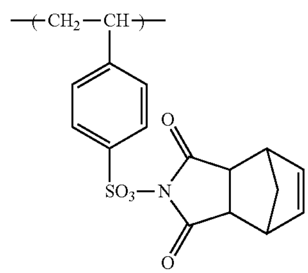
(a49)
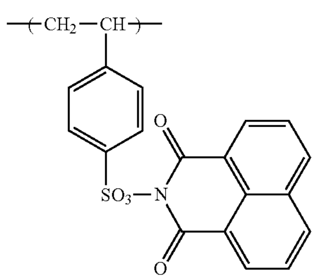
(a50)
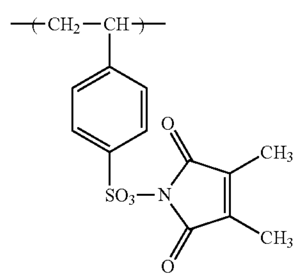
(a51)
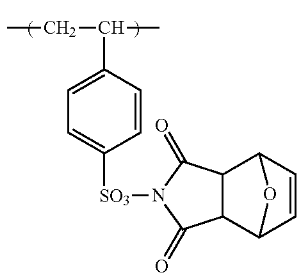
(a52)
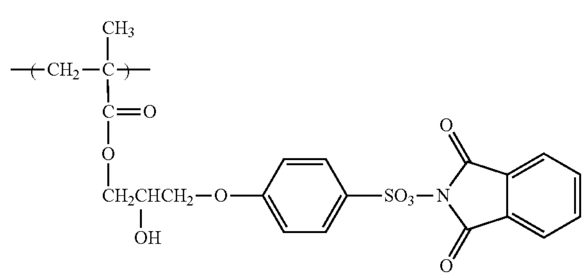
(a53)
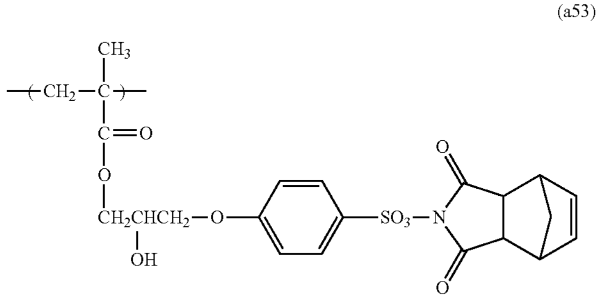
(a54)
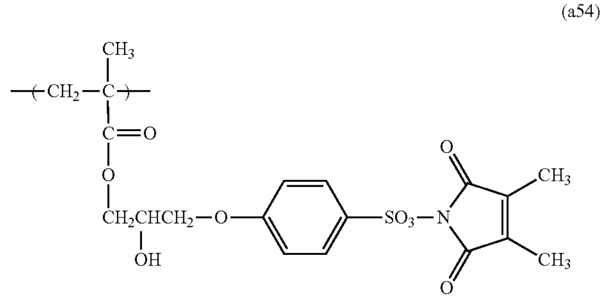

-continued
(a55)
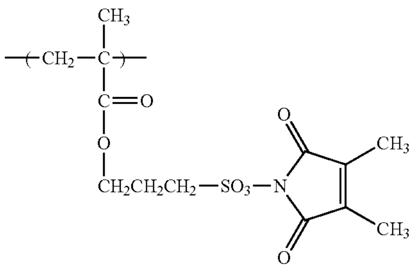
(a56)
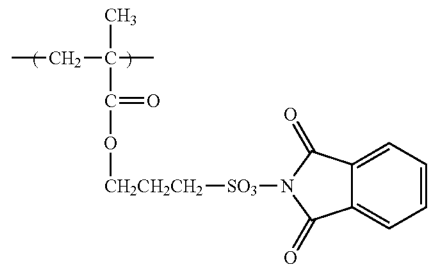
(a57)
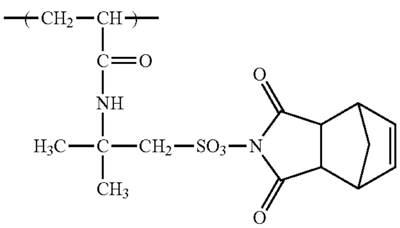
(a58)
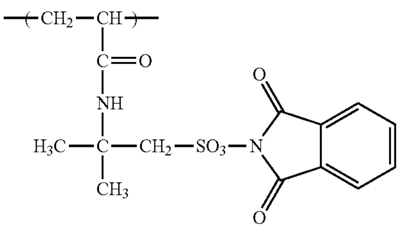
(a59)
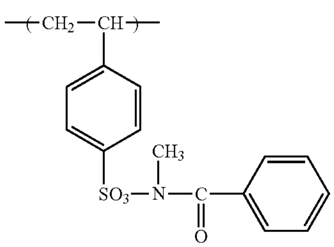
(a60)
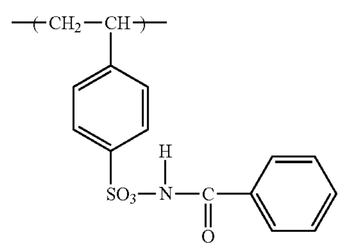
(a61)
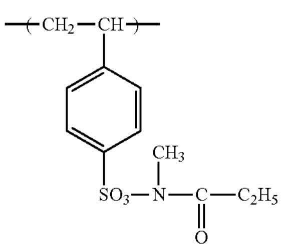
(a62)
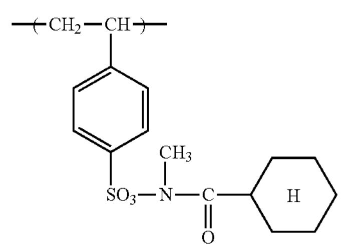
(a63)
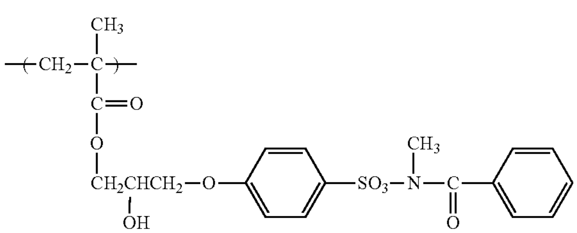
(a64)
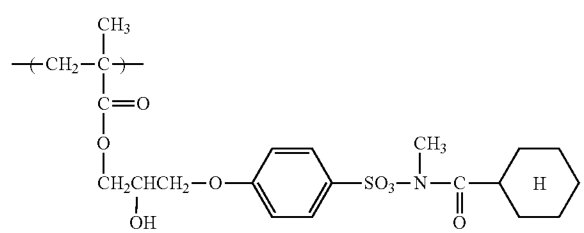
(a65)
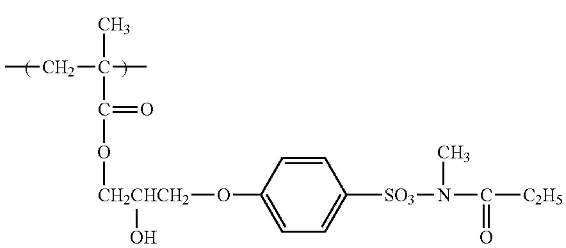
(a66)
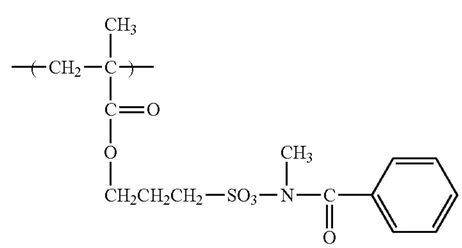

-continued
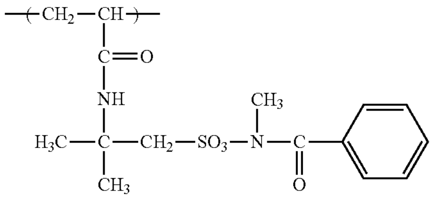
(a67)
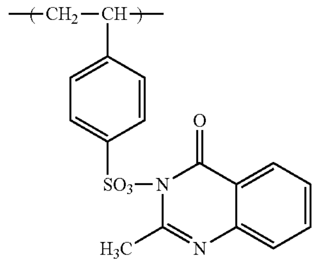
(a68)
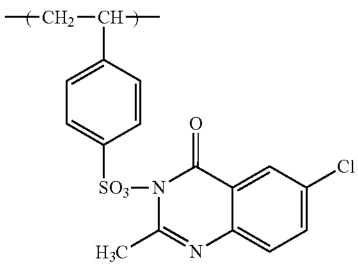
(a69)
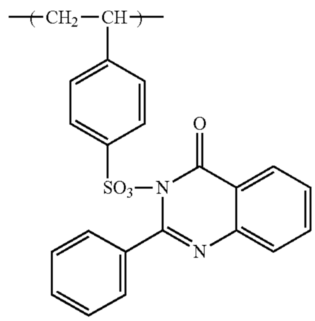
(a70)
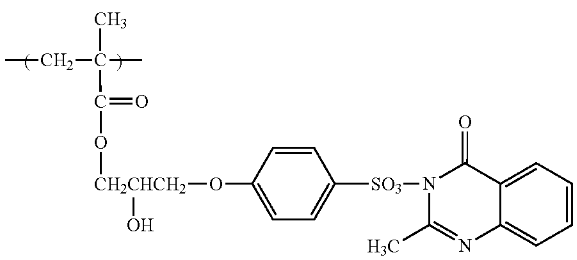
(a71)
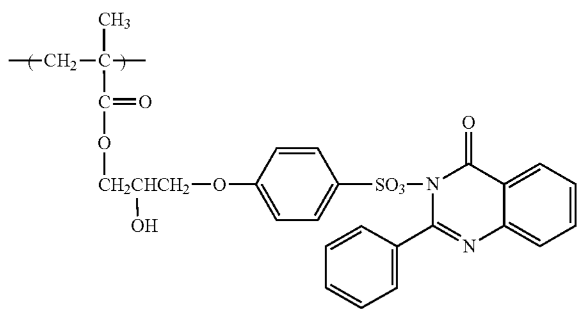
(a72)
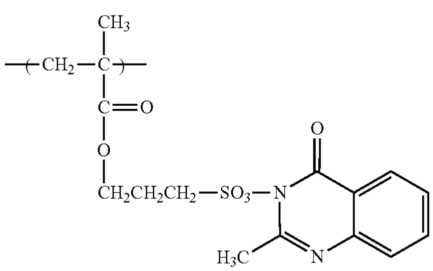
(a73)
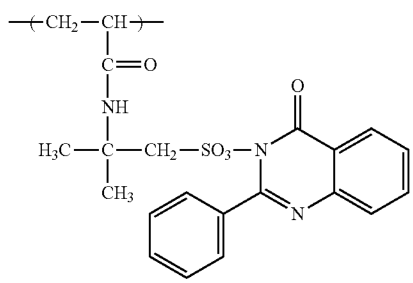
(a74)
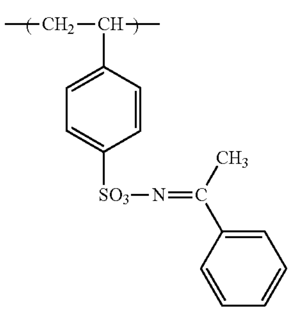
(a75)
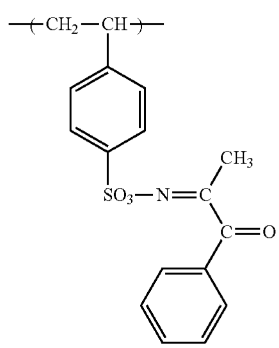
(a76)

-continued
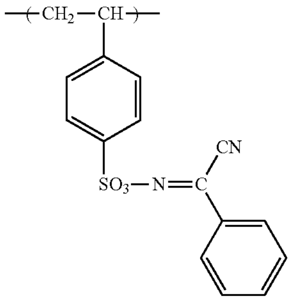
(a77)
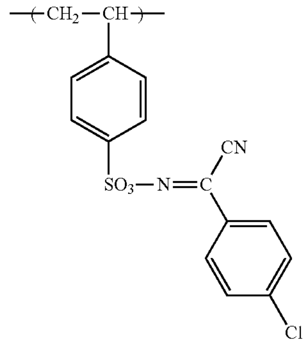
(a78)
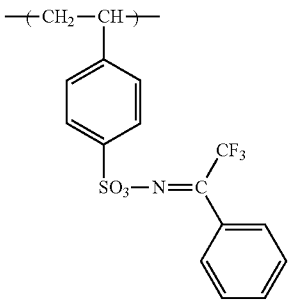
(a79)
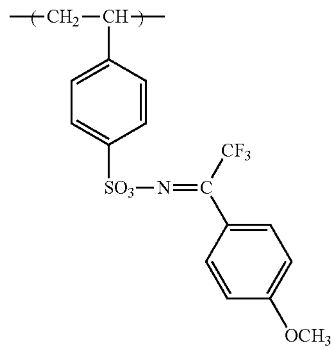
(a80)
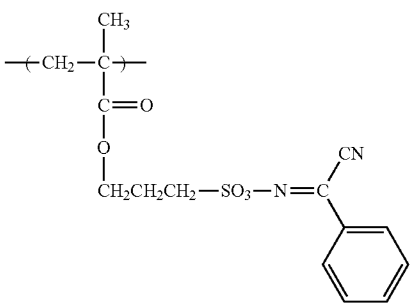
(a81)
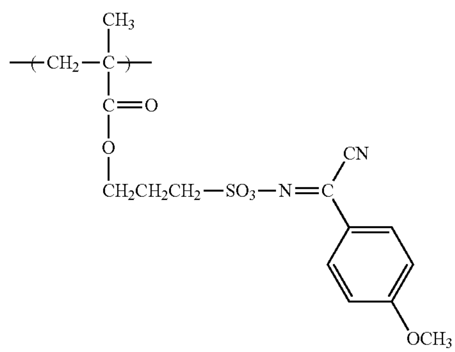
(a82)
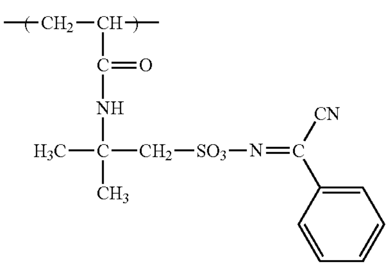
(a83)
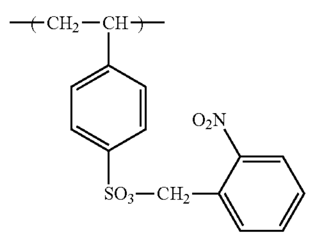
(a84)
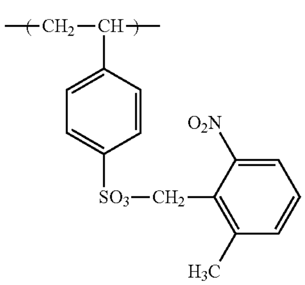
(a85)
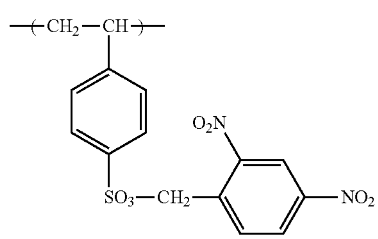
(a86)

-continued
(a87)
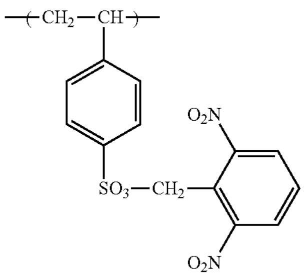
(a88)
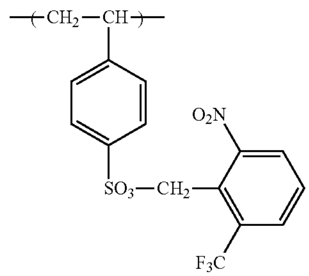
(a89)
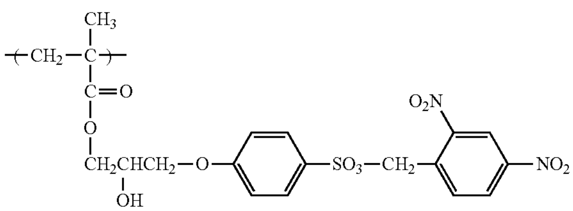
(a90)
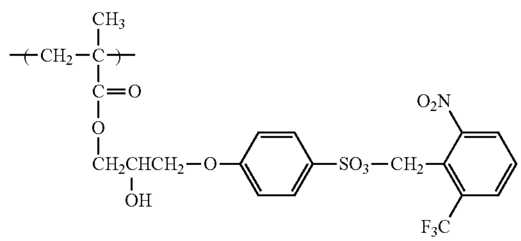
(a91)
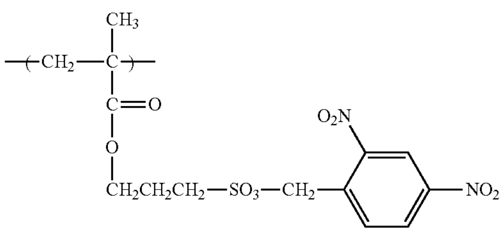
(a92)
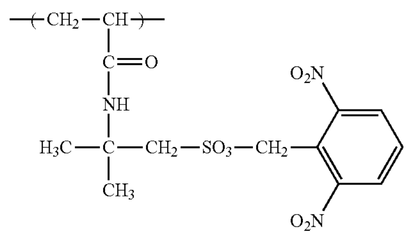
(a93)
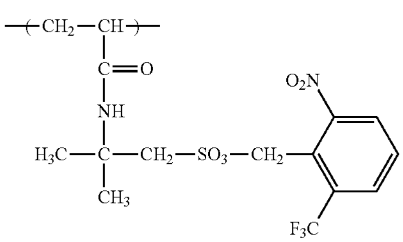
(a94)
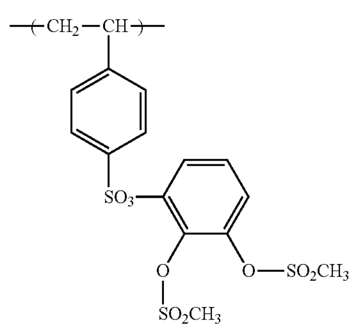
(a95)
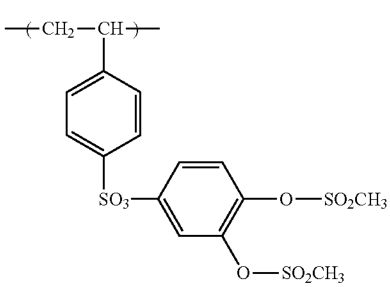
(a96)
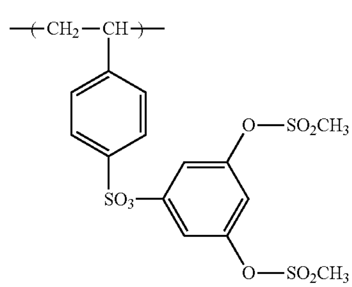

-continued
(a97)
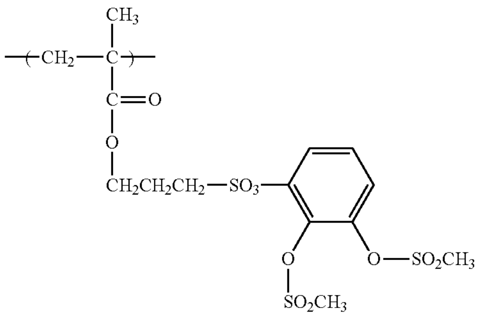
(a98)
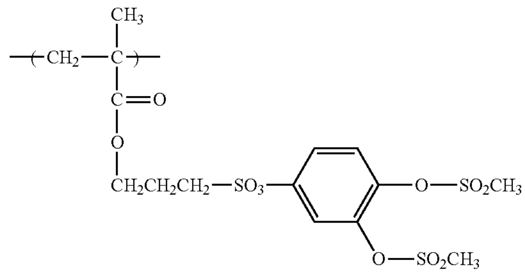
(a99)
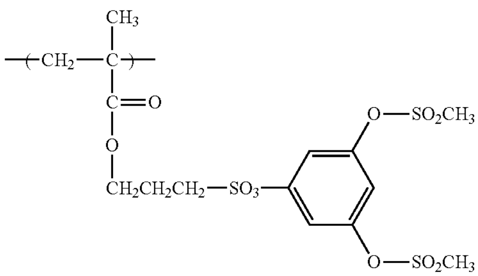
(a100)
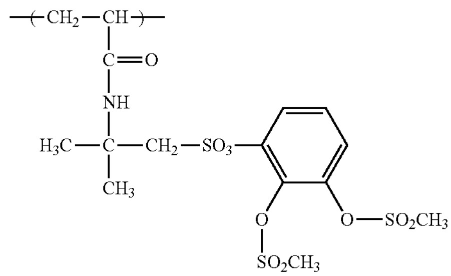
(a101)
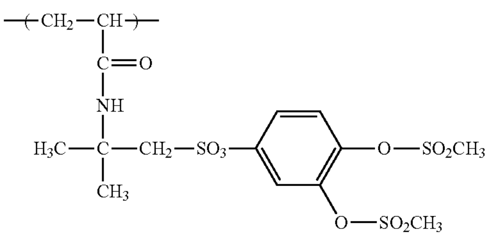
(a102)
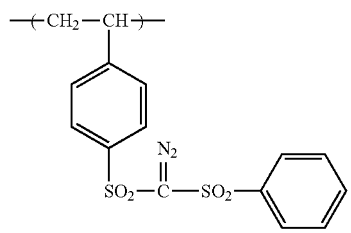
(a103)
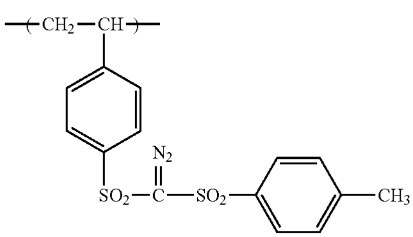
(a104)
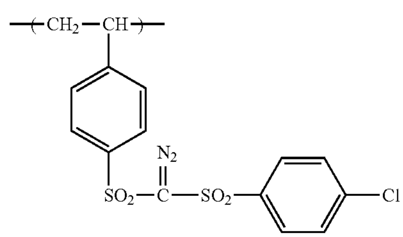
(a105)
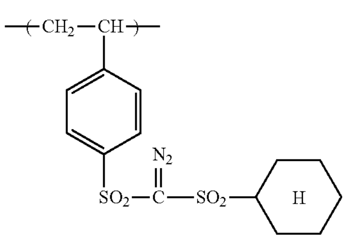
(a106)
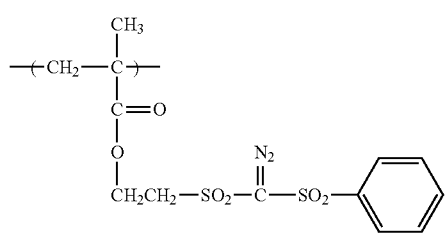
(a107)
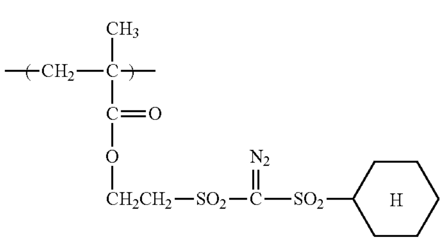
(a108)
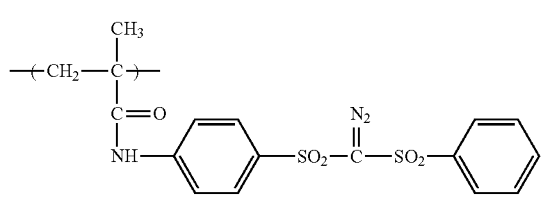

-continued
(a109)
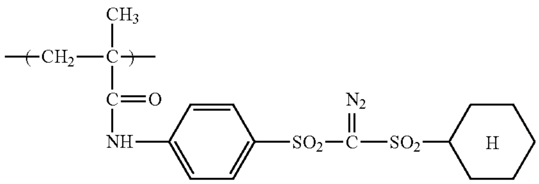
(a110)
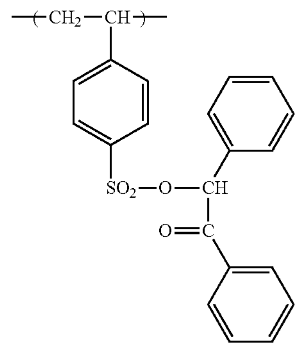
(a111)
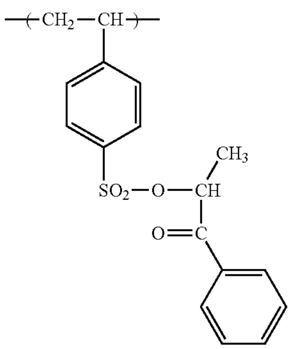
(a112)
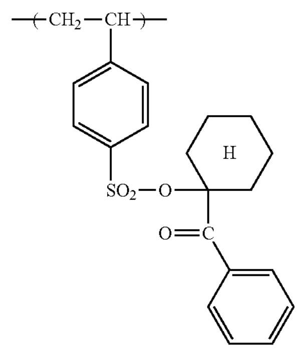
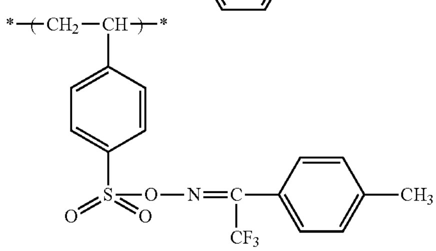
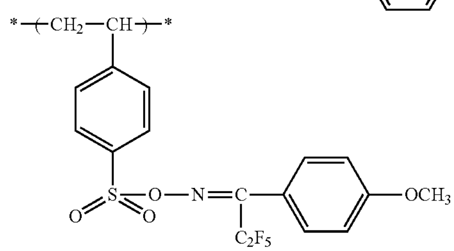
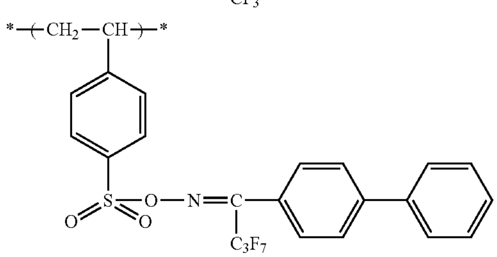
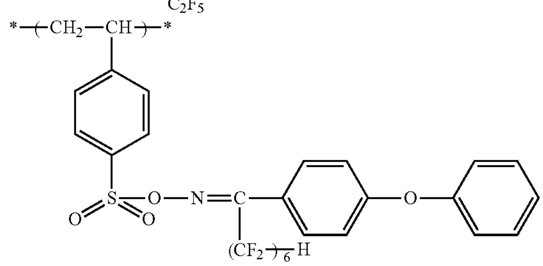
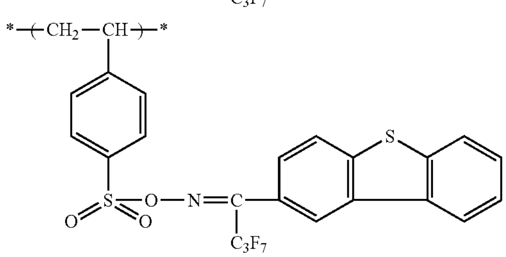
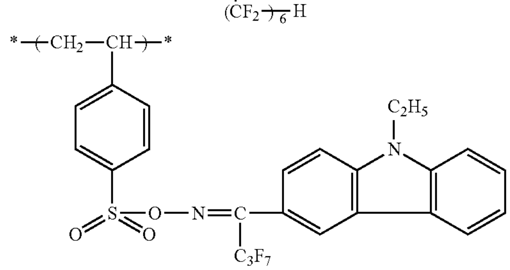
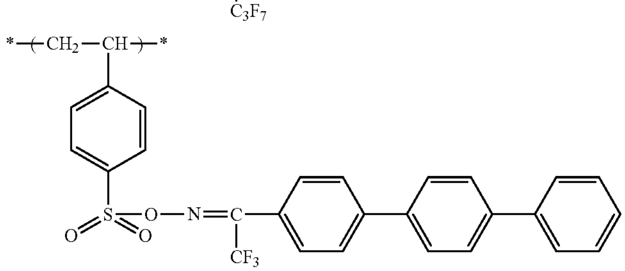
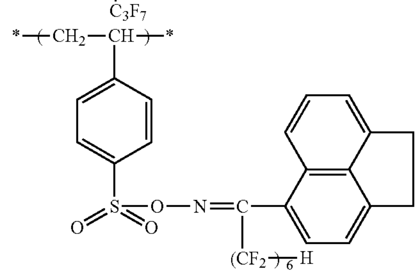

-continued
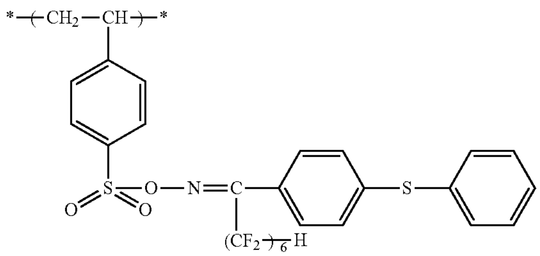
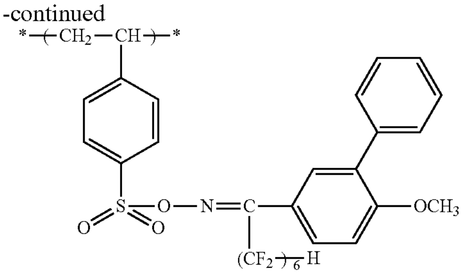
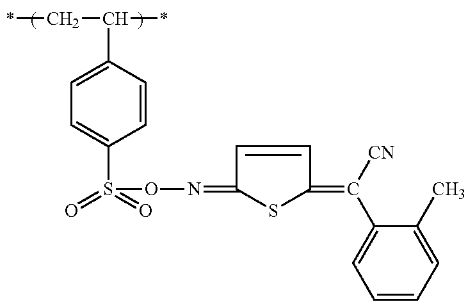
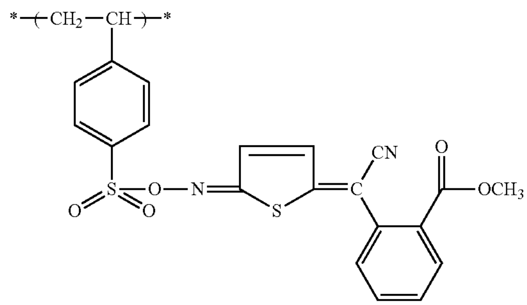
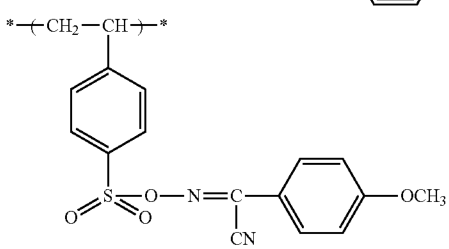
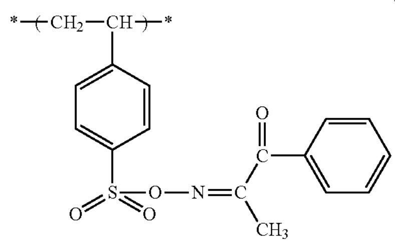
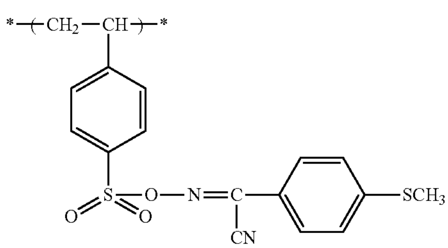
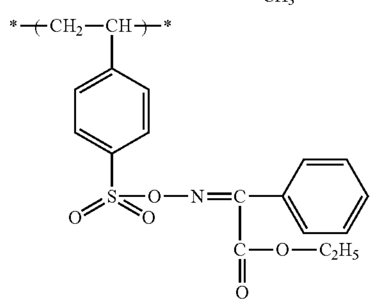
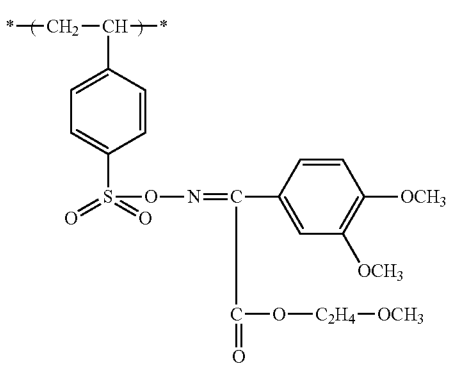
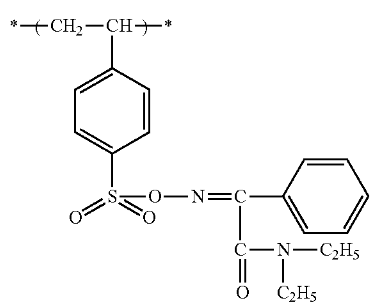
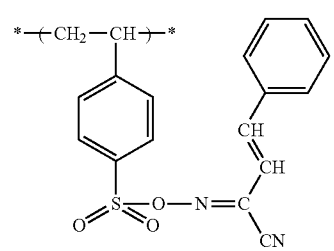
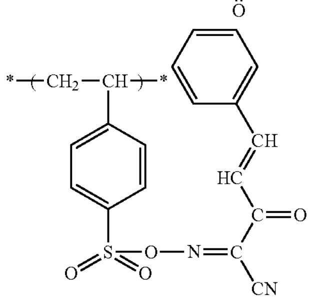
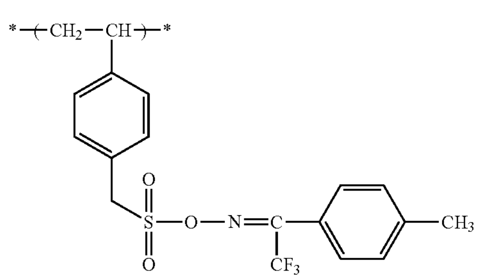

-continued
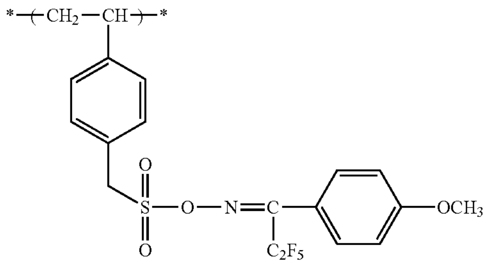
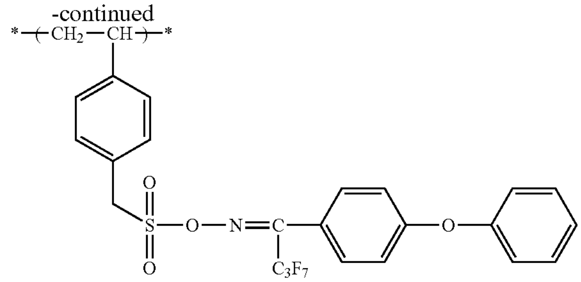
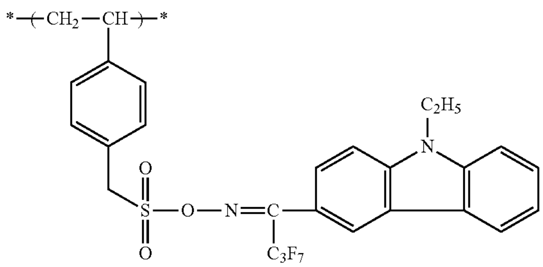
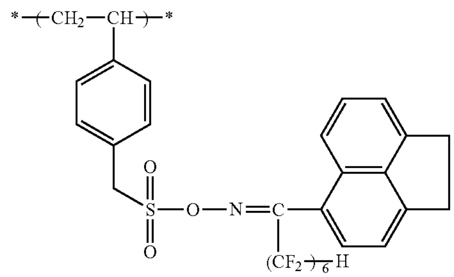
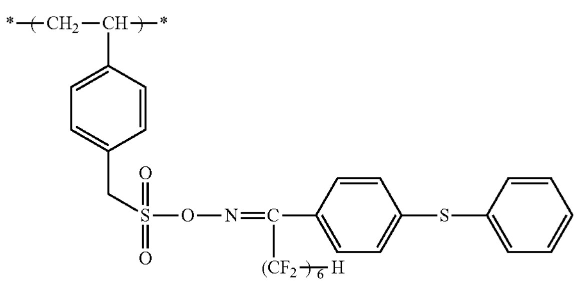
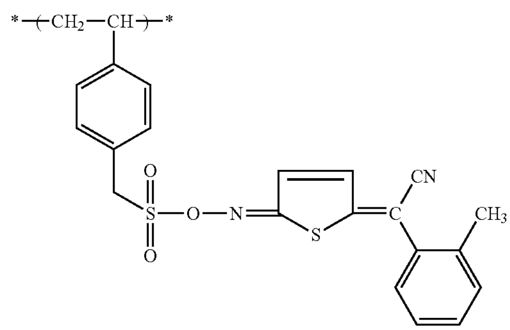
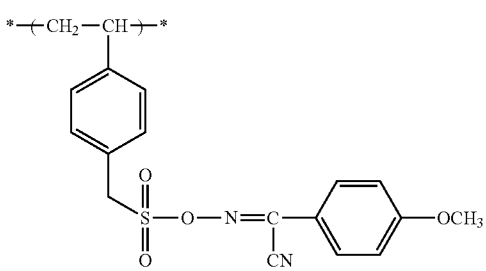
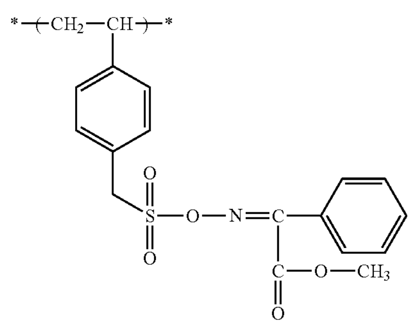
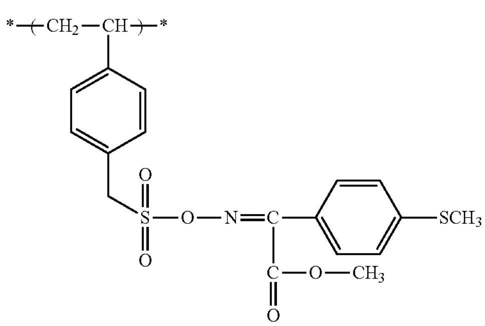
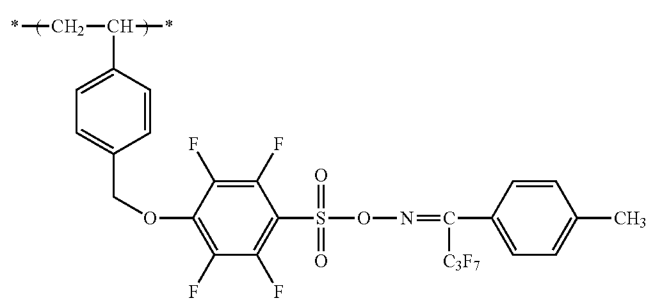

-continued
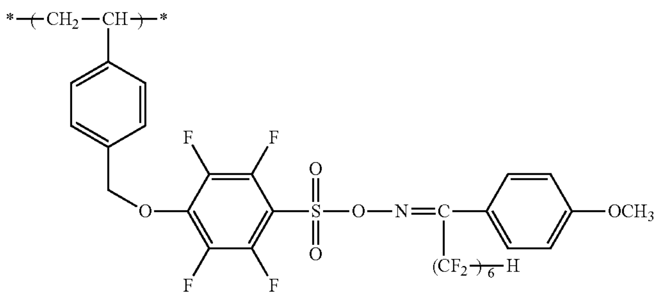
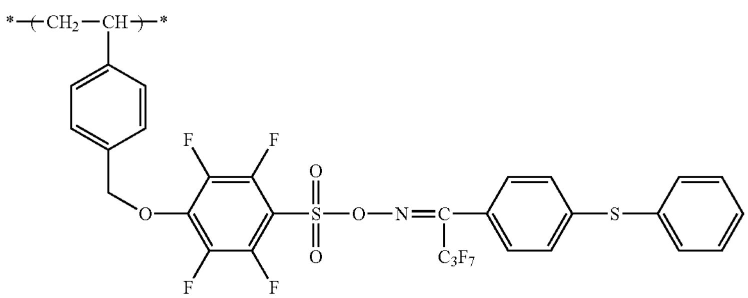
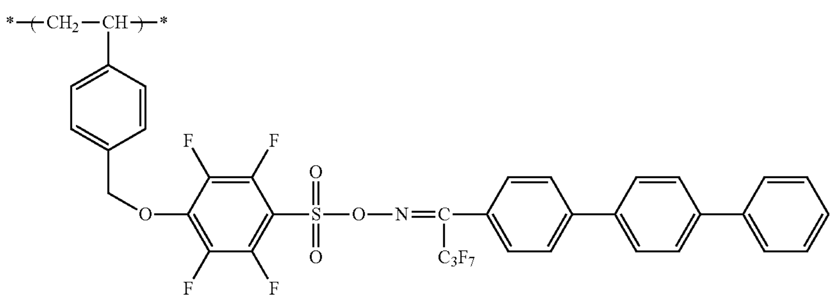
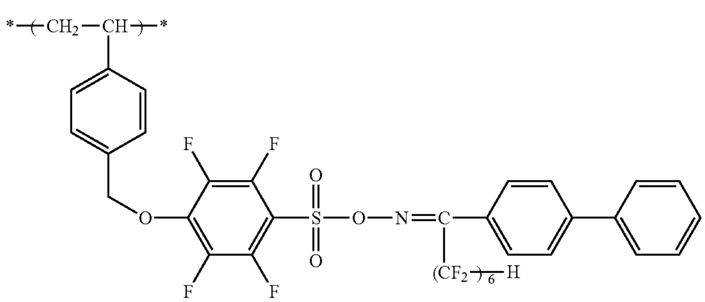
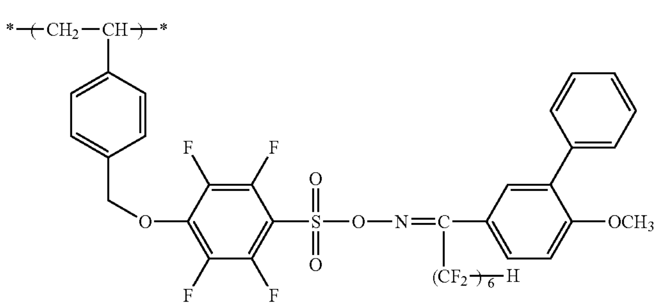

-continued
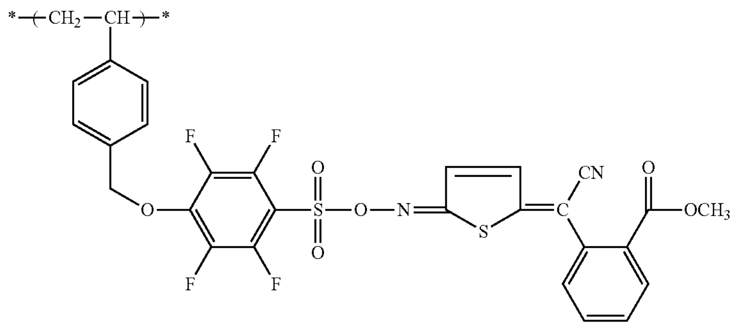
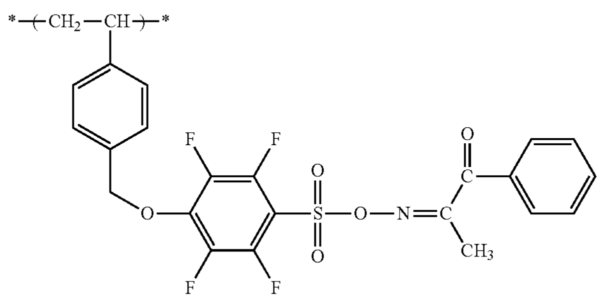
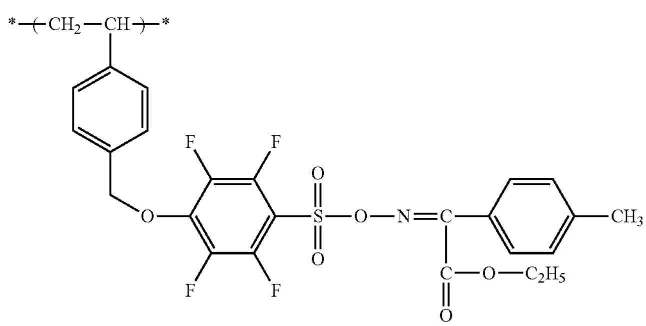
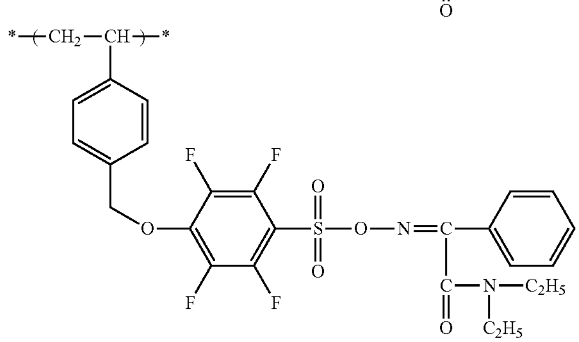
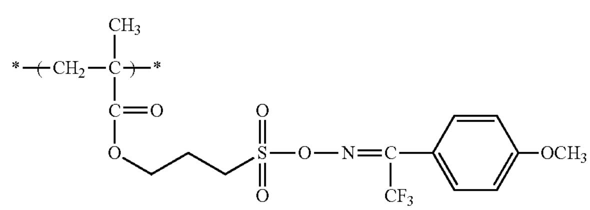
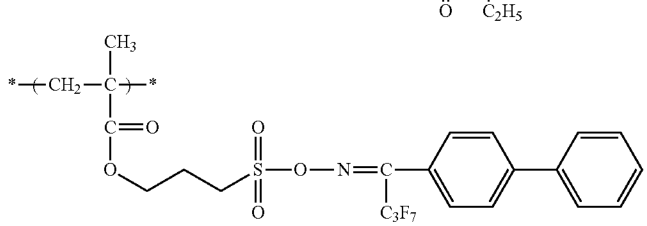
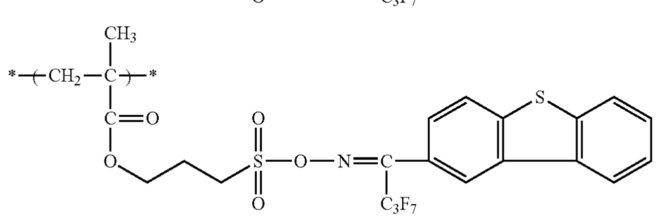

-continued
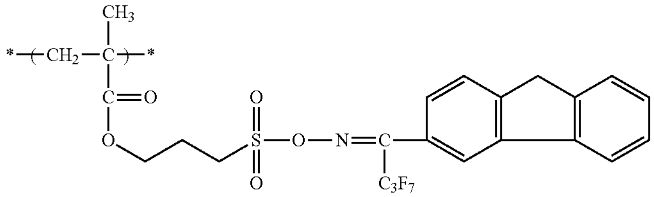
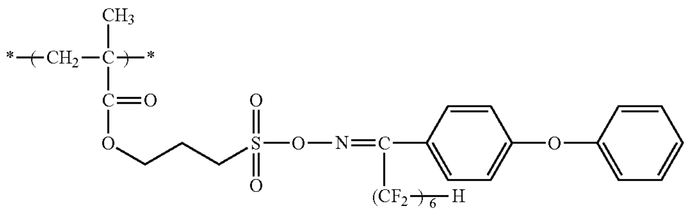
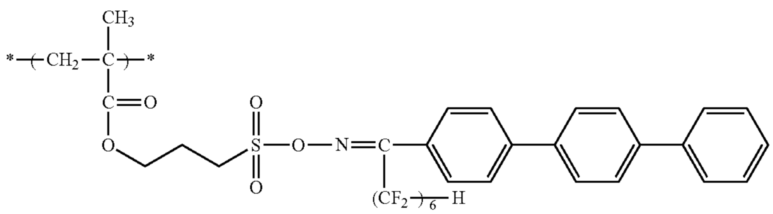
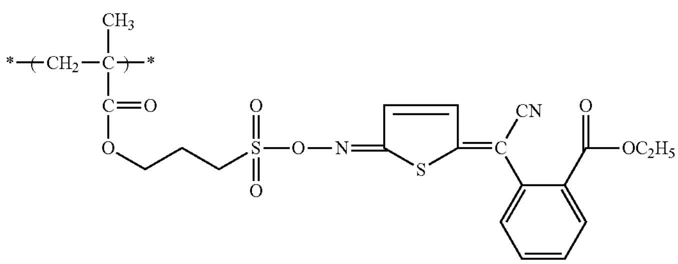
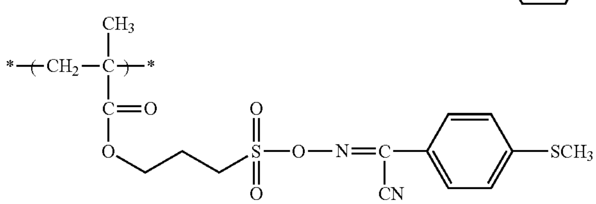
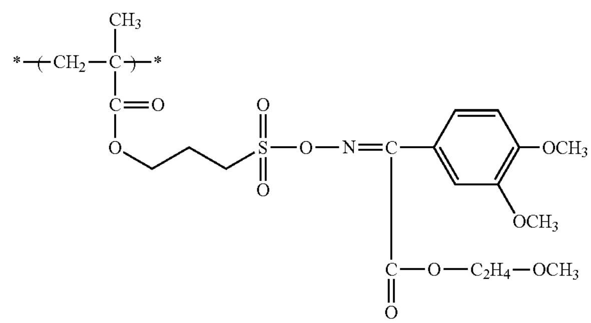
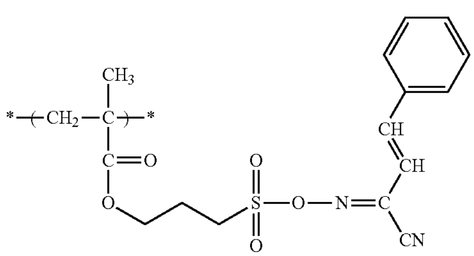
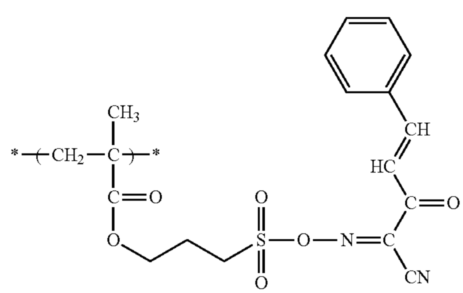
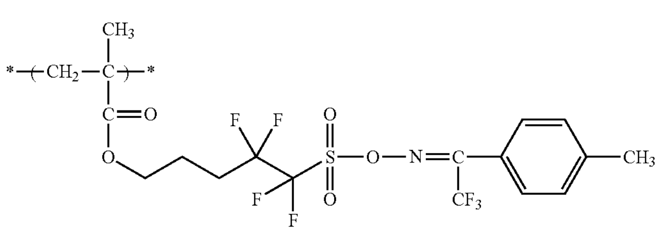

-continued
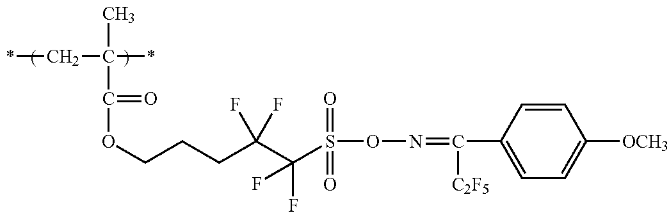
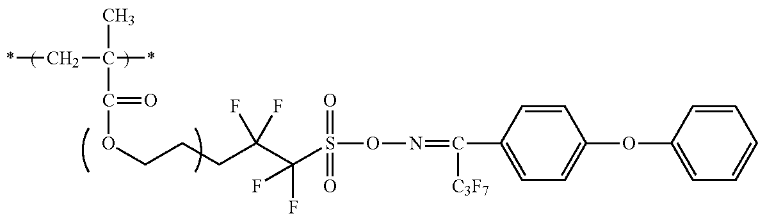
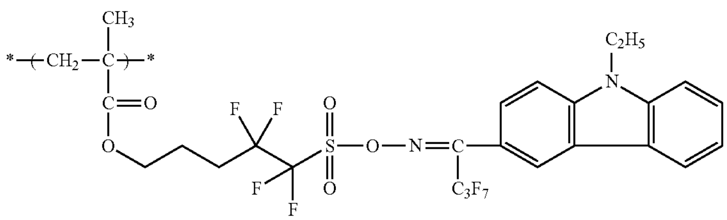
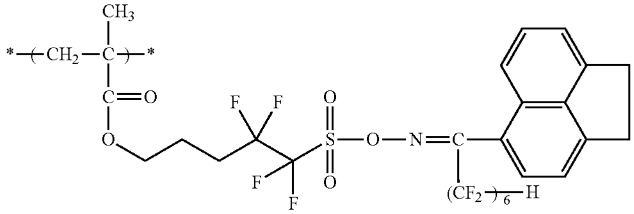
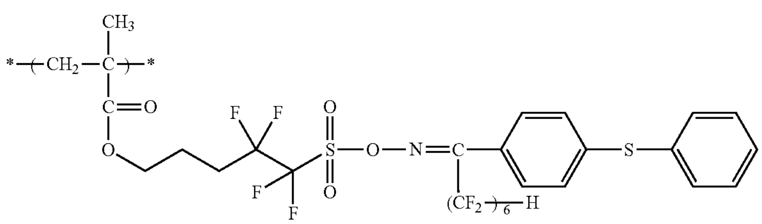
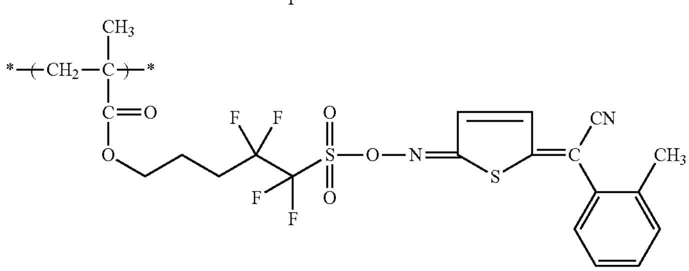
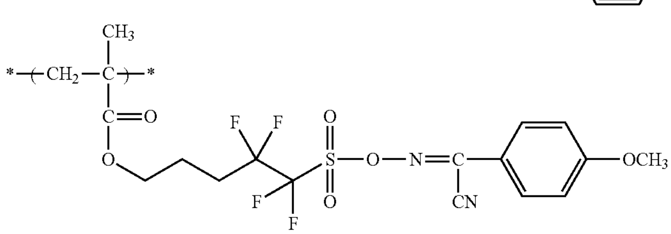

-continued
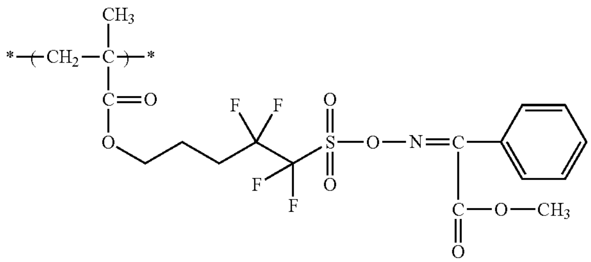
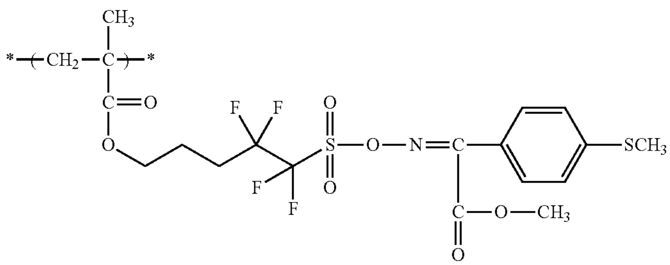
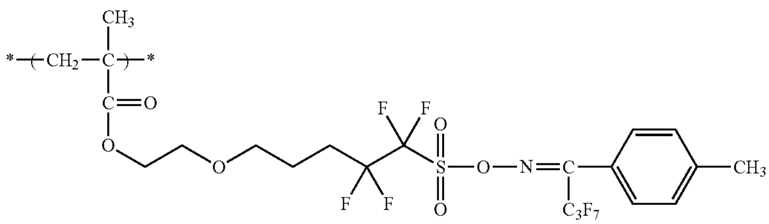
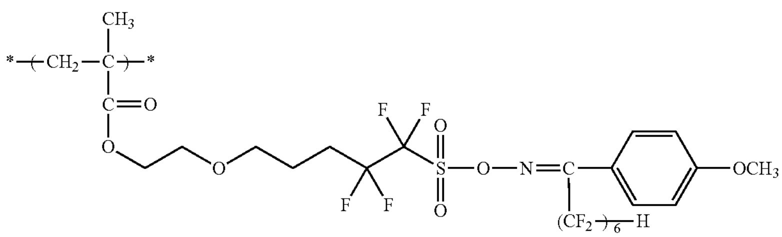
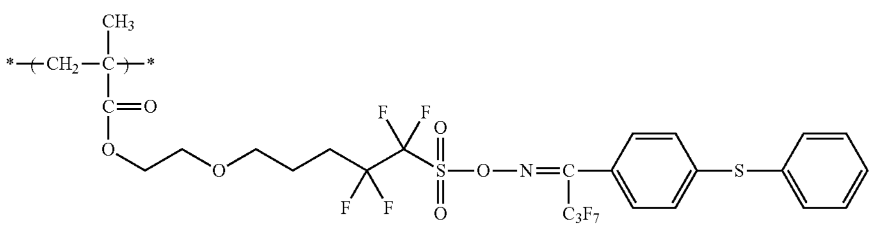
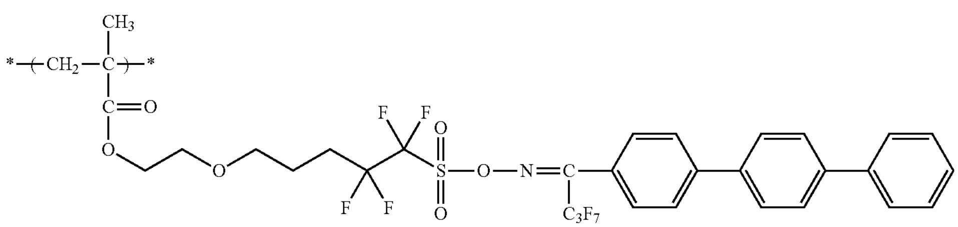
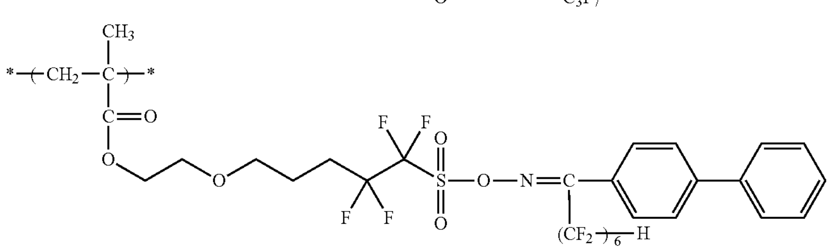

-continued
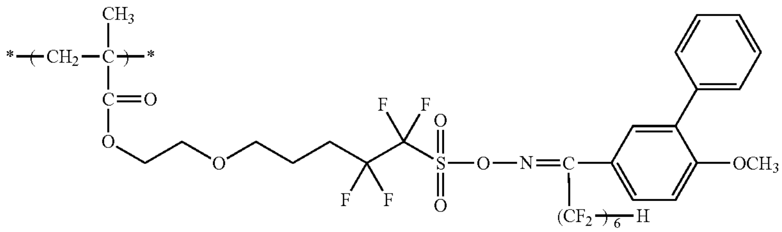
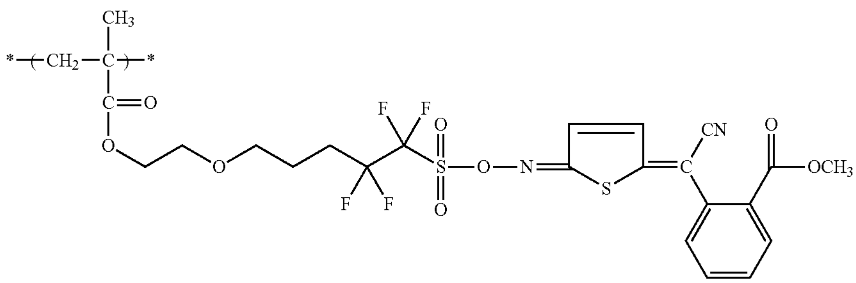
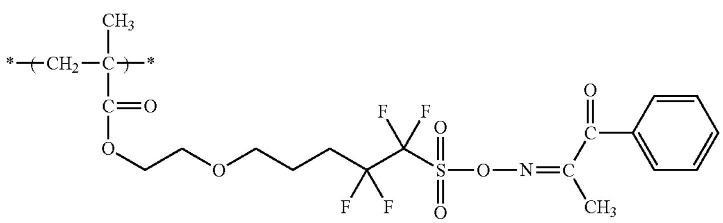
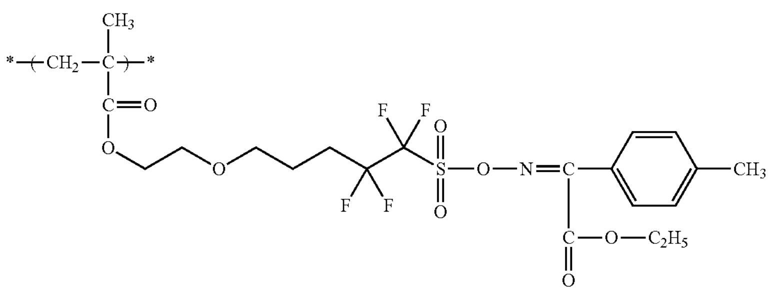
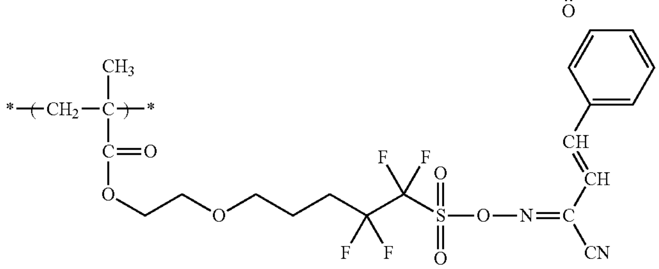
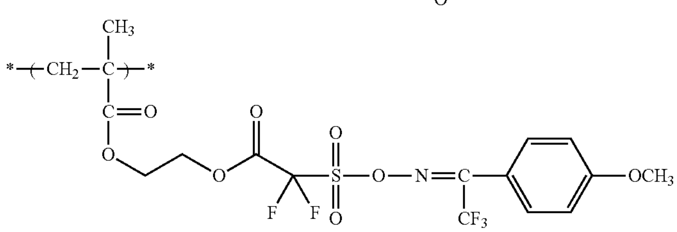
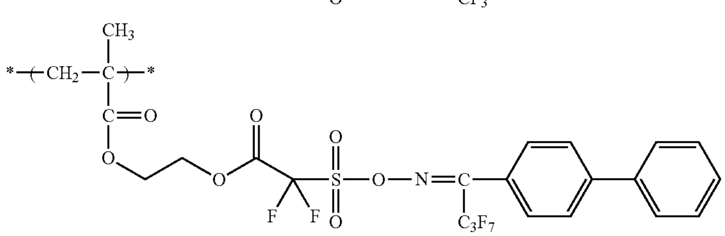

-continued
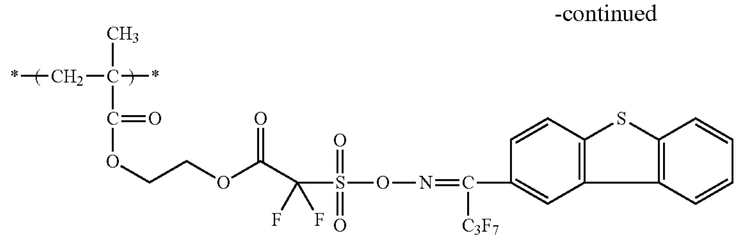
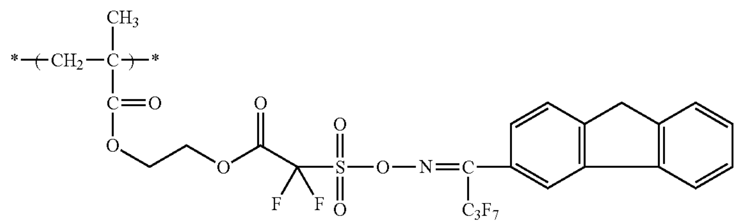
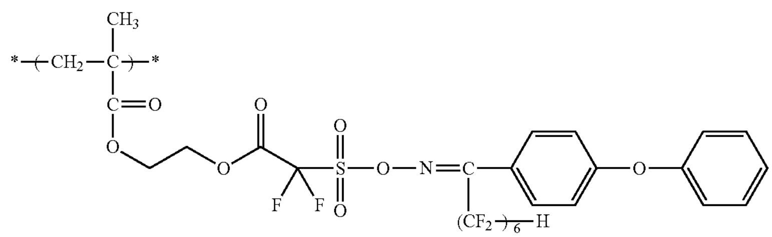
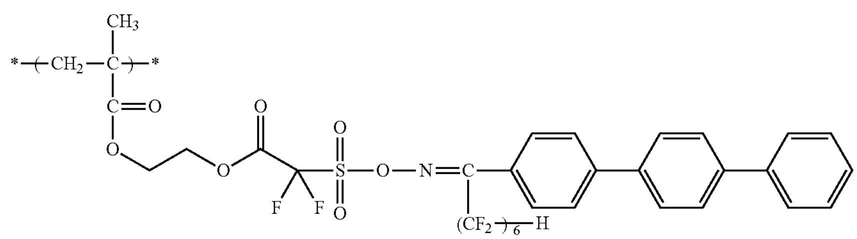
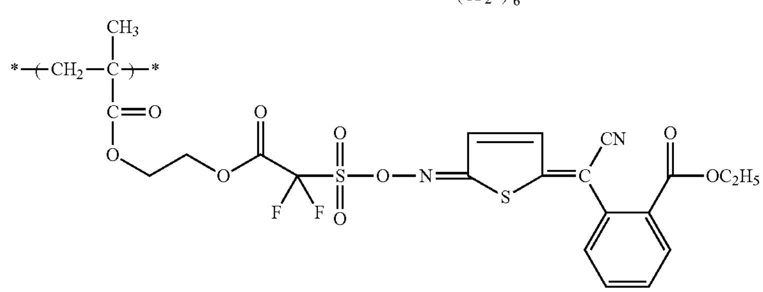
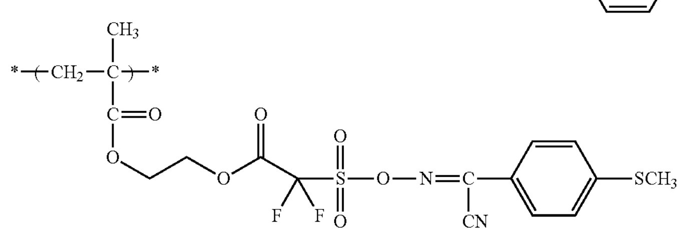
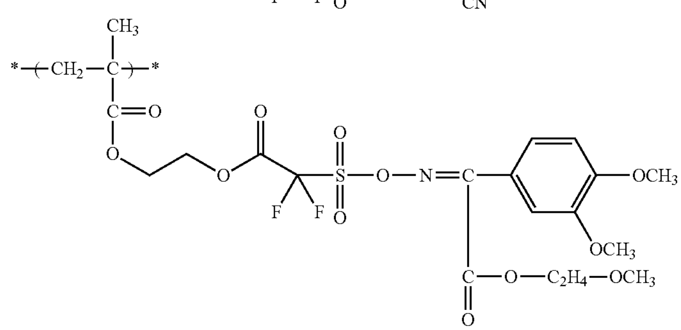

-continued
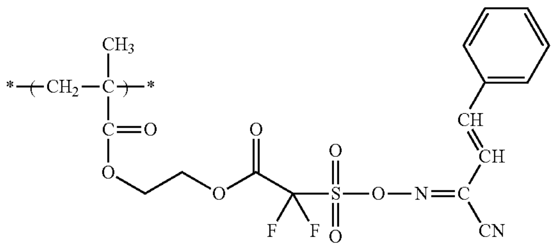
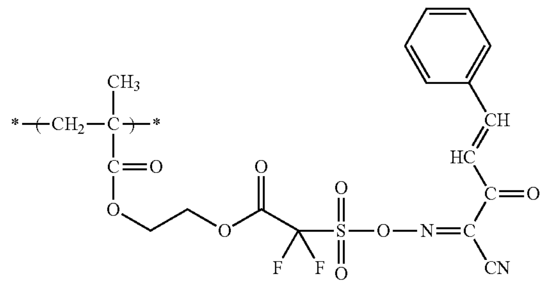
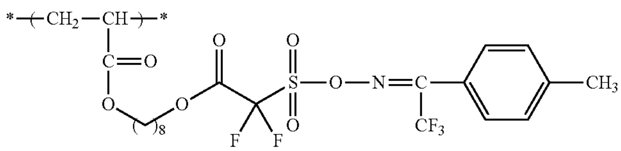
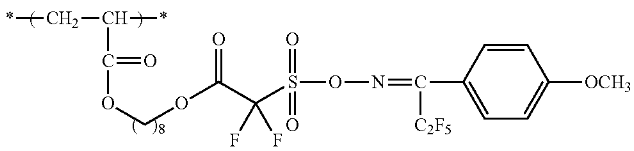
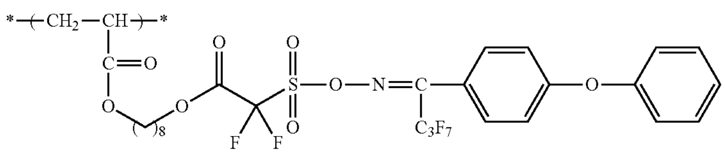
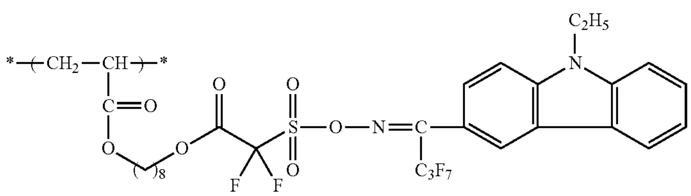
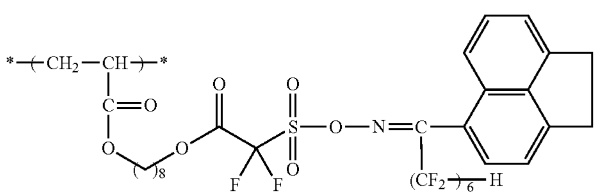
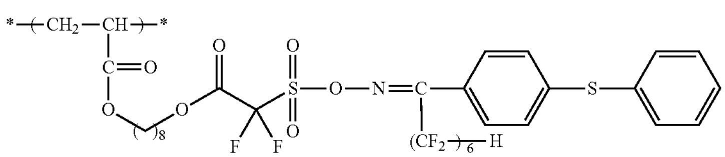
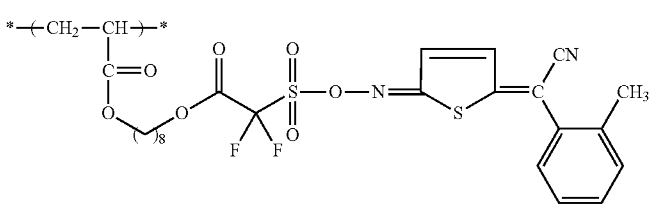
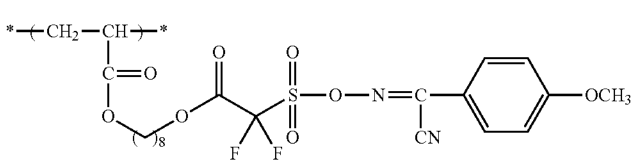
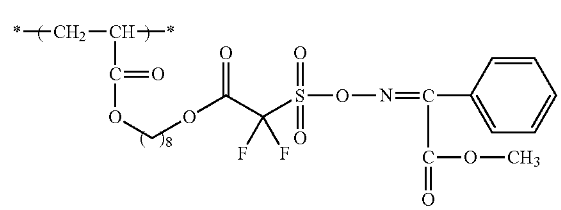

-continued
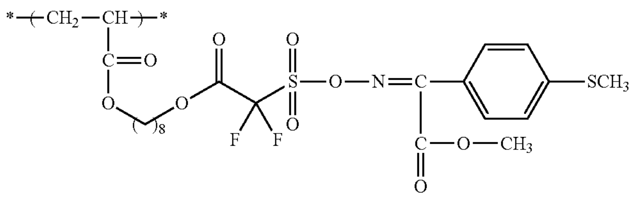
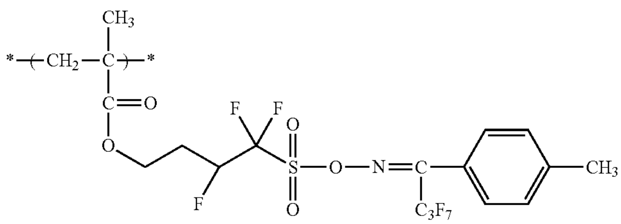
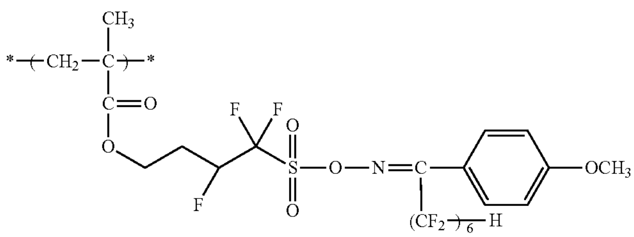
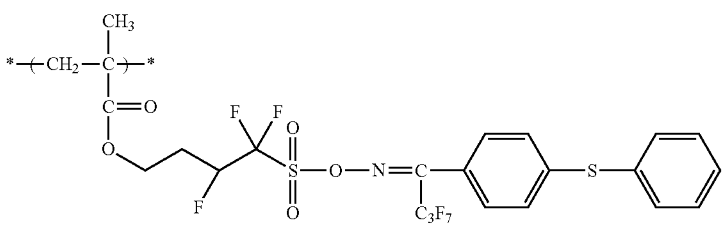
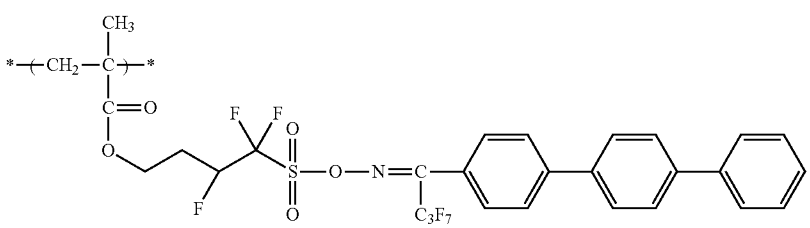
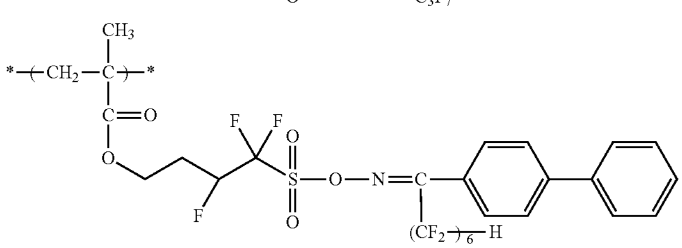
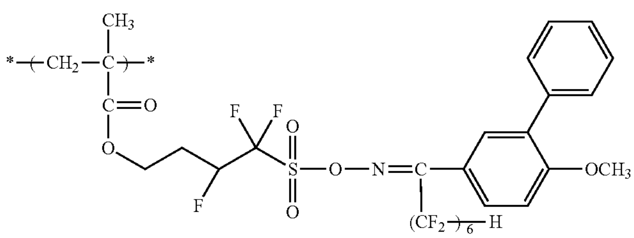

-continued
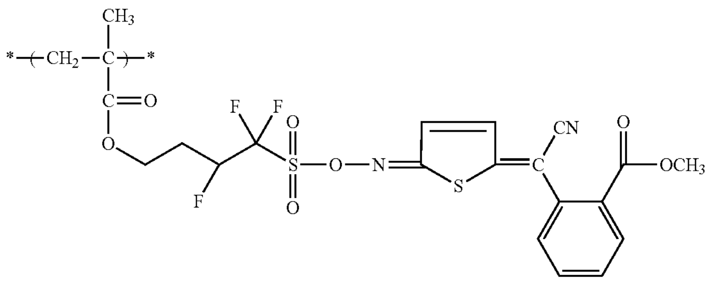
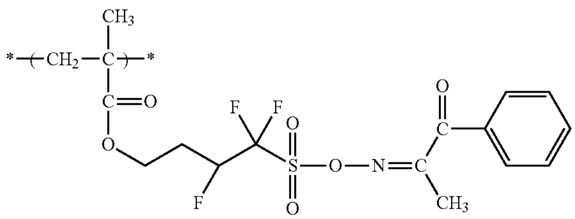
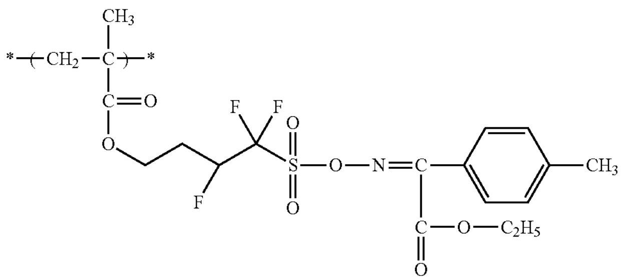
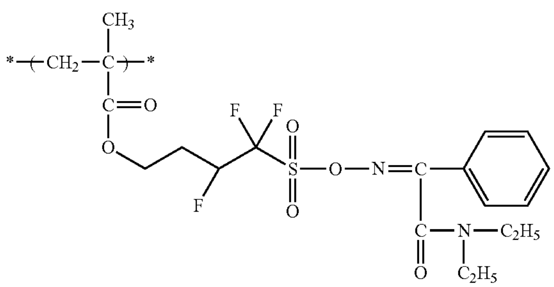
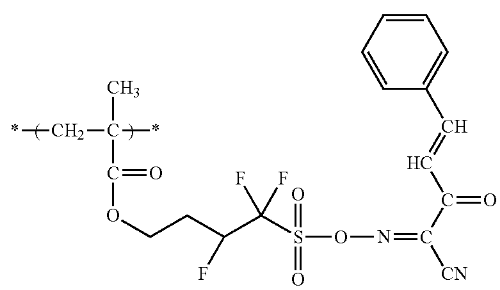
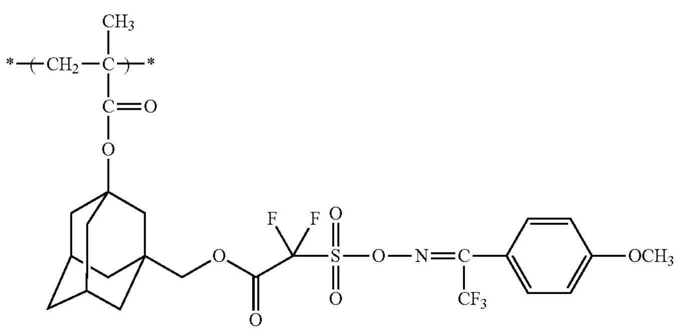
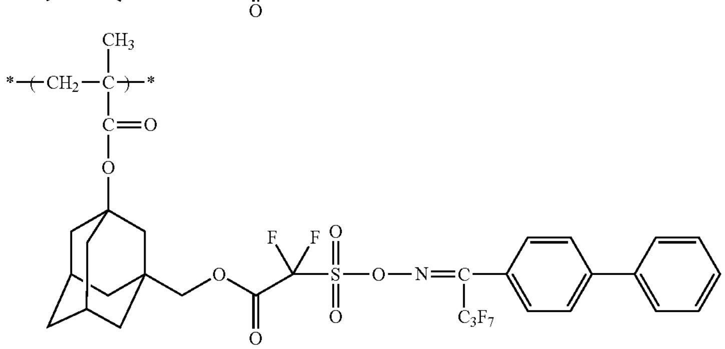

-continued
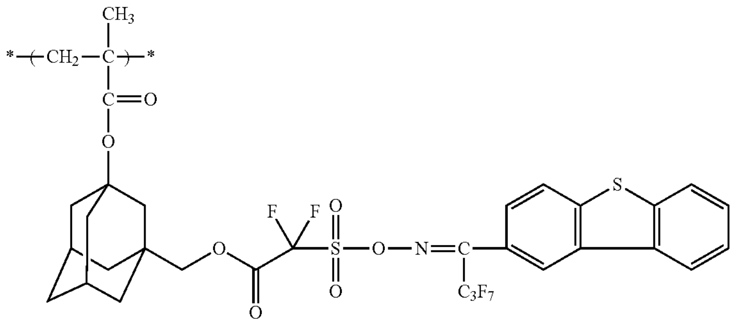
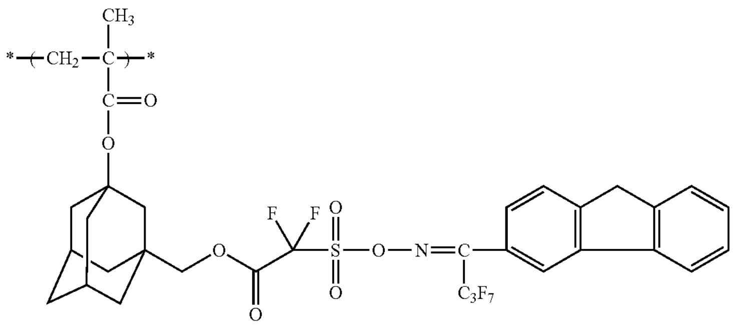
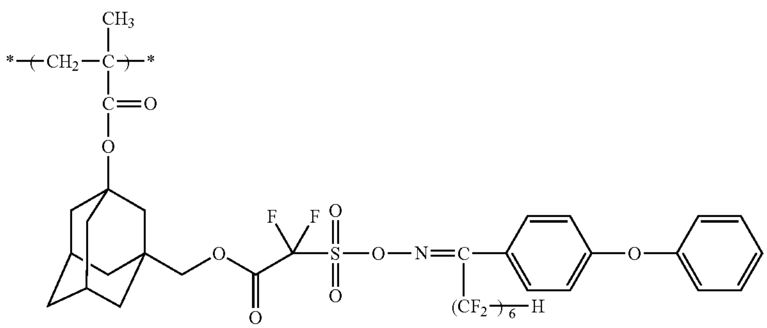
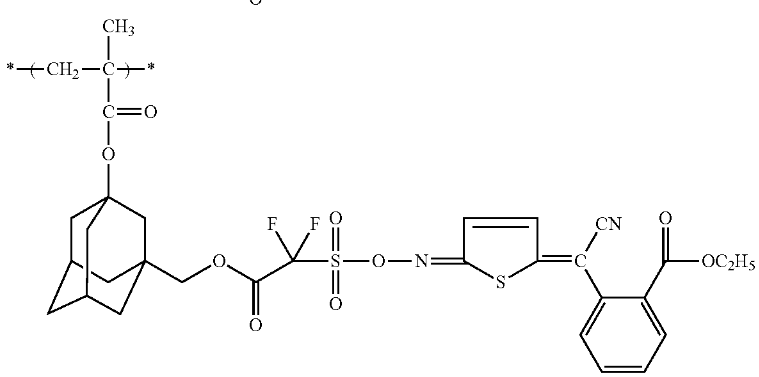
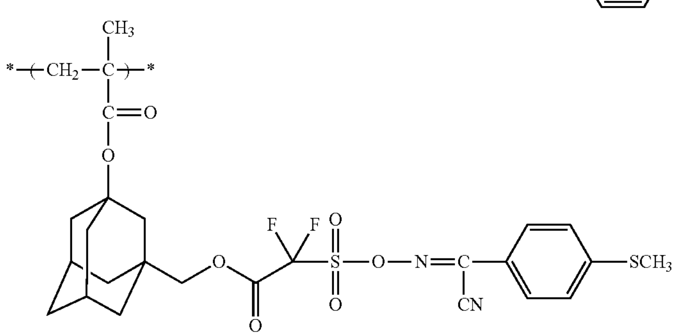

-continued
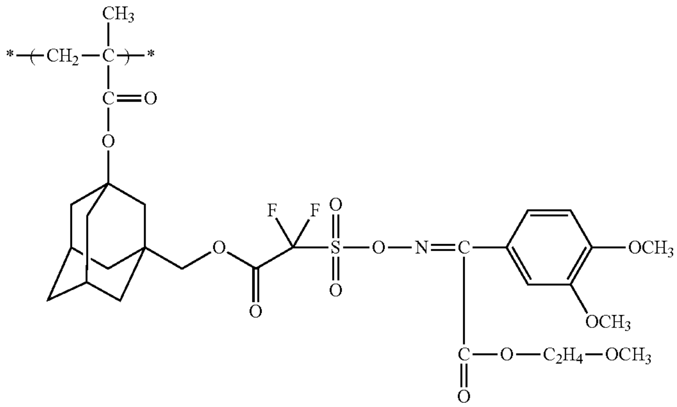
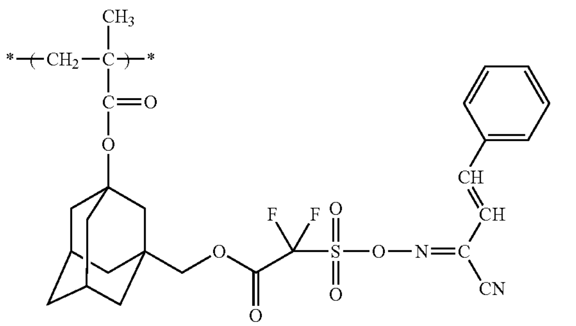
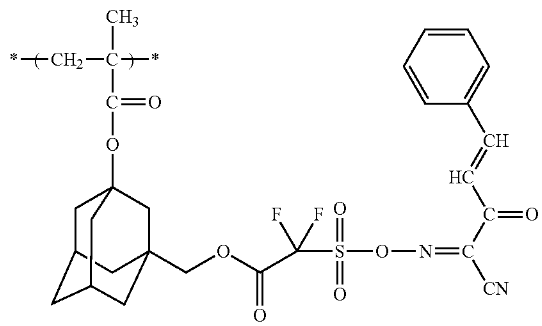
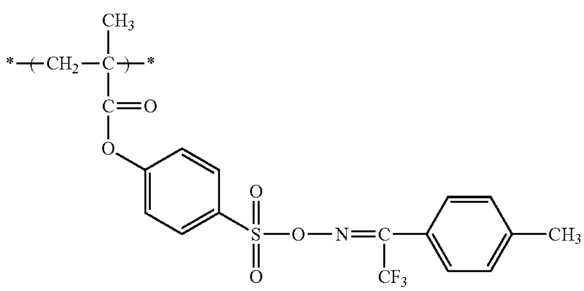
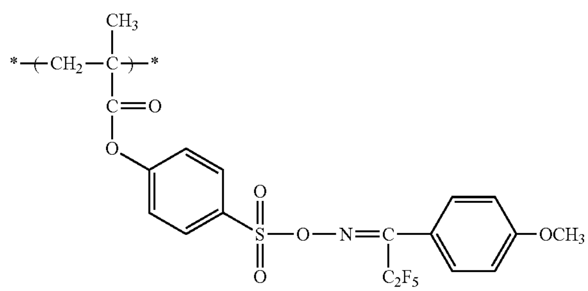
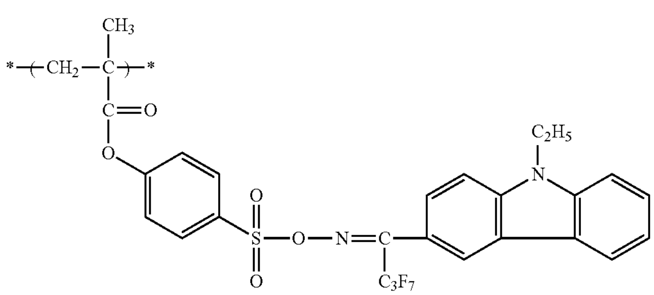
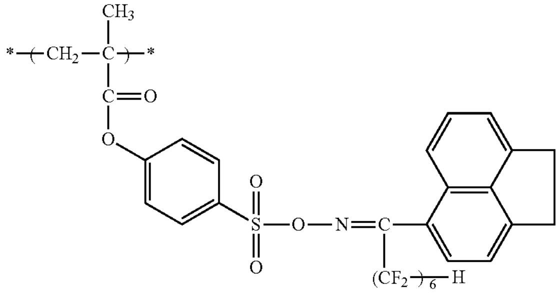

-continued
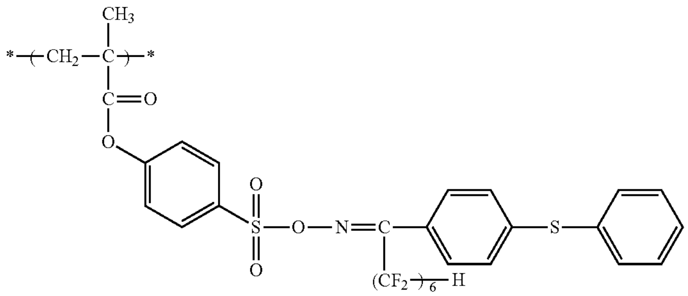
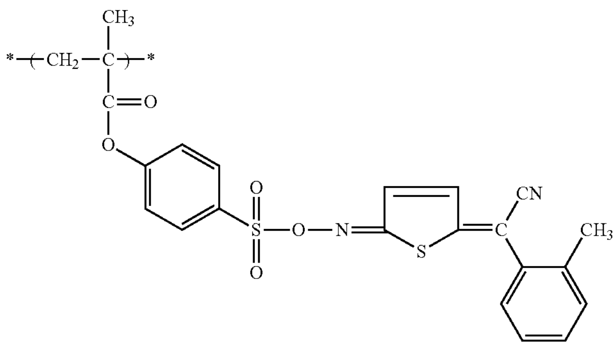
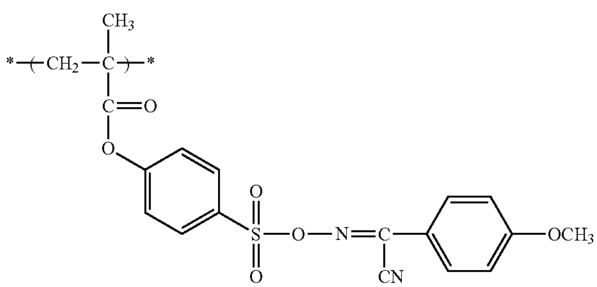
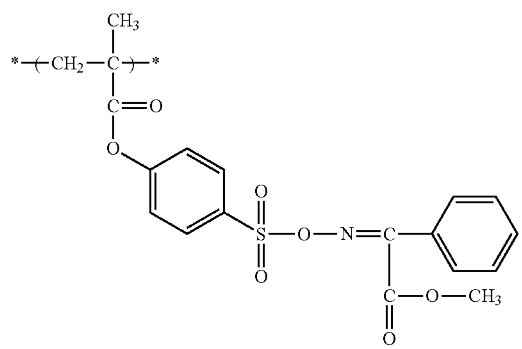
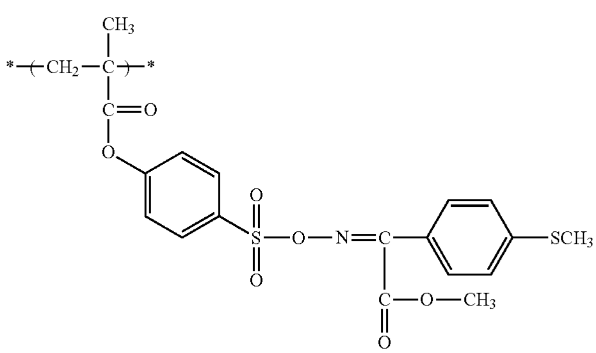
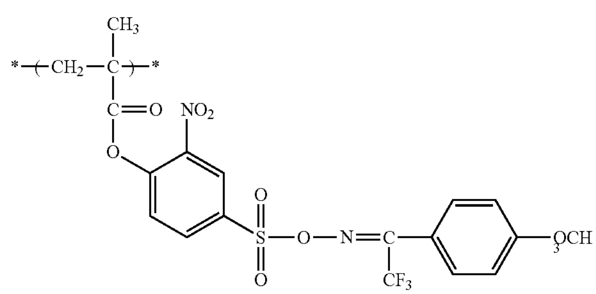
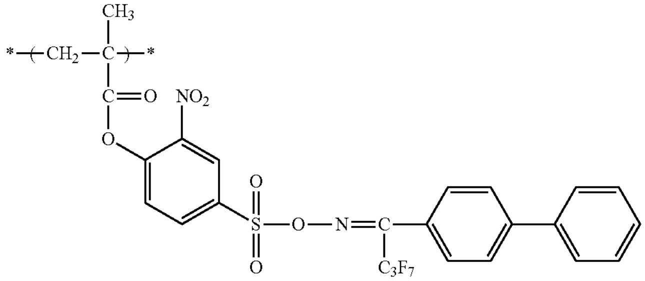

-continued
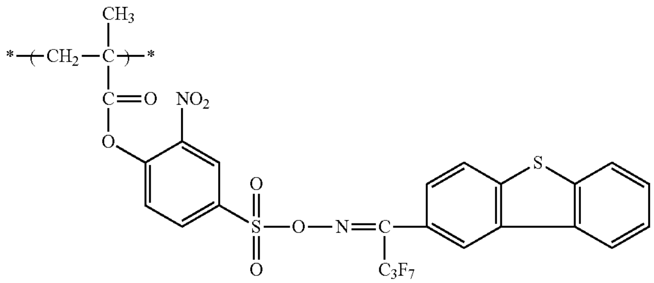
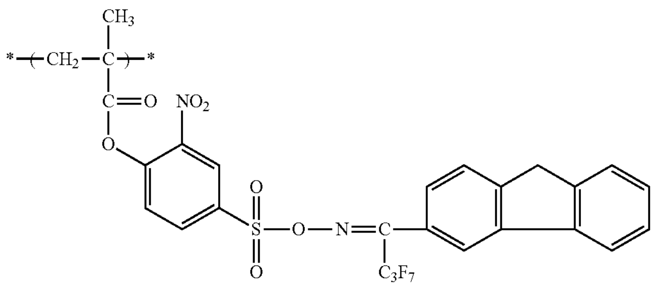
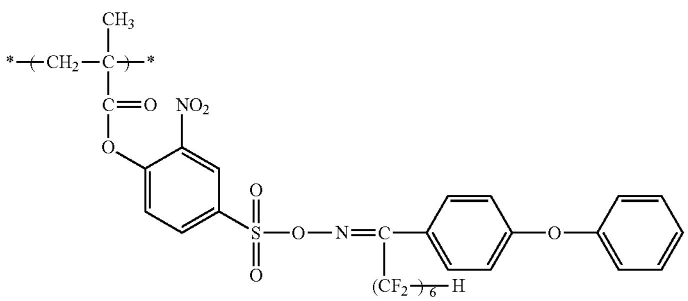
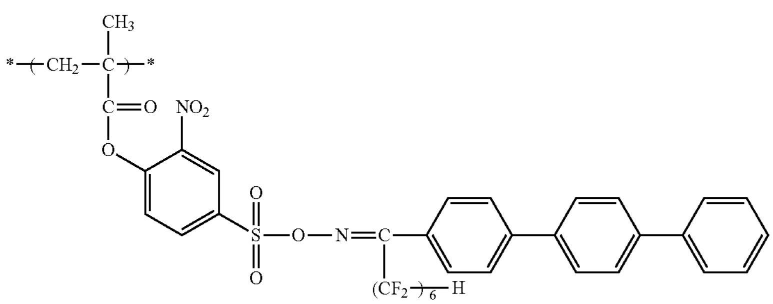
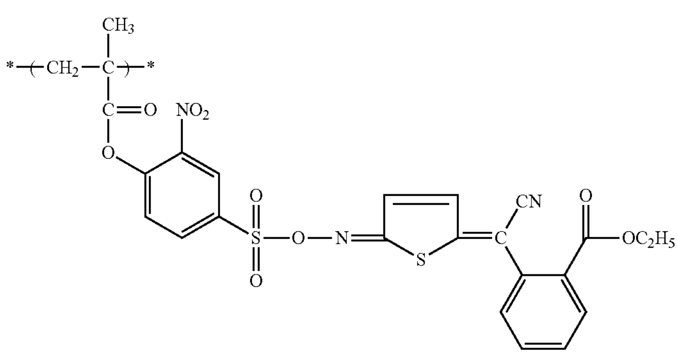

-continued
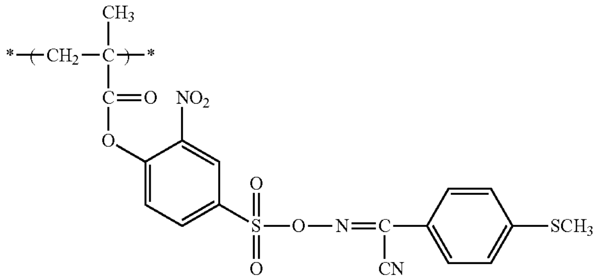
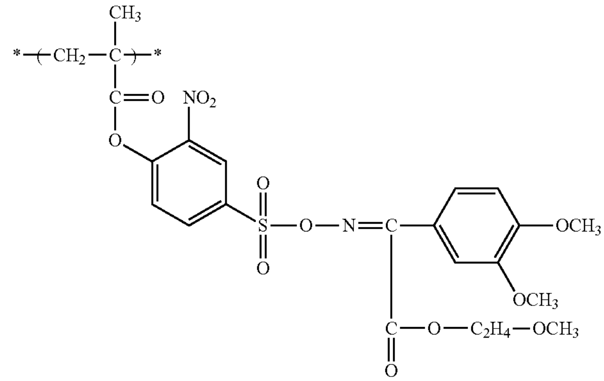
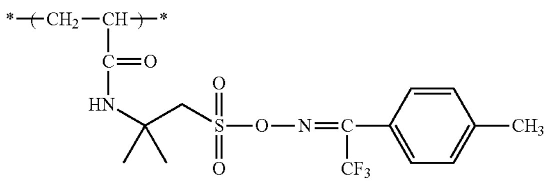
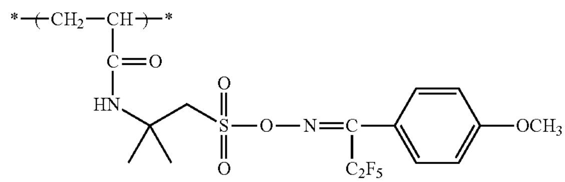
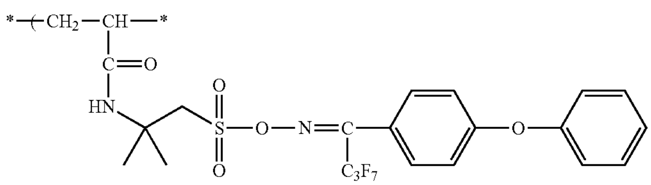
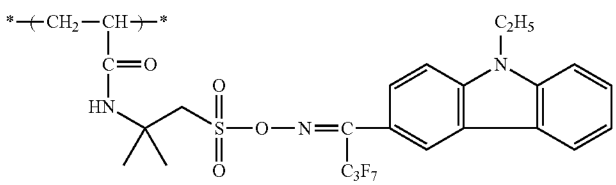
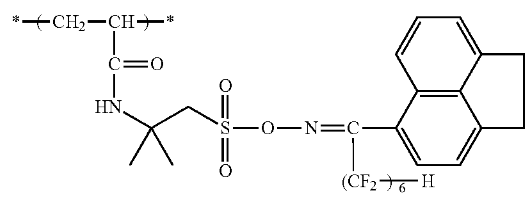
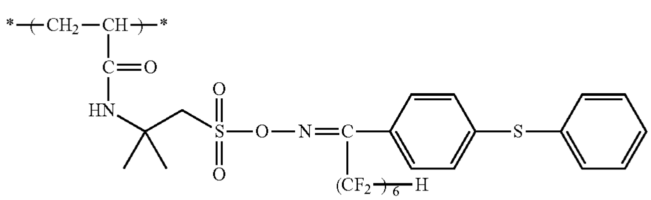
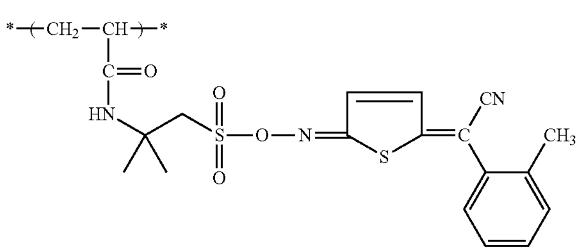
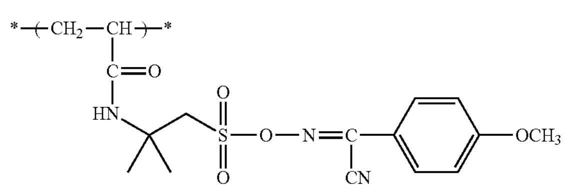
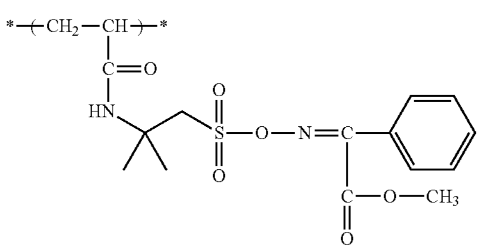
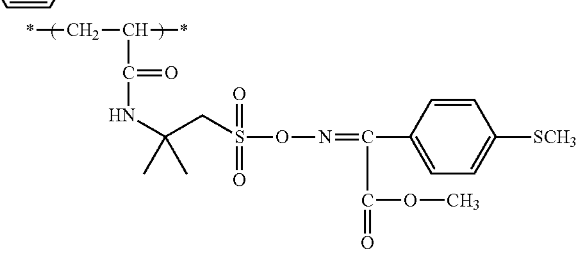

-continued
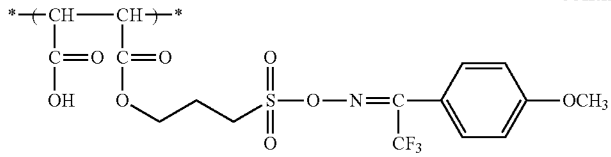
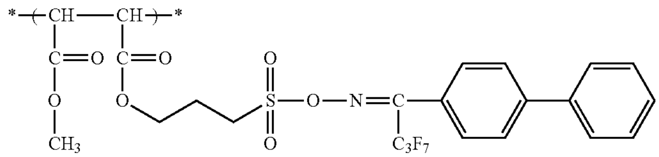
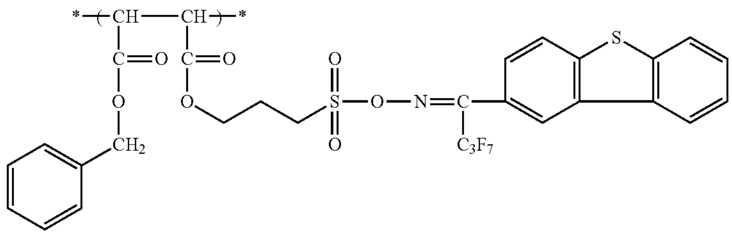
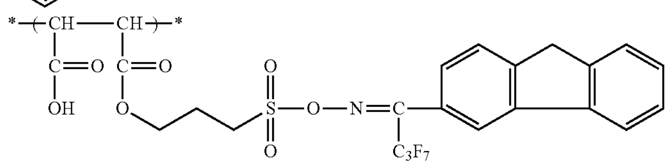
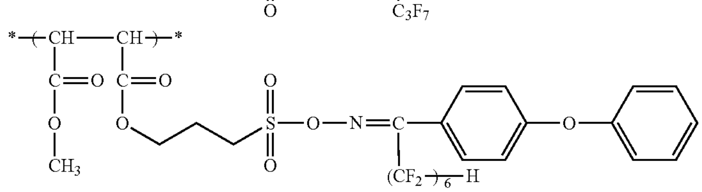
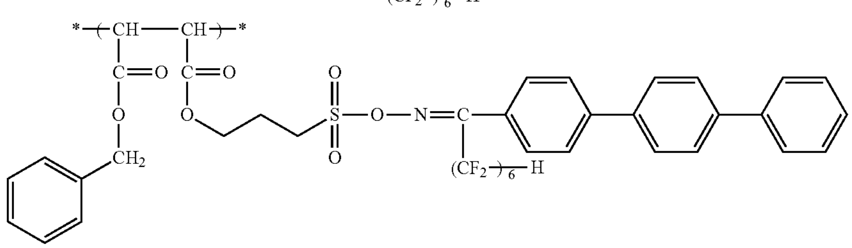
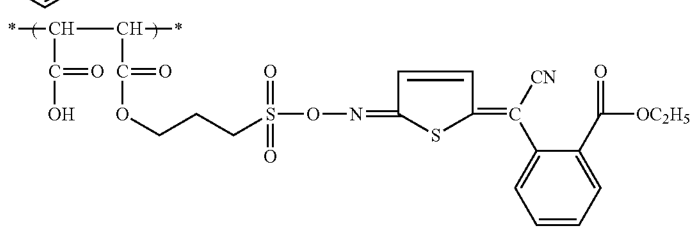
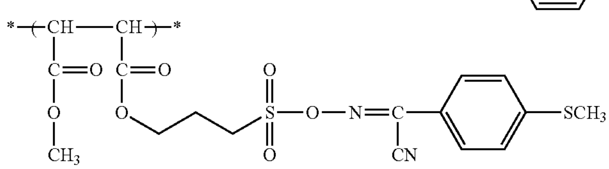
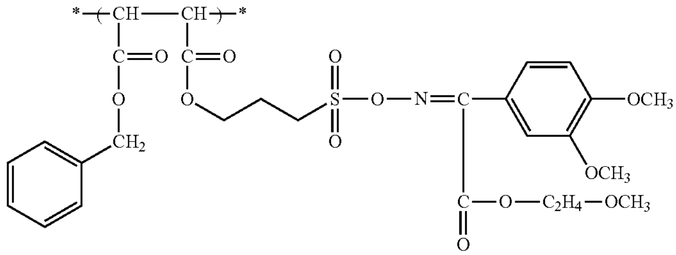

-continued
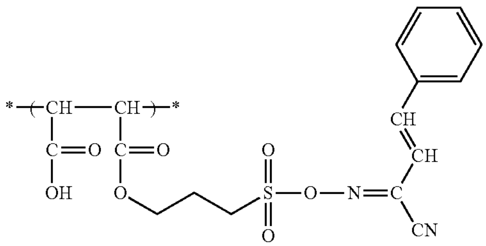
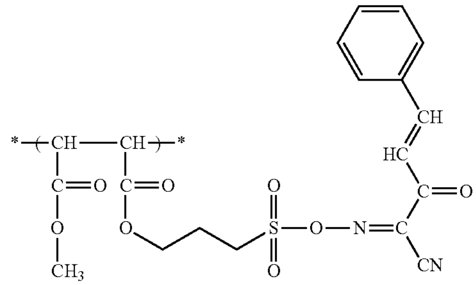
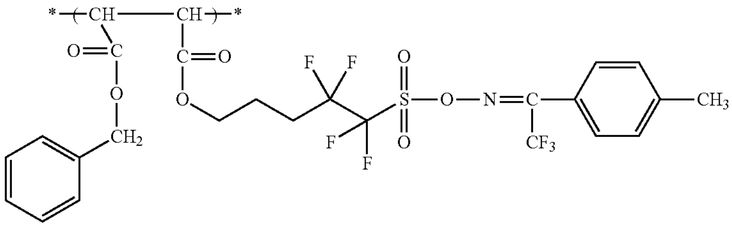
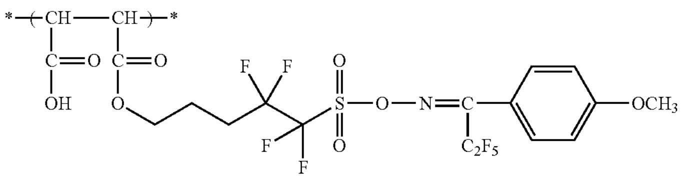
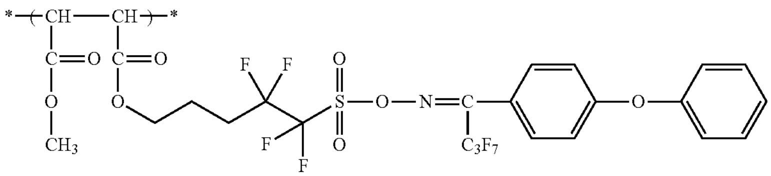
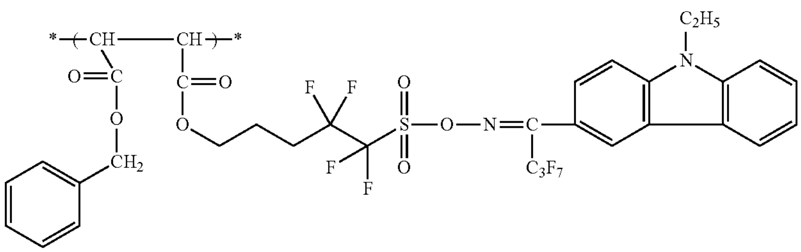
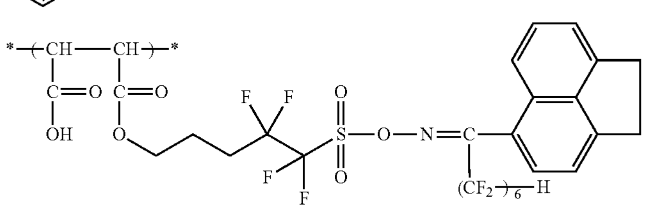
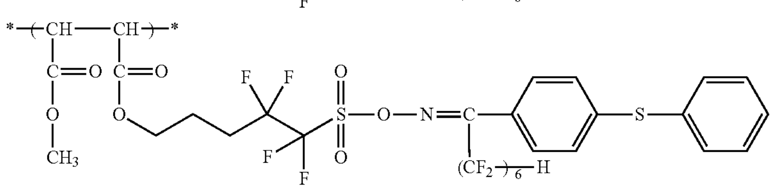
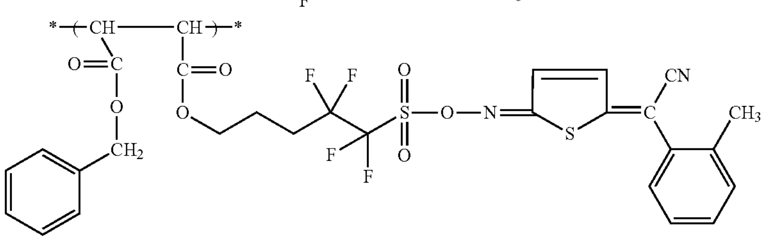

-continued
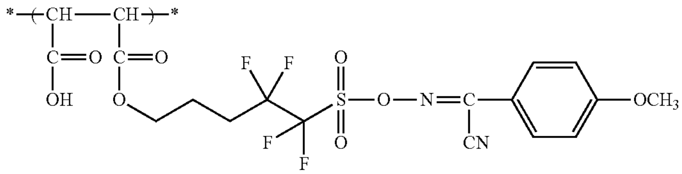
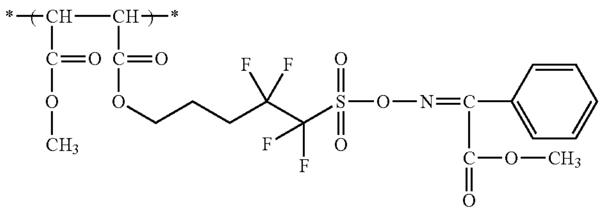
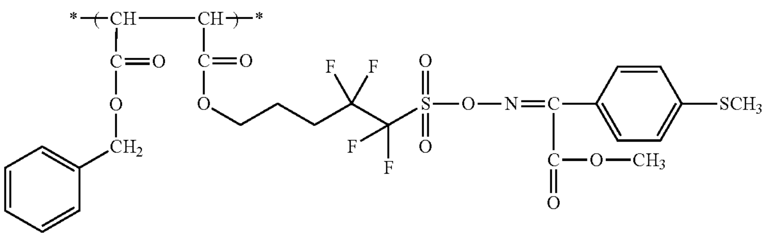
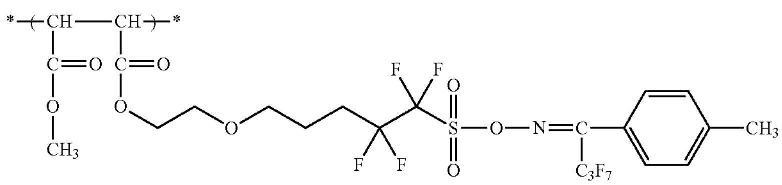
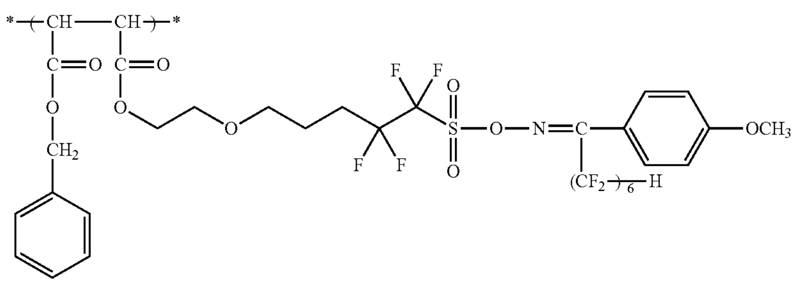
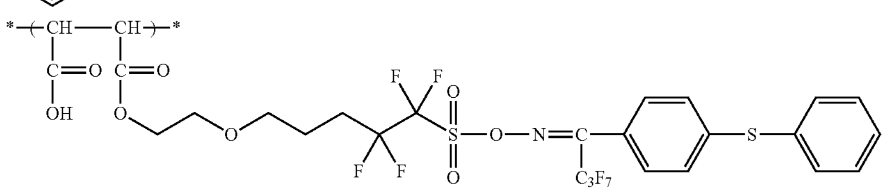
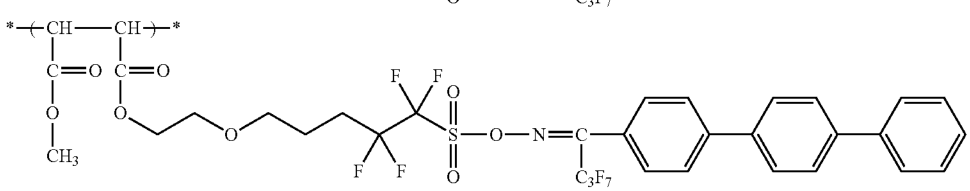
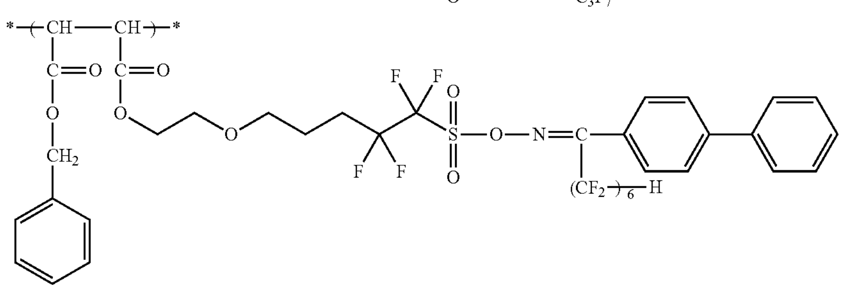

-continued
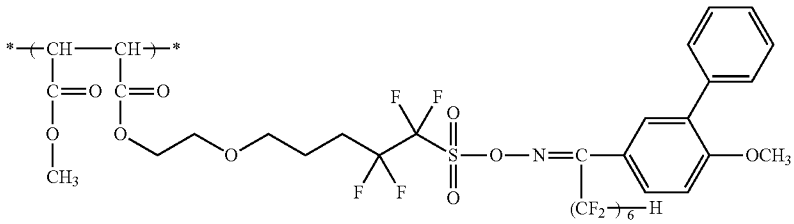
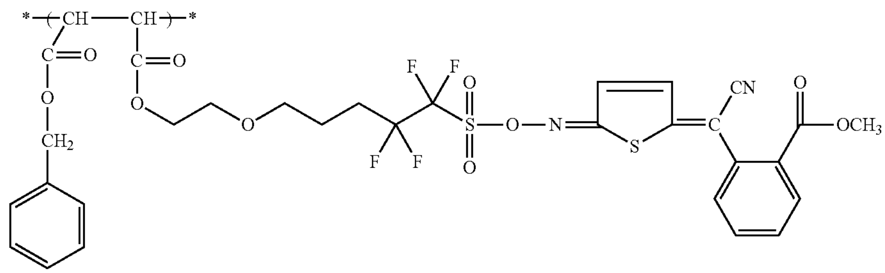
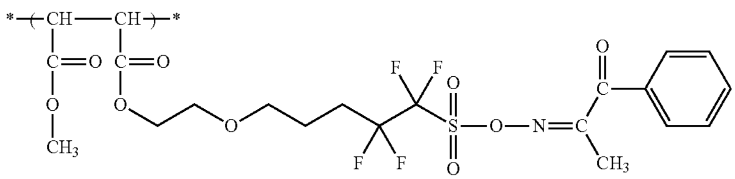
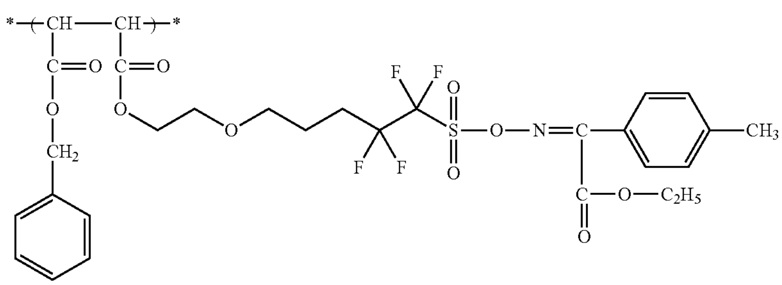
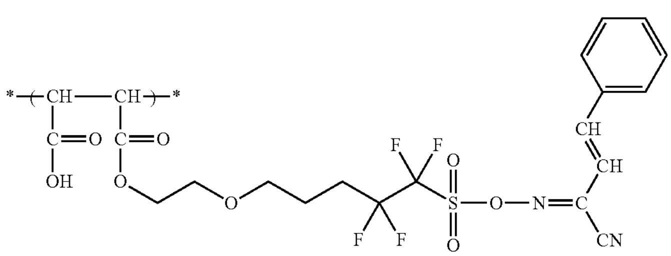
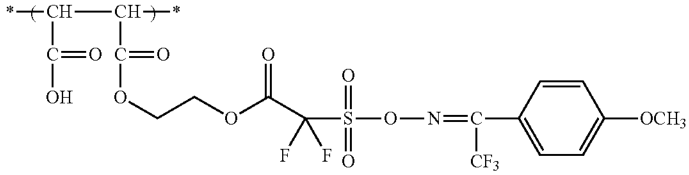
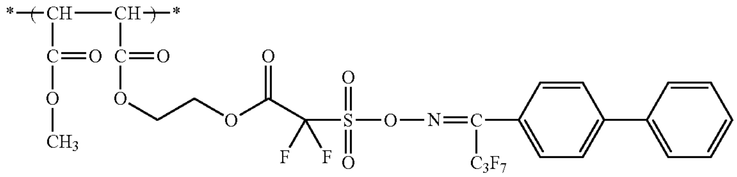

-continued
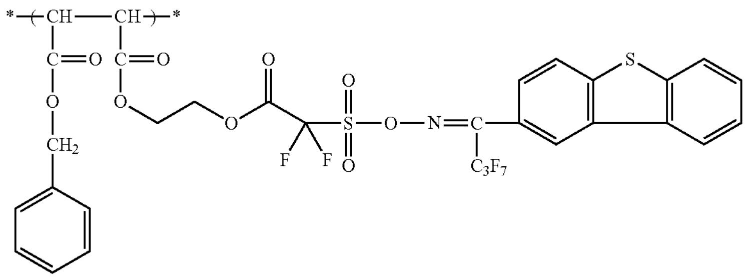
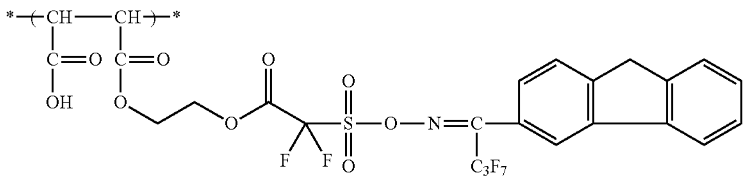
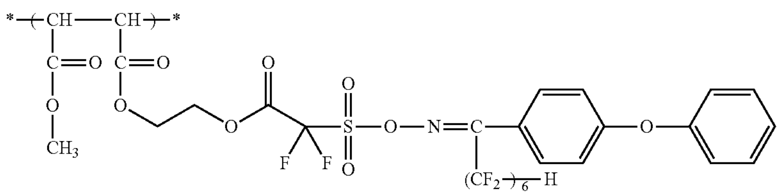
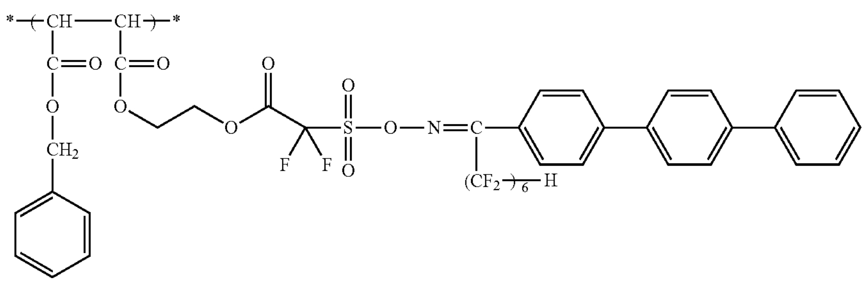
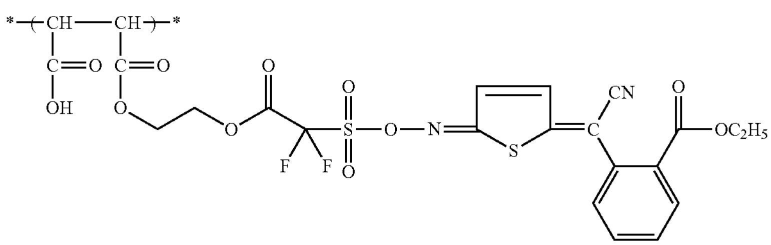
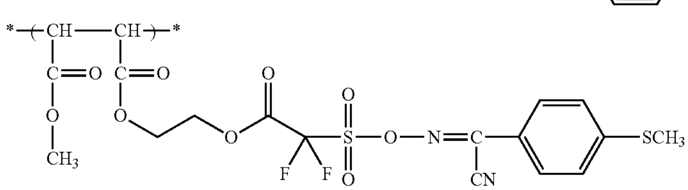
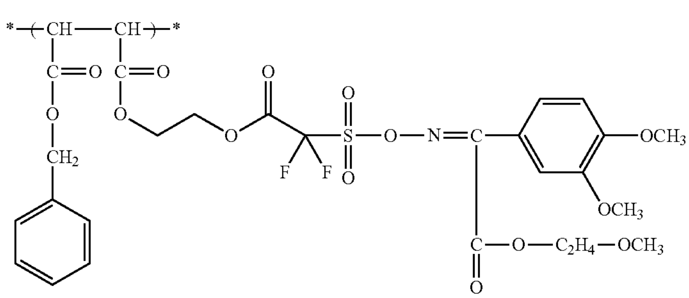

-continued
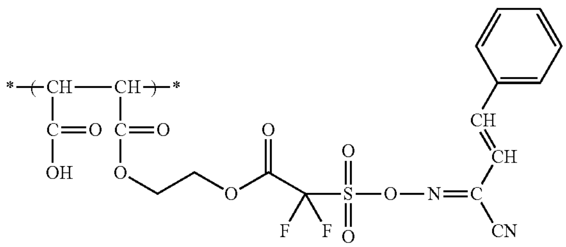
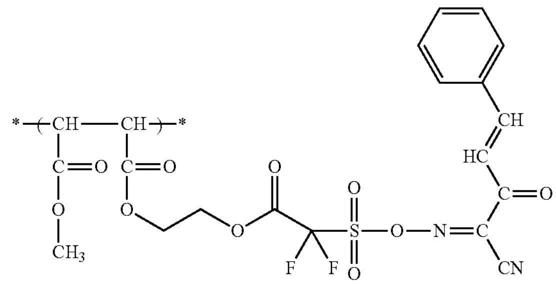
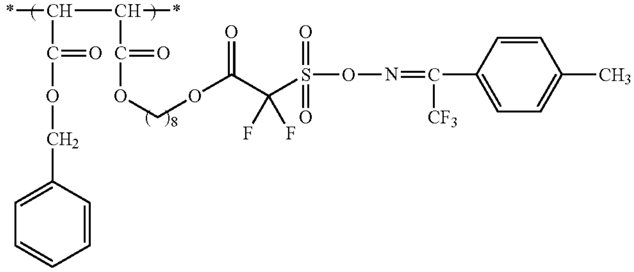
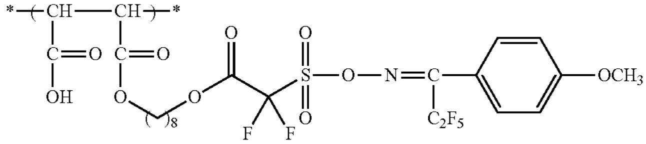
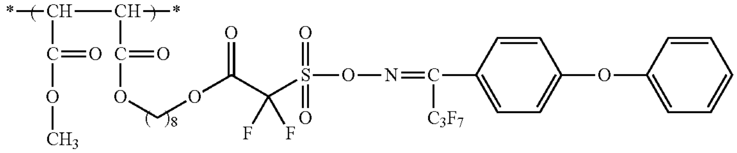
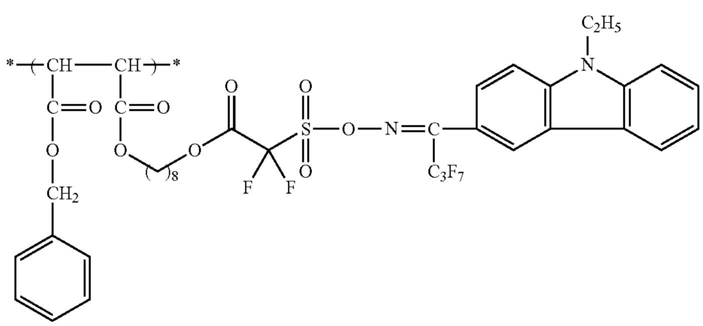
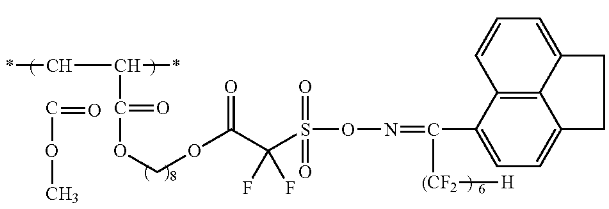
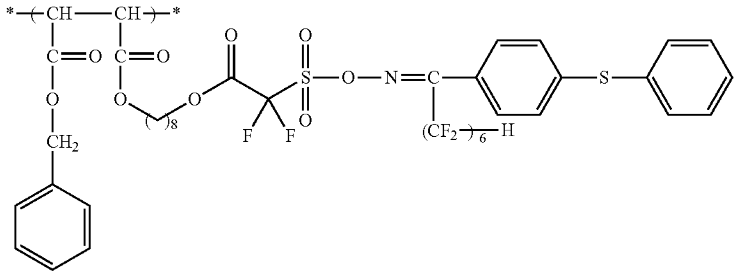

-continued
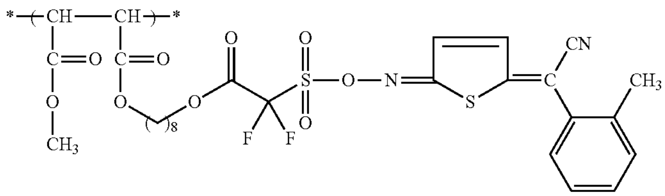
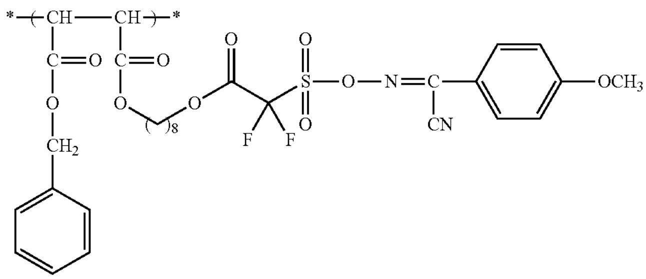
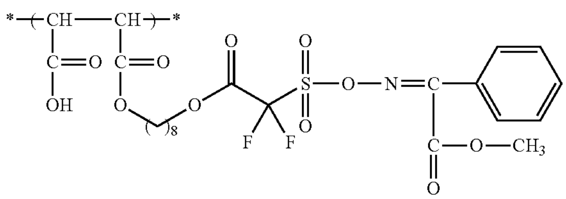
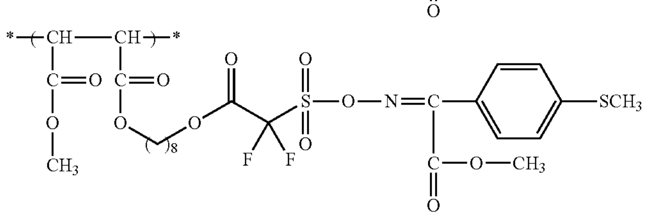
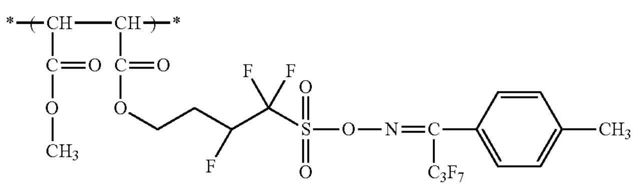
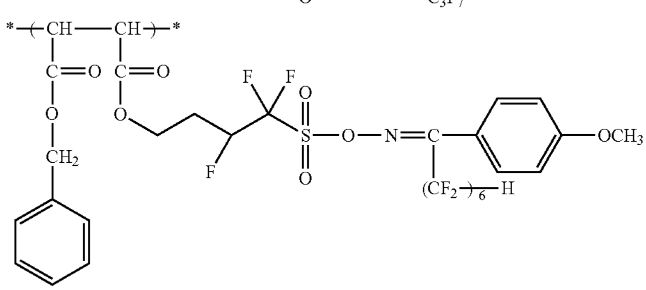
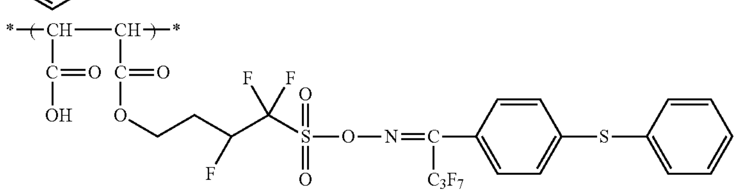
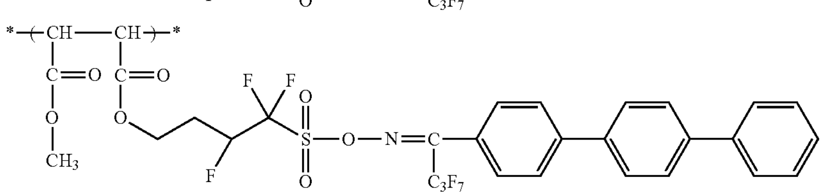

-continued
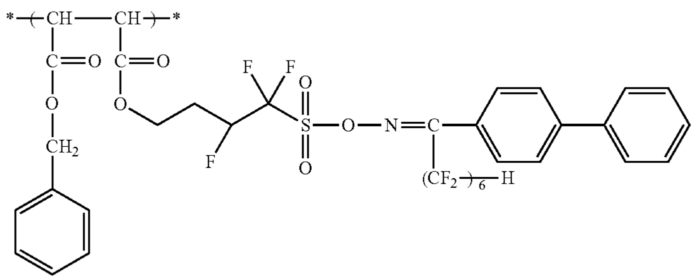
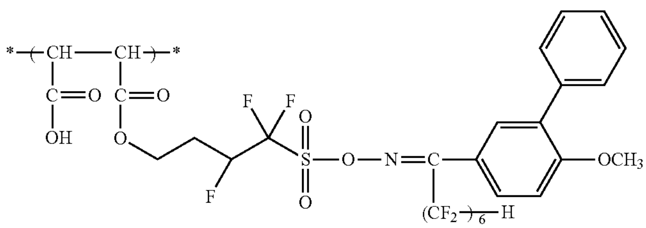
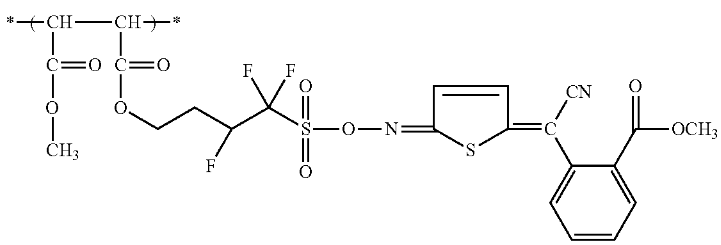
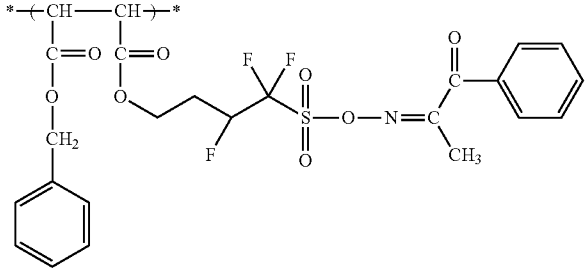
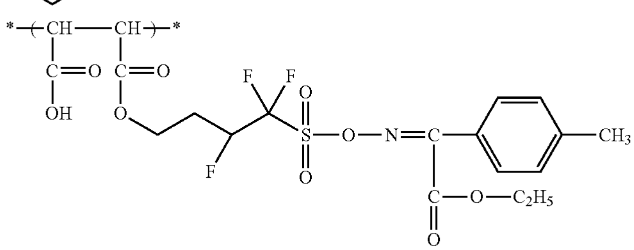
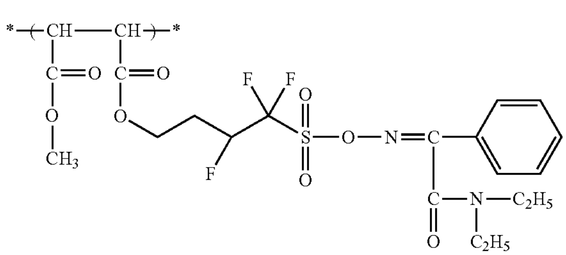
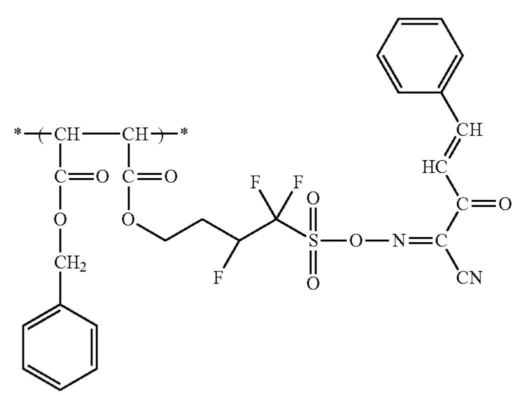

-continued
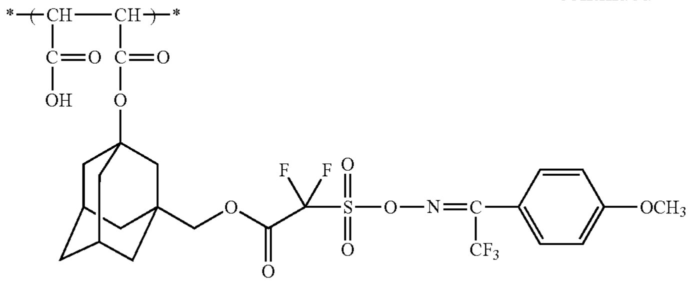
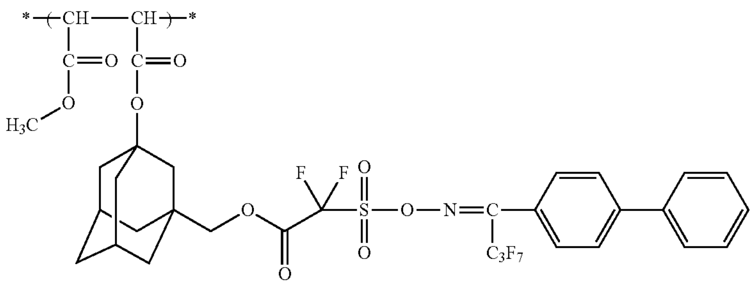
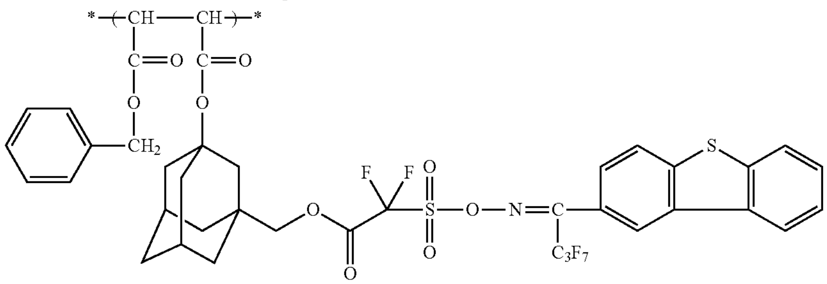
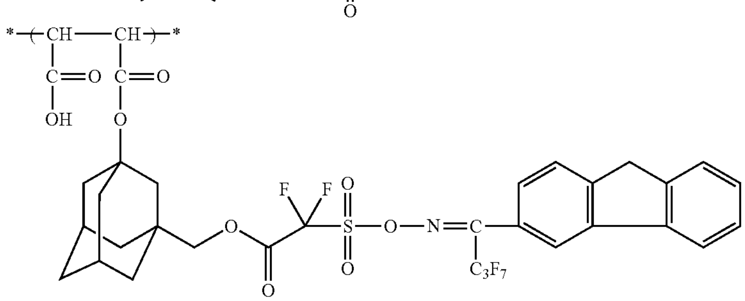
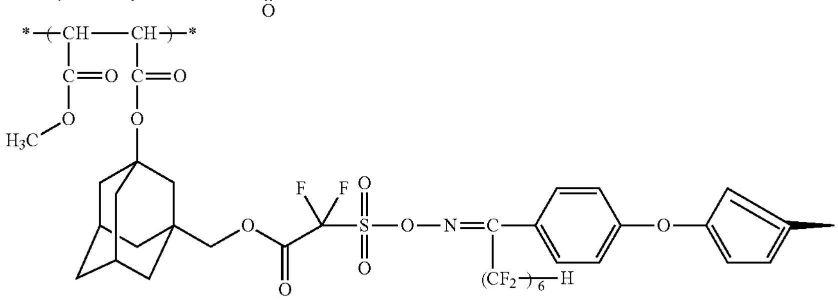
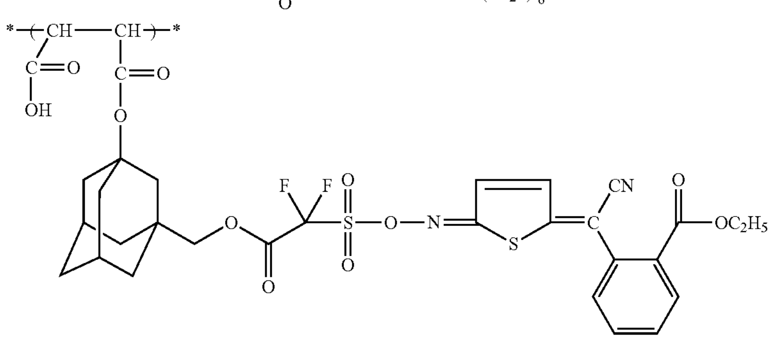

-continued
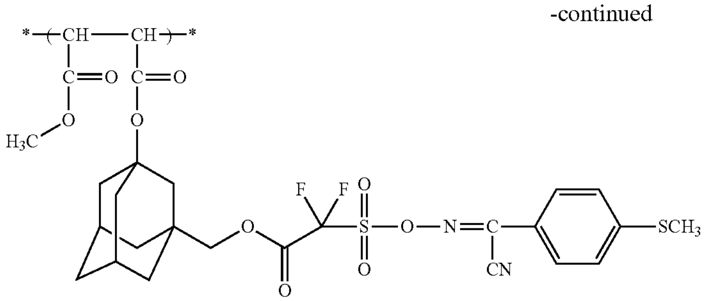
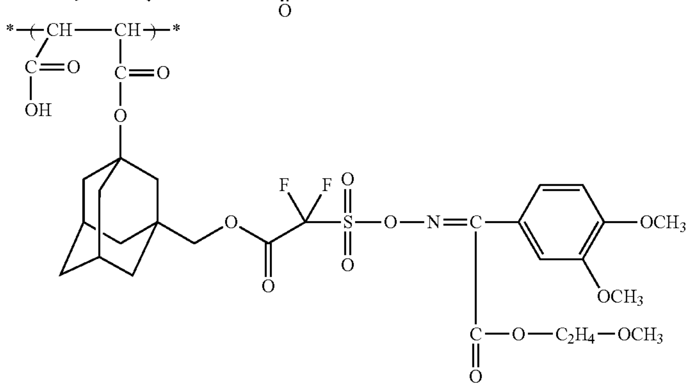
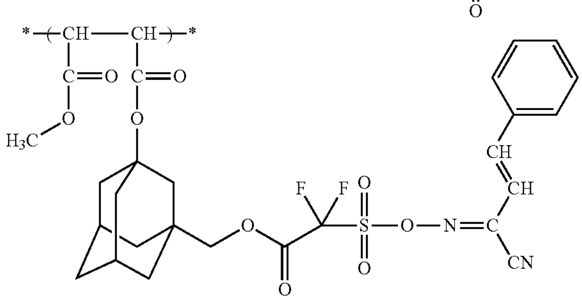
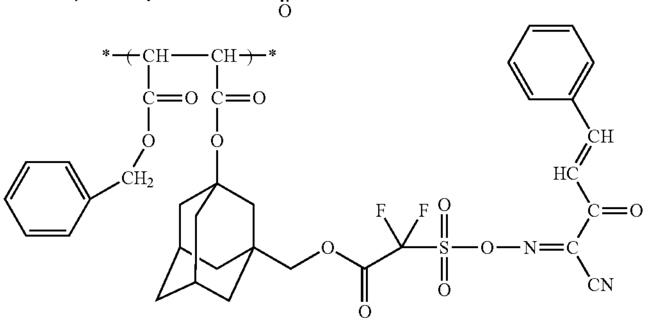
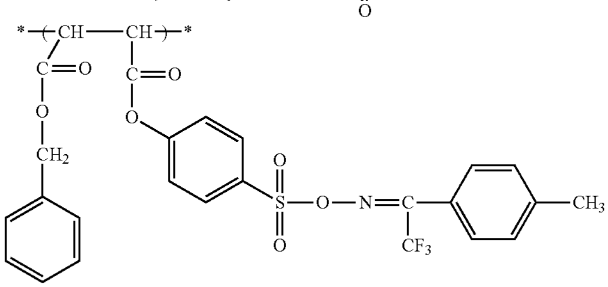
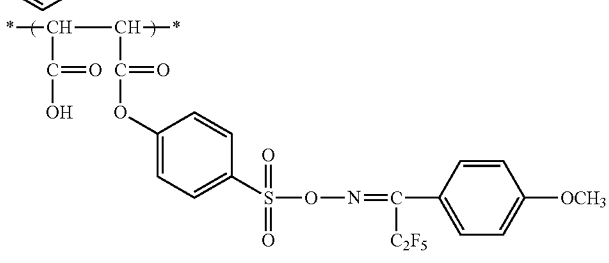

-continued
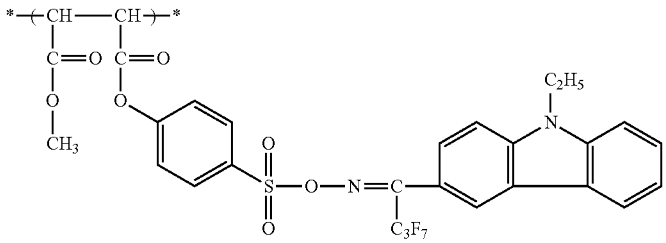
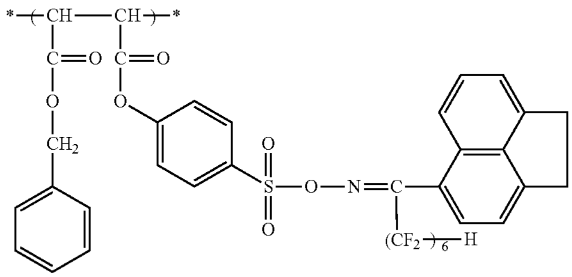
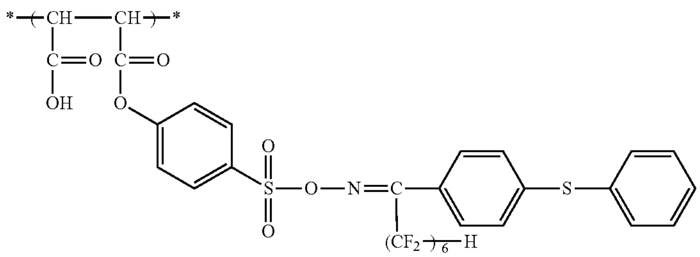
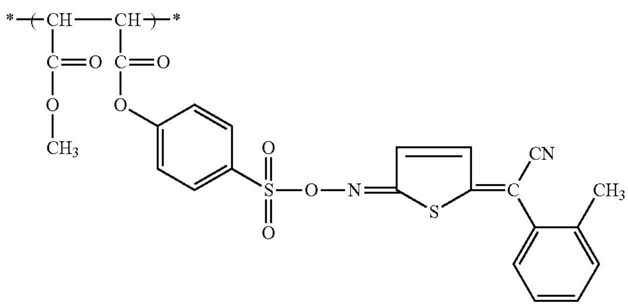
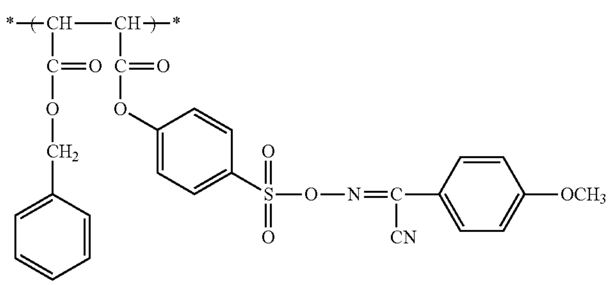
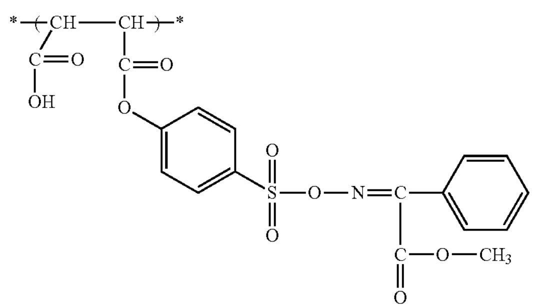
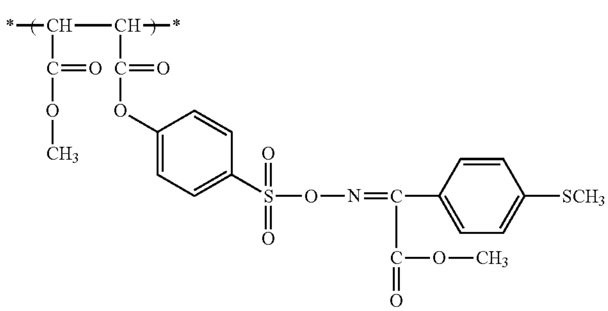

-continued
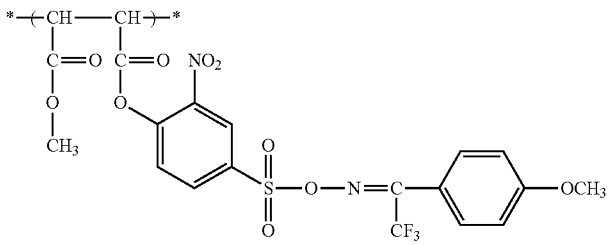
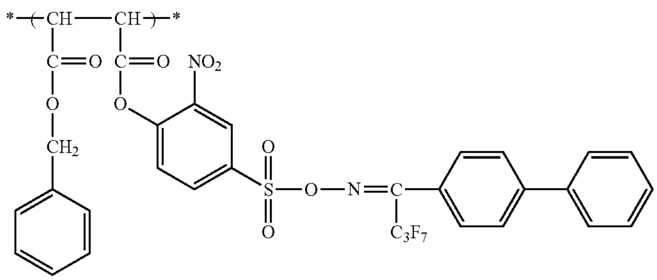
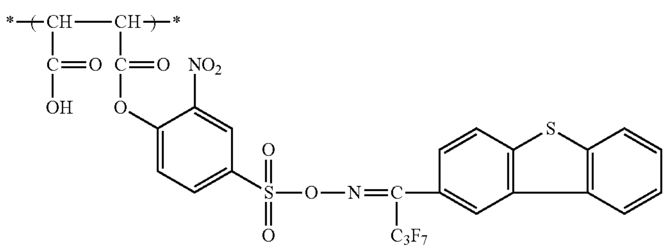
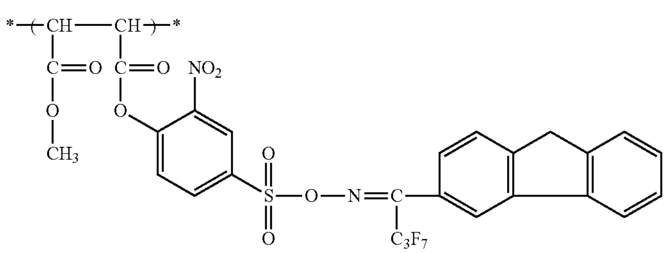
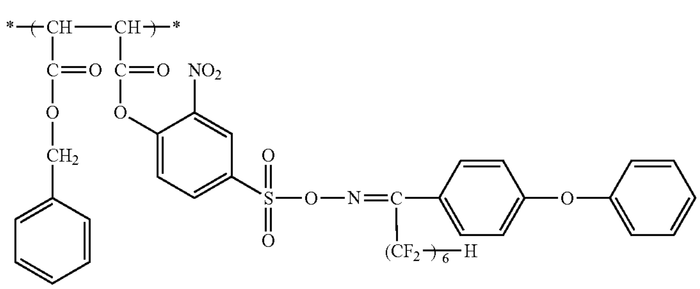
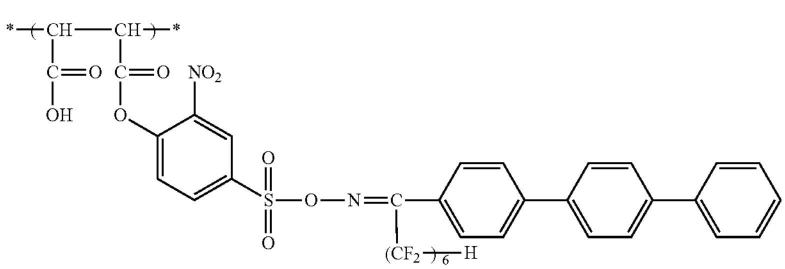

-continued
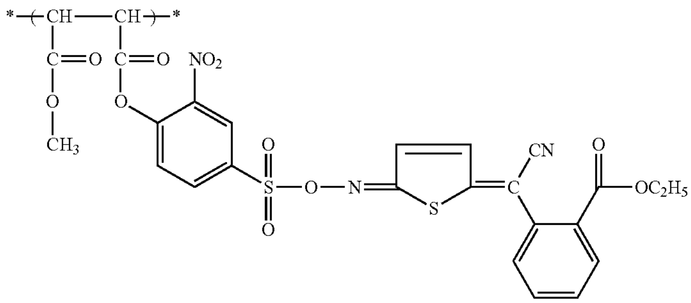
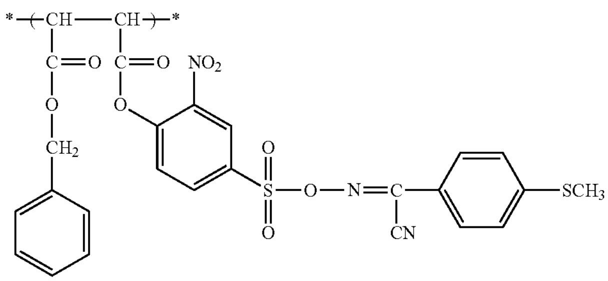
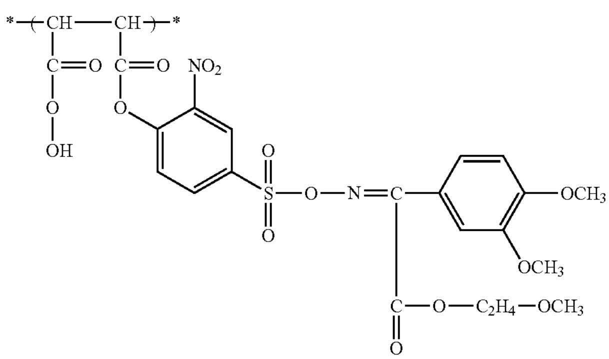
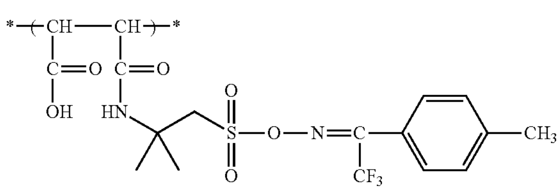
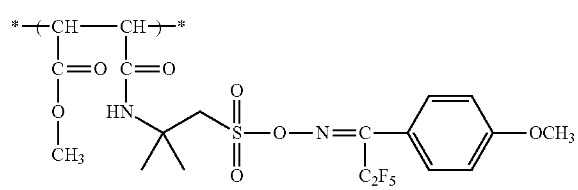
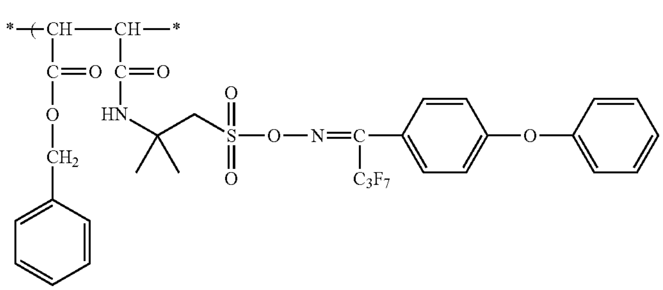
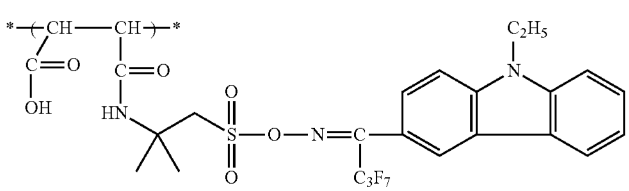
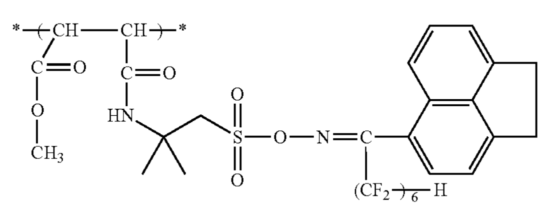

-continued
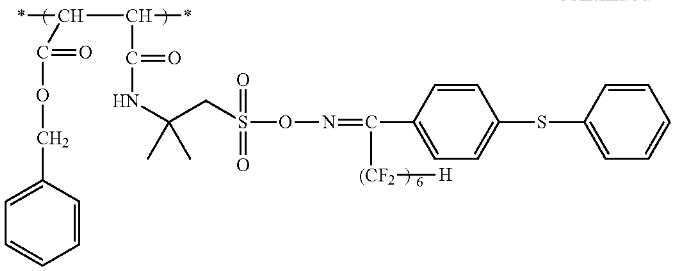
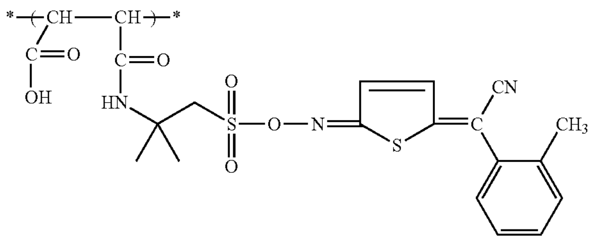
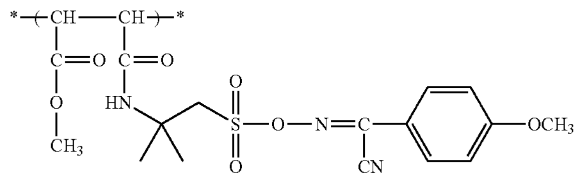
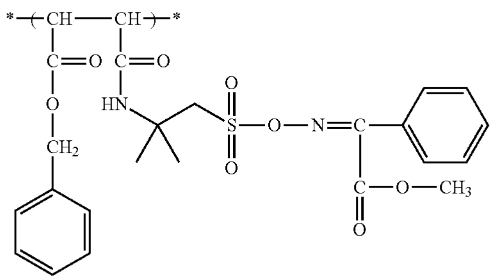
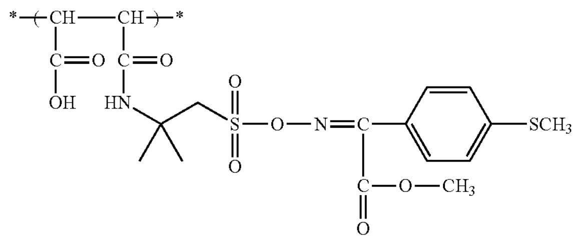
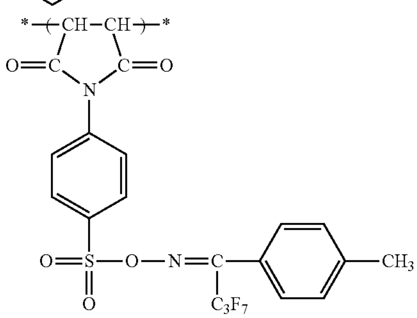
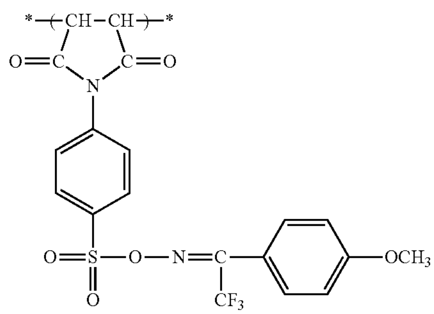
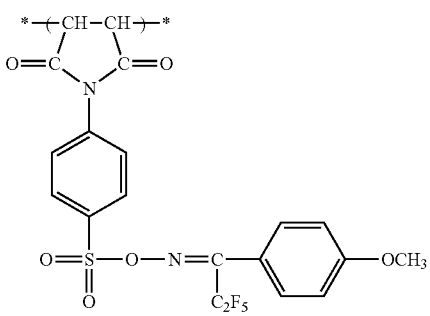
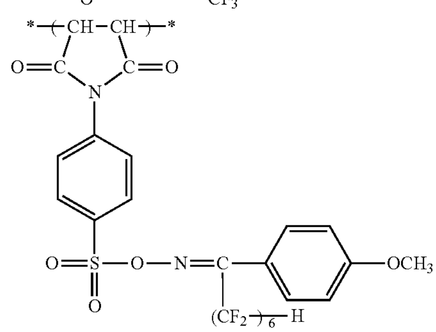
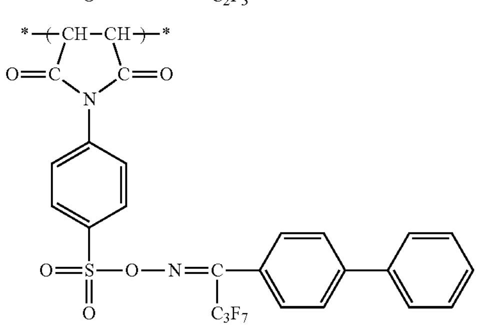
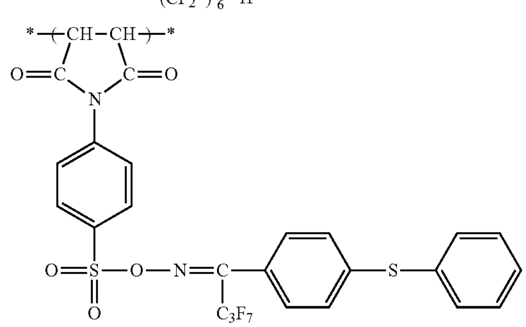

-continued
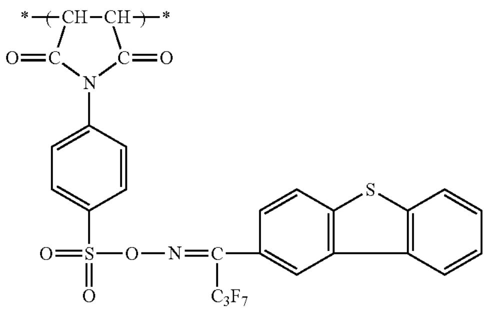
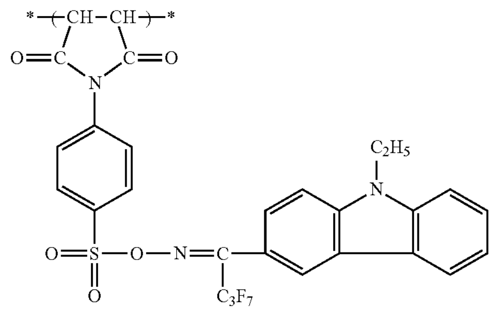
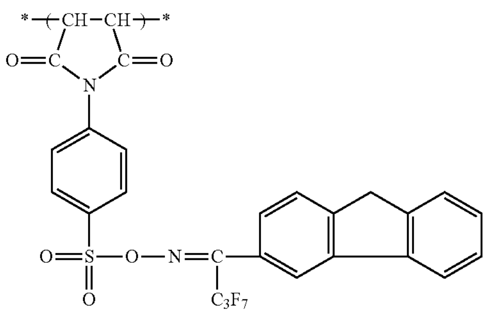
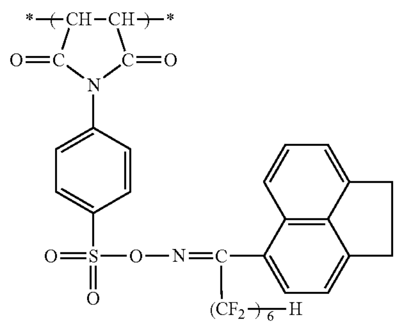
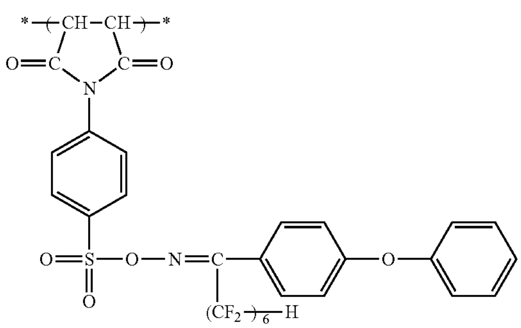
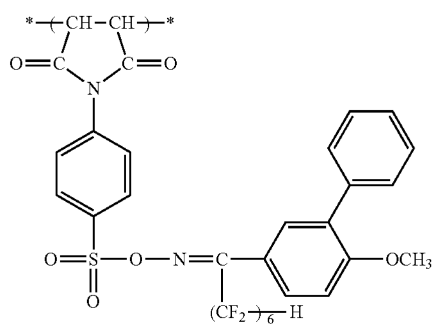
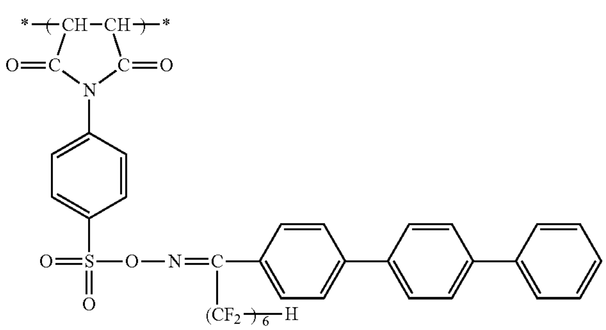
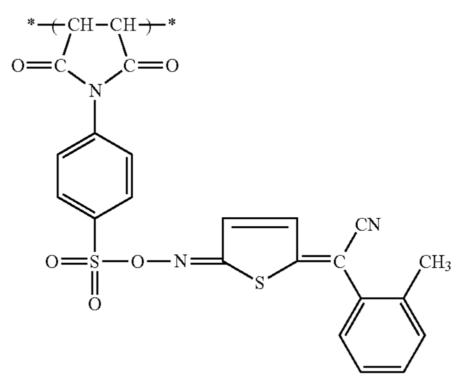
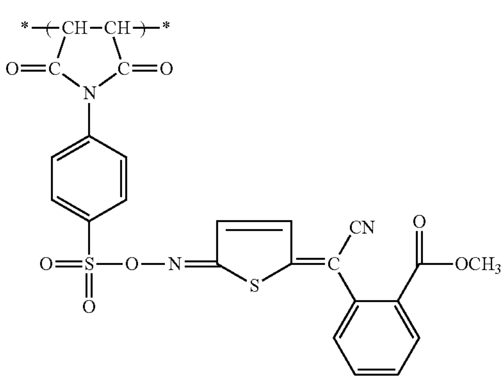
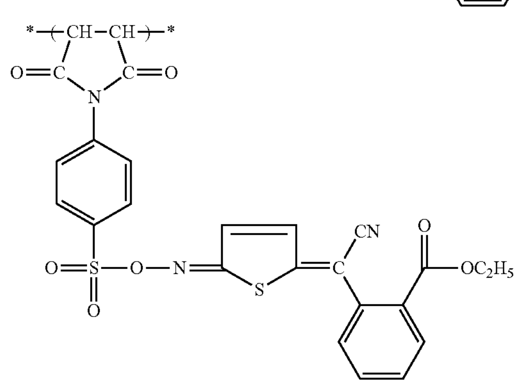

-continued
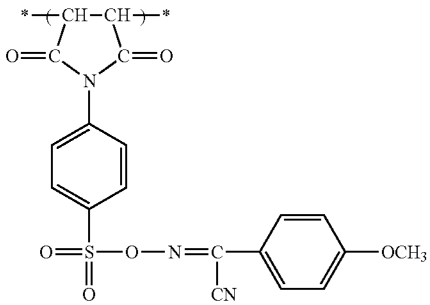
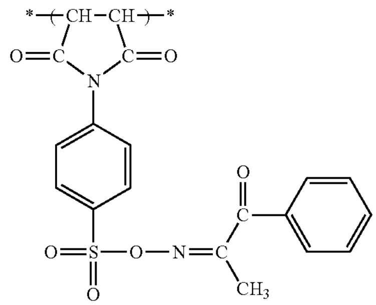
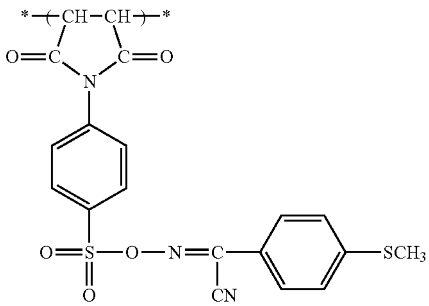
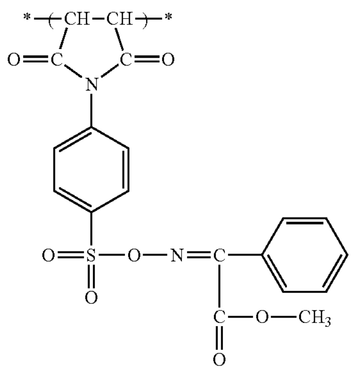
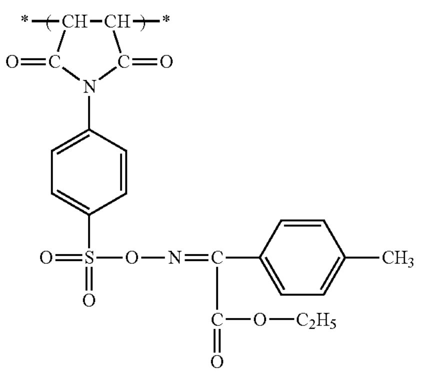
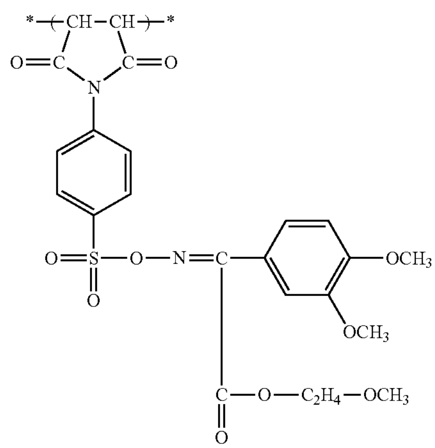
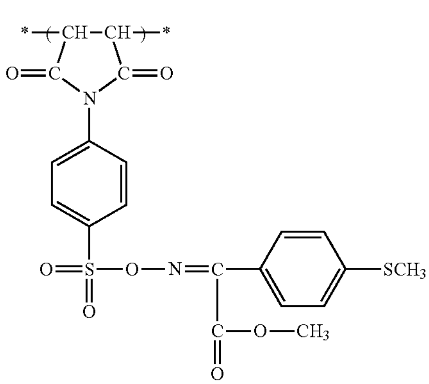
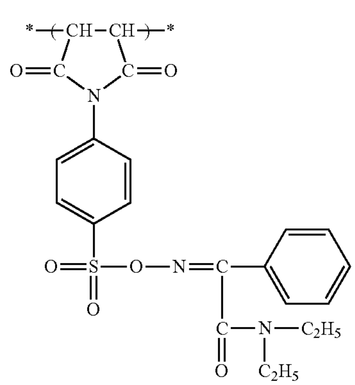
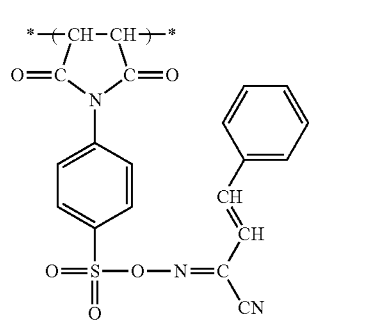

-continued

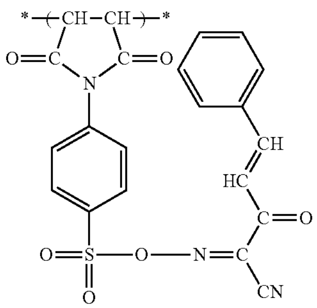

[2] Repeating Unit Containing Acid-Decomposable Group

Typically, the above-mentioned resin further comprises a repeating unit with an acid-decomposable group, that is, a group that is decomposed when acted on by an acid to thereby produce a polar group. The repeating unit may contain the acid-decomposable group either in the principal chain or in the side chain or both of the principal chain and the side chain.

The acid-decomposable group is preferred to have a structure in which the polar group is protected by a group that is decomposed when acted on by an acid to thereby be cleaved. As the polar group, there can be mentioned, for example, a phenolic hydroxyl group, a carboxyl group, an alcoholic hydroroxyl group, a fluoroalcohol group, a sulfonate group, a sulfonamido group, a sulfonylimido group, a (alkylsulfonyl)(alkylcarbonyl)methylene group, a (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred polar groups, there can be mentioned a carboxyl group, an alcoholic hydroxyl group, a fluoroalcohol group (preferably a hexafluoroisopropanol group) and a sulfonate group.

The acid-decomposable group is preferably a group as obtained by substituting the hydrogen atom of any of these polar groups with a group that is cleaved by the action of an acid.

As a group that is cleaved by the action of an acid, there can be mentioned, for example, a group represented by $—C(R_{36})(R_{37})(R_{38})$, $—C(R_{36})(R_{37})(OR_{39})$ or $—C(R_{01})(R_{02})(OR_{39})$. In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to form a ring. Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group, an alcoholic hydroxyl group, or the like. Particularly preferred is a tertiary alkyl ester group or an alcoholic hydroxyl group.

As preferred repeating unit with an acid-decomposable group, for example, at least one of repeating units (R1) and (R2) can be exemplified.

<Repeating Unit (R1)>

The repeating unit (R1) contains a tertiary alkyl ester group. For example, the repeating unit (R1) is represented by general formula (AI) below.

(AI)

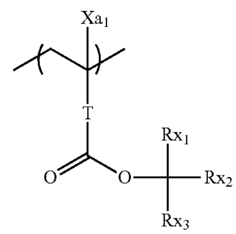

In the formula (AI), $Xa_1$ represents a hydrogen atom, a methyl group, or a group represented by $—CH_2—R_9$. $R_9$ represents a hydroxyl group or a monovalent organic group.

T represents a single bond or a bivalent connecting group.

Each of $Rx_1$ to $Rx_3$ independently represents an alkyl group (linear or branched) or a cycloalkyl group (monocyclic or polycyclic), and at least two of $Rx_1$ to $Rx_3$ may be bonded to each other to thereby form a cycloalkyl group (monocyclic or polycyclic).

The repeating unit represented by general formula (AI) is converted into the one represented by the following general formula (AI') by decomposition upon an action of an acid.

(AI')

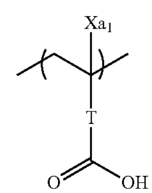

In the formula (AI'), both of $Xa_1$ and T represent the same as in the formula (AI).

Solubility parameter of the resin changes by converting from the repeating unit represented by general formula (AI) into the one represented by general formula (AI'). The amount of change depends, for example, on a structure of each group in general formula (AI) (in particular those represented by $Rx_1$ to $Rx_3$), and, the content of the repeating unit represented by general formula (AI) based on all the repeating units of the resin.

$Xa_1$ and T in general formula (AI) typically do not change their structure by the decomposing reaction. Therefore, these groups can be selected based on the required performance for the repeating unit represented by formula (AI).

$Xa_1$ represents a hydrogen atom, an optionally substituted methyl group, or a group represented by $—CH_2—R_9$. $R_9$ represents a hydroxyl group or a monovalent organic group. $R_9$ preferably represents an alkyl or an acyl group having 5 or less carbon atoms, more preferably an alkyl group having 3 or less carbon atoms, and further more preferably a methyl group. $Xa_1$ preferably represents a hydrogen atom, a methyl group, a trifluoromethyl group or a hydroxymethyl group.

As the bivalent connecting group represented by T, there can be mentioned, for example, an alkylene group, a group of the formula —(COO-Rt)- or a group of the formula —(O-Rt)-. In the formulae, Rt represents an alkylene group or a cycloalkylene group.

T is preferably a single bond or a group of the formula —(COO—Rt)-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

The cycloalkyl group formed by bonding at least two of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

Of these, cycloalkyl groups having 5 or 6 carbon atoms are especially preferred.

In an especially preferred mode, $Rx_1$ is a methyl group or an ethyl group, and $Rx_2$ and $Rx_3$ are bonded to each other to thereby form any of the above-mentioned cycloalkyl groups.

One or more substituents may further be introduced in each of the groups above. As the substituents, there can be mentioned, for example, an alkyl group (preferably having 1 to 4 carbon atoms), a halogen atom, a hydroxy group, an alkoxy group (preferably having 1 to 4 carbon atoms), a carboxyl group, an alkoxycarbonyl group (preferably having 2 to 6 carbon atoms). Preferably, each of the substituents has 8 or less carbon atoms.

It is more preferred for the acid-decomposable resin to contain, as the repeating units of general formula (AI), any of the repeating units of general formula (I) below and/or any of the repeating units of general formula (II) below.

(I)

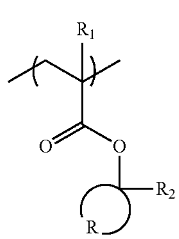

-continued (II)

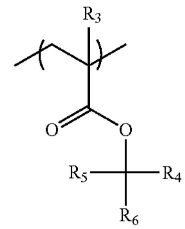

In general formulae (I) and (II), each of $R_1$ and $R_3$ independently represents a hydrogen atom, an optionally substituted methyl group or any of the groups of the formula —$CH_2$—$R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom connected to $R_2$.

$R_1$ preferably represents a hydrogen atom, a methyl group, a trifluoromethyl group or a hydroxymethyl group.

The alkyl group represented by $R_2$ may be linear or branched, and one or more substituents may be introduced therein.

The cycloalkyl group represented by $R_2$ may be monocyclic or polycyclic, and a substituent may be introduced therein.

$R_2$ preferably represents an alkyl group, more preferably an alkyl group having 1 to 10 carbon atoms, further more preferably 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and one or more substituents may be introduced therein. The alkyl groups are preferably those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and a substituent may be introduced therein. The cycloalkyl groups are preferably a monocycloalkyl group, such as a cyclopentyl group or a cyclohexyl group, and a polycycloalkyl group, such as a norbornyl group, a tetracyclodecanyl group, a tetracyclododecanyl group or an adamantyl group.

As the repeating units of general formula (I), there can be mentioned, for example, those of general formula (I-a) below.

(1-a)

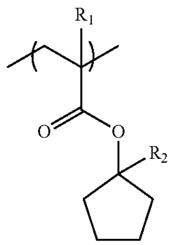

In the formula, $R_1$ and $R_2$ have the same meaning as in general formula (I).

The repeating units of general formula (II) are preferably those of general formula (II-1) below.

(II-1)

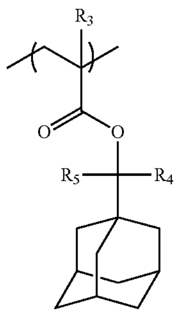

In general formula (II-1), $R_3$ to $R_5$ have the same meaning as in general formula (II).

The acid-decomposable resin may contain two or more kinds of repeating unit (R1). For example, the acid-decomposable resin may contain at least two kinds of the repeating unit represented by formula (I) as the one represented by general formula (AI).

When the acid-decomposable resin contains a repeating unit (R1), the overall content thereof is preferably 10 to 99 mol %, more preferably 20 to 90 mol %, and further more preferably 30 to 80 mol % based on all the repeating units in the resin.

Specific examples of repeating unit (R1) will be shown below, which however in no way limit the scope of the present invention. In the specific examples, Rx and $Xa_1$ each represents a hydrogen atom, $CH_3$, $CF_3$ or $CH_2OH$. Each of Rxa and Rxb represents an alkyl group having 1 to 4 carbon atoms.

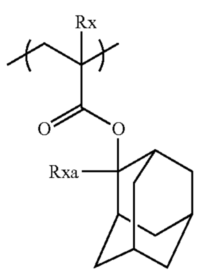

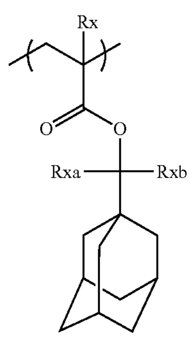

-continued

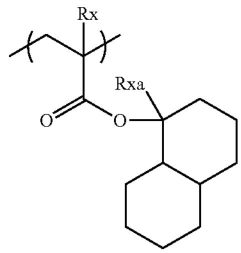

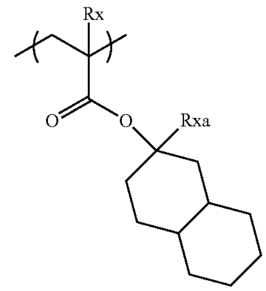

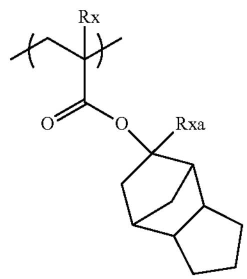

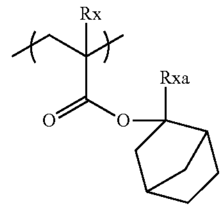

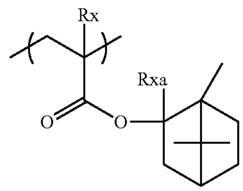

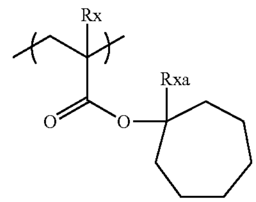

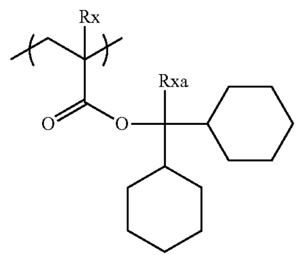

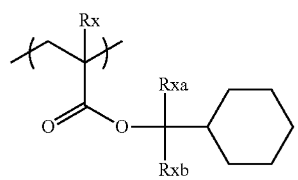

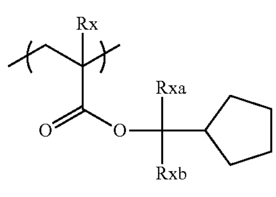

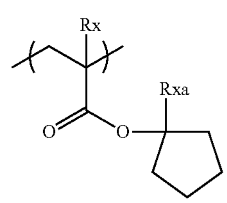

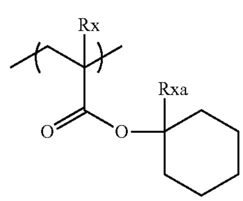

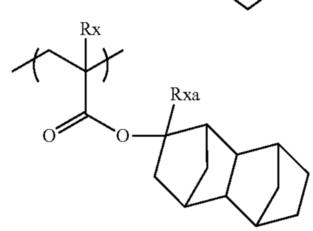

-continued
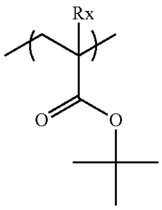
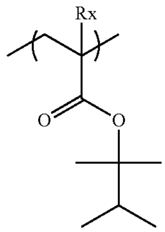
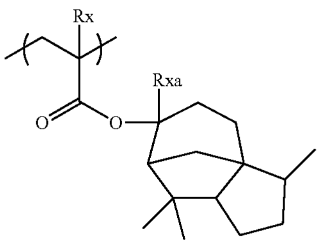
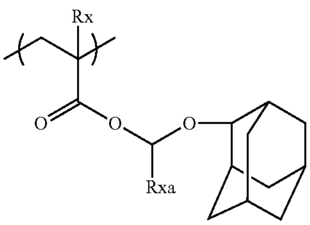
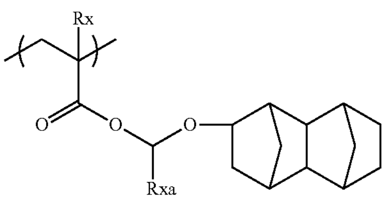
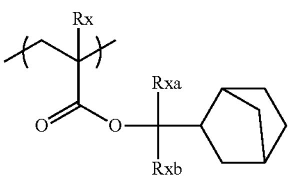
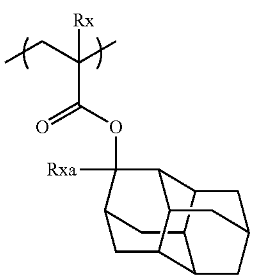
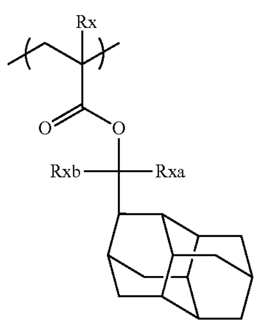
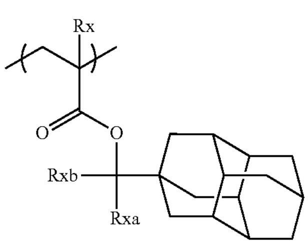
-continued
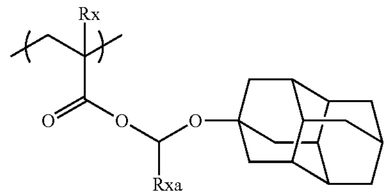
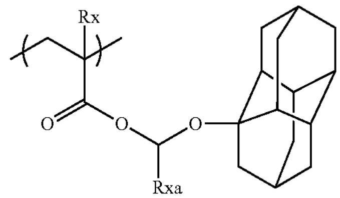
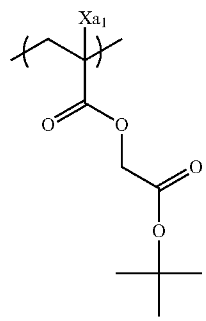
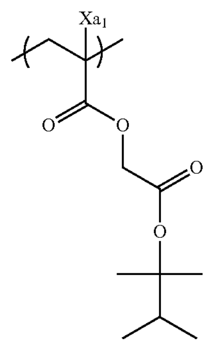
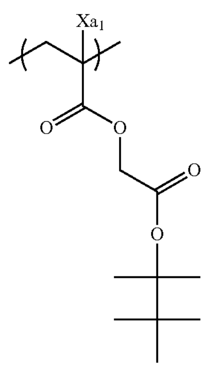
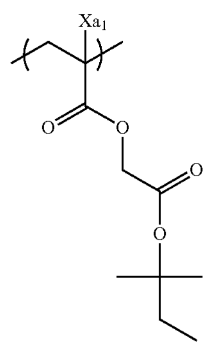
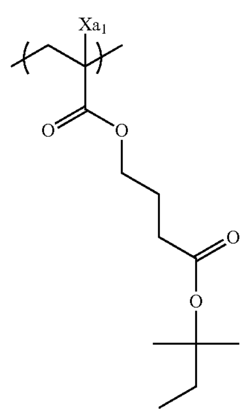
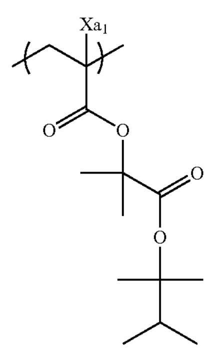

-continued
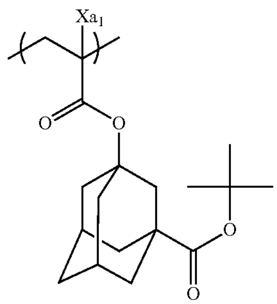
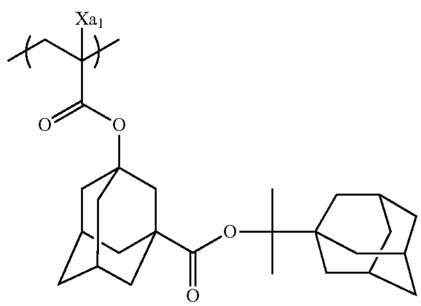
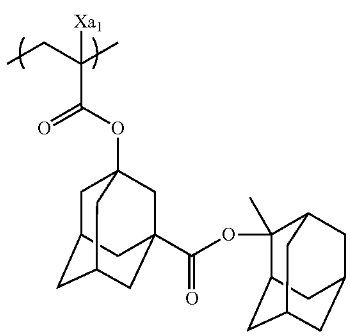
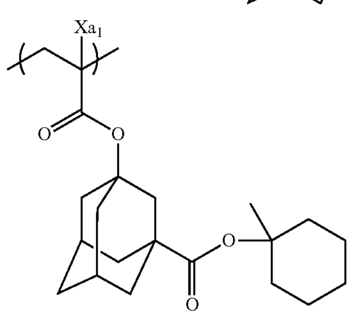
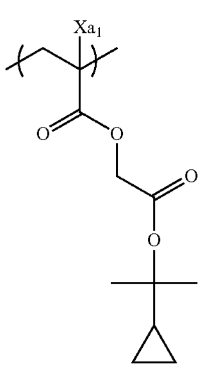
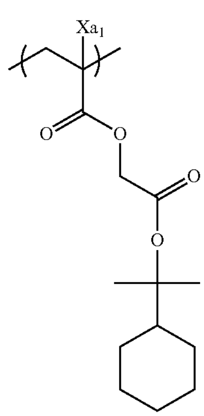
-continued
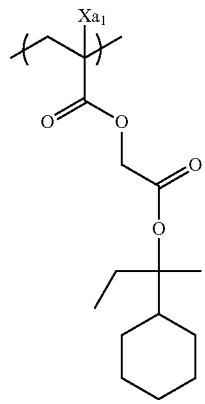
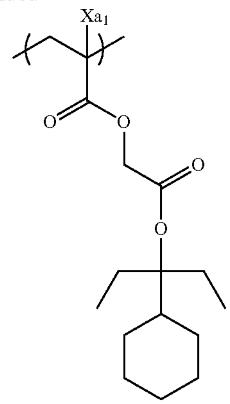
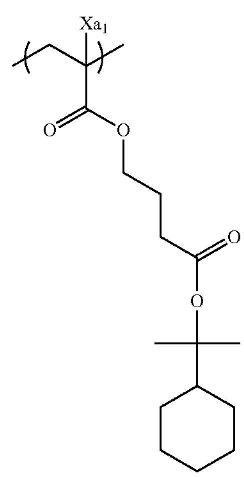
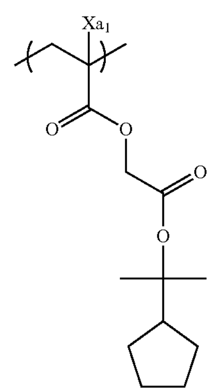
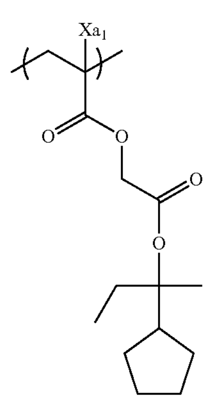
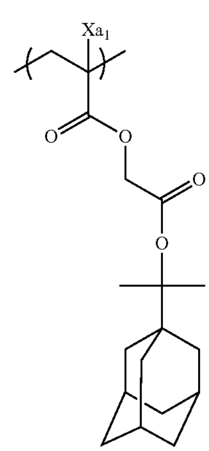

-continued
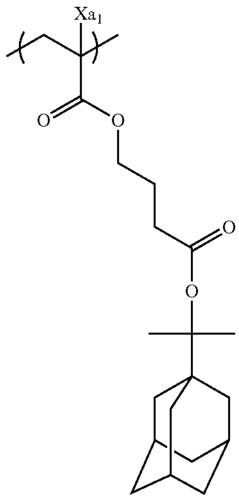
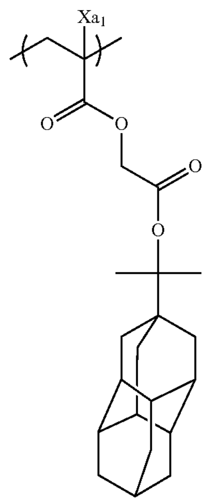
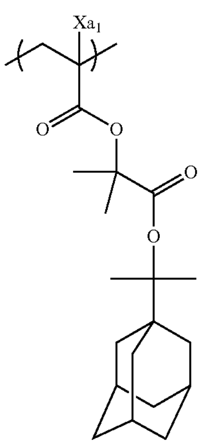
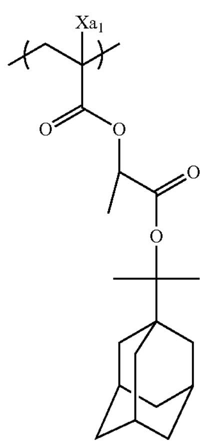
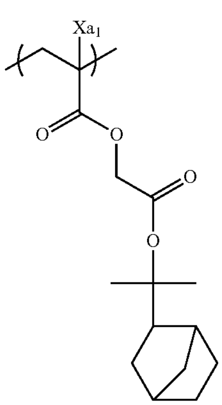
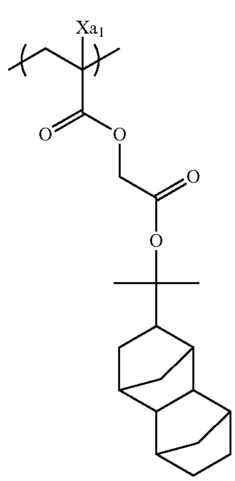
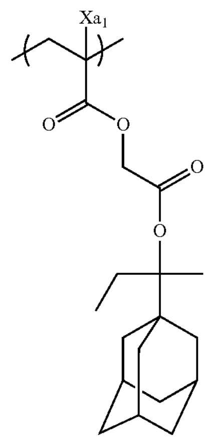
-continued
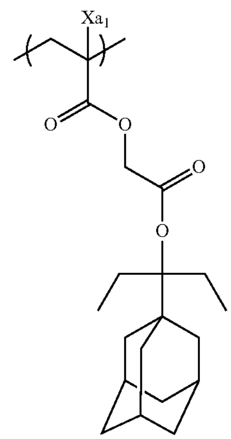
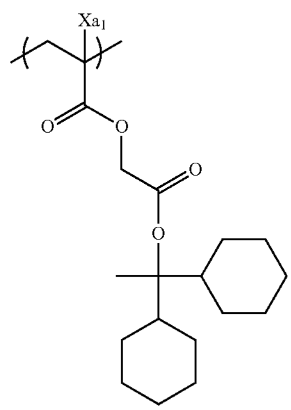
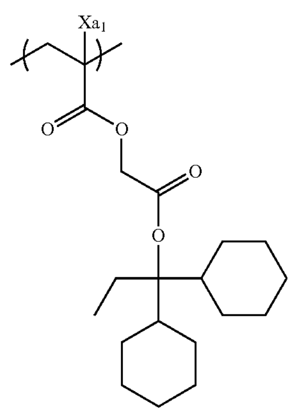
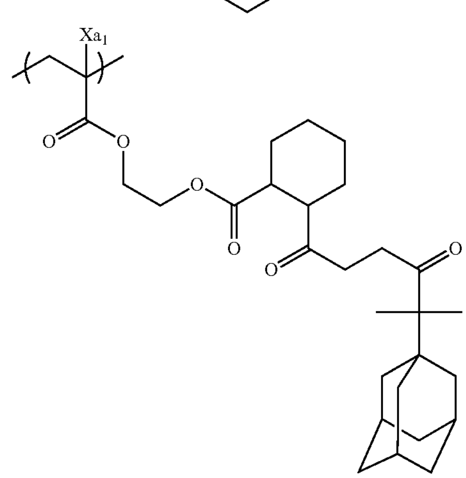

-continued
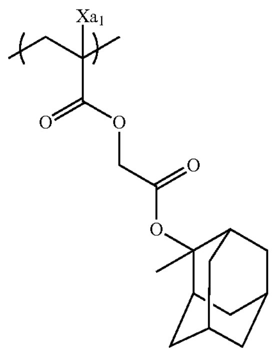
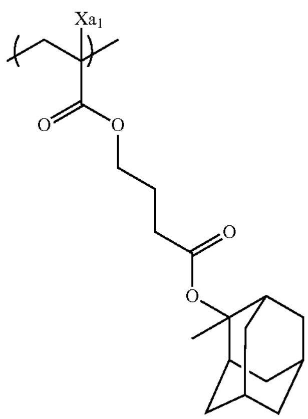
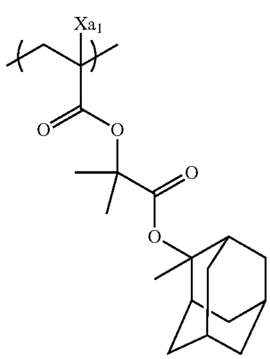
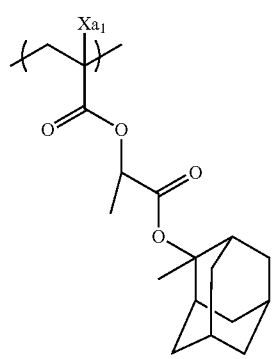
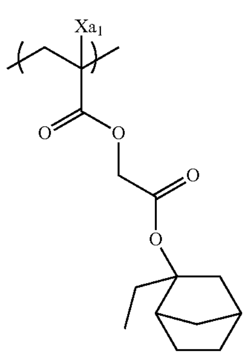
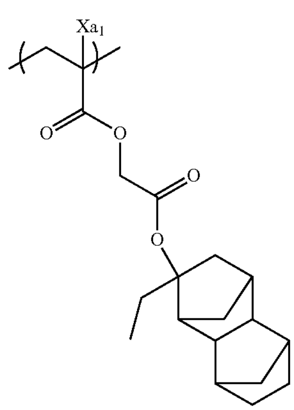
-continued
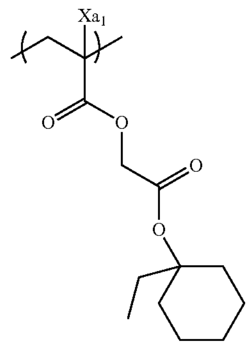
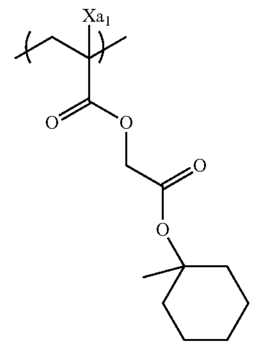
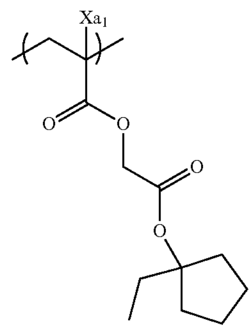
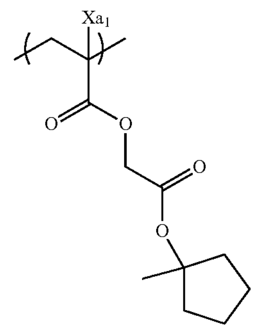
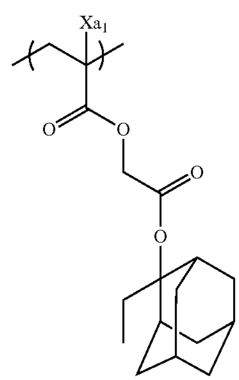
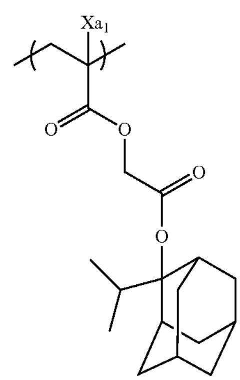
When the acid-decomposable resin contains a plurality of repeating units (R1), the following combinations are preferred. In the following formulae, R each independently represents a hydrogen atom or a methyl group.
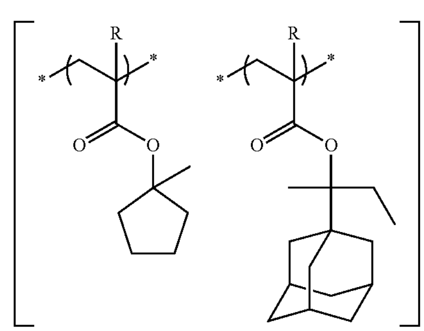

-continued
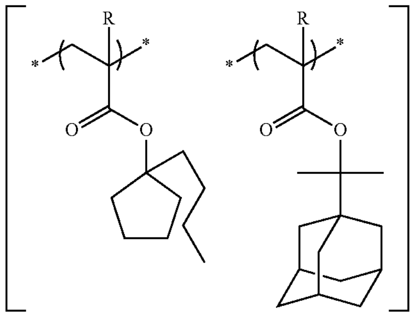
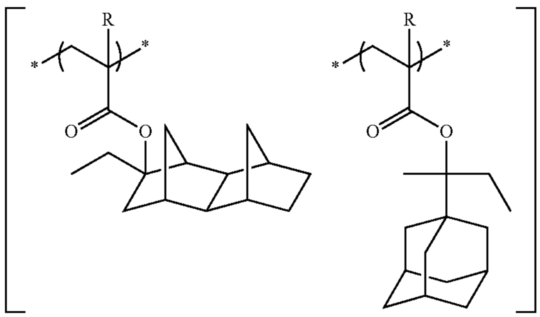
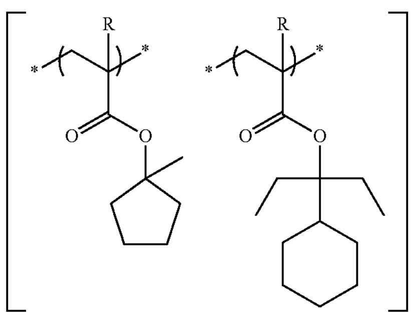
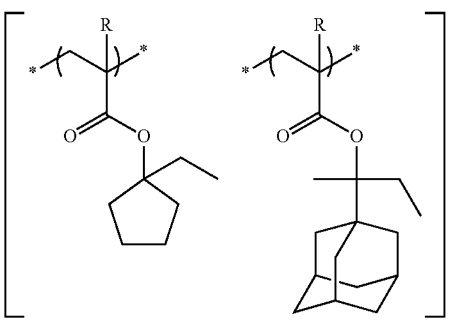
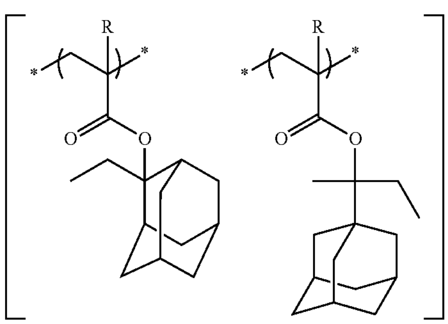
-continued
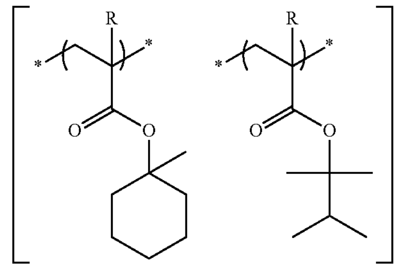
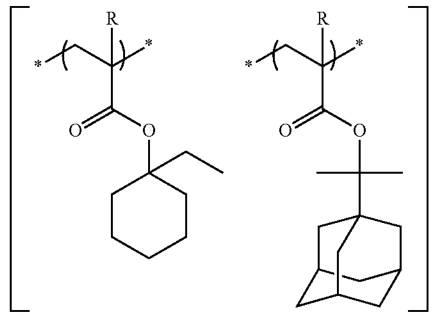
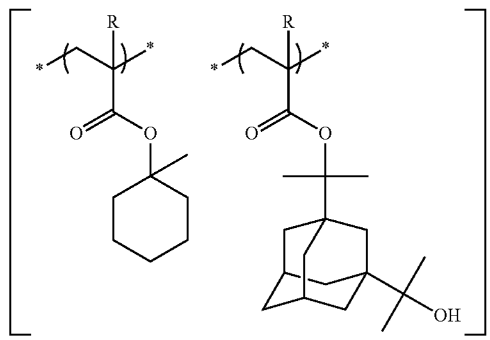
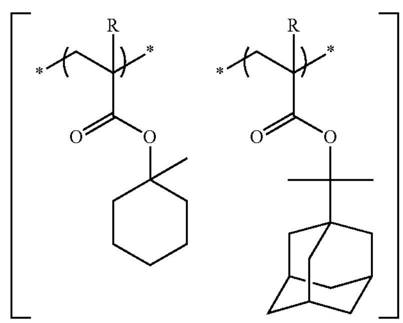
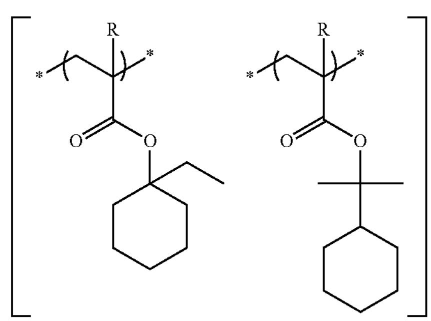

-continued
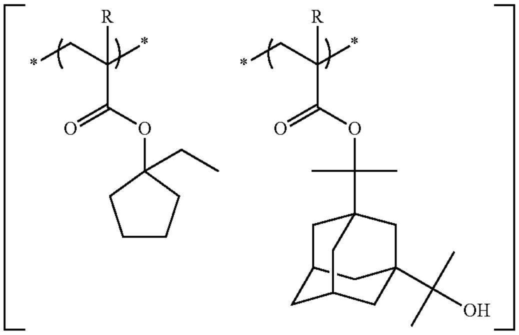
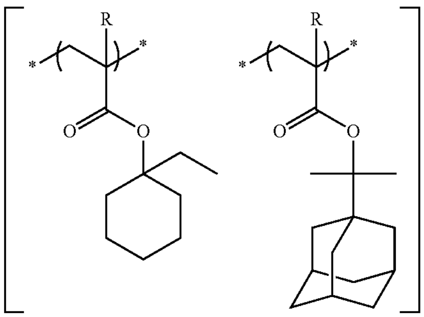
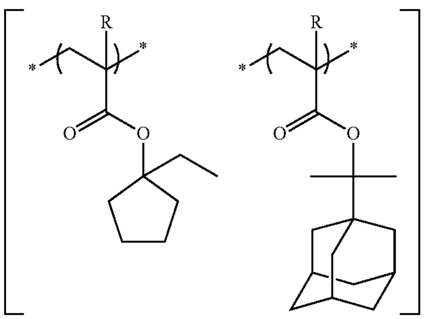
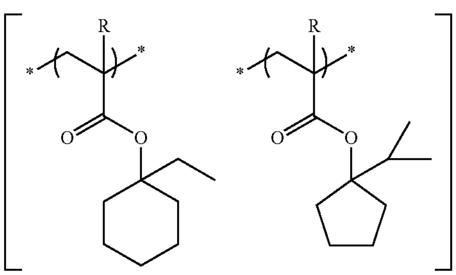
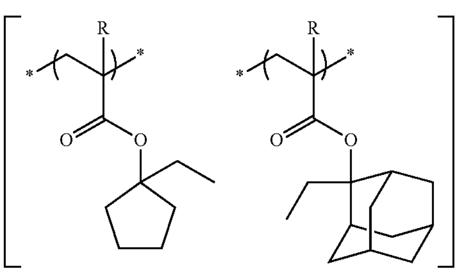
-continued
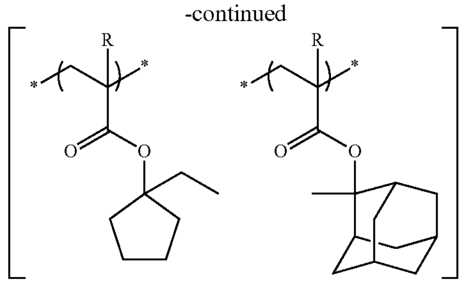
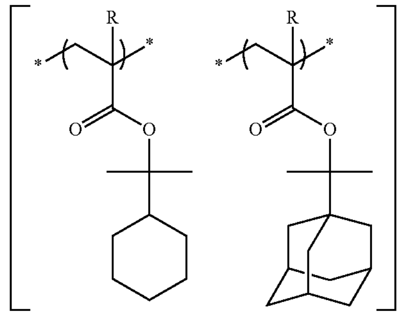
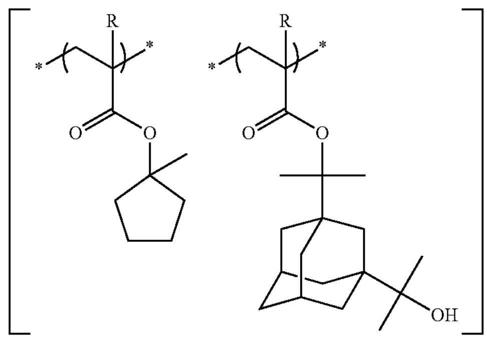
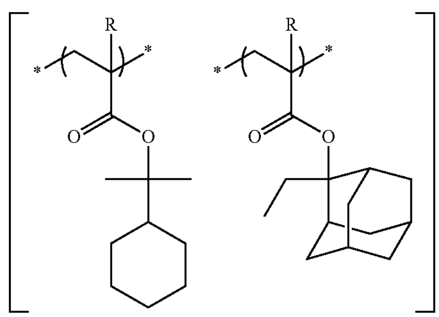
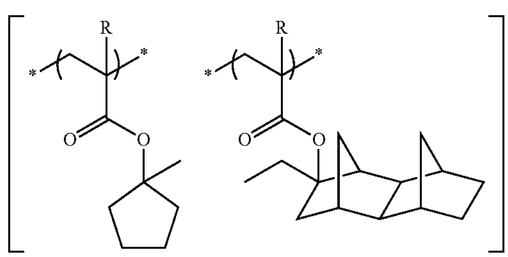

-continued

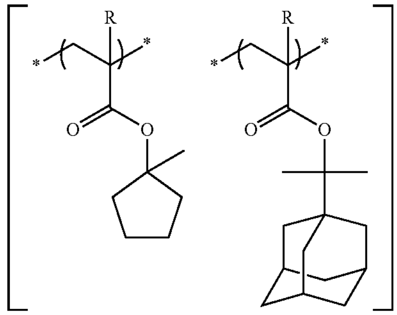

<Repeating Unit (R2)>

The repeating unit (R2) is a repeating unit containing a group that is decomposed when acted on by an acid to thereby produce an alcoholic hydroxyl group. When the resin contains such repeating units, it is possible to make change in polarity by decomposition of acid-decomposable group become higher, and a solubility contrast against a developer containing an organic solvent can be more enhanced. Further, in this case, decrease of the film thickness by post-exposure bake (PEB) can be suppressed more effectively. Additionally, in this case, resolving power can further be enhanced not only when a developer containing organic solvent is used but also when alkali developer is used.

The pKa value of the alcoholic hydroxyl group produced by the decomposition of the above group under the action of an acid is, for example, 12 or greater, and typically in the range of 12 to 20. When the pKa value is extremely small, the stability of the composition containing the acid-decomposable resin tends to decrease and the change over time of the resist performance tends to be large. Herein, the term "pKa" means the value calculated using "ACD/pKa DB" available from Fujitsu Limited under noncustomized initial setting.

It is preferred for the repeating unit (R2) to contain two or more groups that are decomposed to thereby produce an alcoholic hydroxyl group when acted on by an acid. This can further enhance a solubility constant against a developer containing an organic solvent.

It is preferred for the repeating unit (R2) to be any of those of at least one selected from the group consisting of general formulae (I-1) to (I-10) below. This repeating unit is more preferably any of those of at least one selected from the group consisting of general formulae (I-1) to (I-3) below, further more preferably any of those of general formula (I-1) below.

(I-1)

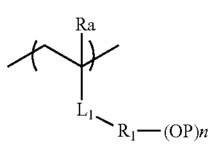

(I-2)

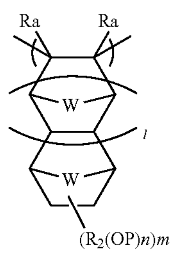

-continued (I-3)

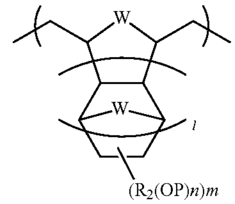

(I-4)

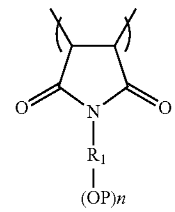

(I-5)

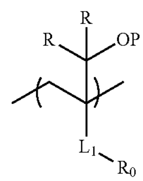

(I-6)

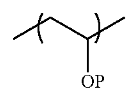

(I-7)

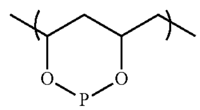

(I-8)

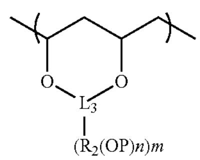

(I-9)

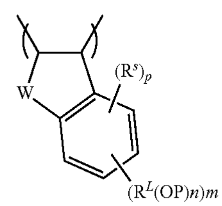

(I-10)

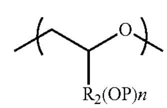

In the formulae,

Ra, or each of Ra's independently, represents a hydrogen atom, an alkyl group or any of groups of the formula $—CH_2—O—Ra2$ in which Ra2 represents a hydrogen atom, an alkyl group or an acyl group.

$R_1$ represents a (n+1)-valent organic group.

$R_2$, when m≥2 each of $R_2$s independently, represents a single bond or a (n+1)-valent organic group.

OP, or each of OPs independently, represents the group that is decomposed when acted on by an acid to thereby produce an alcoholic hydroxyl group, provided that when n≥2 and/or m≥2, two or more OPs may be bonded to each other to thereby form a ring.

W represents a methylene group, an oxygen atom or a sulfur atom.

Each of n and m is an integer of 1 or greater, provided that in general formulae (I-2), (I-3) and (I-8), n is 1 when $R_2$ represents a single bond.

l is an integer of 0 or greater.

$L_1$ represents a connecting group of the formula —COO—, —OCO—, —CONH—, —O—, —Ar—, —$SO_3$— or —$SO_2$NH—, the Ar representing a bivalent aromatic ring group.

Each of R's independently represents a hydrogen atom or an alkyl group.

$R_0$ represents a hydrogen atom or an organic group, $L_3$ represents a (m+2)-valent connecting group.

$R^L$, when m≥2 each of $R^L$s independently, represents a (n+1)-valent connecting group.

$R^S$, when p≥2 each of $R^S$s independently, represents a substituent, provided that when p≥2, two or more $R^S$s may be bonded to each other to thereby form a ring, and p is an integer of 0 to 3.

Ra represents a hydrogen atom, an alkyl group or any of groups of the formula —$CH_2$—O—Ra2. Ra is preferably a hydrogen atom or an alkyl group having 1 to 10 carbon atoms, more preferably a hydrogen atom or a methyl group.

W represents a methylene group, an oxygen atom or a sulfur atom. W is preferably a methylene group or an oxygen atom.

$R_1$ represents a (n+1)-valent organic group. $R_1$ is preferably a nonaromatic hydrocarbon group. In particular, $R_1$ may be a chain hydrocarbon group or an alicyclic hydrocarbon group. $R_1$ is more preferably an alicyclic hydrocarbon group.

$R_2$ is a single bond or a (n+1)-valent organic group. $R_2$ is preferably a single bond or a nonaromatic hydrocarbon group. In particular, $R_2$ may be a chain hydrocarbon group or an alicyclic hydrocarbon group.

When $R_1$ and/or $R_2$ are/is a chain hydrocarbon group, the chain hydrocarbon group may be in the form of a linear chain or a branched chain. The chain hydrocarbon group preferably has 1 to 8 carbon atoms. When $R_1$ and/or $R_2$ are/is, for example, an alkylene group, it is preferred for $R_1$ and/or $R_2$ to be a methylene group, an ethylene group, an n-propylene group, an isopropylene group, an n-butylene group, an isobutylene group or a sec-butylene group.

When $R_1$ and/or $R_2$ are/is an alicyclic hydrocarbon group, the alicyclic hydrocarbon group may be monocyclic or polycyclic. The alicyclic hydrocarbon group has, for example, a monocyclo, bicyclo, tricyclo or tetracyclo structure. The alicyclic hydrocarbon group has generally 5 or more carbon atoms, preferably 6 to 30 carbon atoms and more preferably 7 to 25 carbon atoms.

As the alicyclic hydrocarbon groups, there can be mentioned, for example, those having a series of partial structures shown below. A substituent may be introduced in each of these partial structures. In each of these partial structures, the methylene group (—$CH_2$—) may be replaced by an oxygen atom (—O—), a sulfur atom (—S—), a carbonyl group [—(=O)—], a sulfonyl group [—S(=O)$_2$—], a sulfinyl group [—S(=O)—] or an imino group [—N(R)—] (R is a hydrogen atom or an alkyl group).

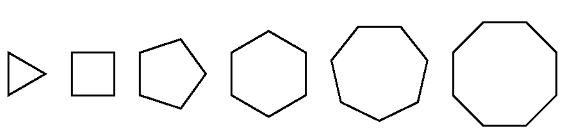

-continued

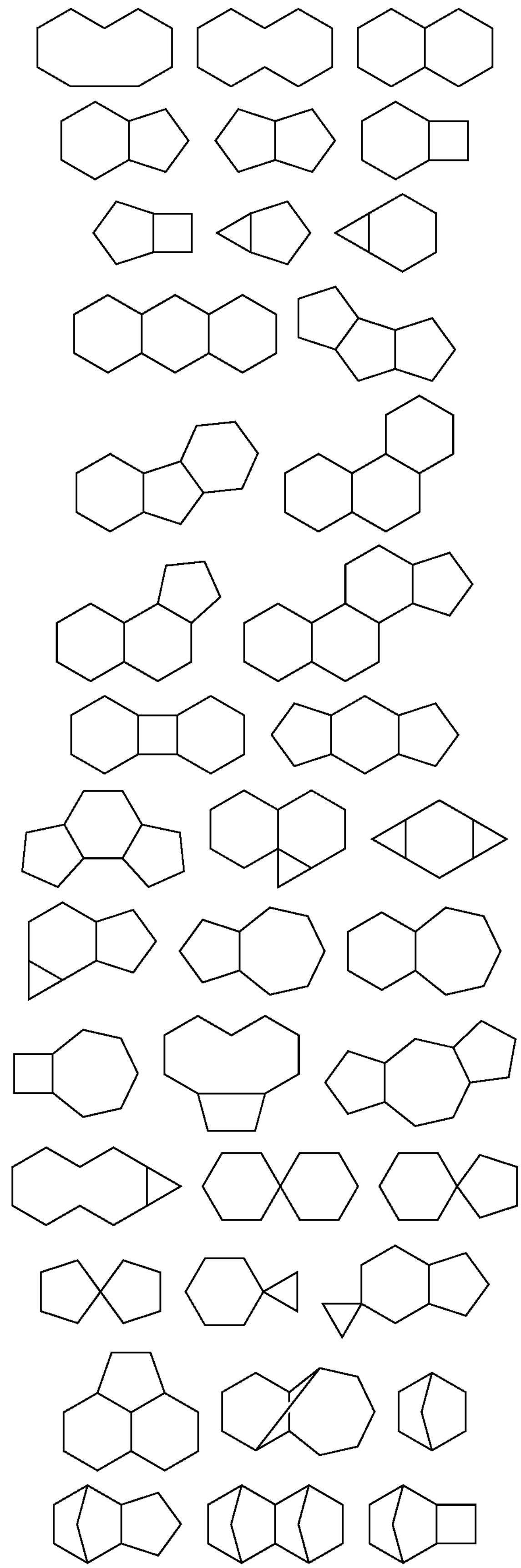

-continued

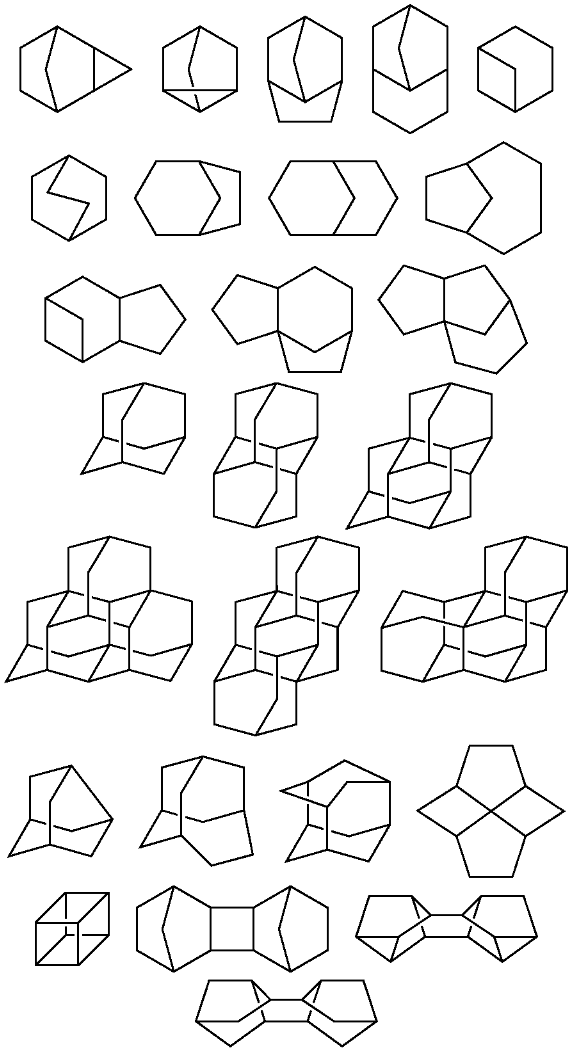

When $R_1$ and/or $R_2$ are/is, for example, a cycloalkylene group, it is preferred for $R_1$ and/or $R_2$ to be an adamantylene group, a noradamantylene group, a decahydronaphthylene group, a tricyclodecanylene group, a tetracyclododecanylene group, a norbornylene group, a cyclopentylene group, a cyclohexylene group, a cycloheptylene group, a cyclooctylene group, a cyclodecanylene group or a cyclododecanylene group. Of these, an adamantylene group, a norbornylene group, a cyclohexylene group, a cyclopentylene group, a tetracyclododecanylene group and a tricyclodecanylene group are more preferred.

One or more substituents may be introduced in the nonaromatic hydrocarbon group represented by $R_1$ and/or $R_2$. As the substituent, there can be mentioned, for example, an alkyl group having 1 to 4 carbon atoms, a halogen atom, a hydroxyl group, an alkoxy group having 1 to 4 carbon atoms, a carboxyl group or an alkoxycarbonyl group having 2 to 6 carbon atoms. A substituent may further be introduced in the alkyl group, alkoxy group and alkoxycarbonyl group. As such a substituent, there can be mentioned, for example, a hydroxyl group, a halogen atom or an alkoxy group.

$L_1$ represents a connecting group of the formula —COO—, —COO—, —CONH—, —O—, —Ar—, —$SO_3$— or —$SO_2$NH—. Herein, Ar represents a bivalent aromatic ring group. $L_1$ is preferably a connecting group of the formula —COO—, —CONH— or —Ar—, more preferably a connecting group of the formula —COO— or —CONH—.

R represents a hydrogen atom or an alkyl group. The alkyl group may be in the form of a linear chain or a branched chain. The alkyl group preferably has 1 to 6 carbon atoms, more preferably 1 to 3 carbon atoms. It is preferred for R to be a hydrogen atom or a methyl group, especially a hydrogen atom.

$R_0$ represents a hydrogen atom or an organic group. As the organic group, there can be mentioned, for example, an alkyl group, a cycloalkyl group, an aryl group, an alkynyl group or an alkenyl group. It is preferred for Ro to be a hydrogen atom or an alkyl group, especially a hydrogen atom or a methyl group.

$L_3$ represents a (m+2)-valent connecting group. Namely, $L_3$ represents a tri- or higher valent connecting group. As such a connecting group, there can be mentioned, for example, a corresponding group contained in each of particular examples shown below.

$R^L$ represents a (n+1)-valent connecting group. Namely, $R^L$ represents a bi- or higher valent connecting group. As such a connecting group, there can be mentioned, for example, an alkylene group, a cycloalkylene group or a corresponding group contained in each of particular examples shown below. $R^L$s, or $R^L$ and $R^S$, may be bonded to each other to thereby form a ring structure.

$R^S$ represents a substituent. As the substituent, there can be mentioned, for example, an alkyl group, an alkenyl group, an alkynyl group, an aryl group, an alkoxy group, an acyloxy group, an alkoxycarbonyl group or a halogen atom.

In the formula, n is an integer of 1 or greater, preferably an integer of 1 to 3, and more preferably 1 or 2. When n is 2 or greater, the dissolution contrast to a developer containing an organic solvent can be enhanced. Accordingly, if so, the limiting resolving power and roughness characteristic can be enhanced.

In the formula, m is an integer of 1 or greater, preferably an integer of 1 to 3, and more preferably 1 or 2, l is an integer of 0 or greater, preferably 0 or 1, and p is an integer of 0 to 3.

Specific examples of the repeating units each containing a group that is decomposed when acted on by an acid to thereby produce an alcoholic hydroxyl group will be shown below. In the particular examples, Ra and OP are as defined in general formulae (I-1) to (I-3). When a plurality of OPs are bonded to each other to thereby form a ring, the corresponding ring structure is expressed as "O—P—O" for the sake of convenience.

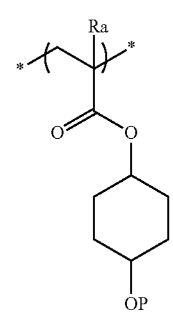

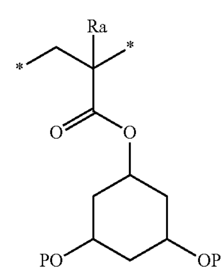

-continued
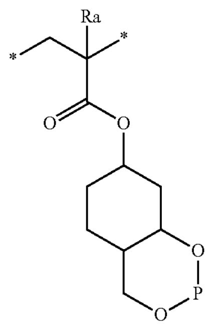
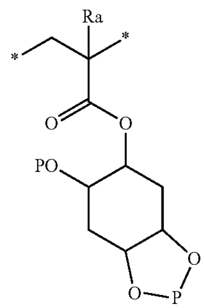
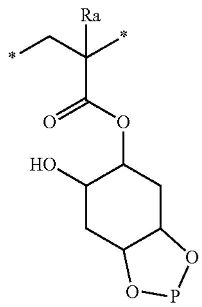
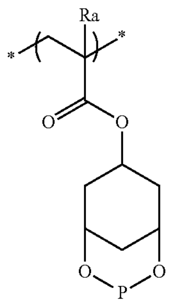
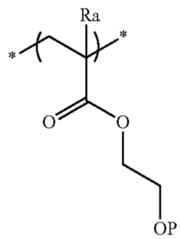
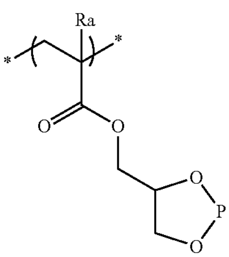
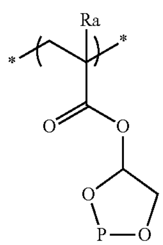
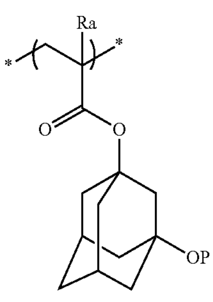
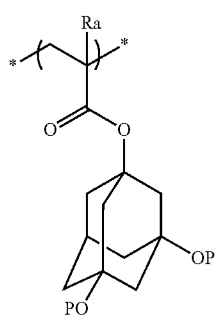
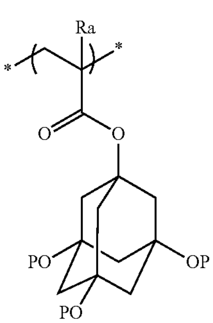
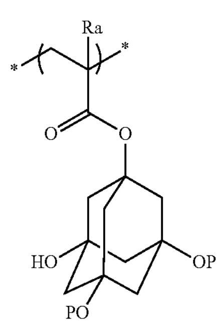
-continued
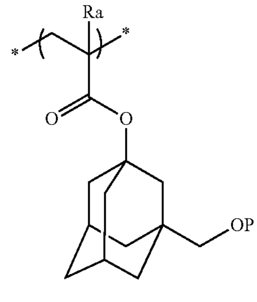
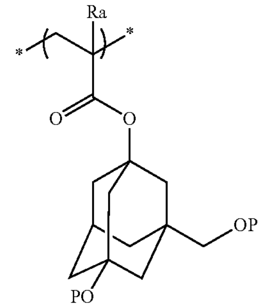
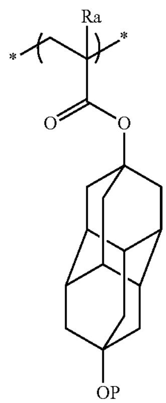
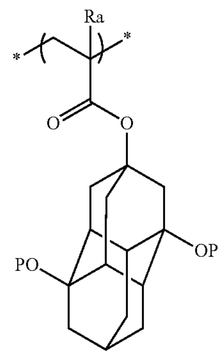
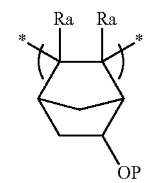
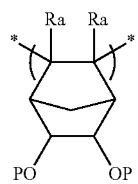
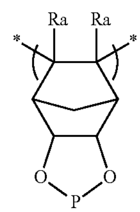
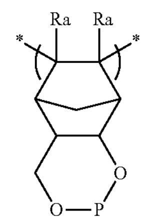
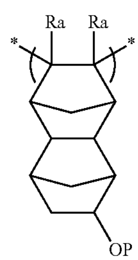
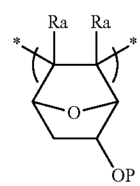
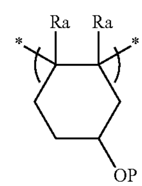
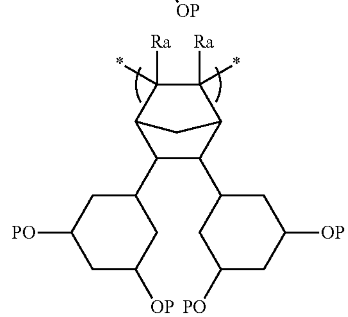
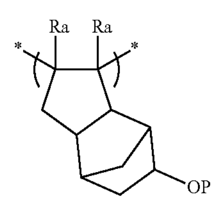
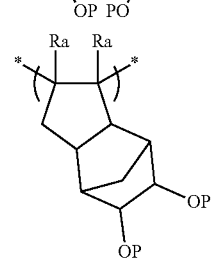
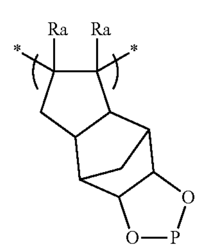

-continued

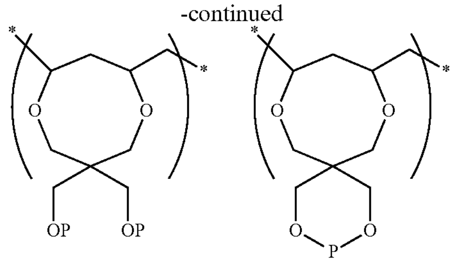

It is preferred for the group that is decomposed when acted on by an acid to thereby produce an alcoholic hydroxyl group to be any of those of at least one selected from the group consisting of general formulae (II-1) to (II-4) below.

(II-1)

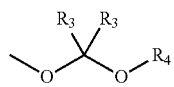

(II-2)

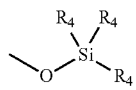

(II-3)

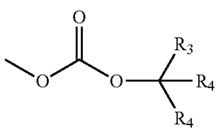

(II-4)

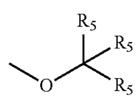

In the formulae, $R_3$, or each of $R_3$s independently, represents a hydrogen atom or a monovalent organic group, provided that $R_3$s may be bonded to each other to thereby form a ring.

$R_4$, or each of $R_4$s independently, represents a monovalent organic group, provided that $R_4$s may be bonded to each other to thereby form a ring and that $R_3$ and $R_4$ may be bonded to each other to thereby form a ring.

Each of $R_5$s independently represents a hydrogen atom, an alkyl group, a cycloalkyl group, an aryl group, an alkenyl group or an alkynyl group, provided that at least two $R_5$s may be bonded to each other to thereby form a ring and that when one or two of three $R_5$s are a hydrogen atom, at least one of the rest of $R_5$s represents an aryl group, an alkenyl group or an alkynyl group.

It is preferred for the group that is decomposed when acted on by an acid to thereby produce an alcoholic hydroxyl group to be any of those of at least one selected from the group consisting of general formulae (II-5) to (II-9) below.

(II-5)

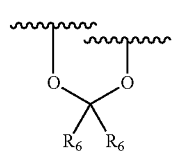

-continued (II-6)

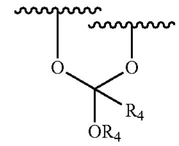

(II-7)

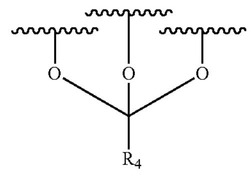

(II-8)

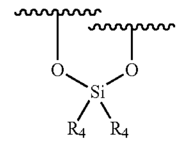

(II-9)

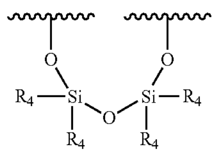

In the formulae, $R_4$ is as defined above in general formulae (II-1) to (II-3).

Each of $R_6$s independently represents a hydrogen atom or a monovalent organic group, provided that $R_6$s may be bonded to each other to thereby form a ring.

The group that is decomposed when acted on by an acid to thereby produce an alcoholic hydroxyl group is more preferably any of those of at least one selected from among general formulae (II-1) to (II-3), further more preferably any of those of general formula (II-1) or (II-3) and most preferably any of those of general formula (II-1).

As mentioned above, $R_3$ represents a hydrogen atom or a monovalent organic group. $R_3$ is preferably a hydrogen atom, an alkyl group or a cycloalkyl group, more preferably a hydrogen atom or an alkyl group.

The alkyl group represented by $R_3$ may be in the form of a linear chain or a branched chain. The alkyl group represented by $R_3$ preferably has 1 to 10 carbon atoms, more preferably 1 to 3 carbon atoms. As the alkyl group represented by $R_3$, there can be mentioned, for example, a methyl group, an ethyl group, an n-propyl group, an isopropyl group or an n-butyl group.

The cycloalkyl group represented by $R_3$ may be monocyclic or polycyclic. The cycloalkyl group represented by $R_3$ preferably has 3 to 10 carbon atoms, more preferably 4 to 8 carbon atoms. As the cycloalkyl group represented by $R_3$, there can be mentioned, for example, a cyclopropyl group, a cyclobutyl group, a cyclopentyl group, a cyclohexyl group, a norbornyl group or an adamantyl group.

In general formula (II-1), it is preferred for at least one of $R_3$s to be a monovalent organic group. If so, an especially high sensitivity can be attained.

$R_4$ represents a monovalent organic group. $R_4$ is preferably an alkyl group or a cycloalkyl group, more preferably an alkyl group. One or more substituents may be introduced in the alkyl group and cycloalkyl group.

Preferably, the alkyl group represented by $R_4$ is unsubstituted, or one or more aryl groups and/or one or more silyl groups are introduced therein as substituents. The unsubstituted alkyl group preferably has 1 to 20 carbon atoms. The alkyl group moiety of the alkyl group substituted with one or more aryl groups preferably has 1 to 25 carbon atoms. The alkyl group moiety of the alkyl group substituted with one or more silyl groups preferably has 1 to 30 carbon atoms. When the cycloalkyl group represented by $R_4$ is unsubstituted, the number of carbon atoms thereof is preferably in the range of 3 to 20.

$R_5$ represents a hydrogen atom, an alkyl group, a cycloalkyl group, an aryl group, an alkenyl group or an alkynyl group, provided that when one or two of three $R_5$s are hydrogen atoms, at least one of the rest of $R_5$s represents an aryl group, an alkenyl group or an alkynyl group. $R_5$ is preferably a hydrogen atom or an alkyl group. The alkyl group may be substituted or unsubstituted. When the alkyl group is unsubstituted, it preferably has 1 to 6 carbon atoms, more preferably 1 to 3 carbon atoms.

As mentioned above, $R_6$ represents a hydrogen atom or a monovalent organic group. $R_6$ is preferably a hydrogen atom, an alkyl group or a cycloalkyl group, more preferably a hydrogen atom or an alkyl group and further more preferably a hydrogen atom or an unsubstituted alkyl group. In particular, $R_6$ is preferably a hydrogen atom or an alkyl group having 1 to 10 carbon atoms, more preferably a hydrogen atom or an unsubstituted alkyl group having 1 to 10 carbon atoms.

As the alkyl groups and cycloalkyl groups represented by $R_4$, $R_5$ and $R_6$, there can be mentioned, for example, those set forth above with respect to $R_3$.

Specific examples of the groups that are decomposed to thereby produce an alcoholic hydroxyl group when acted on by an acid will be shown below.

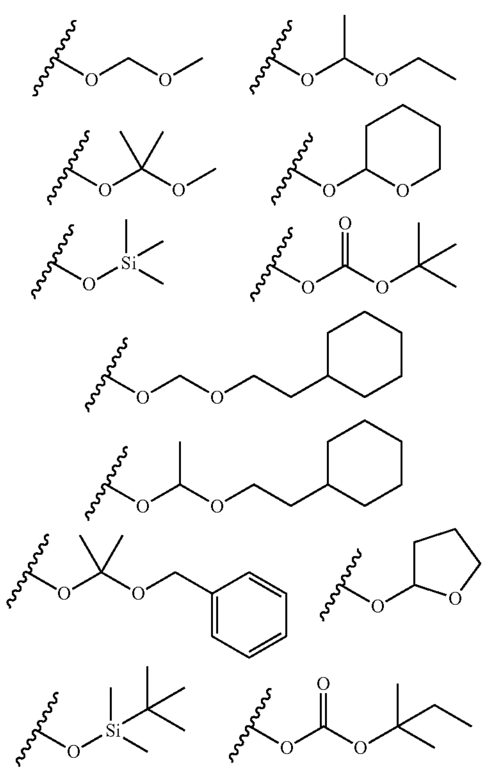

-continued

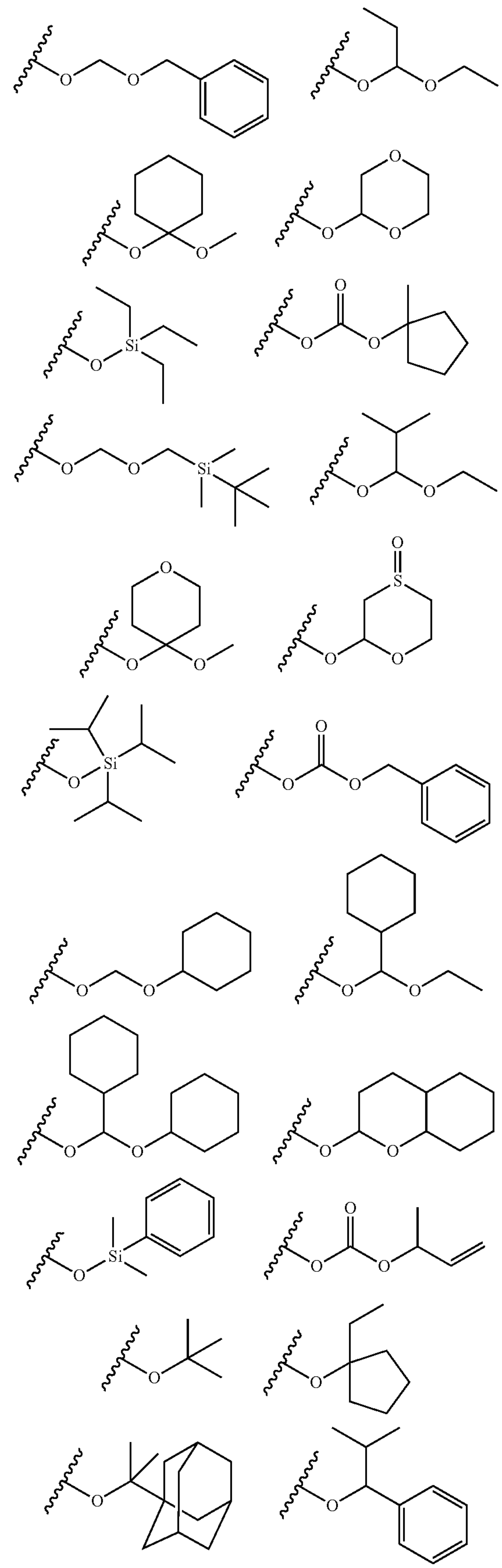

-continued
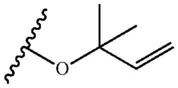
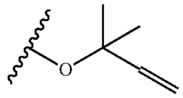
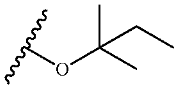
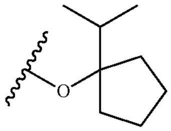
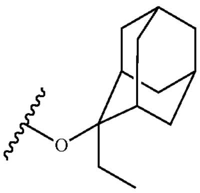
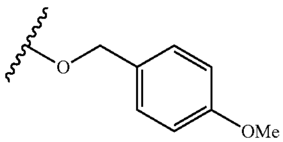
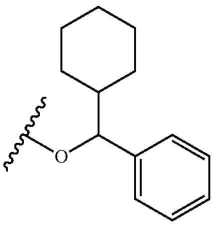
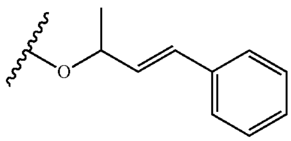
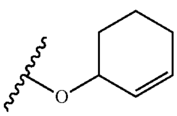
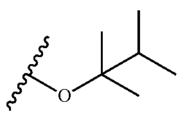
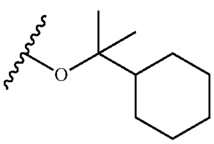
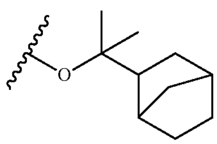
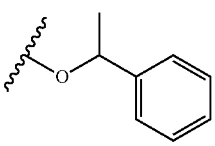
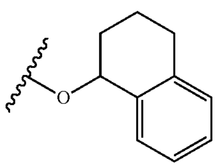
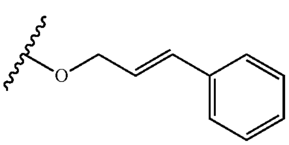
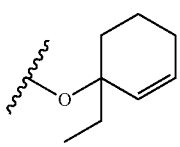
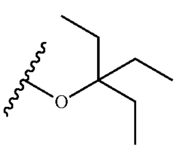
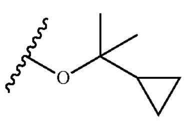
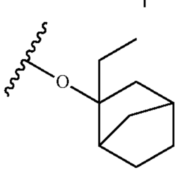
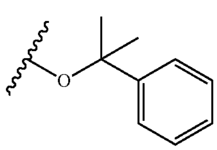
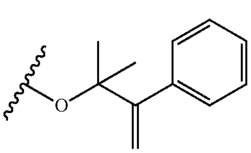
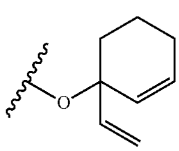
-continued
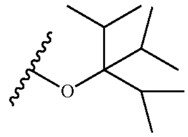
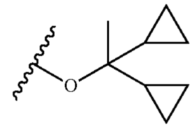
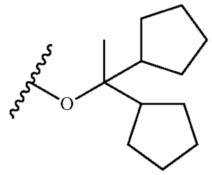
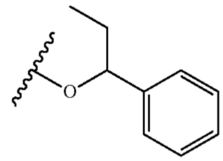
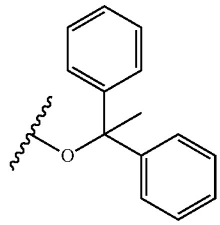
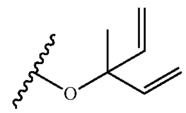
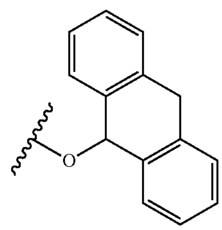
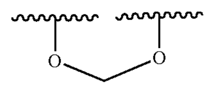
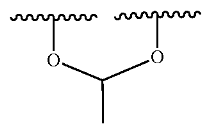
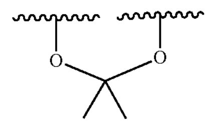
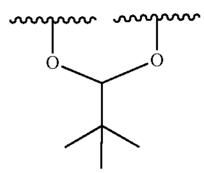
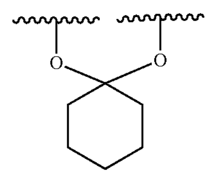
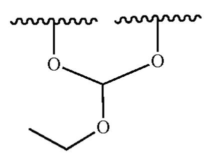
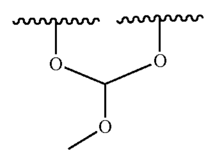
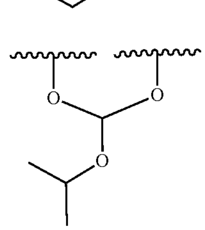
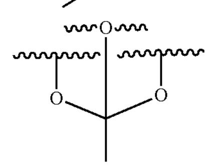
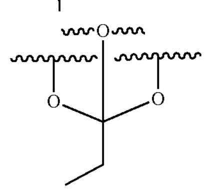
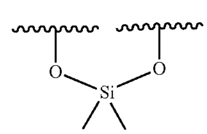

-continued

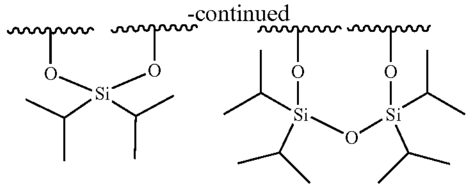

The acid-decomposable resin may contain two or more types of repeating units (R2) each containing a group that is decomposed when acted on by an acid to thereby produce an alcoholic hydroxyl group. If so, fine regulation of reactivity and/or developability can be effected, thereby facilitating the optimization of various performances.

When the acid-decomposable group contains the repeating unit (R2), the overall content thereof is preferably 10 to 99 mol %, more preferably 30 to 90 mol %, and further more preferably 50 to 80 mol % based on all the repeating units in the resin.

The overall content of the repeating units containing an acid-decomposable group is preferably 10 to 99 mol %, more preferably 20 to 90 mol %, and further more preferably 30 to 80 mol % based on all the repeating units in the resin.

[3] Other Repeating Units

The resin may further contain other repeating units. As such, the following repeating units (3A), (3B) and (3C) can be exemplified.

(3A) Repeating Unit Containing a Polar Group

The resin may further contain a repeating unit (A) containing a polar group. If so, for example, the sensitivity of the composition comprising the resin can be enhanced.

As the "polar group" that can be contained in the repeating unit (A), there can be mentioned, for example, functional groups (1) to (4) below. In the following, "electronegativity" means a value according to Pauling.

(1) Functional group containing a structure in which an oxygen atom is bonded through a single bond to an atom whose electronegativity exhibits a difference of 1.1 or greater from that of the oxygen atom As this polar group, there can be mentioned, for example, a group containing the structure of O—H, such as a hydroxyl group.

(2) Functional group containing a structure in which a nitrogen atom is bonded through a single bond to an atom whose electronegativity exhibits a difference of 0.6 or greater from that of the nitrogen atom As this polar group, there can be mentioned, for example, a group containing the structure of N—H, such as an amino group.

(3) Functional group containing a structure in which two atoms whose electronegativity values exhibit a difference of 0.5 or greater are bonded to each other through a double bond or triple bond As this polar group, there can be mentioned, for example, a group containing the structure of C≡N, C═O, N═O, S═O or C═N.

(4) Functional Group Containing an Ionic Moiety

As this polar group, there can be mentioned, for example, a group containing the moiety of $N^+$ or $S^+$.

The "polar group" that can be contained in the repeating unit (3A) is, for example, at least one selected from the group consisting of (I) a hydroxyl group, (II) a cyano group, (III) a lactone group, (IV) a carboxylate group or a sulfonate group, (V) an amido group, a sulfonamido group or a group corresponding to a derivative thereof, (VI) an ammonium group or a sulfonium group, and a group formed of a combination of two or more thereof.

It is especially preferred for this polar group to be an alcoholic hydroxyl group, a cyano group, a lactone group or a group containing a cyanolactone structure.

The exposure latitude (EL) of the composition comprising the resin can be enhanced by causing the resin to further contain a repeating unit containing an alcoholic hydroxyl group.

The sensitivity of the composition comprising the resin can be enhanced by causing the resin to further contain a repeating unit containing a cyano group.

The dissolution contrast in a developer containing an organic solvent of the composition can be enhanced by causing the resin to further contain a repeating unit containing a lactone group. Also, if so, the dry etching resistance, applicability and adhesion to substrates of the composition comprising the resin can be enhanced.

The dissolution contrast in a developer containing an organic solvent of the composition can be enhanced by causing the resin to further contain a repeating unit containing a group having a lactone structure containing a cyano group. Also, if so, the sensitivity, dry etching resistance, applicability and adhesion to substrates of the composition comprising the resin can be enhanced. In addition, if so, the functions respectively attributed to the cyano group and the lactone group can be introduced in a single repeating unit, so that the freedom of the design of the resin can be further increased.

Specific examples of the structures that can be contained in the "polar group" will be shown below.

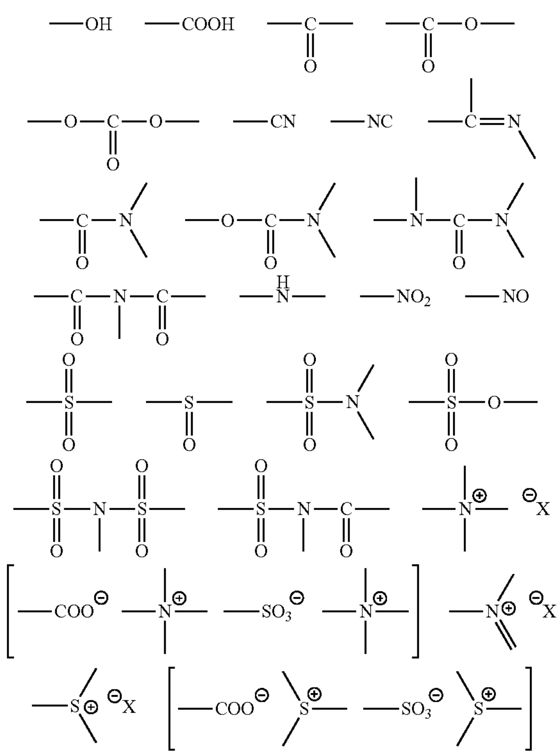

As preferred repeating units (3A), there can be mentioned, for example, repeating units (R2) as mentioned above wherein the "group capable of producing the group that is decomposed when acted on by an acid to thereby produce an alcoholic hydroxyl group" is replaced by an "alcoholic hydroxyl group."

It is preferred for the repeating unit (A) to have any of the structures of general formulae (I-1) to (I-10) above wherein "OP" is replaced by "OH." Namely, it is preferred for the repeating unit (A) to be any of those of at least one selected from the group consisting of general formulae (I-1H) to (I-10H) below. It is especially preferred for the repeating unit (A) to be any of those of at least one selected from the group consisting of general formulae (I-1H) to (I-3H) below. The repeating units of general formula (I-1H) below are further more preferred.

(I-1H)

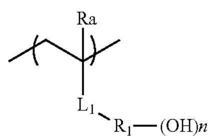

(I-2H)

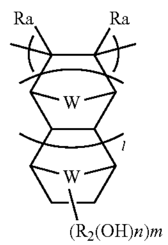

(I-3H)

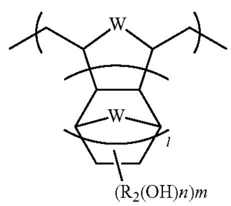

(I-4H)

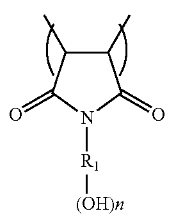

(I-5H)

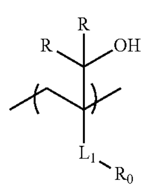

(I-6H)

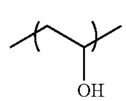

(I-7H)

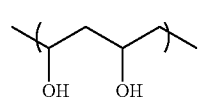

(I-8H)

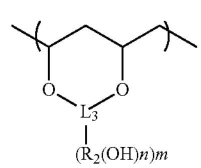

-continued (I-9H)

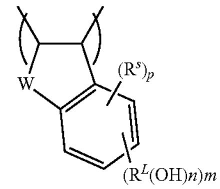

(I-10H)

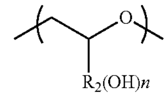

In the formulae, Ra, $R_1$, $R_2$, OP, W, n, m, l, $L_1$, R, $R_0$, $L_3$, $R^L$, $R^S$ and p are as defined above in general formulae (I-1) to (I-10).

When the repeating unit containing a group that is decomposed when acted on by an acid to thereby produce an alcoholic hydroxyl group is used in combination with any of the repeating units of at least one selected from the group consisting of general formulae (I-1H) to (I-10H) above, for example, the inhibition of acid diffusion by the alcoholic hydroxyl group cooperates with the sensitivity increase by the group that is decomposed when acted on by an acid to thereby produce an alcoholic hydroxyl group, thereby realizing an enhancement of exposure latitude (EL) without deterioration of other performance.

The content of repeating unit (3A) resulting from replacement of the "group capable of producing the group that is decomposed when acted on by an acid to thereby produce an alcoholic hydroxyl group" by an "alcoholic hydroxyl group" in the above repeating units ($R_2$), based on all the repeating units of the acid-decomposable resin, is preferably in the range of 5 to 99 mol %, more preferably 10 to 90 mol % and further more preferably 20 to 80 mol %.

Specific examples of the repeating units represented by any of general formula (I-1H) to (I-10H) will be shown below. In the specific examples, Ra is as defined in general formulae (I-1H) to (I-10H) above.

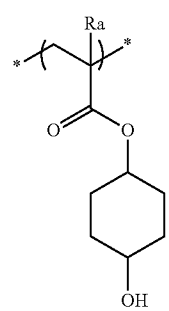

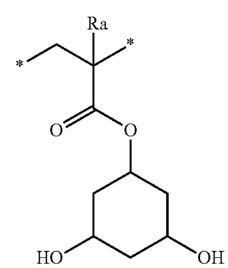

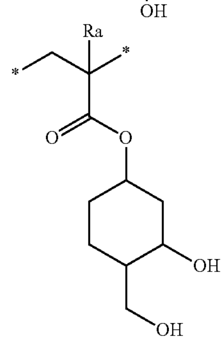

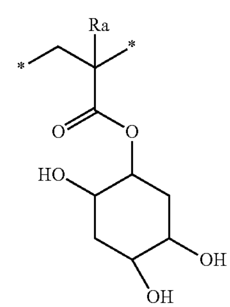

-continued

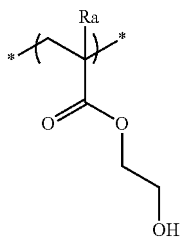
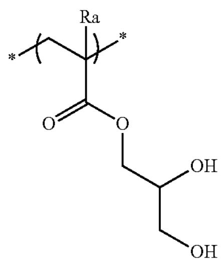
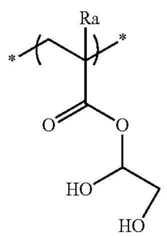
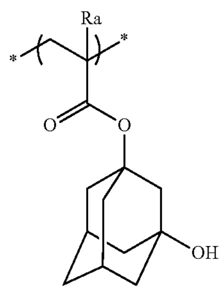
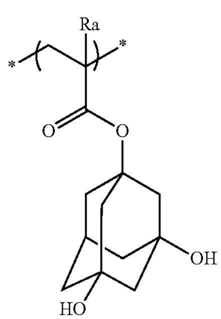
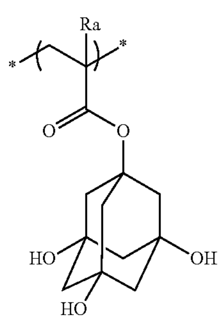
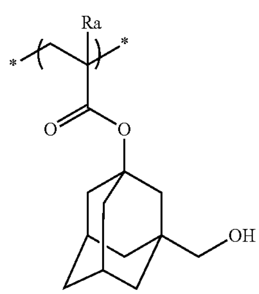
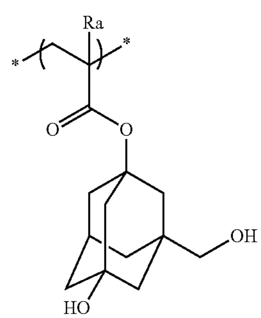
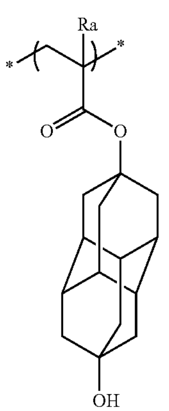
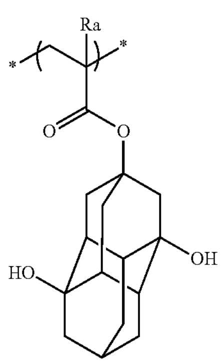
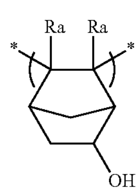

-continued

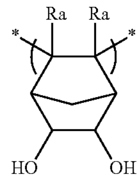
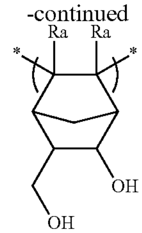
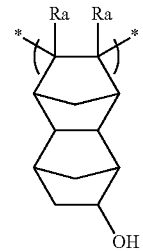
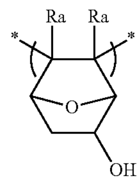
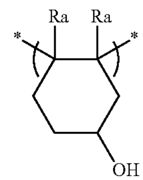
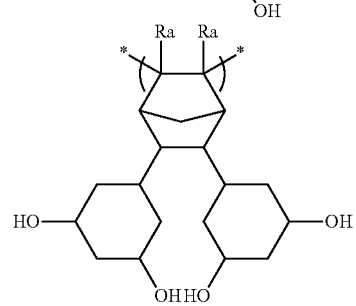
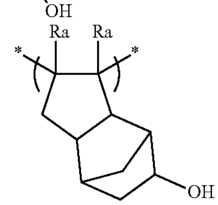
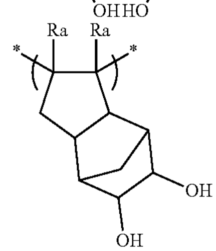
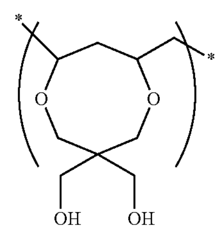

As other preferred repeating units (3A), there can be mentioned, for example, a repeating unit containing a hydroxyl group or a cyano group. Introducing this repeating unit enhances the adherence to substrates and the affinity to developer.

A repeating unit containing a hydroxyl group or a cyano group is preferably a repeating unit having an alicyclic hydrocarbon structure substituted with a hydroxy group or a cyano group. Further, the repeating unit is preferably free from the acid-decomposable group. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

(VIIa)

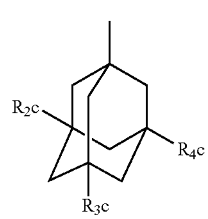

-continued (VIIb)

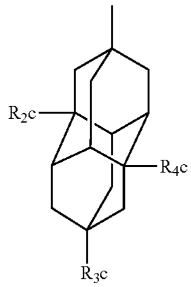

(VIIc)

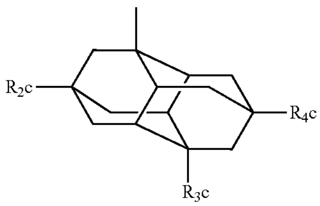

(VIId)

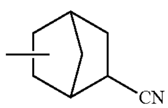

In the general formulae (VIIa) to (VIIc), each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. In the general formula (VIIa), more preferably, two of the $R_2c$ to $R_4c$ are hydroxy groups and the remainder is a hydrogen atom.

As the repeating units having any of the partial structures represented by the general formulae (VIIa) to (VIId), those of the following general formulae (AIIa) to (AIId) can be exemplified.

(AIIa)

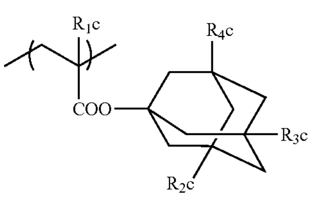

(AIIb)

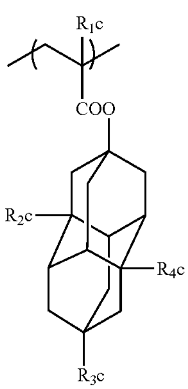

-continued (AIIc)

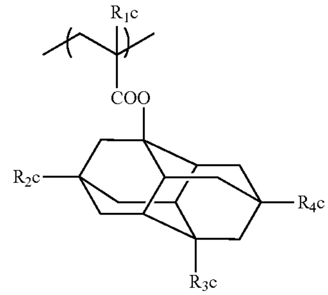

(AIId)

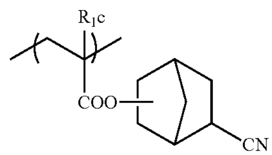

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc).

The content of the repeating unit containing a hydroxyl group or a cyano group based on all the repeating units of the acid-decomposable resin is preferably in the range of 5 to 70 mol %, more preferably 5 to 60 mol % and further more preferably 10 to 50 mol %.

Specific examples of the repeating units containing a hydroxyl group or a cyano group will be shown below, which however in no way limit the scope of the present invention.

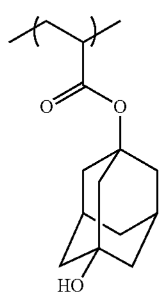

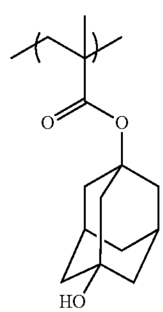

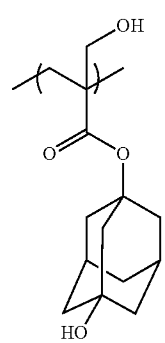

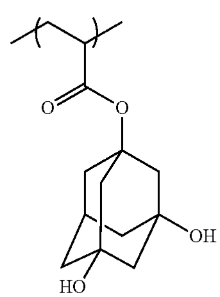

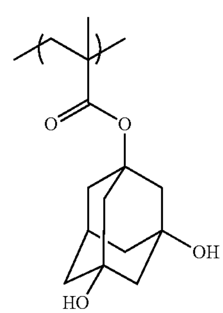

-continued

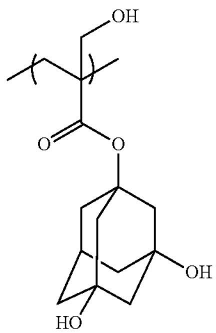

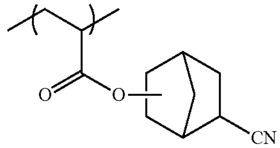

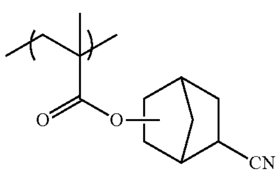

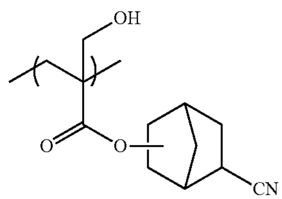

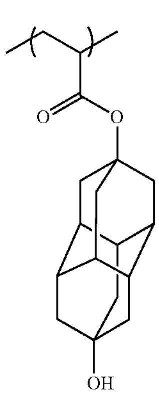

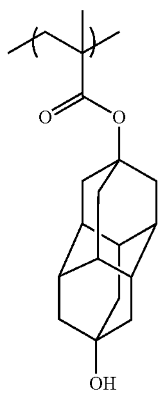

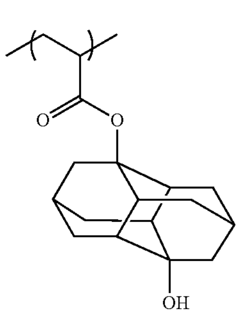

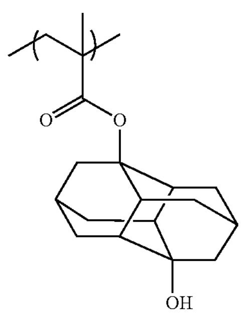

As a further other preferred repeating unit (3A), there can be mentioned, for example, a repeating unit containing a lactone structure.

A repeating unit containing a lactone structure preferably contains the lactone structure having a 5 to 7-membered ring. More preferably, a lactone structure in which another cyclic structure is condensed with this lactone structure having a 5 to 7-membered ring in a fashion to form a bicyclo structure or spiro structure.

More specifically, lactone structures represented by any of general formulae (LC1-1) to (LC1-17) below can be exemplified. Of these, more preferred are those of formulae (LC1-1), (LC1-4), (LC1-5), (LC1-6), (LC1-13), (LC1-14), and (LC1-17). The use of these specified lactone structures would realize improvement in the line edge roughness and development defect.

LC1-1

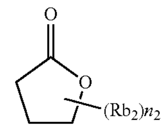

LC1-2

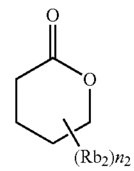

LC1-3

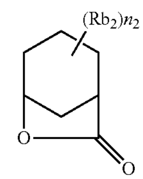

LC1-4

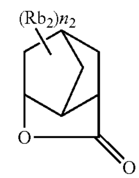

LC1-5

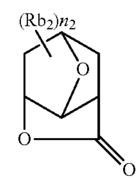

LC1-6

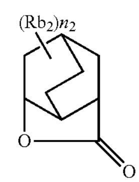

LC1-7

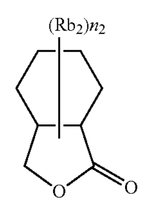

LC1-8

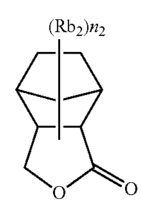

LC1-9

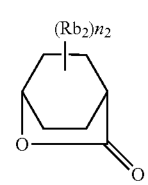

-continued

LC1-10

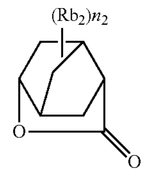

LC1-11

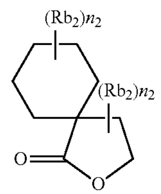

LC1-12

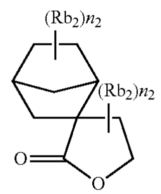

LC1-13

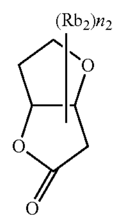

LC1-14

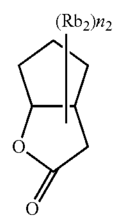

LC1-15

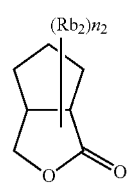

LC1-16

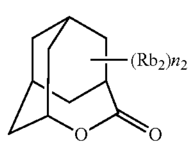

LC1-17

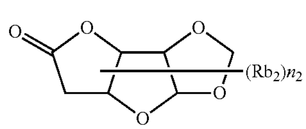

In the formulae, $Rb_2$ represents a substituent, and $n_2$ represents an integer of 0 to 4. Preferably, $n_2$ is an integer of 0 to 2.

As preferred $Rb_2$, there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group which will be described below, and the like. Of these, an alkyl group having 1 to 4 carbon atoms, a cyano group or an acid-decomposable group is particularly preferable.

When $n_2 \geq 2$, the plurality of $Rb_2$ may be identical to or different from each other. Further, the plurality of $Rb_2$ may be bonded to each other to thereby form a ring.

As the repeating unit containing a lactone structure, for example, a repeating unit represented by the general formula (AII') below can be exemplified.

(AII')

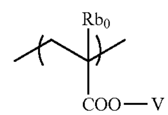

In general formula (AII'), $Rb_0$ represents a hydrogen atom, a halogen atom or an alkyl group having 1 to 4 carbon atoms. As preferred substituents that may be introduced in the alkyl group represented by $Rb_0$, there can be mentioned a hydroxyl group and a halogen atom. As the halogen atom, there can be mentioned a fluorine atom, a chlorine atom, a bromine atom or an iodine atom. Preferably, $Rb_0$ represents a hydrogen atom, a methyl group, a hydroxymethyl group, or a trifluoromethyl group, and more preferably a hydrogen atom or a methyl group.

V represents any of the groups of the general formulae (LC1-1) to (LC1-17).

Specific examples of repeating unit containing a lactone structure will be shown below, which in no way limit the scope of the present invention.

In the formulae, Rx represents H, $CH_3$, $CH_2OH$, or $CF_3$.

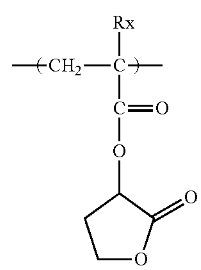

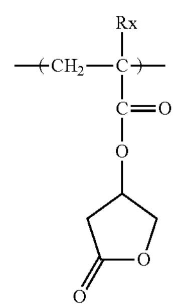

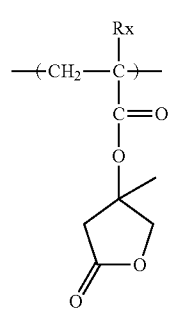

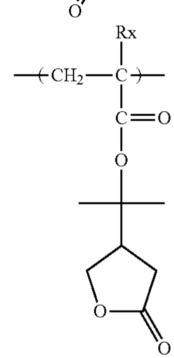

-continued
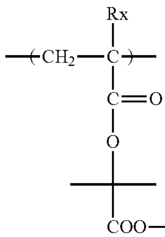
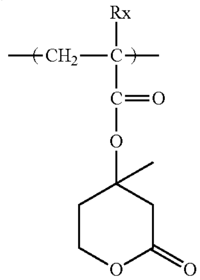
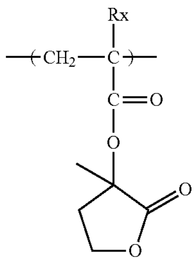
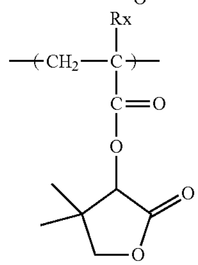
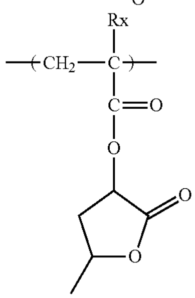
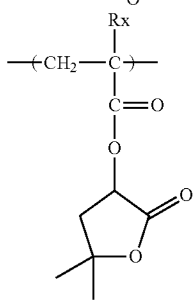
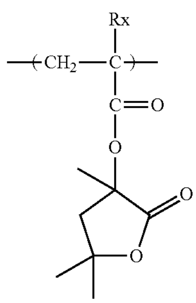
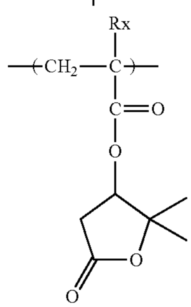
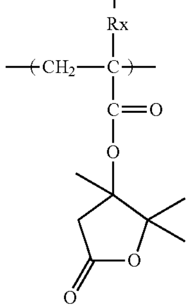
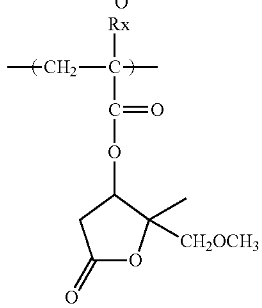
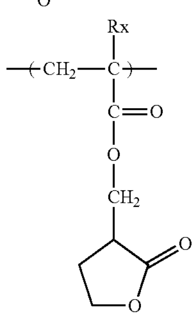
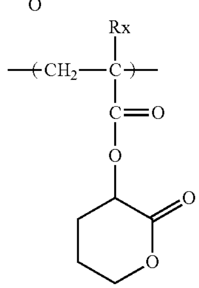
-continued
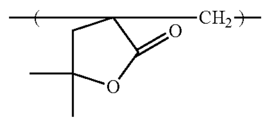
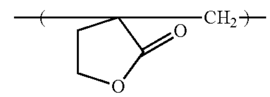
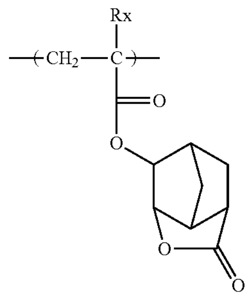
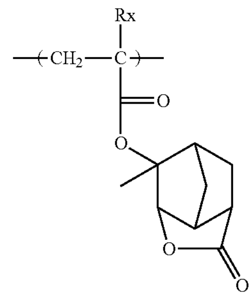
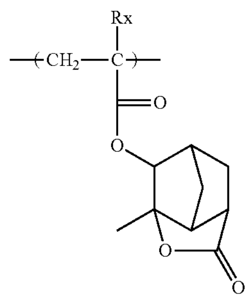
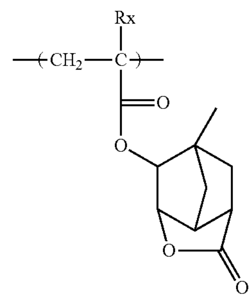
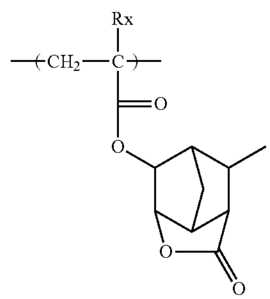
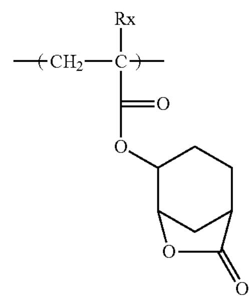
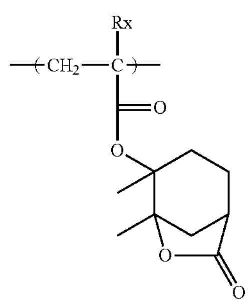
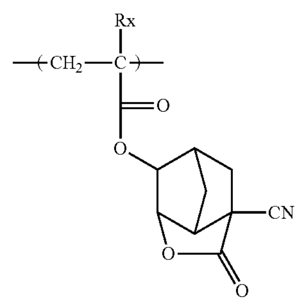
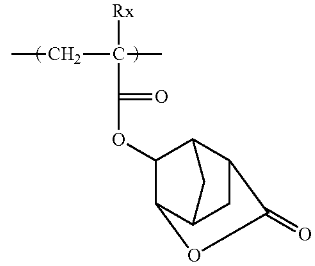

-continued
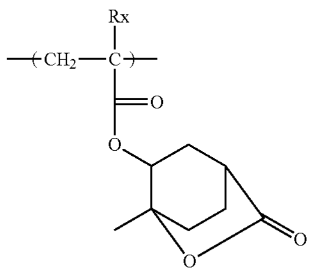
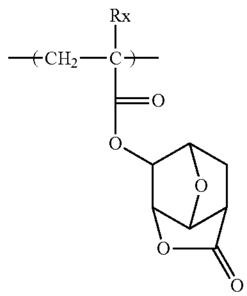
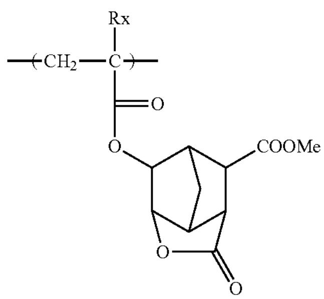
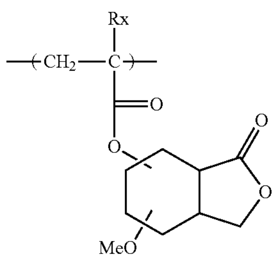
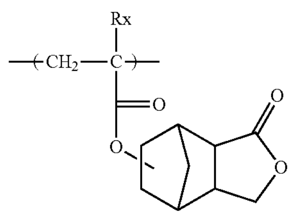
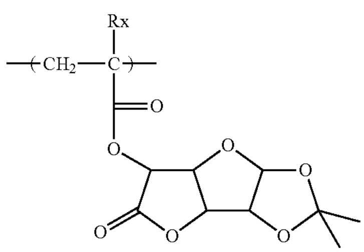
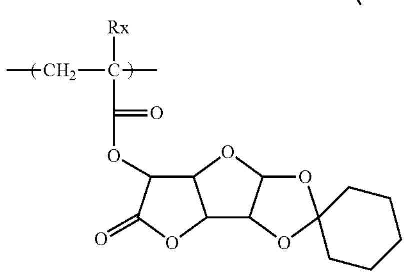
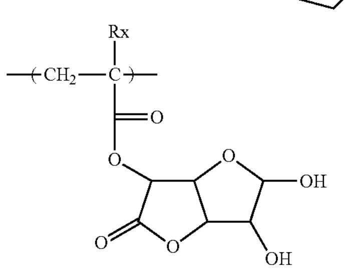
-continued
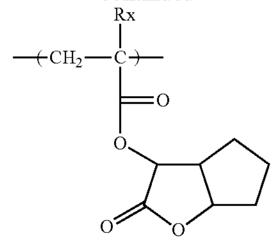
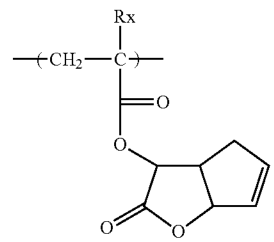
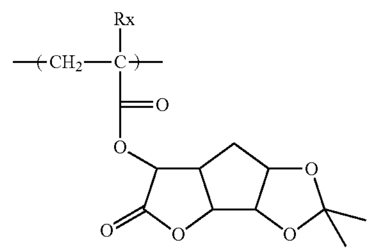
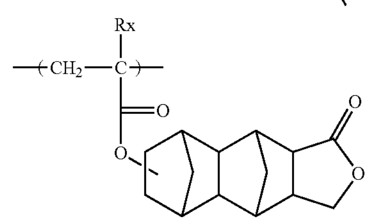
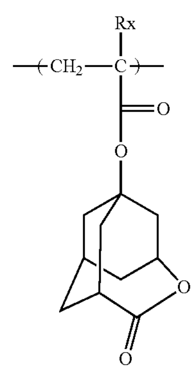
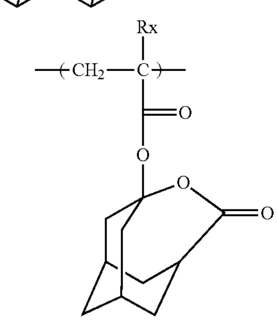
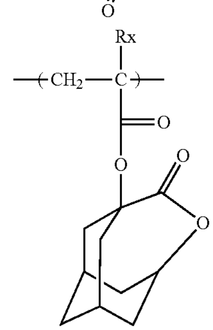
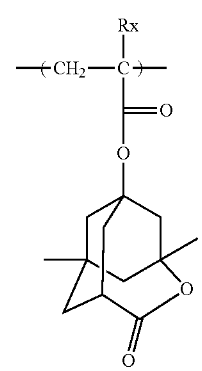

-continued
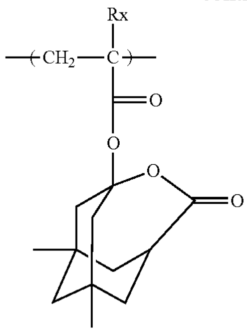
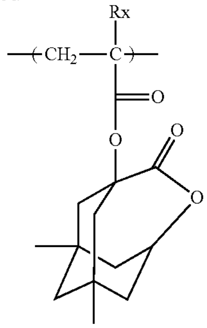
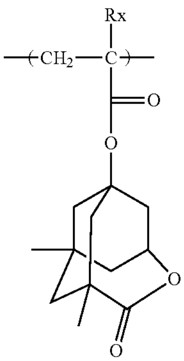
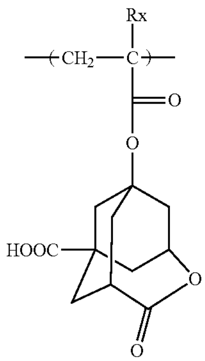
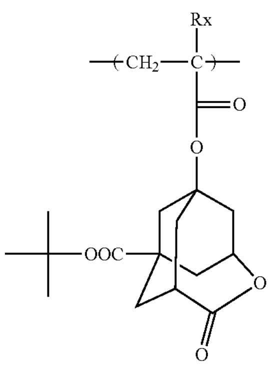
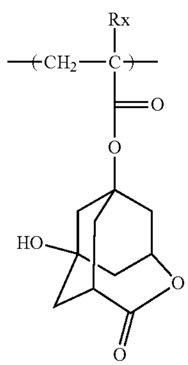
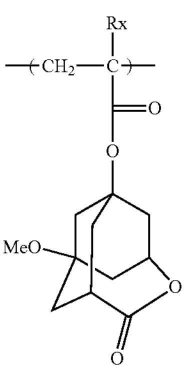
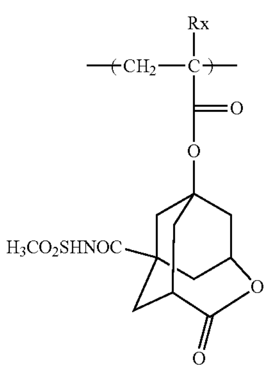
Preferred examples of the repeating units having a lactone structure are those shown below. For example, the pattern profile and/or iso/dense bias can be optimized by selecting the most appropriate lactone group.
In the formulae, Rx represents H, $CH_3$, $CH_2OH$, or $CF_3$.
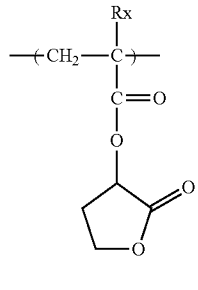
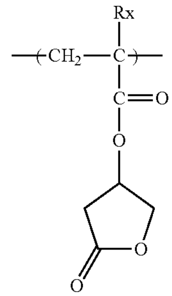
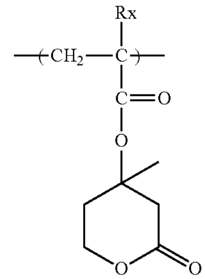
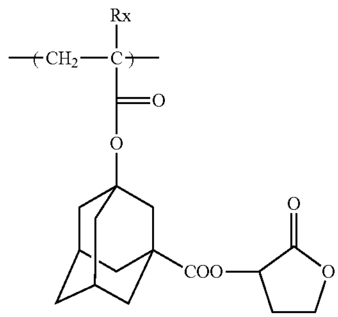
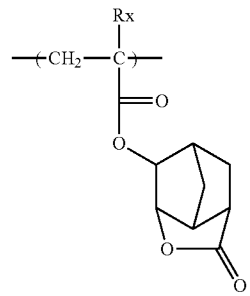
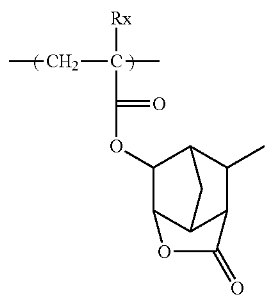
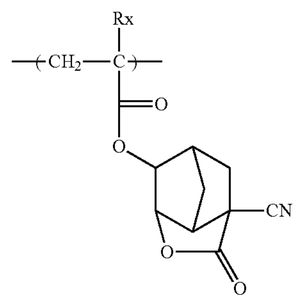
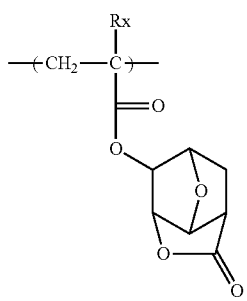
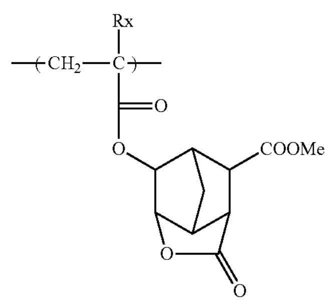
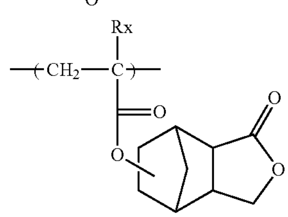
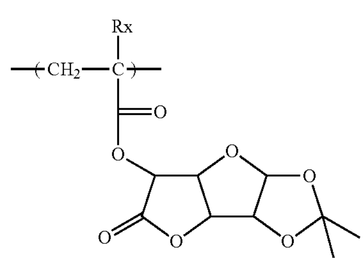

-continued

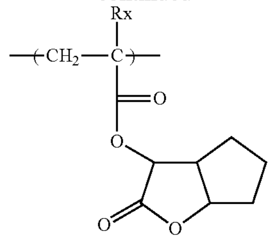

The repeating unit containing a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

The repeating unit containing a lactone group may be any of those of general formula (1) below.

(1)

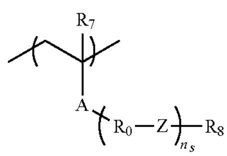

In general formula (1),

A represents an ester bond or an amido bond.

$R_0$, when $n_s \geq 2$ each of $R_0$s independently, represents an alkylene group, a cycloalkylene group or a combination thereof.

Z, when $n_s \geq 2$ each of Zs independently, represents an ether bond, an ester bond, an amido bond, any of urethane bonds of the formula:

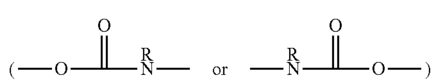

or any of urea bonds of the formula:

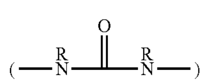

in which R represents, for example, a hydrogen atom, an alkyl group, a cycloalkyl group or an aryl group.

$R_8$ represents a monovalent organic group with a lactone structure.

In the general formula, $n_s$ is an integer of 1 to 5, preferably 1.

$R_7$ represents a hydrogen atom, an alkyl group or a halogen atom. One or more substituents may be introduced in the alkyl group. $R_7$ is preferably a hydrogen atom, a methyl group, a hydroxymethyl group or an acetoxymethyl group.

As mentioned above, $R_0$ represents an alkylene group, a cycloalkylene group or a combination thereof.

The alkylene group represented by $R_0$ may be in the form of a linear chain or a branched chain. The alkylene group preferably has 1 to 6 carbon atoms, more preferably 1 to 3 carbon atoms. As the alkylene group, there can be mentioned, for example, a methylene group, an ethylene group or a propylene group.

The cycloalkylene group represented by $R_0$ preferably has 3 to 10 carbon atoms, more preferably 5 to 7 carbon atoms. As the cycloalkylene group, there can be mentioned, for example, a cyclopropylene group, a cyclobutylene group, a cyclopentylene group or a cyclohexylene group.

One or more substituents may be introduced in these alkylene and cycloalkylene groups. As such substituents, there can be mentioned, for example, a halogen atom, such as a fluorine atom, a chlorine atom or a bromine atom; a mercapto group; a hydroxyl group; an alkoxy group, such as a methoxy group, an ethoxy group, an isopropoxy group, a t-butoxy or a benzyloxy group; a cycloalkyl group, such as a cyclopropyl group, a cyclobutyl group, a cyclopentyl group, a cyclohexyl group or a cycloheptyl group; a cyano group; a nitro group; a sulfonyl group; a silyl group; an ester group; an acyl group; a vinyl group; and an aryl group.

As mentioned above, Z represents an ether bond, an ester bond, an amido bond, a urethane bond or a urea bond. Z is preferably an ether bond or an ester bond. An ester bond is especially preferred.

As mentioned above, $R_8$ is a monovalent organic group with a lactone structure. This organic group has, for example, any of the lactone structures of general formulae (LC1-1) to (LC1-17) above. Of these, the structures of general formulae (LC1-4), (LC1-5) and (LC1-17) are preferred. The structure of general formula (LC1-4) is especially preferred.

It is preferred for $R_8$ to have an unsubstituted lactone structure or a lactone structure in which a methyl group, a cyano group or an alkoxycarbonyl group is introduced as a substituent. Most preferably, $R_8$ is a monovalent organic group with a lactone structure in which one or more cyano groups are introduced as substituents (namely, a cyanolactone structure).

Specific examples of the repeating units of general formula (1) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

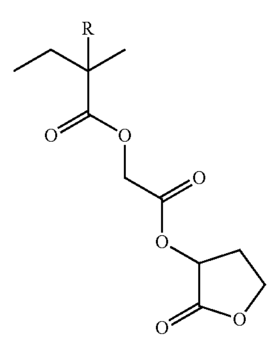

-continued

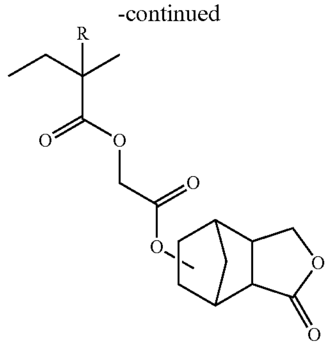

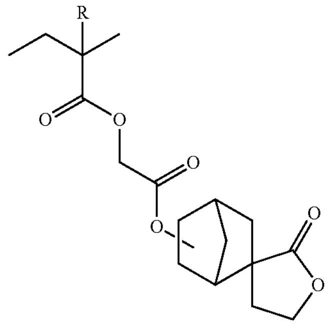

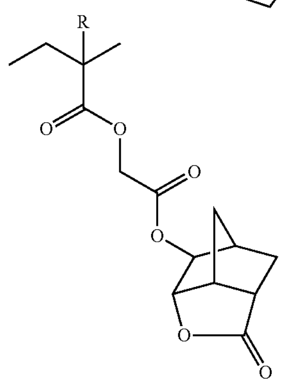

The repeating units of general formula (1) are preferably those of general formula (2) below.

(2)

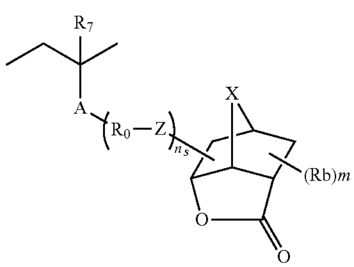

In general formula (2), $R_7$, A, $R_0$, Z and $n_s$ are as defined in general formula (1) above.

Rb, when m≥2 each of Rb's independently, represents an alkyl group, a cycloalkyl group, an alkoxycarbonyl group, a cyano group, a hydroxyl group or an alkoxy group. When m≥2, two or more Rb's may be bonded to each other to thereby form a ring.

X represents an alkylene group, an oxygen atom or a sulfur atom, and m is an integer of 0 to 5. Preferably, m is 0 or 1.

The alkyl group represented by Rb is preferably an alkyl group having 1 to 4 carbon atoms, more preferably a methyl group or an ethyl group, and most preferably a methyl group. As the cycloalkyl group, there can be mentioned, for example, a cyclopropyl group, a cyclobutyl group, a cyclopentyl group or a cyclohexyl group. As the alkoxycarbonyl group, there can be mentioned, for example, a methoxycarbonyl group, an ethoxycarbonyl group, an n-butoxycarbonyl group or a t-butoxycarbonyl group. As the alkoxy group, there can be mentioned, for example, a methoxy group, an ethoxy group, an n-butoxy group or a t-butoxy group. One or more substituents may be introduced in the alkyl group, cycloalkyl group, alkoxycarbonyl group and alkoxy group represented by Rb. As such substituents, there can be mentioned, for example, a hydroxyl group; an alkoxy group such as a methoxy group or an ethoxy group; a cyano group; and a halogen atom such as a fluorine atom. More preferably, Rb is a methyl group, a cyano group or an alkoxycarbonyl group, further more preferably a cyano group.

When m≥1, it is preferred for the substitution with at least one Rb to take place at the α- or β-position of the carbonyl group of the lactone. The substitution with Rb at the α-position of the carbonyl group of the lactone is especially preferred.

As the alkylene group represented by X, there can be mentioned, for example, a methylene group or an ethylene group. X is preferably an oxygen atom or a methylene group, more preferably a methylene group.

Specific examples of the repeating units of general formula (2) will be shown below. In the specific examples, R represents a hydrogen atom, an alkyl group or a halogen atom. A substituent may be introduced in the alkyl group. R is preferably a hydrogen atom, a methyl group, a hydroxymethyl group or an acetoxymethyl group.

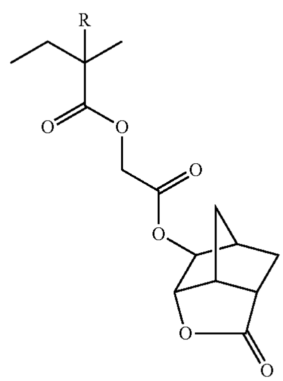

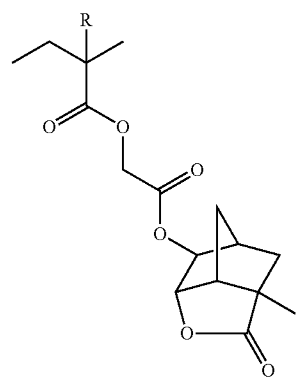

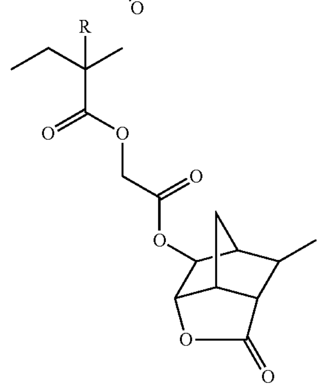

-continued
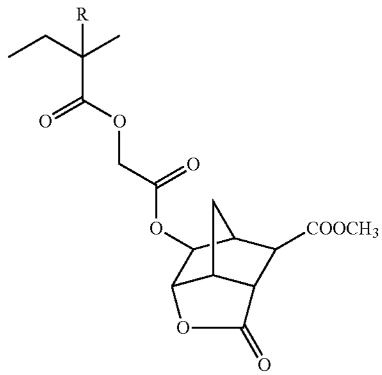
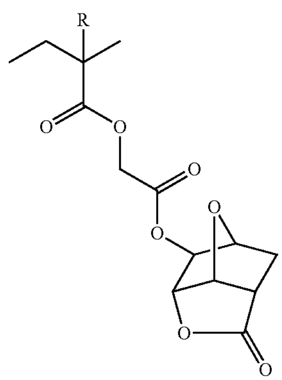
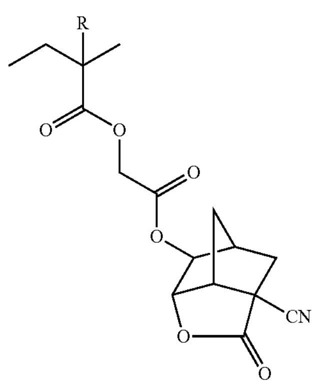
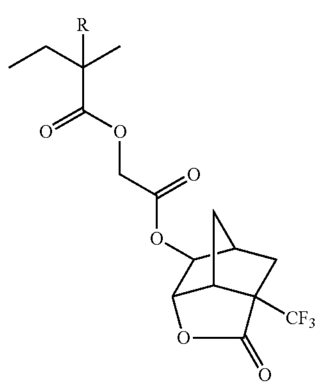
-continued
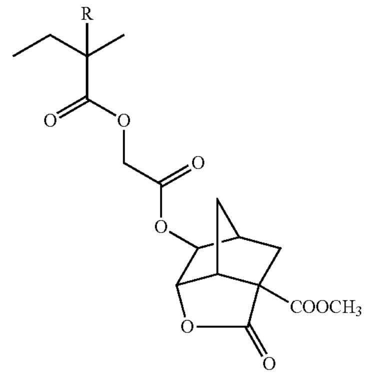
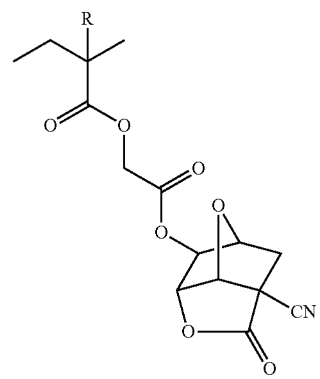
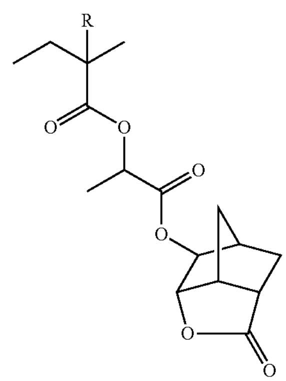
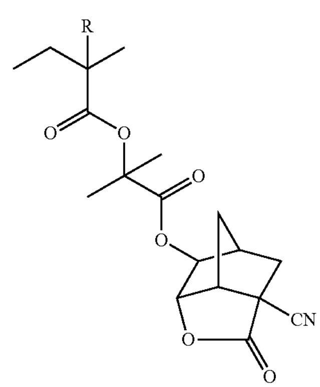

-continued
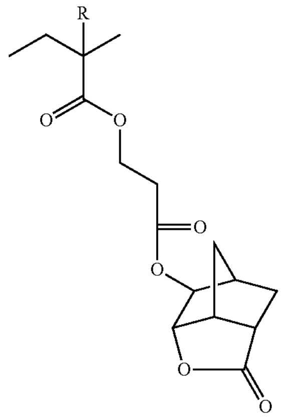
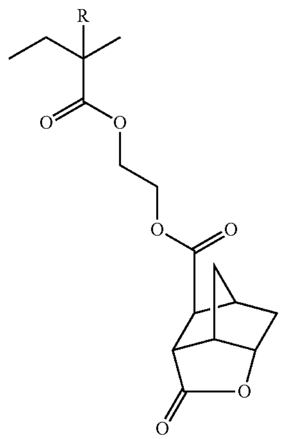
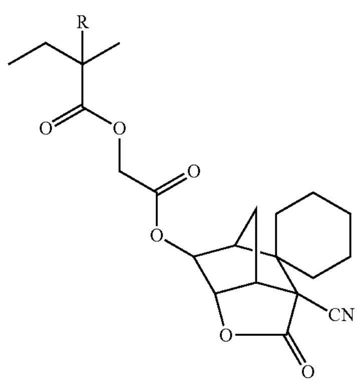
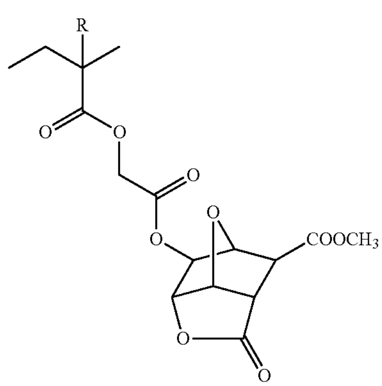
-continued
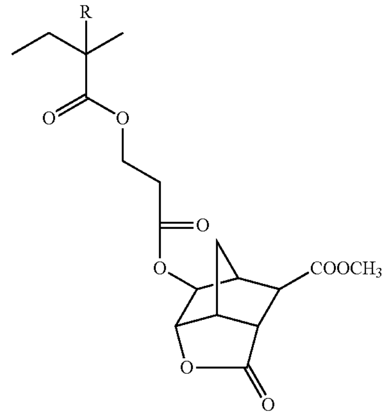
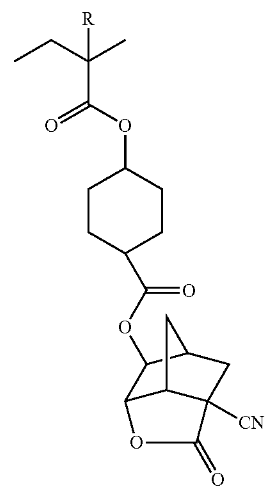
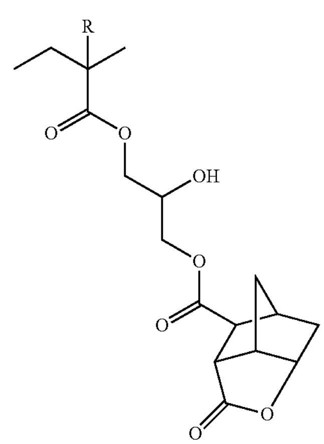

-continued

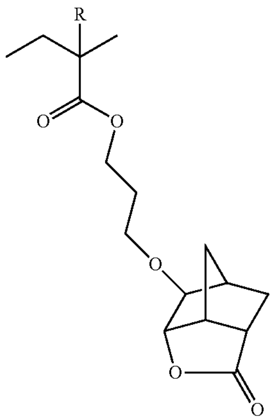

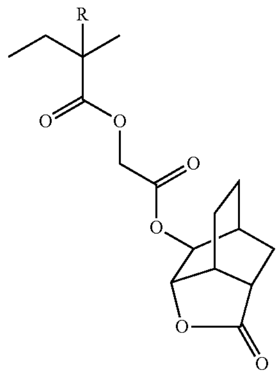

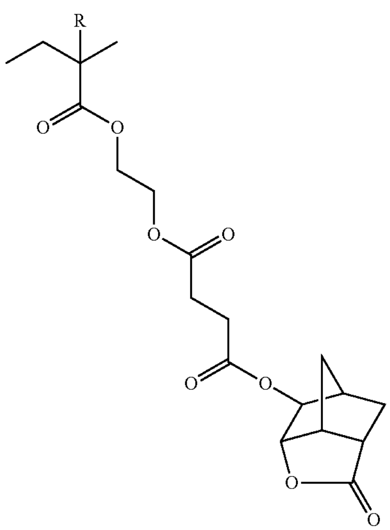

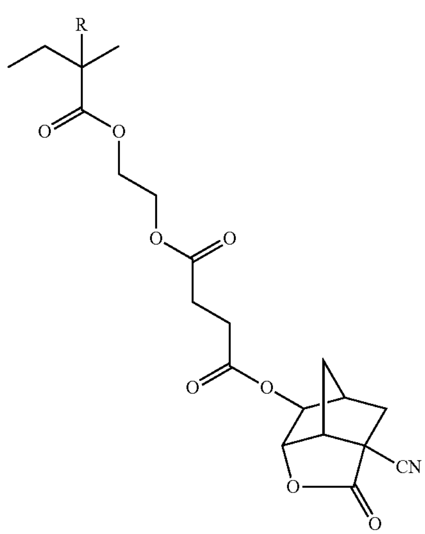

-continued

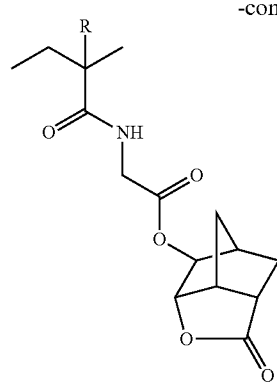

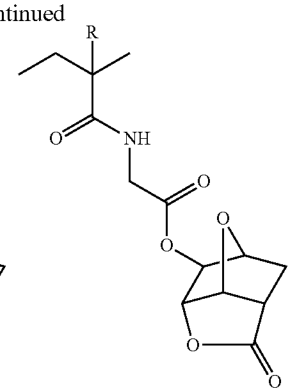

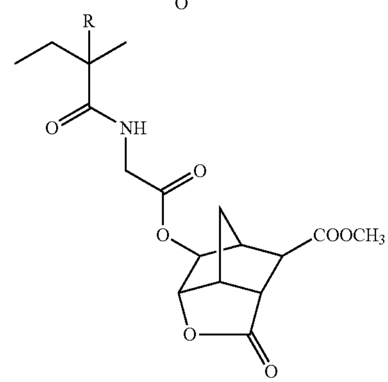

Two or more types of lactone repeating units selected from among those of general formula (1) can be simultaneously used in order to increase the effects of the present invention. In the simultaneous use, it is preferred to select two or more types of repeating units from among those of general formula (1) in which $n_s$ is 1 and simultaneously use the selected repeating units.

The content of the repeating unit containing a lactone structure based on all the repeating units of the resin is preferably in the range of 10 to 80 mol %, more preferably 15 to 70 mol % and further more preferably 20 to 60 mol %.

As other preferred repeating units (A), there can be mentioned, for example, those containing any of a carboxyl group, a sulfonamido group, a sulfonylimido group, a bissulfonylimido group and an aliphatic alcohol group substituted at its α-position with an electron withdrawing group (e.g., a hexafluoroisopropanol group). Of these, the repeating unit (3A) containing a carboxyl group is more preferred.

The incorporation of the repeating unit containing any of these groups increases the resolution in contact hole usage. The repeating unit (3A) is preferably any of a repeating unit wherein any of these groups is directly bonded to the principal chain of a resin such as a repeating unit of acrylic acid or methacrylic acid, a repeating unit wherein any of these groups is bonded via a connecting group to the principal chain of a resin and a repeating unit wherein any of these groups is introduced in a terminal of a polymer chain by the use of a chain transfer agent or polymerization initiator containing any of these groups in the stage of polymerization. The connecting group may have a mono- or polycyclohydrocarbon structure. The repeating unit of acrylic acid or methacrylic acid is especially preferred.

The content of the repeating unit (A) containing the above group based on all the repeating units of the acid-decomposable resin is preferably in the range of 0 to 20 mol %, more preferably 3 to 15 mol % and further more preferably 5 to 10 mol %.

Specific examples of the repeating unit (A) containing the above group will be shown below, which however in no way limit the scope of the present invention.

In the specific examples, Rx represents H, $CH_3$, $CH_2OH$ or $CF_3$.

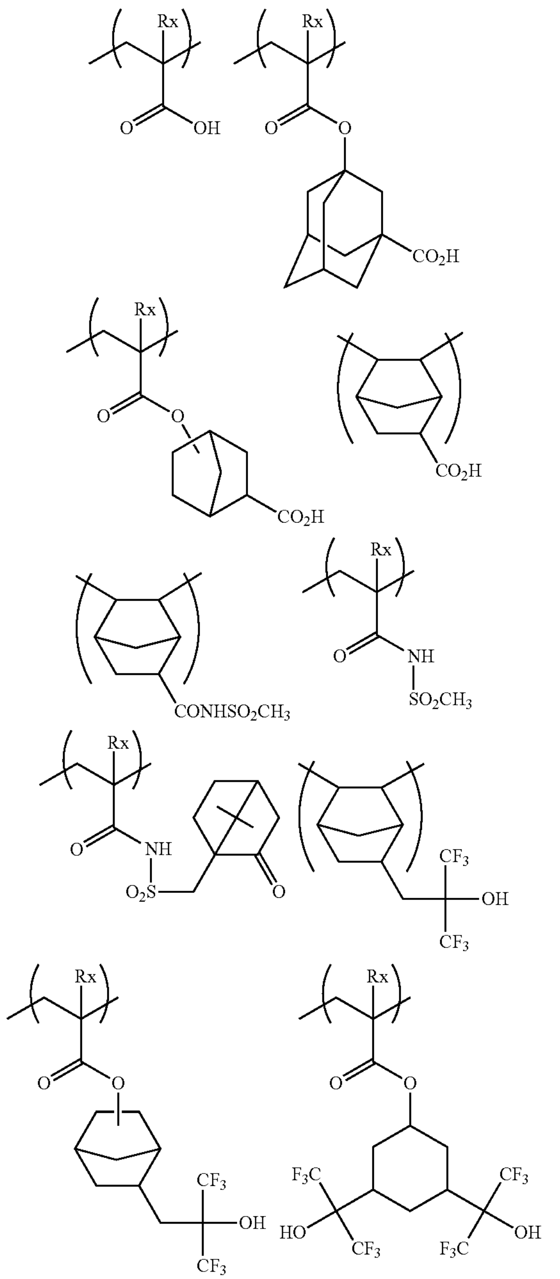

(3B) Repeating unit having an alicyclic hydrocarbon structure containing no polar group, which repeating unit exhibits no acid decomposability The acid-decomposable resin may further contain a repeating unit (3B) having an alicyclic hydrocarbon structure containing no polar group, which repeating unit exhibits no acid decomposability. As the repeating unit (3B), there can be mentioned, for example, any of those of general formula (IV) below.

(IV)

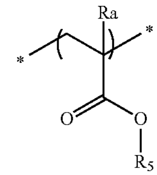

In the general formula (IV), $R_5$ represents a hydrocarbon group having at least one cyclic structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra is preferably a hydrogen atom, a methyl group, a hydroxymethyl group or a trifluoromethyl group, further preferably a hydrogen atom or a methyl group.

The cyclic structures contained in $R_5$ include a monocyclic hydrocarbon group and a polycyclic hydrocarbon group. As the monocyclic hydrocarbon group, a cycloalkyl group having 3 to 12 carbon atoms and a cycloalkenyl group having 3 to 12 carbon atoms can be exemplified. Preferably, the monocyclic hydrocarbon group is a monocyclic hydrocarbon group having 3 to 7 carbon atoms. As such, a cyclopentyl group and a cyclohexyl group can be exemplified.

The polycyclic hydrocarbon groups include ring-assembly hydrocarbon groups and crosslinked-ring hydrocarbon groups.

As the ring-assembly hydrocarbon groups, for example, a bicyclohexyl group and a perhydronaphthalenyl group can be exemplified.

As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo[3.2.1]octane ring); tricyclic hydrocarbon rings, such as homobledane, adamantane, tricyclo[5.2.1.$0^{2,6}$]decane and tricyclo [4.3.1.$1^{2,5}$]undecane rings; and tetracyclic hydrocarbon rings, such as tetracyclo[4.4.0.$1^{2,5}$.$1^{7,10}$]dodecane and perhydro-1,4-methano-5,8-methanonaphthalene rings.

Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenalene rings.

As preferred crosslinked-ring hydrocarbon rings, there can be mentioned a norbornyl group, an adamantyl group, a bicyclooctanyl group, a tricyclo[5.2.1.$0^{2,6}$]decanyl group and the like. As more preferred crosslinked-ring hydrocarbon rings, there can be mentioned a norbornyl group and an adamantyl group.

These alicyclic hydrocarbon groups may have one or more substituents. As preferred substituents, a halogen atom, an alkyl group, a hydroxyl group protected by a protective group, and an amino group protected by a protective group can be exemplified. The halogen atom is preferably a bromine, chlorine or fluorine atom. The alkyl group is preferably a methyl, ethyl, butyl or t-butyl group. The alkyl group may further have one or more substituents. As the optional substituent, a halogen atom, an alkyl group, a hydroxyl group protected by a protective group, and an amino group protected by a protective group can be exemplified.

As the protective group, an alkyl group, a cycloalkyl group, an aralkyl group, a substituted methyl group, a substituted ethyl group, an alkoxycarbonyl group and an aralkyloxycarbonyl group can be exemplified. Preferred alkyl groups include alkyl groups having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1-methyl-1-methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups having 1 to 4 carbon atoms and the like.

When the acid-decomposable resin contains the repeating unit (3B), the content thereof based on all the repeating units of the acid-composable resin is preferably in the range of 1 to 40 mol %, more preferably 1 to 20 mol %.

Specific examples of the repeating unit (B) will be shown below, which however in no way limit the scope of the present invention. In the formulae, Ra represents H, $CH_3$, $CH_2OH$ or $CF_3$.

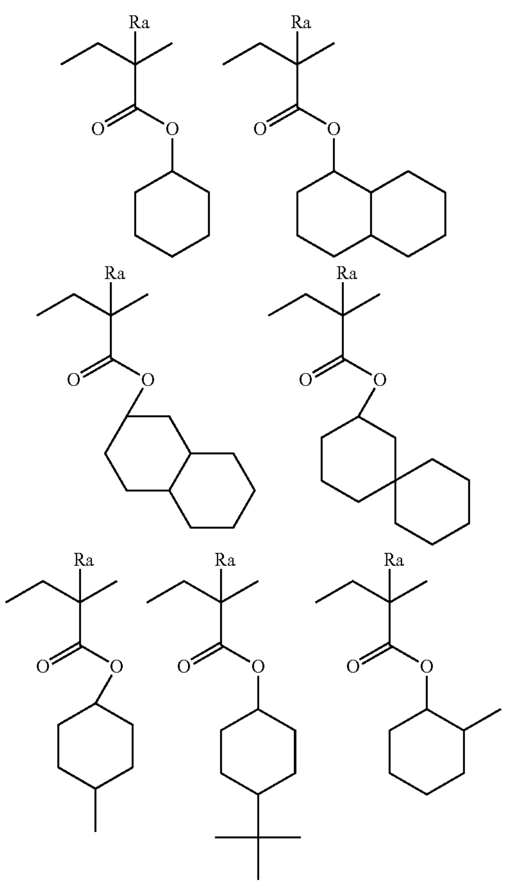

-continued

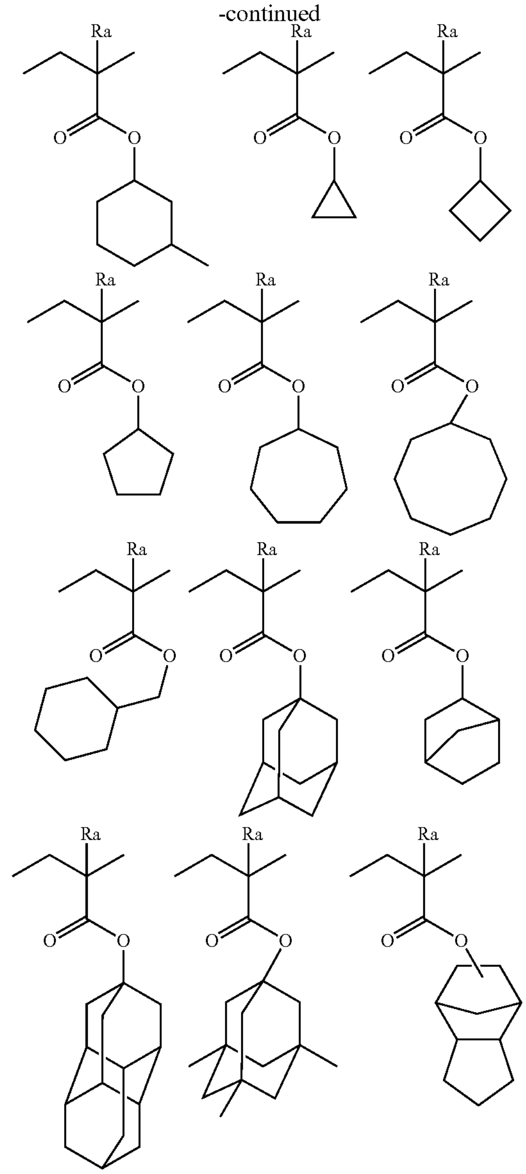

(3C) Other Repeating Units

Various repeating structural units other than those mentioned hereinbefore can be introduced in the acid-decomposable resin in order to regulate the dry etching resistance, standard developer adaptability, adherence to substrates, resist profile, and generally required properties for resist, such as resolving power, heat resistance, sensitivity, and the like.

As such other repeating structural units, those corresponding to the following monomers can be exemplified, which however are nonlimiting.

Such other repeating structural units would permit fine regulation of the properties required to have by the resin for use in the composition of the present invention, especially, (1) solubility in applied solvents, (2) film forming easiness (glass transition temperature), (3) alkali developability, (4) film thinning (selection of hydrophilicity/hydrophobicity and polar group), (5) adhesion of unexposed areas to substrate, and (6) dry etching resistance, etc.

As the above-mentioned monomers, compounds having an unsaturated bond capable of addition polymerization, selected from among acrylic esters, methacrylic esters, acrylamides, methacrylamides, allyl compounds, vinyl ethers, vinyl esters and the like can be exemplified.

The monomers are not limited to the above, and unsaturated compounds capable of addition polymerization that are copolymerizable with the monomers corresponding to the above various repeating structural units can be used in the copolymerization.

The molar ratios of individual repeating structural units contained in the resin for use in the composition of the present invention are appropriately determined from the viewpoint of regulation of not only the resist dry etching resistance but also the standard developer adaptability, substrate adhesion, resist profile and generally required properties of resists such as resolving power, heat resistance and sensitivity.

When the composition of the present invention is used in ArF exposure, it is preferred for the acid-decomposable resin to contain no aromatic group from the viewpoint of transparency to ArF light. It is especially preferred for the acid-decomposable resin to contain an alicyclic hydrocarbon structure of a single ring or multiple rings.

Further, it is preferred for the acid-decomposable resin to contain neither a fluorine atom nor a silicon atom from the viewpoint of compatibility with hydrophobic resins to be described hereinafter.

Preferred acid-decomposable resin is that whose repeating units consisting of (meth)acrylate repeating units. In that instance, use can be made of any of a resin wherein all the repeating units consist of methacrylate repeating units, a resin wherein all the repeating units consist of acrylate repeating units and a resin wherein all the repeating units consist of methacrylate repeating units and acrylate repeating units. However, it is preferred for the acrylate repeating units to account for 50 mol % or less of all the repeating units.

In the event of exposing the actinic-ray- or radiation-sensitive resin composition of the present invention to KrF excimer laser beams, electron beams, X-rays or high-energy light rays of wavelength 50 nm or less (EUV, etc.), it is preferred for the resin to further contain hydroxystyrene repeating units. More preferably, acid-decomposable resin contains hydroxystyrene repeating units, hydroxystyrene repeating units protected by an acid-decomposable group and acid-decomposable repeating units of a (meth)acrylic acid tertiary alkyl ester, etc.

As preferred hydroxystyrene repeating units having an acid-decomposable group, there can be mentioned, for example, repeating units derived from t-butoxycarbonyloxystyrene, a 1-alkoxyethoxystyrene and a (meth)acrylic acid tertiary alkyl ester. Repeating units derived from a 2-alkyl-2-adamantyl(meth)acrylate and a dialkyl(1-adamantyl)methyl(meth)acrylate are more preferred.

The resin of the present invention can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the solvent capable of dissolving the composition of the present invention, such as propylene glycol monomethyl ether acetate, propylene glycol monomethyl ether or cyclohexanone, to be described hereinafter. It is preferred to perform the polymerization with the use of the same solvent as employed in the actinic-ray- or radiation-sensitive resin composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of the acid-decomposable resin in terms of polystyrene molecular weight as measured by GPC is preferably in the range of 1000 to 200,000, more preferably 2000 to 20,000, still more preferably 3000 to 15,000 and further preferably 5000 to 13,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is usually in the range of 1 to 3, preferably 1 to 2.6, more preferably 1 to 2 and most preferably 1.4 to 2.0. The lower the molecular weight distribution, the more excellent the resolving power and resist profile and the smoother the side wall of the resist pattern to thereby attain an excellence in roughness.

The resin may be used either individually or in combination.

In one embodiment of the present invention, the content ratio of the above-mentioned resin based on the total solid content of the whole composition is preferably in the range of 30 to 99 mass %, and more preferably 60 to 95 mass %.

A resin other than the above-mentioned resins may be used in combination with the same in a proportion not detrimental to the effects according to the present invention. For example, in combination with the resin containing the repeating unit (R), use may be made of a resin (except the hydrophobic resin to be described hereinafter) not containing any repeating unit (R). In that instance, the mass ratio of the total amount of the former resin to the total amount of the latter resin is preferably 50/50 or greater, more preferably 70/30 or greater. In that instance, the resin not containing any repeating unit (R) typically contains a repeating unit containing the above-mentioned acid-decomposable group.

[B] Solvent

The composition according to the present invention contains a solvent. This solvent comprises at least either a propylene glycol monoalkyl ether carboxylate (S1) or at least one member (S2) selected from the group consisting of a propylene glycol monoalkyl ether, a lactic ester, an acetic ester, a formic ester, an alkoxypropionic ester, a chain ketone, a cycloketone, a lactone and an alkylene carbonate. This solvent may further contain a component other than the components (S1) and (S2).

The inventors have found that not only is the applicability of the composition improved but also a pattern having less development defects can be formed by using these solvents in combination with the above-described resins. The reason therefor is not necessarily apparent. However, the inventors presume that the reason would be that as these solvents ensure a favorable balance of solubility of the above resins, boiling point and viscosity, any irregularity of the thickness of the composition film, deposition during spin coating, etc. can be suppressed.

The component (S1) is preferably at least one member selected from the group consisting of propylene glycol monomethyl ether acetate, propylene glycol monomethyl ether propionate and propylene glycol monoethyl ether acetate. Propylene glycol monomethyl ether acetate is most preferred.

The following solvents are preferred as the component (S2).

The propylene glycol monoalkyl ether is preferably propylene glycol monomethyl ether or propylene glycol monoethyl ether.

The lactic ester is preferably ethyl lactate, butyl lactate or propyl lactate.

The acetic/formic ester is preferably methyl acetate, ethyl acetate, butyl acetate, isobutyl acetate, propyl acetate, isoamyl acetate, methyl formate, ethyl formate, butyl formate, propyl formate or 3-methoxybutyl acetate.

The alkoxypropionic ester is preferably methyl 3-methoxypropionate (MMP) or ethyl 3-ethoxypropionate (EEP).

The chain ketone is preferably 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetylcarbinol, acetophenone, methyl naphthyl ketone or methyl amyl ketone.

The cycloketone is preferably methylcyclohexanone, isophorone or cyclohexanone.

The lactone is preferably γ-butyrolactone.

The alkylene carbonate is preferably propylene carbonate.

The component (S2) is more preferably propylene glycol monomethyl ether, ethyl lactate, ethyl 3-ethoxypropionate, methyl amyl ketone, cyclohexanone, butyl acetate, pentyl acetate, γ-butyrolactone or propylene carbonate.

A solvent whose flash point (hereinafter also referred to as fp) is 37° C. or higher is preferably used as the component (S2). The preferred component (S2) is propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), γ-butyrolactone (fp: 101° C.) or propylene carbonate (fp: 132° C.). Of these, propylene glycol monomethyl ether, ethyl lactate, pentyl acetate and cyclohexanone are more preferred. Propylene glycol monomethyl ether and ethyl lactate are most preferred. Herein, the "flash point" values are those appearing in the reagent catalogues issued by Tokyo Chemical Industry Co., Ltd. and Sigma-Aldrich.

It is preferred for the solvent to contain the component (S1). More preferably, the solvent consists essentially of the component (S1), or is a mixed solvent composed of the component (S1) and another component. In the latter case, it is further more preferred for the solvent to contain both the component (S1) and the component (S2).

The mass ratio of component (S1) to component (S2) is preferably in the range of 100:0 to 15:85, more preferably 100:0 to 40:60 and further more preferably 100:0 to 60:40. Namely, it is preferred for the solvent to consist of the component (S1) only or contain both the component (S1) and the component (S2) whose mass ratio is as follows. In the latter case, the mass ratio of component (S1) to component (S2) is preferably 15/85 or higher, more preferably 40/60 or higher and further more preferably 60/40 or higher. The number of development defects can further be reduced by employing these solvent ratios.

When the solvent contains both the component (S1) and the component (S2), the mass ratio of component (S1) to component (S2) is set at, for example, 99/1 or below.

As mentioned above, the solvent may further contain a component other than the components (S1) and (S2). If so, it is preferred for the content of the component other than the components (S1) and (S2) to be in the range of 5 to 30 mass % based on the total amount of solvent.

The content of solvent in the composition is preferably set so that the solid content of all components falls within the range of 2 to 30 mass %, more preferably 3 to 20 mass %. If so, the applicability of the composition can be enhanced.

[C] Acid Generator

The composition according to the present invention may contain an acid generator other than the resin mentioned above. As preferred compounds among the acid generators, those represented by the following general formulae (ZI'), (ZII') and (ZIII') can be exemplified.

(ZI')

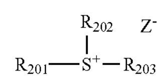

(ZII')

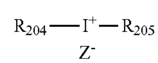

(ZIII')

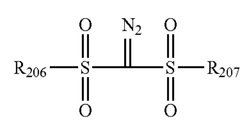

In the above general formula (ZI), each of $R_{201}$, $R_{202}$ and $R_{203}$ independently represents an organic group.

The number of carbon atoms in the organic group represented by $R_{201}$, $R_{202}$ and $R_{203}$ is generally in the range of 1 to 30, preferably 1 to 20.

Two of $R_{201}$ to $R_{203}$ may be bonded to each other via a single bond or a connecting group to thereby form a ring structure. As the connecting group, there can be mentioned, for example, an ether bond, a thioether bond, an ester bond, an amido bond, a carbonyl group, a methylene group or an ethylene group. As the group formed by the mutual bonding of two of $R_{201}$ to $R_{203}$, there can be mentioned, for example, an alkylene group, such as a butylene group or a pentylene group.

$Z^-$ represents a nonnucleophilic anion.

As the nonnucleophilic anion represented by $Z^-$, a sulfonate anion (e.g. an aliphatic sulfonate anion, an aromatic sulfonate anion, and a camphor sulfonate anion), a carboxylate anion (e.g. an aliphatic carboxylate anion, an aromatic carboxylate anion, and an aralkyl carboxylate anion), a sulfonylimido anion, a bis(alkylsulfonyl)imido anion, and a tris(alkylsulfonyl)methyl anion can be exemplified.

The aliphatic moiety of the aliphatic sulfonate anion and the aliphatic carboxylate anion may be an alkyl group or a cycloalkyl group, being preferably an alkyl group having 1 to 30 carbon atoms or a cycloalkyl group having 3 to 30 carbon atoms.

As a preferred aromatic group of the aromatic sulfonate anion and the aromatic carboxylate anion, an aryl group having 6 to 14 carbon atoms, such as a phenyl group, a tolyl group and a naphthyl group can be exemplified.

The alkyl group, cycloalkyl group and aryl group mentioned above may have one or more substituents.

As such, a nitro group, a halogen atom such as a fluorine atom, a carboxy group, a hydroxy group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms) can be exemplified. The aryl group or ring structure of these groups may further have an alkyl group (preferably having 1 to 15 carbon atoms) as its substituent.

As a preferred aralkyl group of the aralkyl carboxylate anion, an aralkyl group having 6 to 12 carbon atoms, such as a benzyl group, a phenethyl group, a naphthylmethyl group, a naphthylethyl group, and a naphthylbutyl group can be exemplified.

As the sulfonylimido anion, a saccharin anion can be exemplified.

The alkyl group of the bis(alkylsulfonyl)imido anion and tris(alkylsulfonyl)methyl anion is preferably an alkyl group having 1 to 5 carbon atoms. As such, a methyl group, an ethyl group, a propyl group, an isopropyl group, an n-butyl group, an isobutyl group, a sec-butyl group, a pentyl group, and a neopentyl group can be exemplified. As a substituent of these alkyl groups, a halogen atom, an alkyl group substituted with a halogen atom, an alkoxy group, an alkylthio group, an alkyloxysulfonyl group, an aryloxysulfonyl group, and a cycloalkylaryloxysulfonyl group can be exemplified. An alkyl group substituted with one or more fluorine atoms is preferred.

As the other nonnucleophilic anions, $PF_6^-$, $BF_4^-$, and $SbF_6^-$ can be exemplified.

The nonnucleophilic anion represented by $Z^-$ is preferably selected from among an aliphatic sulfonate anion substituted at its α-position of sulfonic acid with a fluorine atom, an aromatic sulfonate anion substituted with one or more fluorine atoms or a group having a fluorine atom, a bis(alkylsulfonyl)imido anion whose alkyl group is substituted with one or more fluorine atoms and a tris(alkylsulfonyl)methide anion whose alkyl group is substituted with one or more fluorine atoms. More preferably, the nonnucleophilic anion is a perfluorinated aliphatic sulfonate anion having 4 to 8 carbon atoms or a benzene sulfonate anion having a fluorine atom. Still more preferably, the nonnucleophilic anion is a nonafluorobutane sulfonate anion, a perfluorooctane sulfonate anion, a pentafluorobenzene sulfonate anion or a 3,5-bis(trifluoromethyl)benzene sulfonate anion.

From the viewpoint of acid strength, pKa of the generated acid is preferably −1 or lower. Employing such embodiment can make sensitivity of the composition become higher.

As the organic group represented by $R_{201}$, $R_{202}$ and $R_{203}$, an aryl group (preferably having 6 to 15 carbon atoms), a linear or branched alkyl group (preferably having 1 to 10 carbon atoms), and a cycloalkyl group (preferably having 3 to 15 carbon atoms) can be exemplified.

Preferably, at least one of $R_{201}$, $R_{202}$ and $R_{203}$ is an aryl group. More preferably, these three are simultaneously aryl groups. As the aryl group, there can be mentioned, for example, a phenyl group or a naphthyl group. The aryl groups also include a heteroaryl group, such as an indole residue or a pyrrole residue.

One or more substituents may further be introduced in the aryl groups. As the substituents, there can be mentioned, for example, a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms) and the like.

Two selected from among $R_{201}$, $R_{202}$ and $R_{203}$ may be bonded via a single bond or a connecting group to each other. As the connecting group, there can be mentioned, for example, an alkylene group (preferably having 1 to 3 carbon atoms), —O—, —S—, —CO— or —$SO_2$—.

As preferred structures in which at least one of $R_{201}$, $R_{202}$ and $R_{203}$ is not an aryl group, there can be mentioned the cation structures of the compounds set forth in Paragraphs 0047 and 0048 of JP-A-2004-233661, compounds set forth in Paragraphs 0040 to 0046 of JP-A-2003-35948, compounds of formulae (I-1) to (I-70) shown as examples in US 2003/0224288 A1, compounds of formulae (IA-1) to (IA-54) and (IB-1) to (IB-24) shown as examples in US 2003/0077540 A1 and the like.

In general formulae (ZII') and (ZIII'), each of $R_{204}$ to $R_{207}$ independently represents an aryl group, an alkyl group or a cycloalkyl group. As such, those explained with respect to the groups represented by $R_{201}$ to $R_{203}$ in the compound (ZI') can be exemplified.

The aryl group, the alkyl group and the cycloalkyl group represented by $R_{204}$ to $R_{207}$ may have one or more substituents. As such, those explained with respect to the groups represented by $R_{201}$ to $R_{203}$ in the compound (ZI') can be exemplified.

$Z^-$ represents a nonnucleophilic anion. As such, those explained with respect to the groups represented by $Z^-$ in the compound (ZI') can be exemplified.

As the acid generators, the compounds represented by the following general formulae (ZIV'), (ZV') and (ZVI') can further be exemplified.

(ZIV')

$Ar_3—SO_2—SO_2—Ar_4$ (ZV')

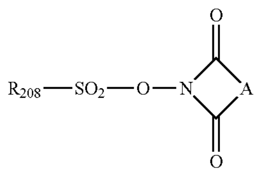

(ZVI')

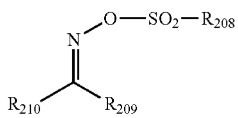

In the general formulae (ZIV') to (ZVI'), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Especially preferred examples of the acid generators will be shown below.

(z1)

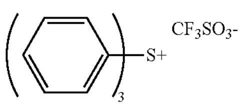

(z2)

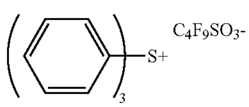

(z3)

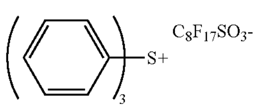

(z4)

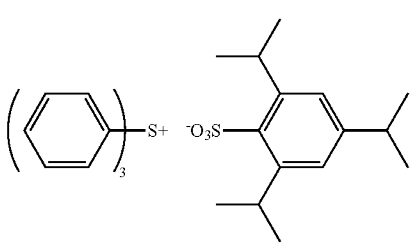

(z5)

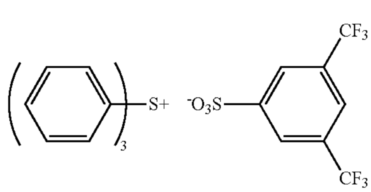

-continued (z6)

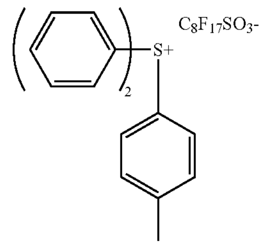

(z7)

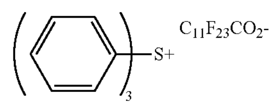

(z8)

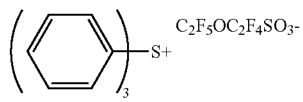

(z9)

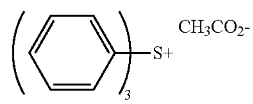

(z10)

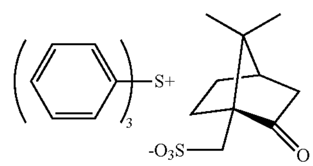

(z11)

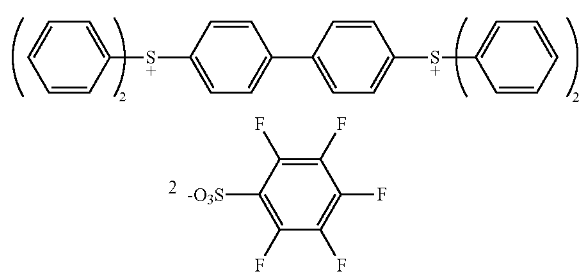

(z12)

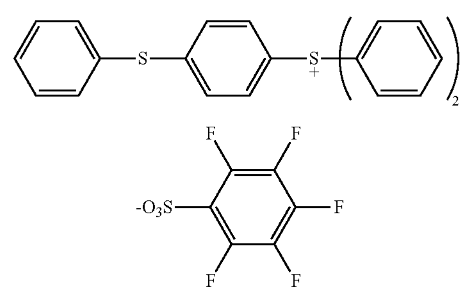

(z13)

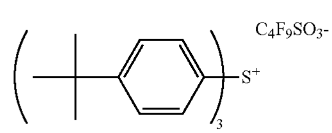

(z14)

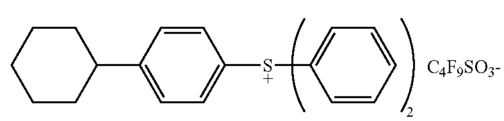

-continued
(z15)
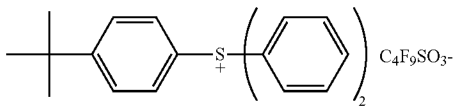
(z16)
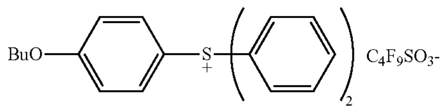
(z17)
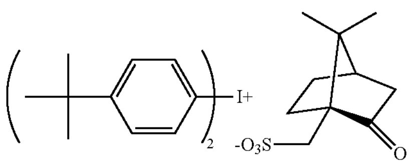
(z18)
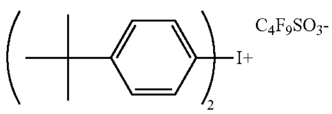
(z19)
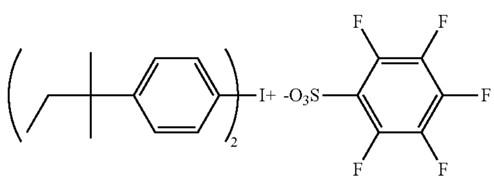
(z20)
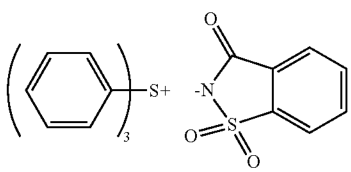
(z21)
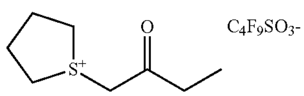
(z22)
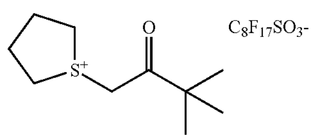
(z23)
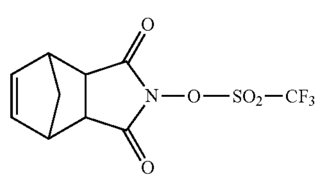
(z24)
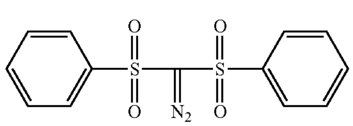
(z25)
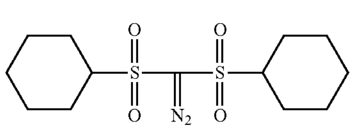
-continued
(z26)
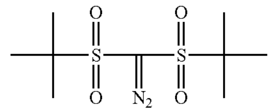
(z27)
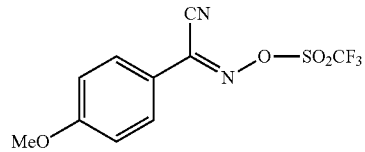
(z28)
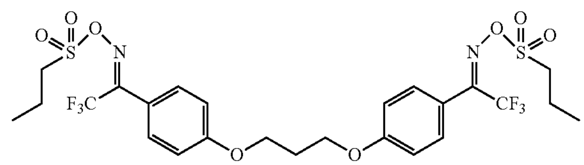
(z29)
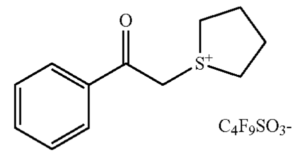
(z30)
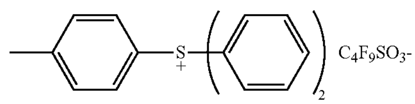
(z31)
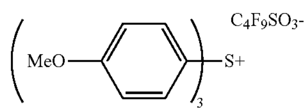
(z32)
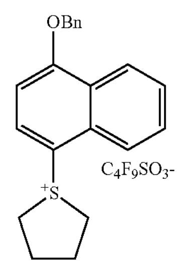
(z33)
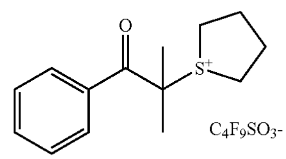
(z34)
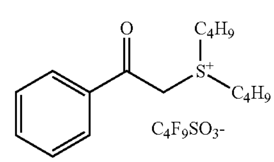
(z35)
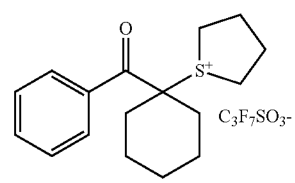

-continued
(z36)
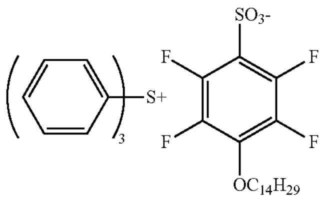
(z37)
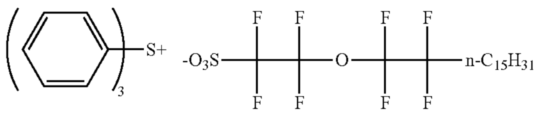
(z38)
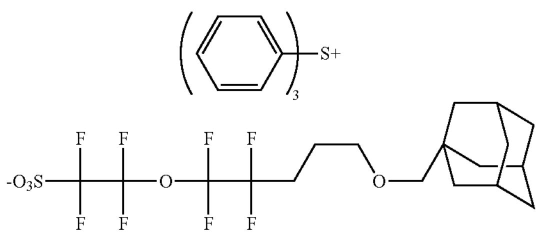
(z39)
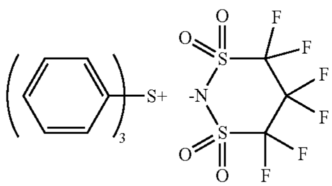
(z40)
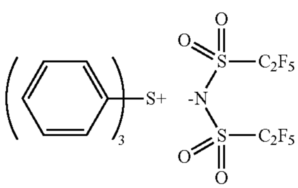
(z41)
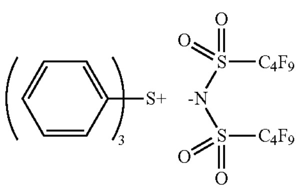
(z42)
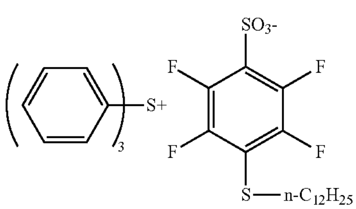
(z43)
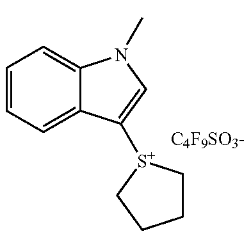
-continued
(z44)
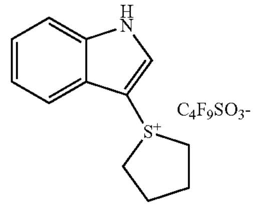
(z45)
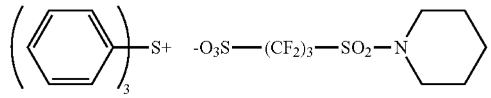
(z46)
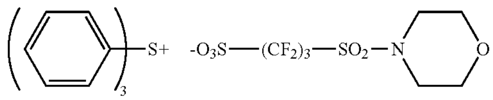
(z47)
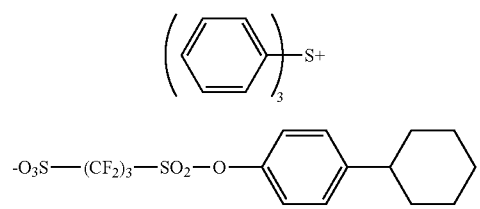
(z48)
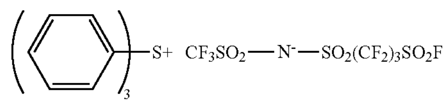
(z49)
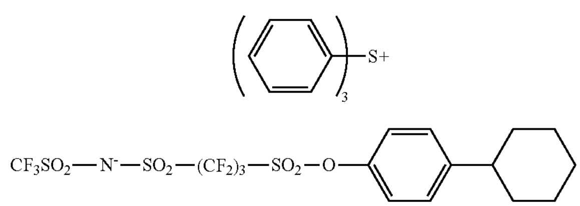
(z50)
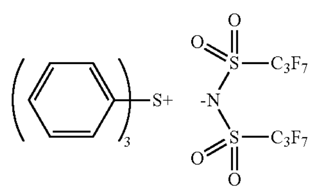
(z51)
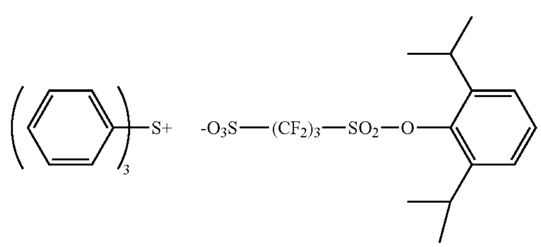
(z52)
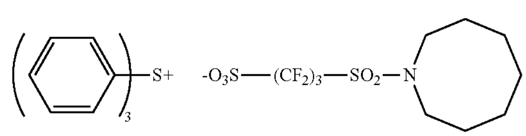

-continued
(z53)
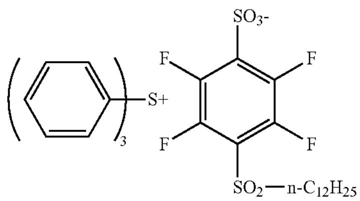
(z54)
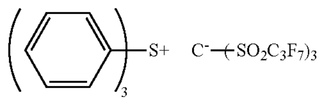
(z55)
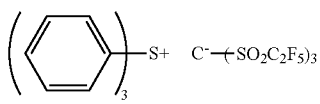
(z56)
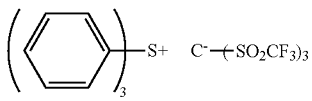
(z57)
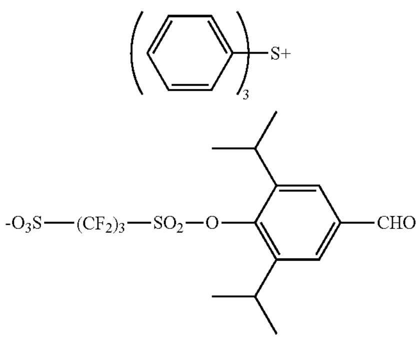
(z58)
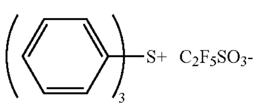
(z59)
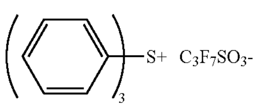
(z60)
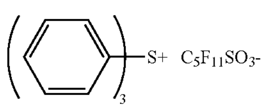
(z61)
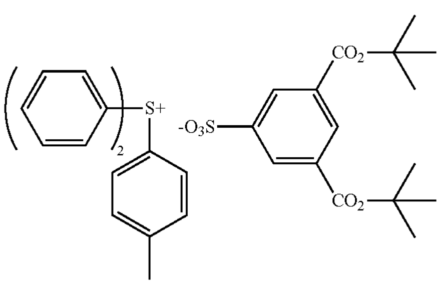
-continued
(z62)
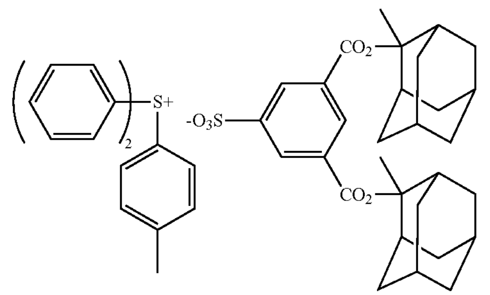
(z63)
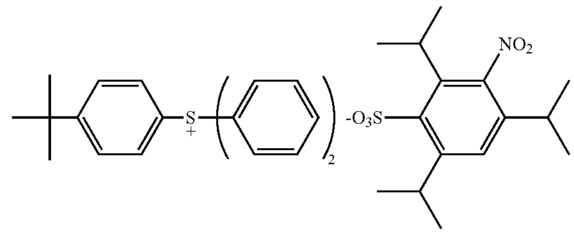
(z64)
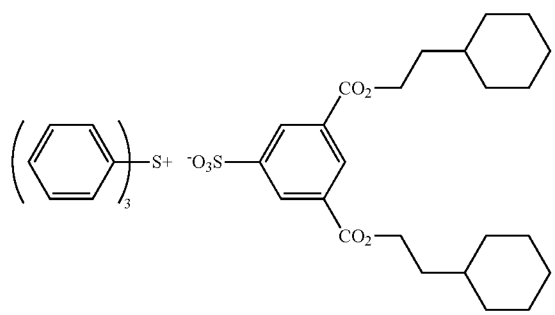
(z65)
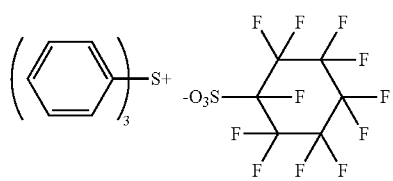
(z66)
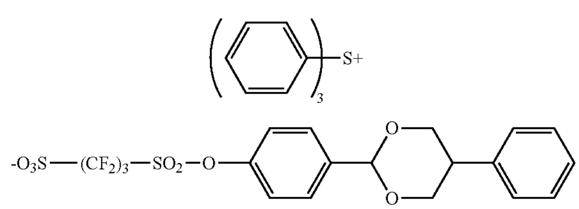
(z67)
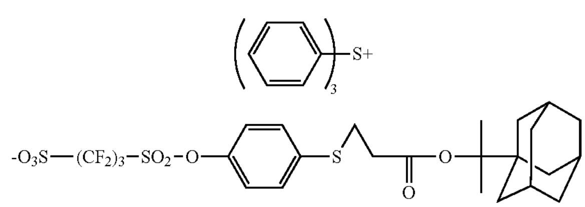

-continued (z68)

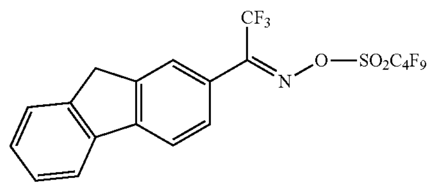

(z69)

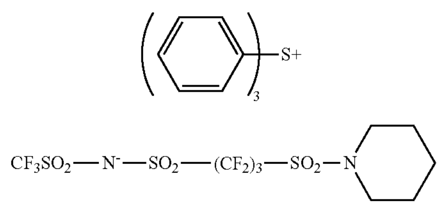

(z70)

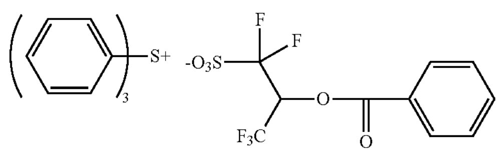

The acid generators can be used either individually or in combination of two or more kinds.

When the composition of the present invention contains an acid generator, the content thereof based on the total solids of the composition is preferably in the range of 0.1 to 20 mass %, more preferably 0.5 to 10 mass %, and further more preferably 1 to 7 mass %.

[D] Basic Compound

The composition according to the present invention may further contain one or more basic compounds. As preferred basic compounds, the compounds having the structures represented by the following formulae (A) to (E) can be exemplified.

(A)

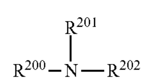

(B)

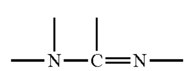

(C)

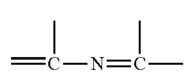

(D)

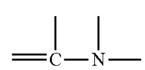

(E)

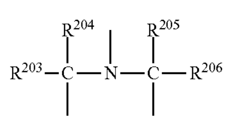

In the general formulae (A) and (E), $R^{200}$, $R^{201}$ and $R^{202}$ each independently represents a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded to each other to form a ring.

$R^{203}$, $R^{204}$, $R^{205}$ and $R^{206}$ each independently represents an alkyl group having 1 to 20 carbon atoms.

With respect to the above alkyl group, as a preferred substituted alkyl group, an aminoalkyl group having 1 to 20 carbon atoms, a hydroxyalkyl group having 1 to 20 carbon atoms, and a cyanoalkyl group having 1 to 20 carbon atoms can be exemplified. More preferably, the alkyl groups are unsubstituted.

As preferred basic compounds, guanidine, aminopyrrolidine, pyrazole, pyrazoline, piperazine, aminomorpholine, aminoalkylmorpholine and piperidine can be exemplified. As more preferred compounds, those with an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond can be exemplified.

As the compounds with an imidazole structure, imidazole, 2,4,5-triphenylimidazole, benzimidazole, and 2-phenylbenzoimidazole can be exemplified.

As the compounds with a diazabicyclo structure, 1,4-diazabicyclo[2,2,2]octane, 1,5-diazabicyclo[4,3,0]non-5-ene, and 1,8-diazabicyclo[5,4,0]undec-7-ene can be exemplified.

As the compounds with an onium hydroxide structure, tetrabutylammonium hydroxide, triarylsulfonium hydroxide, phenacylsulfonium hydroxide, and sulfonium hydroxides having a 2-oxoalkyl group, such as triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified.

As the compounds with an onium carboxylate structure, those having a carboxylate at the anion moiety of the compounds with an onium hydroxide structure, such as acetate, adamantane-1-carboxylate, and perfluoroalkyl carboxylate can be exemplified.

As the compounds with a trialkylamine structure, tri(n-butyl)amine and tri(n-octyl)amine can be exemplified.

As the aniline compounds, 2,6-diisopropylaniline, N,N-dimethylaniline, N,N-dibutylaniline, and N,N-dihexylaniline can be exemplified.

As the alkylamine derivatives having a hydroxy group and/or an ether bond, ethanolamine, diethanolamine, triethanolamine, N-phenyldiethanolamine, and tris(methoxyethoxyethyl)amine can be exemplified.

As the aniline derivatives having a hydroxy group and/or an ether bond, N,N-bis(hydroxyethyl)aniline can be exemplified.

As preferred basic compounds, an amine compound having a phenoxy group, an ammonium salt compound having a phenoxy group, an amine compound having a sulfonic ester group, and an ammonium salt compound having a sulfonic ester group can further be exemplified.

In these compounds, it is preferred for at least one alkyl group to be bonded to a nitrogen atom. More preferably, an oxygen atom is contained in the chain of the alkyl group, thereby forming an oxyalkylene group. With respect to the number of oxyalkylene groups in each molecule, one or more is preferred, three to nine more preferred, and four to six further more preferred. Of these oxyalkylene groups, the groups of the formulae $—CH_2CH_2O—$, $—CH(CH_3)CH_2O—$ and $—CH_2CH_2CH_2O—$ are especially preferred.

As specific examples of these compounds, there can be mentioned, for example, the compounds (C1-1) to (C3-3) given as examples in section [0066] of US Patent Application Publication No. 2007/0224539 A.

The composition according to the present invention may contain, as a basic compound, a low-molecular compound containing a nitrogen atom and containing a group that is cleaved when acted on by an acid (hereinafter also referred to as a "low-molecular compound (D)" or "compound (D)").

The group that is cleaved when acted on by an acid is not particularly limited. However, an acetal group, a carbonate group, a carbamate group, a tertiary ester group, a tertiary hydroxyl group and a hemiaminal ether group are preferred. This group is most preferably a carbamate group or a hemiaminal ether group.

The molecular weight of the compound (D) is preferably in the range of 100 to 1000, more preferably 100 to 700 and most preferably 100 to 500.

It is preferred for the compound (D) to be an amine derivative in which the group that is cleaved when acted on by an acid is contained on its nitrogen atom.

The compound (D) may contain a carbamate group having a protective group on its nitrogen atom. The protective group as a constituent of the carbamate group can be expressed by, for example, general formula (d-1) below.

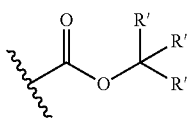

(d-1)

In general formula (d-1), each of R's independently represents a hydrogen atom, a linear or branched alkyl group, a cycloalkyl group, an aryl group, an aralkyl group or an alkoxyalkyl group. R's may be bonded to each other to thereby form a ring.

Preferably, R' is a linear or branched alkyl group, a cycloalkyl group or an aryl group, more preferably a linear or branched alkyl group or a cycloalkyl group.

Particular examples of these groups are shown below.

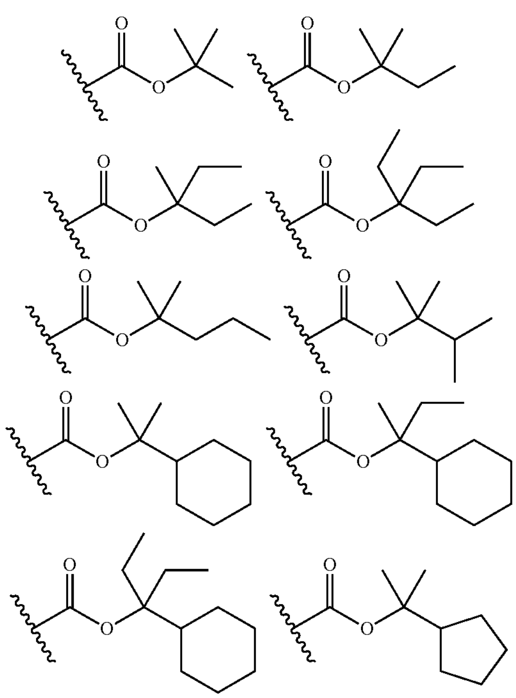

-continued

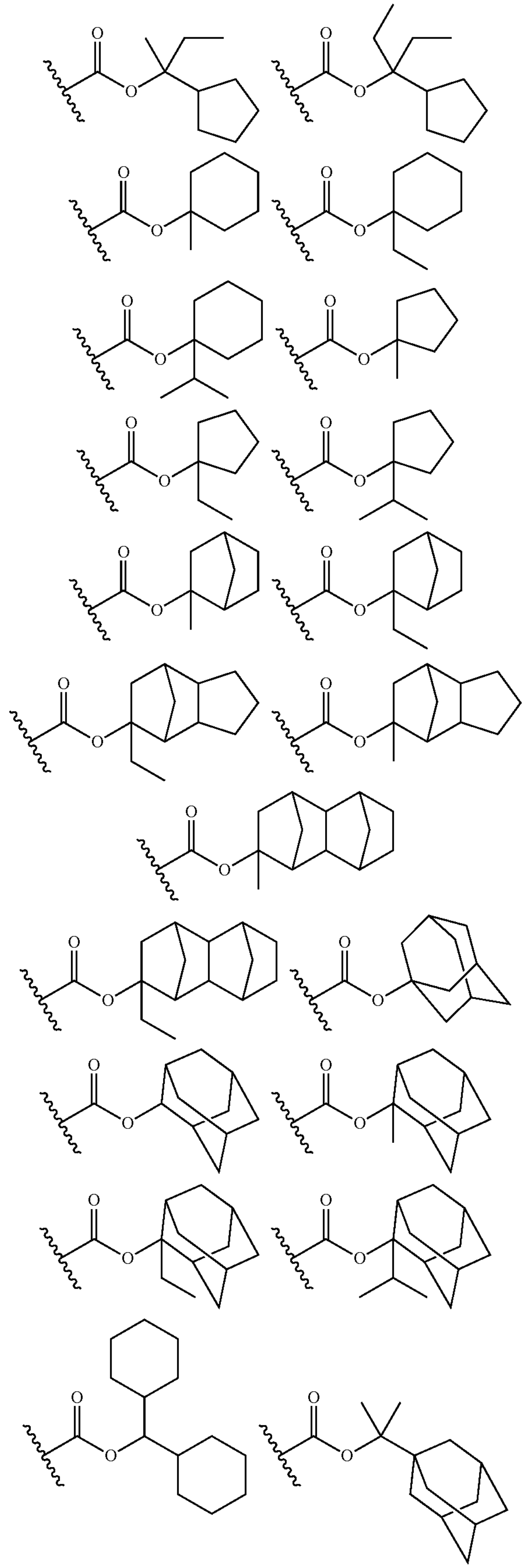

-continued

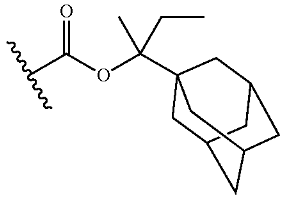
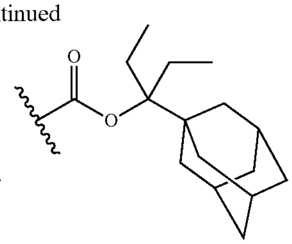
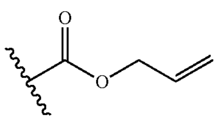
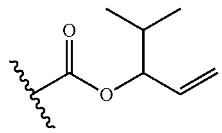
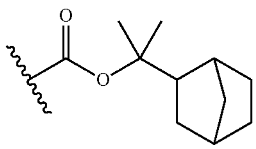
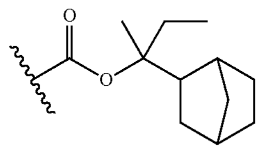
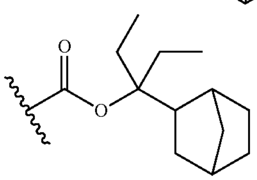
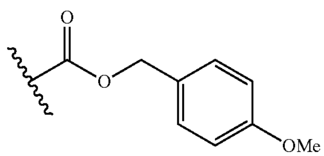
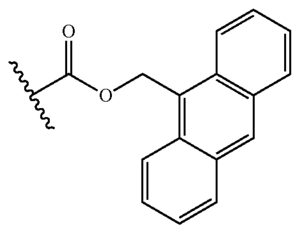
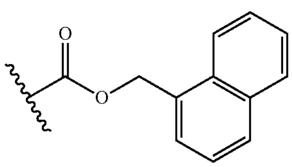
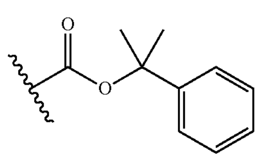
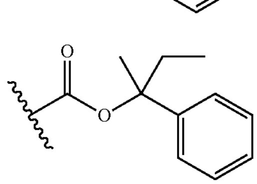
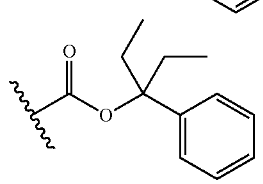
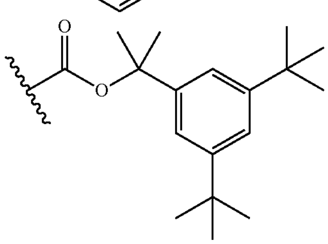

The compound (D) can also be constructed of an arbitrary combination of any of the above-mentioned various basic compounds with any of the structures of general formula (d-1).

It is especially preferred for the compound (D) to have any of the structures of general formula (F) below.

The compound (D) may be any of the compounds corresponding to the above-mentioned various basic compounds as long as it is a low-molecular compound containing a group that is cleaved when acted on by an acid.

(F)

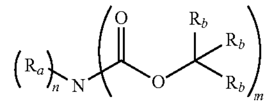

In general formula (F), Ra represents a hydrogen atom, an alkyl group, a cycloalkyl group, an aryl group or an aralkyl group. When n=2, two Ra's may be identical to or different from each other, and two Ra's may be bonded to each other to thereby form a bivalent heterocyclic hydrocarbon group (preferably up to 20 carbon atoms) or a derivative thereof.

Each of Rb's independently represents a hydrogen atom, an alkyl group, a cycloalkyl group, an aryl group, an aralkyl group or an alkoxyalkyl group, provided that in the moiety —C(Rb)(Rb)(Rb), when one or more Rb's are a hydrogen atom, at least one of the remaining Rb's is a cyclopropyl group, a 1-alkoxyalkyl group or an aryl group.

At least two Rb's may be bonded to each other to thereby form an alicyclic hydrocarbon group, an aromatic hydrocarbon group, a heterocyclic hydrocarbon group or a derivative thereof.

In the formula, n is an integer of 0 to 2, and m is an integer of 1 to 3, provided that n+m=3.

In general formula (F), each of the alkyl groups, cycloalkyl groups, aryl groups and aralkyl groups represented by Ra and Rb may be substituted with a functional group, such as a hydroxyl group, a cyano group, an amino group, a pyrrolidino group, a piperidino group, a morpholino group or an oxo group, as well as an alkoxy group or a halogen atom. With respect to the alkoxyalkyl group represented by Rb, the same substitution can be performed.

As the alkyl group, cycloalkyl group, aryl group and aralkyl group represented by Ra and/or Rb (these alkyl group, cycloalkyl group, aryl group and aralkyl group may be substituted with the above functional group, alkoxy group or halogen atom), there can be mentioned, for example, a group derived from a linear or branched alkane, such as methane, ethane, propane, butane, pentane, hexane, heptane, octane, nonane, decane, undecane or dodecane; a group as obtained by substituting the above alkane-derived group with at least one or at least one type of cycloalkyl group, such as a cyclobutyl group, a cyclopentyl group or a cyclohexyl group;

a group derived from a cycloalkane, such as cyclobutane, cyclopentane, cyclohexane, cycloheptane, cyclooctane, norbornane, adamantane or noradamantane; a group as obtained by substituting the above cycloalkane-derived group with at least one or at least one type of linear or branched alkyl group, such as a methyl group, an ethyl group, an n-propyl group, an i-propyl group, an n-butyl group, a 2-methylpropyl group, a 1-methylpropyl group or a t-butyl group;

a group derived from an aromatic compound, such as benzene, naphthalene or anthracene; a group as obtained by substituting the above aromatic-compound-derived group with at least one or at least one type of linear or branched alkyl group, such as a methyl group, an ethyl group, an n-propyl group, an i-propyl group, an n-butyl group, a 2-methylpropyl group, a 1-methylpropyl group or a t-butyl group;

a group derived from a heterocyclic compound, such as pyrrolidine, piperidine, morpholine, tetrahydrofuran, tetrahydropyran, indole, indoline, quinoline, perhydroquinoline, indazole or benzimidazole; a group as obtained by substituting the above heterocyclic-compound-derived group with at least one or at least one type of linear or branched alkyl group or aromatic-compound-derived group;

a group as obtained by substituting the above linear or branched-alkane-derived group or cycloalkane-derived group with at least one or at least one type of aromatic-compound-derived group, such as a phenyl group, a naphthyl group or an anthracenyl group; any of groups as obtained by substituting the above substituents with a functional group, such as a hydroxyl group, a cyano group, an amino group, a pyrrolidino group, a piperidino group, a morpholino group or an oxo group; and the like.

As the bivalent heterocyclic hydrocarbon group (preferably 1 to 20 carbon atoms) formed by the mutual bonding of Ra's, or derivative thereof, there can be mentioned, for example, a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline or 1,5,9-triazacyclododecane; a group as obtained by substituting the above heterocyclic-compound-derived group with at least one or at least one type of linear or branched-alkane-derived group, cycloalkane-derived group, aromatic-compound-derived group, heterocyclic-compound-derived group or functional group, such as a hydroxyl group, a cyano group, an amino group, a pyrrolidino group, a piperidino group, a morpholino group or an oxo group; or the like.

Particular examples of compounds (D) especially preferred in the present invention are shown below, which however in no way limit the scope according to the present invention.

(D-1)

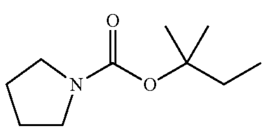

(D-2)

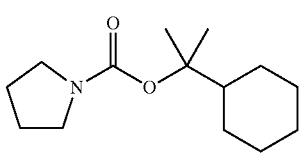

(D-3)

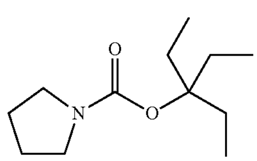

(D-4)

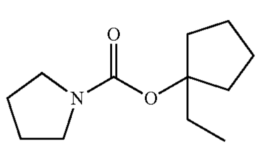

(D-5)

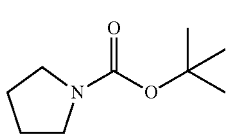

-continued (D-6)

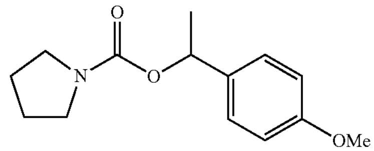

(D-7)

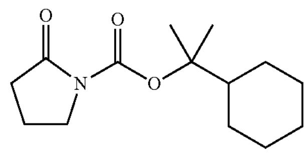

(D-8)

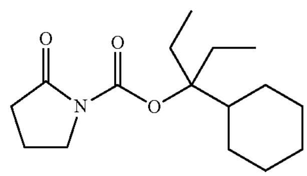

(D-9)

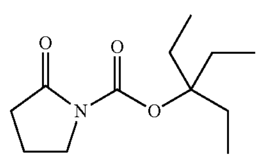

(D-10)

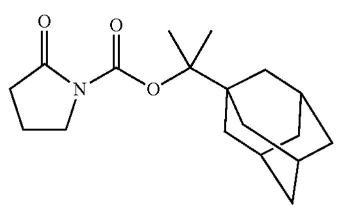

(D-11)

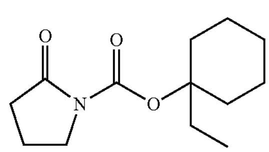

(D-12)

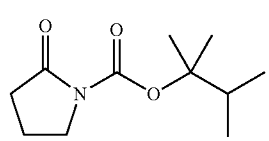

(D-13)

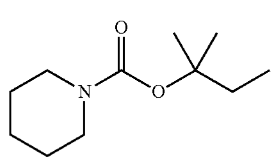

(D-14)

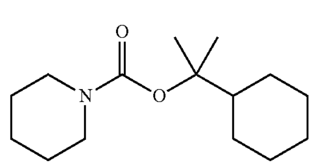

(D-15)
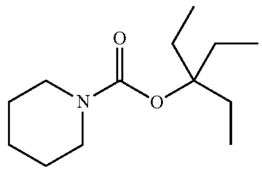
(D-16)
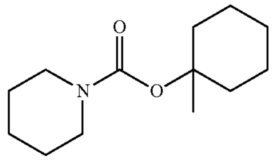
(D-17)
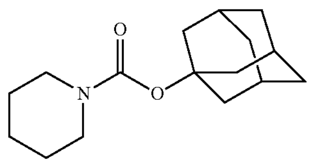
(D-18)
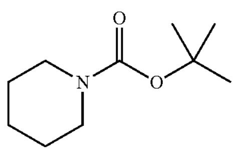
(D-19)
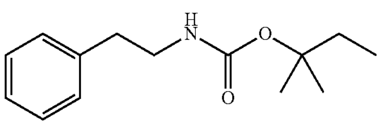
(D-20)
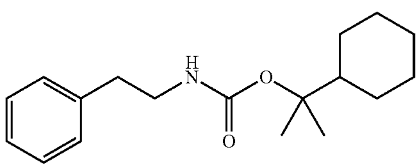
(D-21)
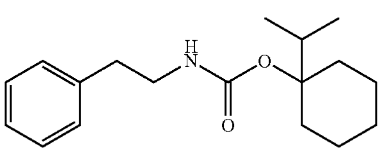
(D-22)
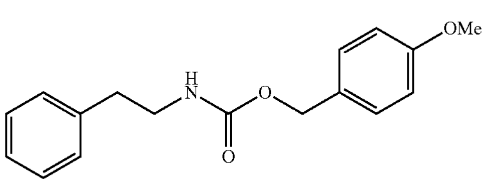
(D-23)
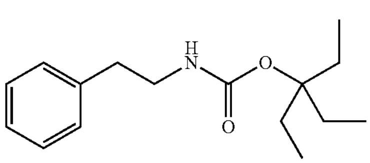
(D-24)
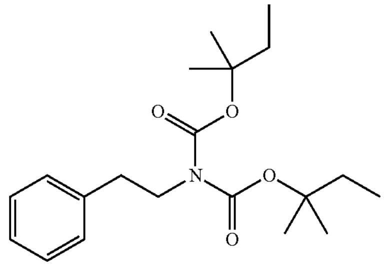
(D-25)
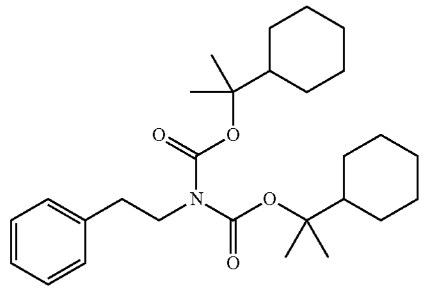
(D-26)
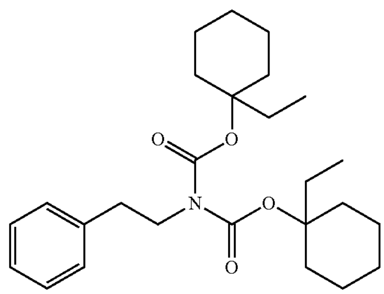
(D-27)
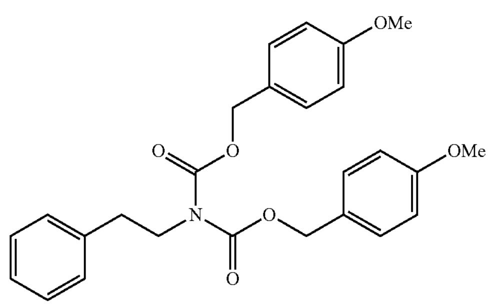
(D-28)
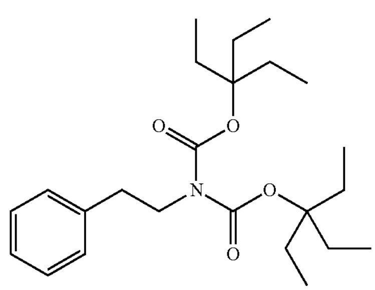

-continued
(D-29)
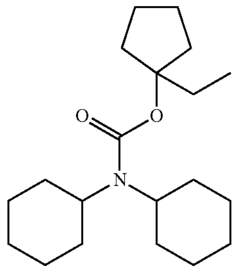
(D-30)
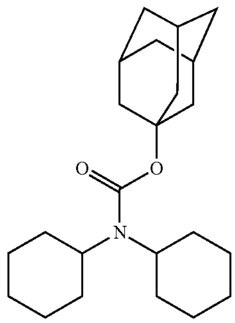
(D-31)
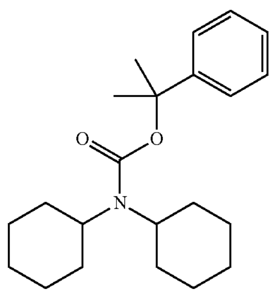
(D-32)
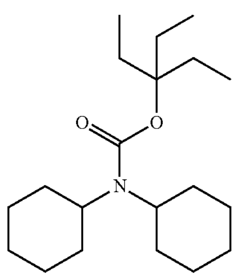
(D-33)
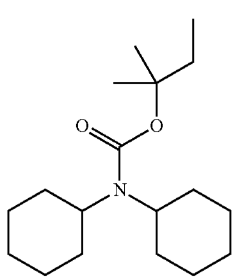
-continued
(D-34)
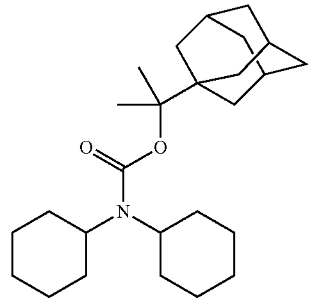
(D-35)
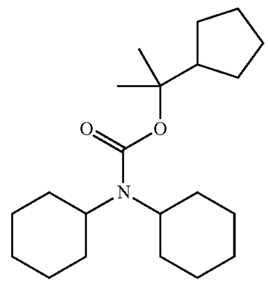
(D-36)
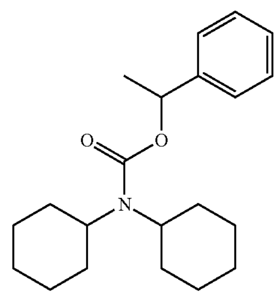
(D-37)
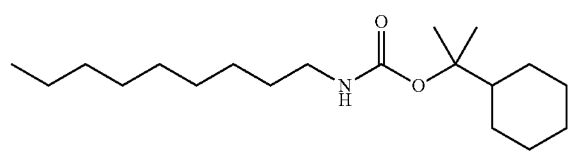
(D-38)
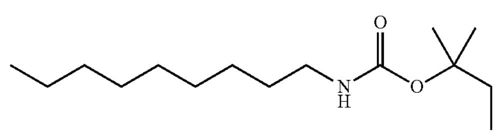
(D-39)
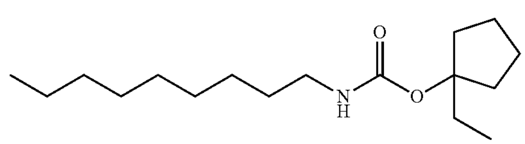
(D-40)
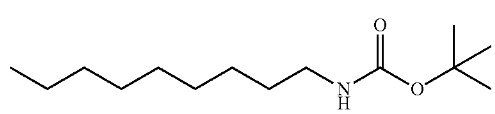

-continued
(D-41)
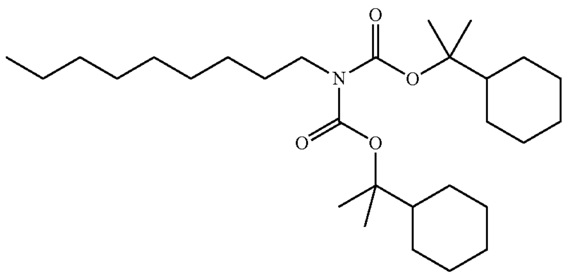
(D-42)
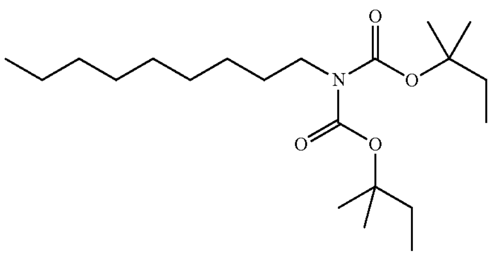
(D-43)
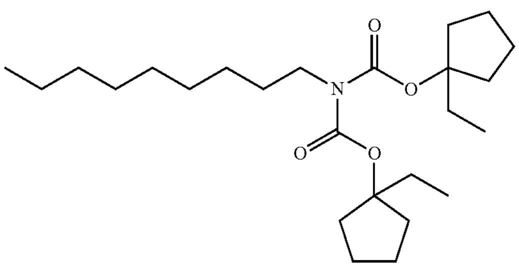
(D-44)
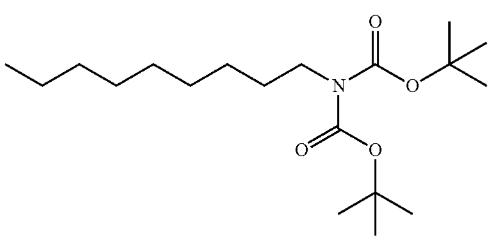
(D-45)
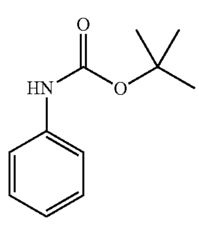
(D-46)
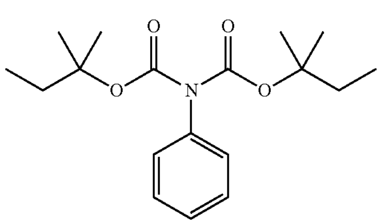
-continued
(D-47)
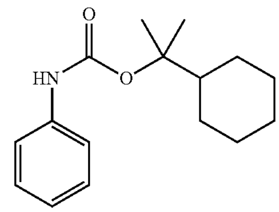
(D-48)
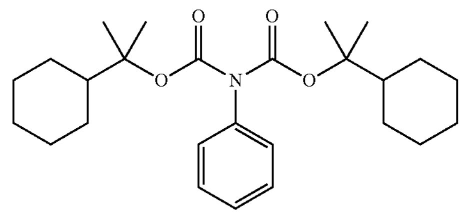
(D-49)
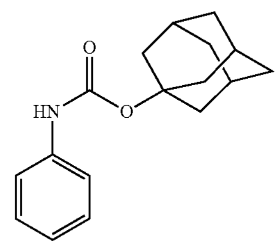
(D-50)
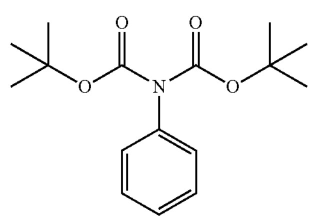
(D-51)
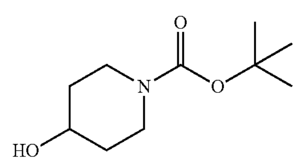
(D-52)
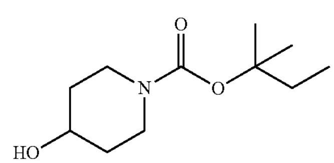
(D-53)
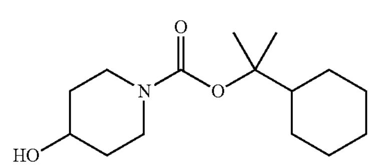
(D-54)
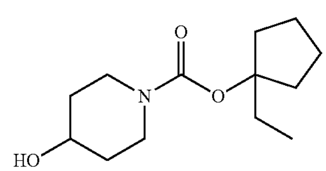

-continued (D-55)

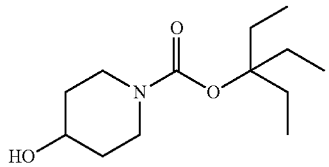

The compounds of general formula (F) can be easily synthesized from commercially available amines by the methods described in, for example, Protective Groups in Organic Synthesis, the fourth edition. The commonest method for obtaining the compounds comprises causing a bicarbonic ester or a haloformic ester to act on commercially available amines. In the formulae, X represents a halogen atom. The definitions and particular examples of Ra and Rb are the same as set forth above in connection with general formula (F) above.

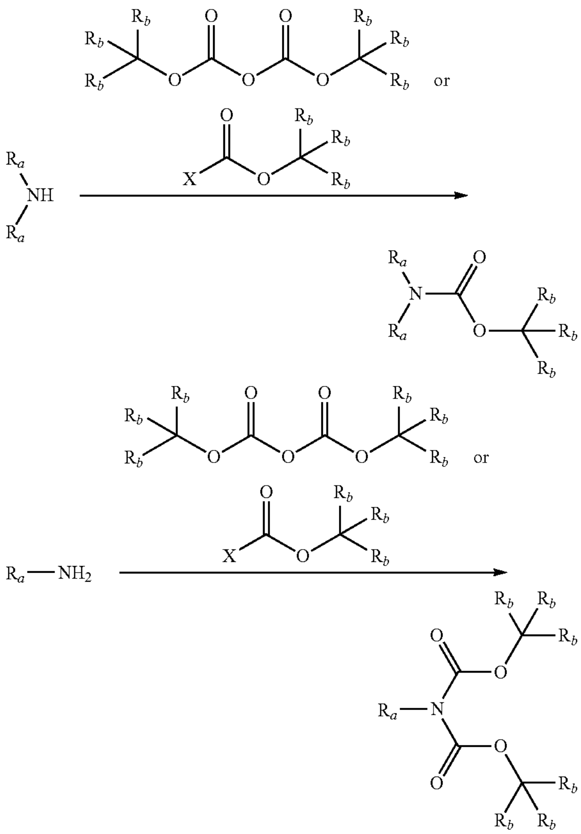

The basic compounds (including compound (D)) described above can be used either individually or in combination.

The total amount of basic compound used based on the solid contents of the actinic ray-sensitive or radiation-sensitive resin composition is preferably in the range of 0.001 to 20 mass %, more preferably 0.001 to 10 mass %, and further more preferably 0.01 to 5 mass %.

The molar ratio of the total amount of acid generators to the total amount of basic compounds is preferably in the range of 2.5 to 300, more preferably 5.0 to 200 and further more preferably 7.0 to 150. When this molar ratio is extremely lowered, the possibility of sensitivity and/or resolution deterioration is invited. On the other hand, when the molar ratio is extremely raised, any pattern thickening might occur during the period between exposure and postbake.

[E] Hydrophobic Resin

The composition according to the present invention may further contain a hydrophobic resin. When the hydrophobic resin is contained, the hydrophobic resin is localized in a surface layer of resist film, so that in the use of water as an immersion medium, the receding contact angle of the film with the immersion liquid can be increased to thereby enhance the immersion liquid tracking property of the film.

The receding contact angle of a film after baking and before exposing is preferably in the range of 60° to 90°, more preferably 65° or higher, further more preferably 70° or higher, and particularly preferably 75° or higher as measured under the conditions of temperature 23±3° C. and humidity 45±5%.

Although the hydrophobic resin is unevenly localized on any interface, as different from the surfactant, the hydrophobic resin does not necessarily have to have a hydrophilic group in its molecule and does not need to contribute toward uniform mixing of polar/nonpolar substances.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the film in dynamic condition is important, and it is required for the actinic ray-sensitive or radiation-sensitive resin composition to be capable of tracking the high-speed scanning of the exposure head without leaving droplets.

The hydrophobic resin (HR) is preferably a resin containing at least one of fluorine atom and silicon atom. The fluorine atom or the silicon atom in the hydrophobic resin (HR) may present either in the principal chain or in the side chain. The hydrophobicity (water following property) of the film surface can be increased and the amount of development residue (scum) can be reduced by the containment of the fluorine atom or the silicon atom in the hydrophobic resin.

When the hydrophobic resin (HR) contains fluorine atom, the resin preferably has, as a partial structure containing one or more fluorine atoms, an alkyl group containing one or more fluorine atoms, a cycloalkyl group containing one or more fluorine atoms, or an aryl group containing one or more fluorine atoms.

The alkyl group containing one or more fluorine atoms is a linear or branched alkyl group having at least one hydrogen atom thereof substituted with one or more fluorine atoms. The group preferably has 1 to 10 carbon atoms, more preferably 1 to 4 carbon atoms. Further, other substituents than fluorine atom may also be contained.

The cycloalkyl group containing one or more fluorine atoms is a monocyclic or polycyclic alkyl group having at least one hydrogen atom thereof substituted with one or more fluorine atoms. Further, other substituents than fluorine atom may also be contained.

The aryl group containing one or more fluorine atoms is an aryl group having at least one hydrogen atom of an aryl group substituted with one or more fluorine atoms. As the aryl group, a phenyl or a naphthyl group can be exemplified. Further, other substituents than fluorine atom may also be contained.

As preferred alkyl groups containing one or more fluorine atoms, cycloalkyl groups containing one or more fluorine atoms and aryl groups containing one or more fluorine atoms, groups of the following general formulae (F2) to (F4) can be exemplified.

(F2)

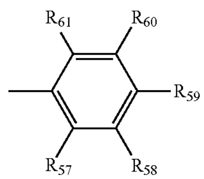

(F3)

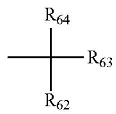

(F4)

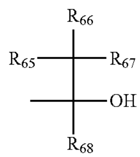

In the general formulae (F2) to (F4), each of $R_{57}$ to $R_{68}$ independently represents a hydrogen atom, a fluorine atom or an alkyl group in condition that: at least one of $R_{57}$-$R_{61}$ represents a fluorine atom or an alkyl group having at least one hydrogen atom thereof substituted with one or more fluorine atoms; at least one of $R_{62}$-$R_{69}$ represents a fluorine atom or an alkyl group having at least one hydrogen atom thereof substituted with one or more fluorine atoms; and at least one of $R_{65}$-$R_{68}$ represents a fluorine atom or an alkyl group having at least one hydrogen atom thereof substituted with one or more fluorine atoms. These alkyl groups preferably are those having 1 to 4 carbon atoms. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group having at least one hydrogen atom thereof substituted with one or more fluorine atoms, more preferably a perfluoroalkyl group having 1 to 4 carbon atoms. $R_{62}$ and $R_{63}$ may be bonded to each other to form a ring.

Specific examples of the groups represented by the general formula (F2) include a p-fluorophenyl group, a pentafluorophenyl group, and a 3,5-di(trifluoromethyl)phenyl group.

Specific examples of the groups represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups represented by the general formula (F4) include —$C(CF_3)_2OH$, —$C(C_2F_5)_2OH$, —$C(CF_3)(CH_3)OH$, —$CH(CF_3)OH$ and the like. Of these, —$C(CF_3)_2OH$ is particularly preferred.

Preferred repeating units containing one or more fluorine atoms are as follows.

(C-Ia)

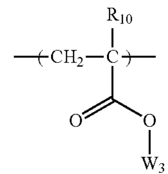

(C-Ib)

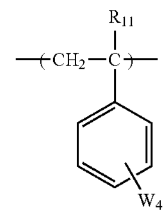

(C-Ic)

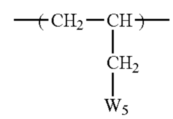

(C-Id)

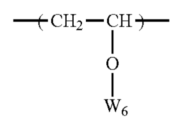

In the formulae, $R_{10}$ and $R_{11}$ each independently represents a hydrogen atom, a fluorine atom, and an alkyl group. As the alkyl group, a linear or branched alkyl group having 1 to 4 carbon atoms is preferred. As an alkyl group with one or more substituents, a fluorinated alkyl group can especially be exemplified.

Each of $W_3$ to $W_6$ independently represents an organic group containing one or more fluorine atoms. Specifically, groups represented by the general formulae (F2) to (F4) can be exemplified.

The following units may also be employed as the repeating unit containing one or more fluorine atoms.

(C-II)

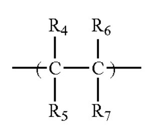

(C-III)

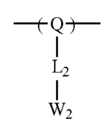

In the formulae, each of $R_4$ to $R_7$ independently represents a hydrogen atom, a fluorine atom, and an alkyl group with the proviso that at least one of $R_4$ to $R_7$ represents a fluorine atom and $R_4$ and $R_5$ or $R_6$ and $R_7$ may form a ring. As the alkyl group, a linear or branched alkyl group having 1 to 4 carbon atoms is preferred. As an alkyl group with one or more substituents, a fluorinated alkyl group can especially be exemplified.

Q represents an alicyclic structure. The alicyclic structure may contain one or more substituents, and may either be monocyclic or polycyclic. When the alicyclic structure contains a polycyclic structure, it may be a bridged type. As the monocyclic one, a cycloalkyl group having 3 to 8 carbon atoms such as a cyclopenryl group, a cyclohexyl group, a cyclobutyl group, or a cyclobutyl group is preferred. As the polycyclic one, a group containing bicyclo-, tricyclo-, or tetracyclo-structure having 5 or more carbon atoms can be exemplified. The polycyclic one preferably is a cycloalkyl group having 6 to 20 carbon atoms such as an adamantyl group, a norbornyl group, a dicyclopentyl group, a tricyclodecanyl group, or a tetracyclododecyl group. At least a part of carbon atoms in the cycloalkyl group may be substituted with one or more heteroatoms such as oxygen atoms.

$L_2$ represents a single bond or divalent connecting group. As the divalent connecting group, a substituted or nonsubstituted arylene group, a substituted or nonsubstituted alkylene group, —O—, —$SO_2$—, —CO—, —N(R)— (R represents a hydrogen atom or an alkyl group), —$NHSO_2$—, or a combination of two or more of these groups.

The hydrophobic resin (HR) may contain one or more silicon atoms. As partial structure containing one or more silicon atoms, an alkylsilyl structure or a cyclosiloxane structure can be exemplified. Preferred alkylsilyl structure is the one containing one or more trialkylsilyl groups.

As the alkylsilyl structure and cyclosiloxane structure, any of the groups represented by the following general formulae (CS-1) to (CS-3) can be exemplified.

(CS-1)

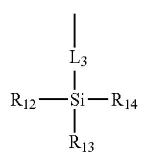

(CS-2)

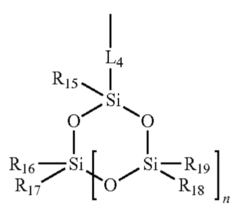

(CS-3)

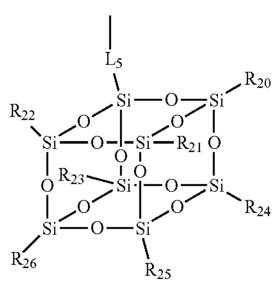

In the general formulae (CS-1) to (CS-3), each of $R_{12}$ to $R_{26}$ independently represents a linear or branched alkyl group or a cycloalkyl group. The alkyl group preferably has 1 to 20 carbon atoms. The cycloalkyl group preferably has 3 to 20 carbon atoms.

Each of $L_3$ to $L_5$ represents a single bond or a bivalent connecting group. As the bivalent connecting group, any one or a combination of two or more groups selected from the group consisting of an alkylene group, a phenylene group, an ether group, a thioether group, a carbonyl group, an ester group, an amido group, a urethane group and a urea group can be exemplified.

In the formulae, n is an integer of 1 to 5, and preferably an integer of 2 to 4.

Specific examples of the repeating units containing a fluorine atom or a silicon atom will be shown below. In the specific examples, $X_1$ represents a hydrogen atom, —$CH_3$, —F or —$CF_3$, and $X_2$ represents —F or —$CF_3$.

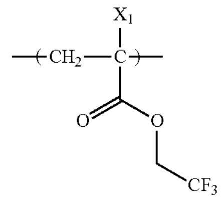
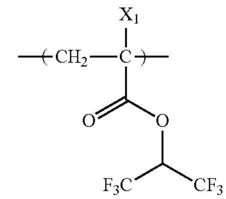
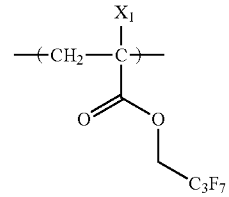
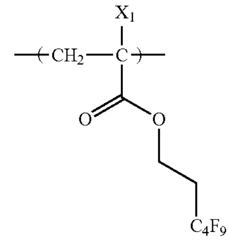
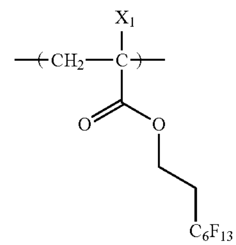
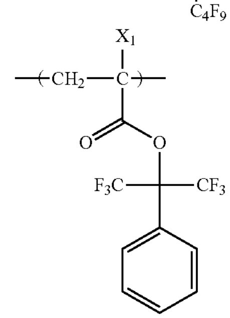
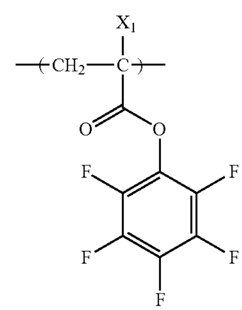
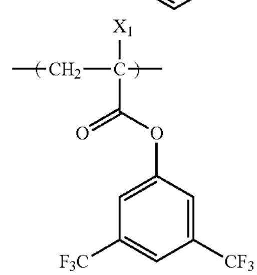
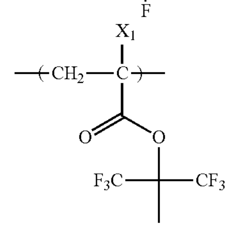
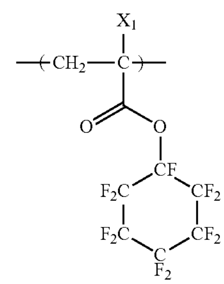
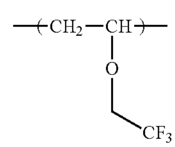
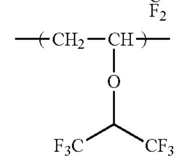

-continued
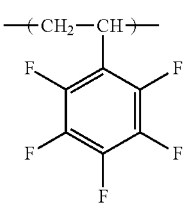
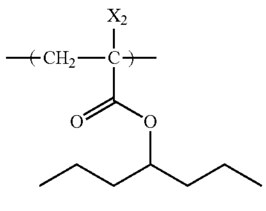
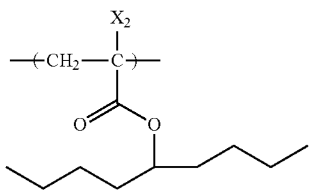
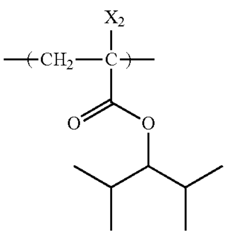
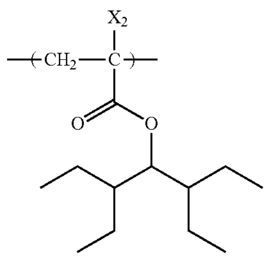
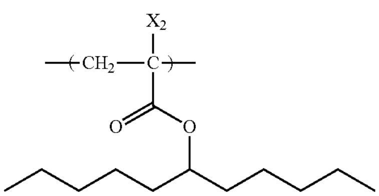
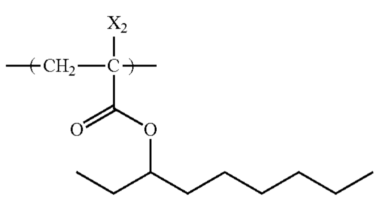
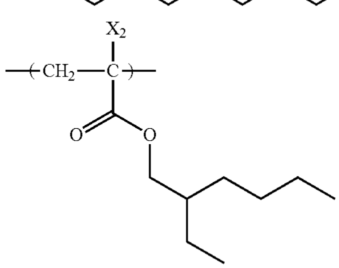
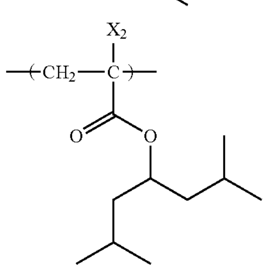
-continued
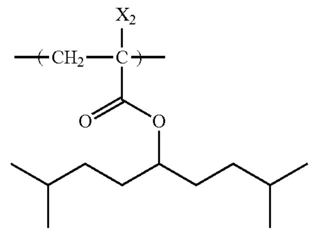
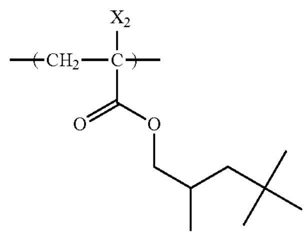
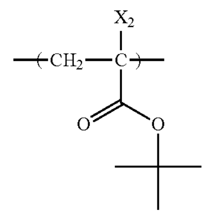
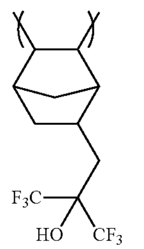
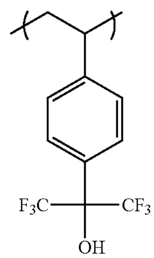
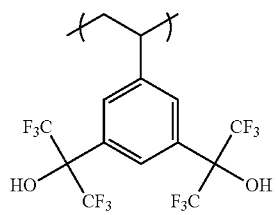
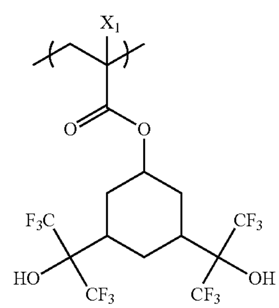
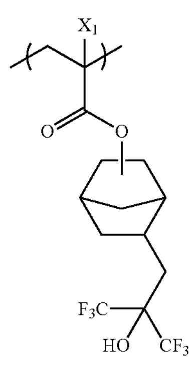
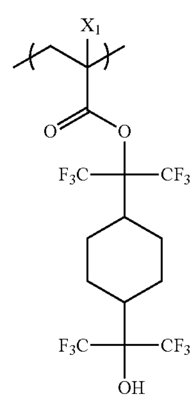

-continued
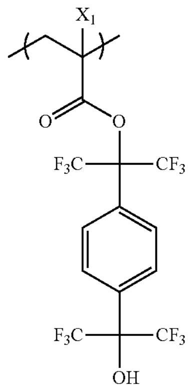
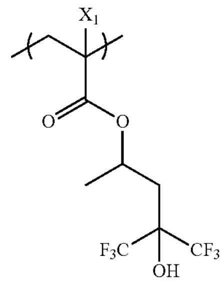
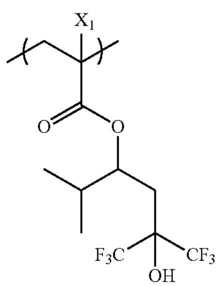
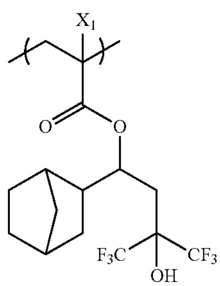
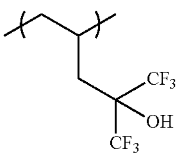
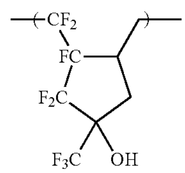
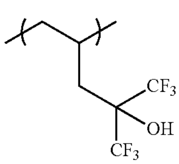
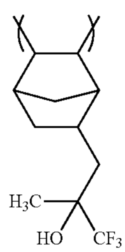
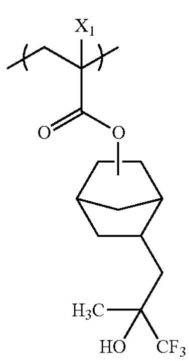
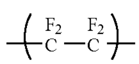
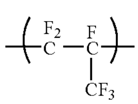
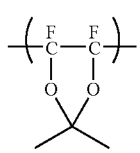
-continued
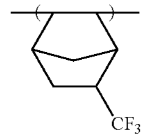
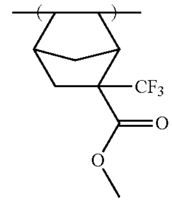
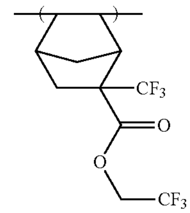
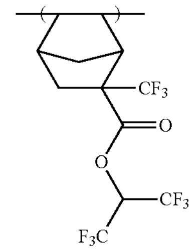
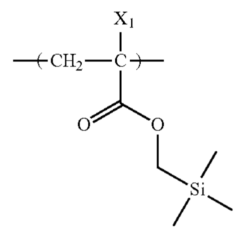
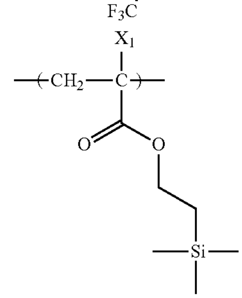
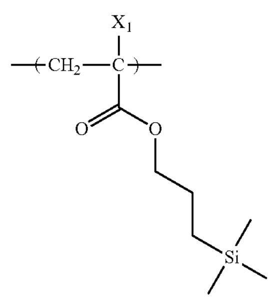
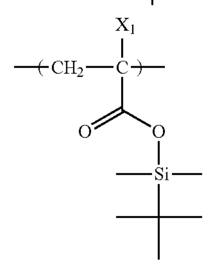
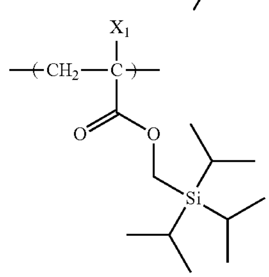
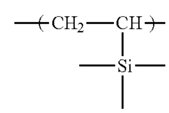
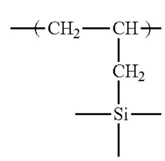
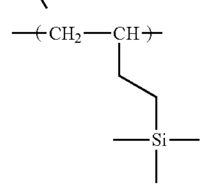
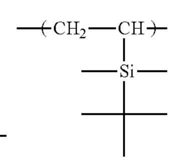
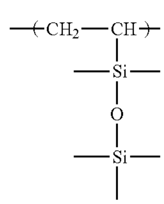
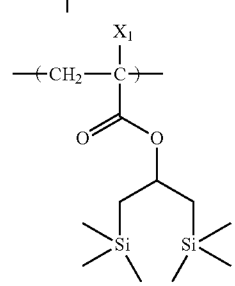

-continued

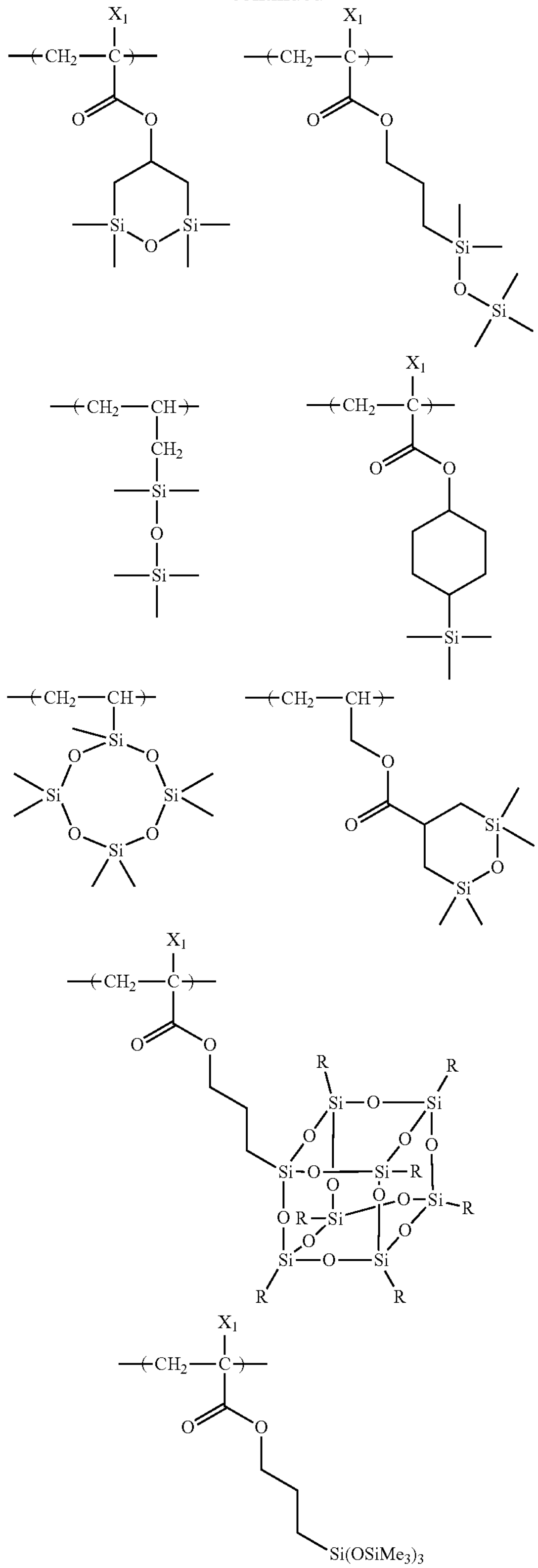

R = $CH_3$, $C_2H_5$, $C_3H_7$, $C_4H_9$

Further, the hydrophobic resin (HR) may contain at least one group selected from among the following groups (x) and (z):

(x) a polar group;

(z) a group that is decomposed by the action of an acid.

As the polar group (x), a phenolic hydroxy group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group can be exemplified.

As preferred polar groups, a fluoroalcohol group, a sulfonimido group, and a bis(carbonyl)methylene group can be exemplified. As preferred fluoroalcohol group, a hexafluoroisopropanol group can be exemplified.

As the repeating unit containing a polar group (x), use can be made of any of a repeating unit resulting from direct bonding of an polar group to the principal chain of a resin like a repeating unit of acrylic acid or methacrylic acid; a repeating unit resulting from bonding, via a connecting group, of a polar group to the principal chain of a resin; and a repeating unit resulting from polymerization with the use of a chain transfer agent or polymerization initiator having a polar group to introduce the same in a polymer chain terminal.

The content of repeating units containing a polar group (x) based on all the repeating units of the polymer is preferably in the range of 1 to 50 mol %, more preferably 3 to 35 mol %, and still more preferably 5 to 20 mol %.

Specific examples of the repeating units containing a polar group (x) will be shown below. In the formulae, Rx represents H, $CH_3$, $CH_2OH$, or $CF_3$.

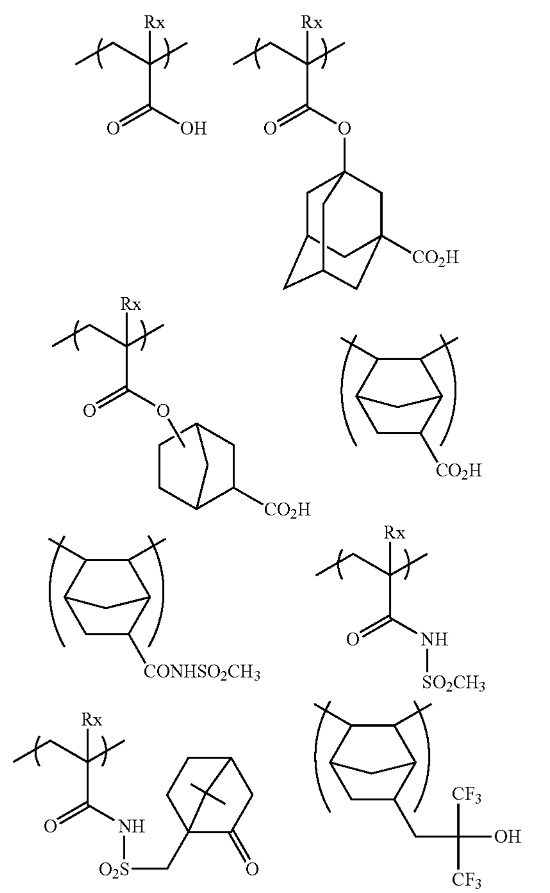

-continued

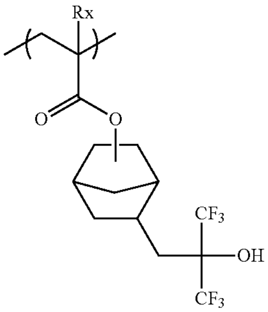

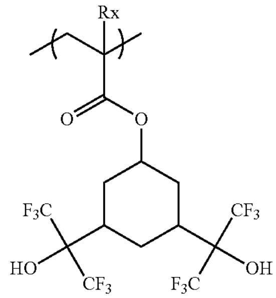

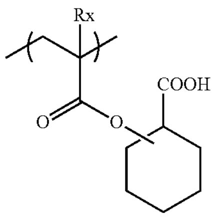

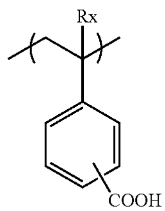

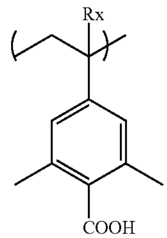

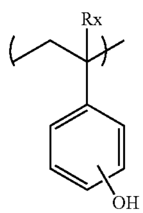

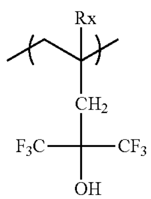

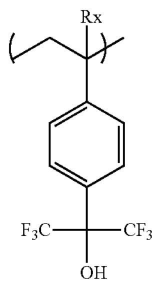

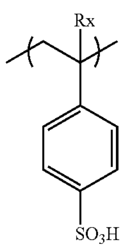

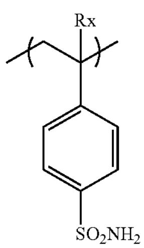

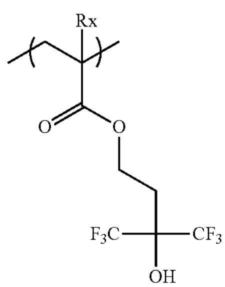

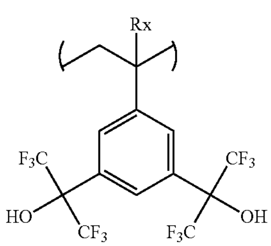

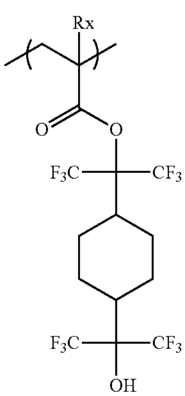

-continued

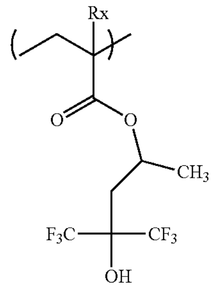

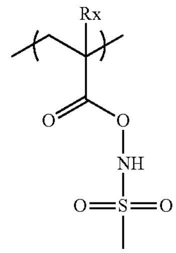

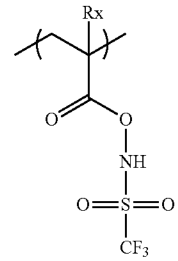

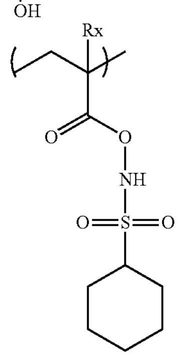

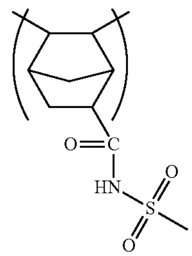

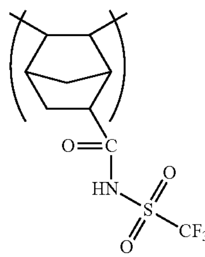

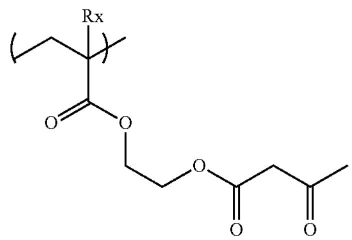

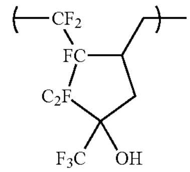

As the repeating unit containing a group (z) that is decomposed by the action of an acid, for example, those explained in connection with the acid-decomposable resin can be exemplified.

The content of repeating units containing such a group (z) based on all the repeating units of the hydrophobic resin is preferably in the range of 1 to 80 mol %, more preferably 10 to 80 mol %, and still more preferably 20 to 60 mol %.

The hydrophobic resin (HR) may further have any of the repeating units represented by the following general formula (VI).

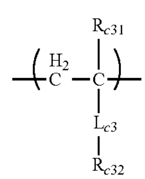

(VI)

In the formula (VI), $R_{c31}$ represents a hydrogen atom, an alkyl group, an alkyl group optionally substituted with one or more fluorine atoms, a cyano group or a group of the formula —$CH_2$—

O—$R_{ac2}$ in which $R_{ac2}$ represents a hydrogen atom, an alkyl group or an acyl group. $R_{c31}$ is preferably a hydrogen atom, a methyl group, a hydroxymethyl group, or a trifluoromethyl group, more preferably a hydrogen atom or a methyl group.

$R_{c32}$ represents a group containing an alkyl group, a cycloalkyl group, an alkenyl group, a cycloalkenyl group, or an aryl group. These groups may be substituted with fluorine atom and/or silicon atom.

$L_{c3}$ represents a single bond or a bivalent connecting group.

The alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms such as a phenyl group or a naphthyl group.

These groups may have one or more substituents.

Preferably, $R_{c32}$ represents an unsubstituted alkyl group or an alkyl group substituted with one or more fluorine atoms.

$L_{c3}$ represents a single bond or a bivalent connecting group. As the bivalent connecting group represented by $L_{c3}$, an alkylene group (preferably having 1 to 5 carbon atoms), an oxy group, a phenylene group, or an ester bond (a group represented by —COO—) can be exemplified.

The hydrophobic resin (HR) may contain a repeating unit represented by the general formula (VII) or (VIII) as the one represented by the general formula (VI).

(VII)

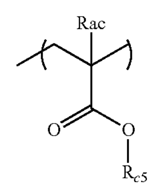

(VIII)

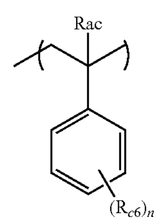

In the general formula (VII), $R_{c5}$ represents a hydrocarbon group having at least one cyclic structure in which neither a hydroxyl group nor a cyano group is contained.

Rac represents a hydrogen atom, an alkyl group, an alkyl group that may be substituted with a fluorine atom, a cyano group or a group of the formula —$CH_2$—O—$Rac_2$ in which $Rac_2$ represents a hydrogen atom, an alkyl group or an acyl group. Rac is preferably a hydrogen atom, a methyl group, a hydroxymethyl group or a trifluoromethyl group, especially preferably a hydrogen atom or a methyl group.

The cyclic structures contained in $R_{c5}$ include a monocyclic hydrocarbon group and a polycyclic hydrocarbon group. As the monocyclic hydrocarbon group, there can be mentioned, for example, a cycloalkyl group having 3 to 12 carbon atoms or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

In the general formula (VIII), Rc6 represents an alkyl group, a cycloalkyl group, an alkenyl group, a cycloalkenyl group, an alkoxycarbonyl group or an alkylcarbonyloxy group. These groups may be substituted with a fluorine atom or a silicon atom.

The alkyl group represented by $R_{c6}$ is preferably a linear or branched alkyl group having 1 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

In the formula, n is an integer of 0 to 5. When n is 2 or greater, the plurality of $R_{c6}$s may be identical to or different from each other.

It is preferred for $R_{c6}$ to represent an unsubstituted alkyl group or an alkyl group substituted with a fluorine atom. A trifluoromethyl group and a t-butyl group are especially preferred.

The hydrophobic resin may further contain any of the repeating units represented by general formula (CII-AB) below.

(CII-AB)

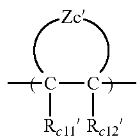

In the formula (CII-AB), each of $R_{c11'}$ and $R_{c12'}$ independently represents a hydrogen atom, a cyano group, a halogen atom or an alkyl group.

Zc' represents an atomic group required for forming an alicyclic structure in cooperation with two carbon atoms (C—C) to which $R_{c11'}$ and $R_{c12'}$ are respectively bonded.

Further, the general formula (CII-AB) is preferable to be one of the formulae (CII-AB1) or (CII-AB2) below.

CII-AB1

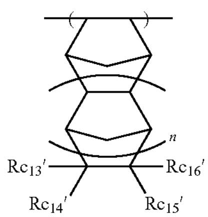

CII-AB2

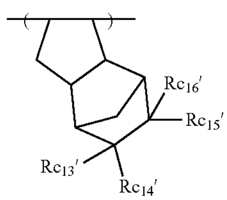

In the formulae (CII-AB1) and (CII-AB2), each of $R_{c13'}$ to $R_{c16'}$ independently represents a hydrogen atom, a halogen atom, an alkyl group, or a cycloalkyl group.

At least two of $R_{c13'}$ to $R_{c16'}$ may bond to each other to form a ring.

In the formula (CII-AB), n represents 0 or 1.

Specific examples of the repeating units represented by the general formulae (VI) or (CII-AB) will be shown below. In the formulae, Ra represents H, $CH_3$, $CH_2OH$, $CF_3$ or CN.

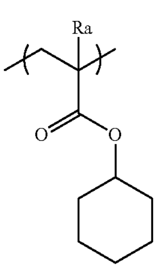

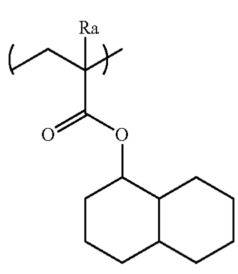

-continued

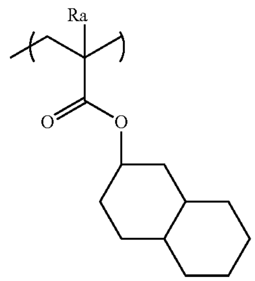

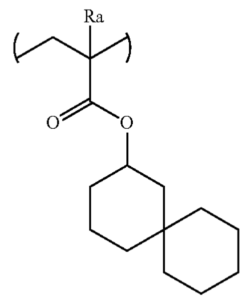

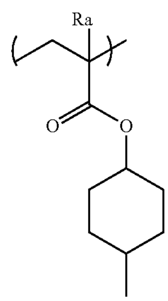

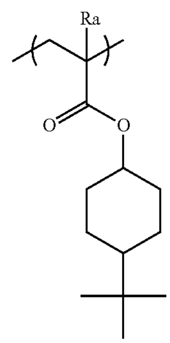

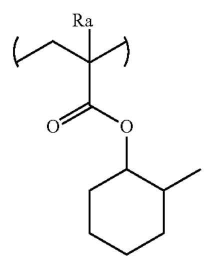

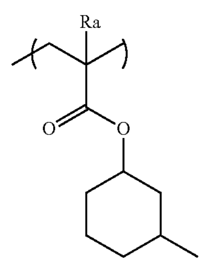

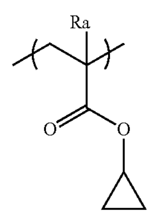

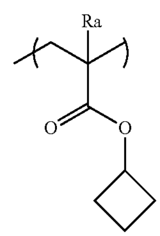

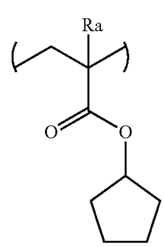

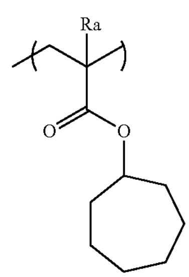

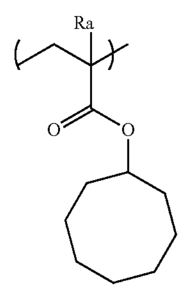

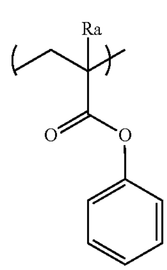

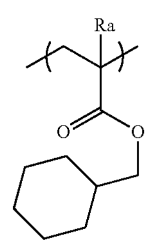

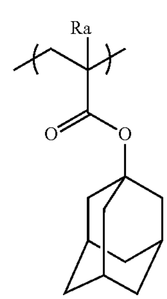

-continued
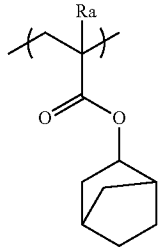
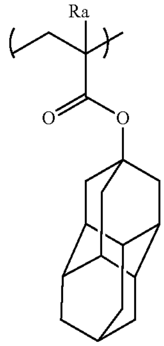
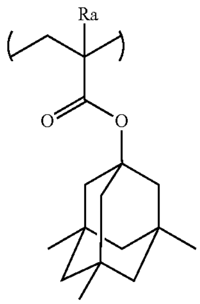
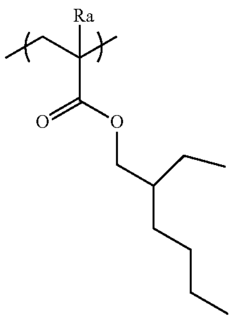
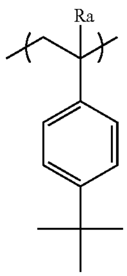
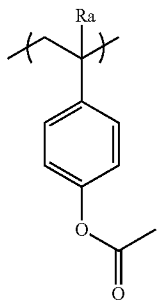
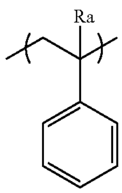
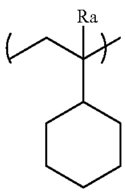
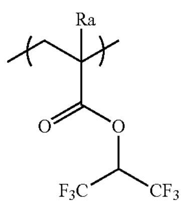
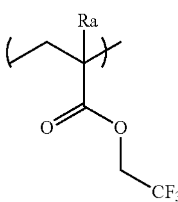
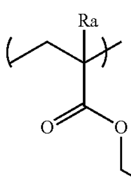
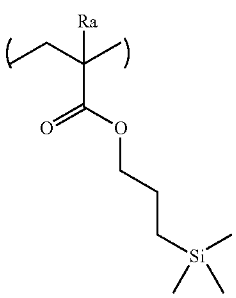
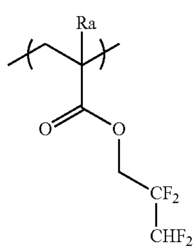
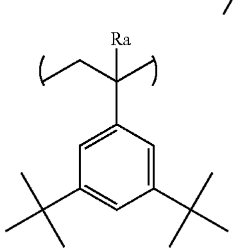
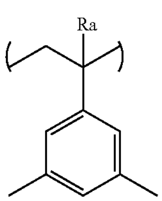
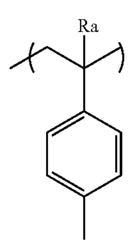
-continued
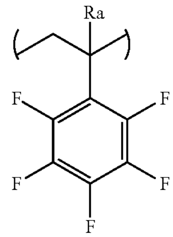
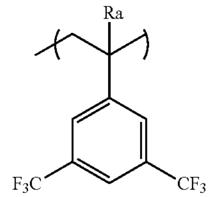
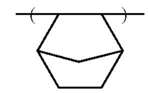
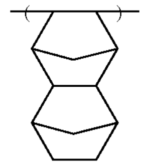
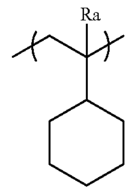
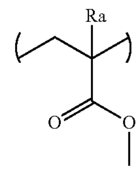
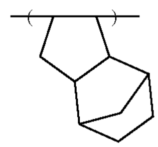
Specific examples of the hydrophobic resins (HR) will be shown below. The following Table 1 and Table 2 shows the molar ratio of individual repeating units (corresponding to individual repeating units in order from the left), weight average molecular weight, and degree of dispersal with respect to each of the resins.
(HR-1)
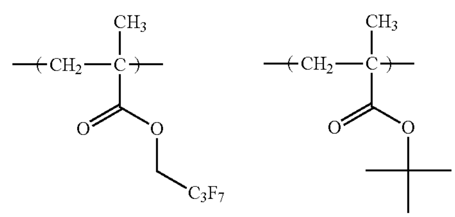
(HR-2)
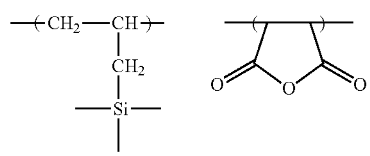
(HR-3)
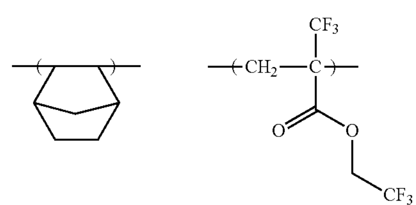
(HR-4)
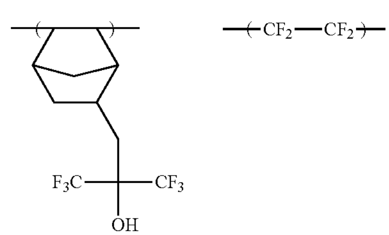

-continued
(HR-5)
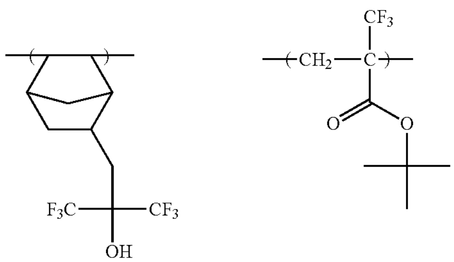
(HR-6)
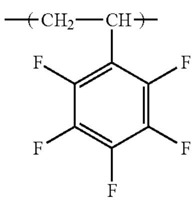
(HR-7)
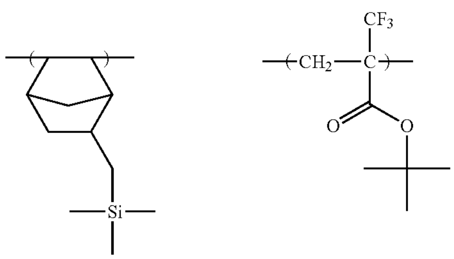
(HR-8)
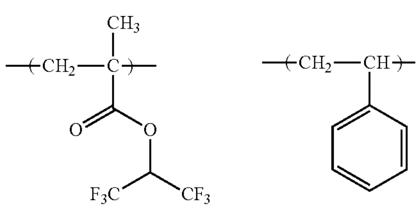
(HR-9)
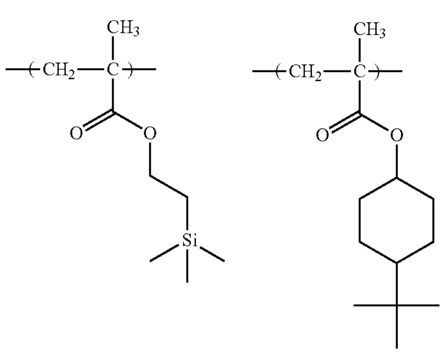
-continued
(HR-10)
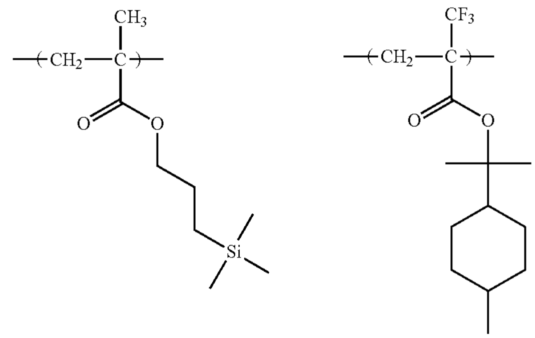
(HR-11)
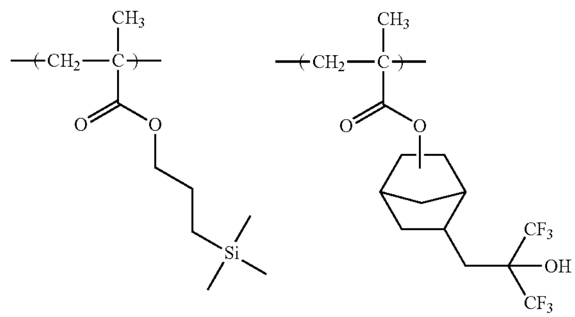
(HR-12)
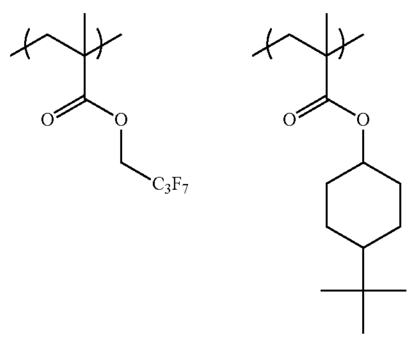
(HR-13)
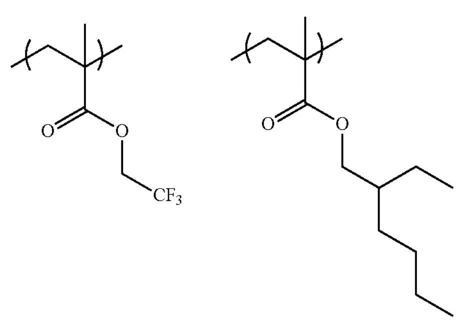
(HR-14)
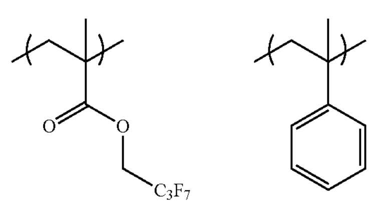

-continued
(HR-15)
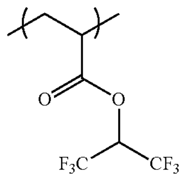
(HR-16)
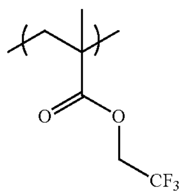
(HR-17)
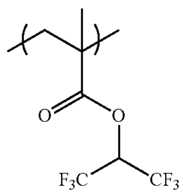
(HR-18)
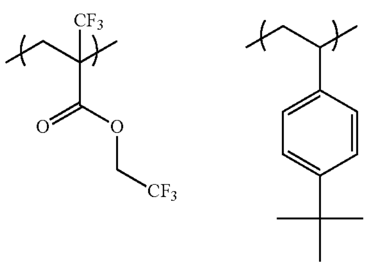
(HR-19)
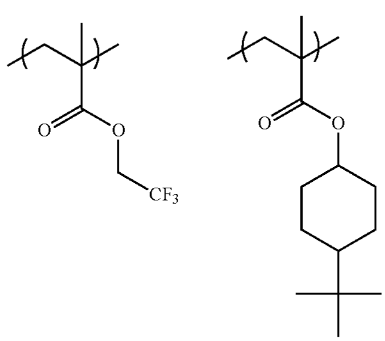
(HR-20)
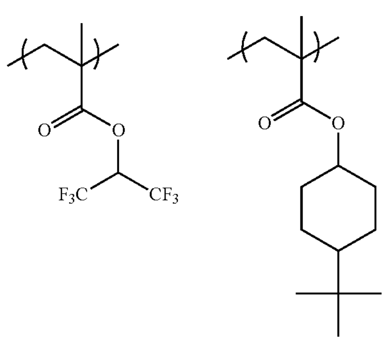
-continued
(HR-21)
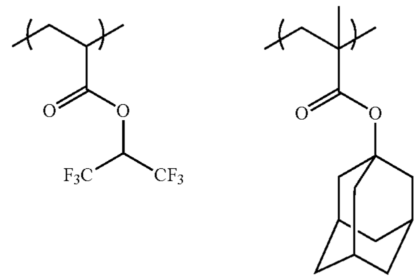
(HR-22)
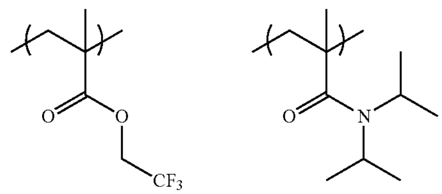
(HR-23)
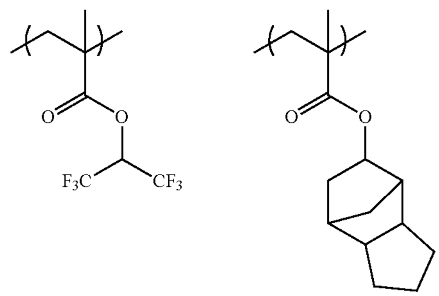
(HR-24)
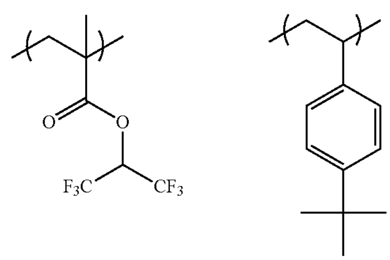
(HR-25)
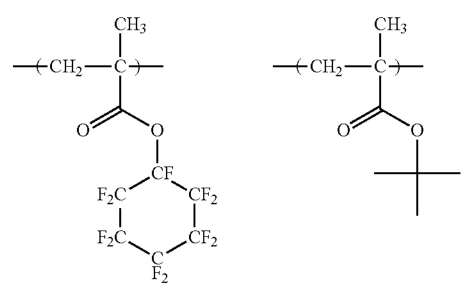
(HR-26)
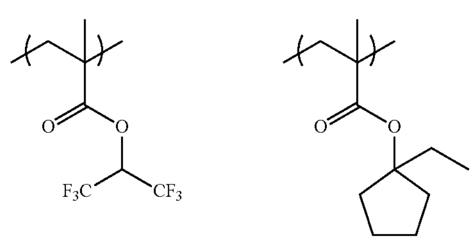

-continued
(HR-27)
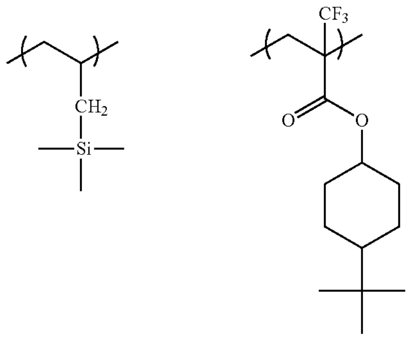
(HR-28)
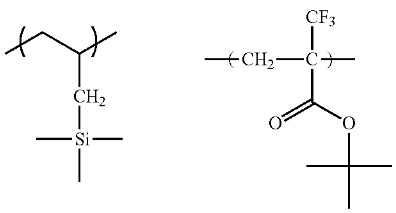
(HR-29)
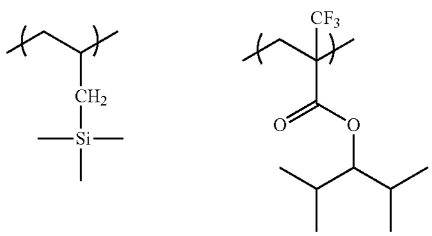
(HR-30)
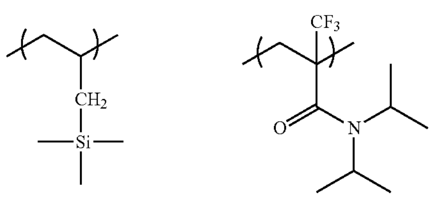
(HR-31)
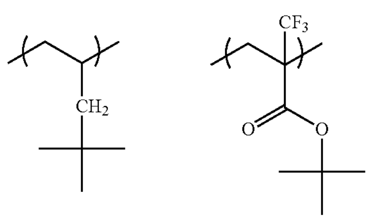
(HR-32)
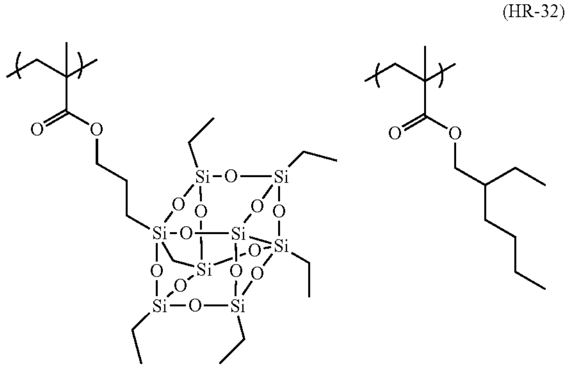
-continued
(HR-33)
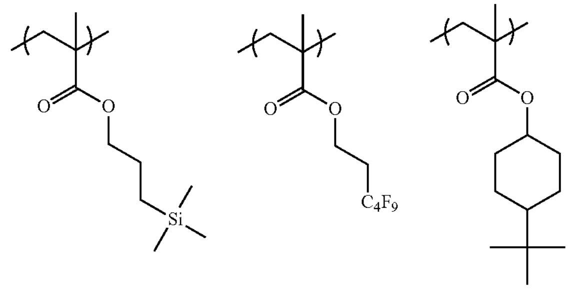
(HR-34)
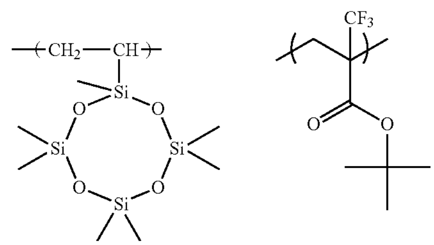
(HR-35)
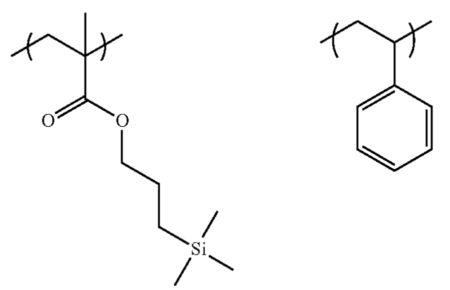
(HR-36)
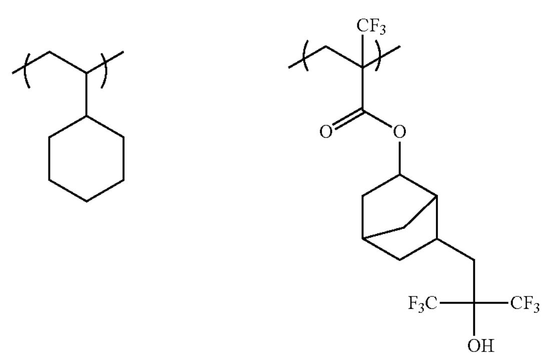
(HR-37)
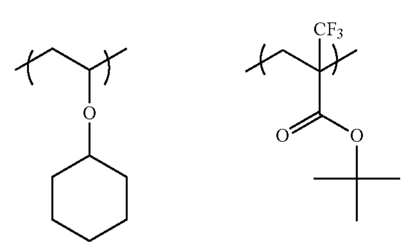

-continued
(HR-38)
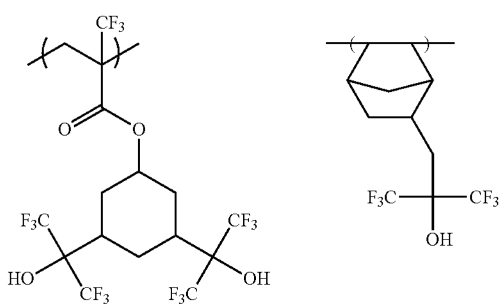
(HR-39)
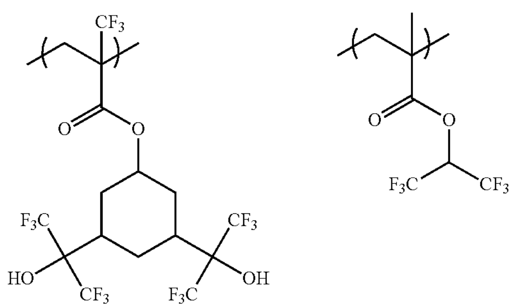
(HR-40)
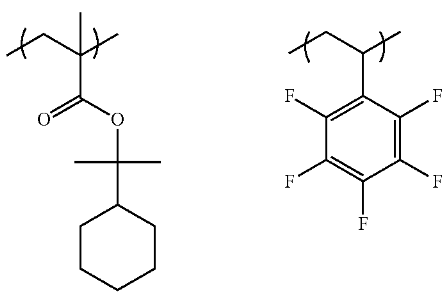
(HR-41)
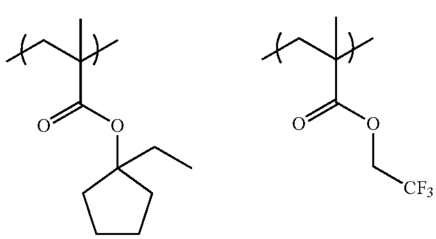
(HR-42)
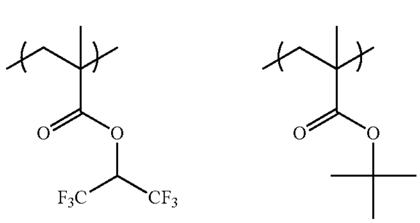
-continued
(HR-43)
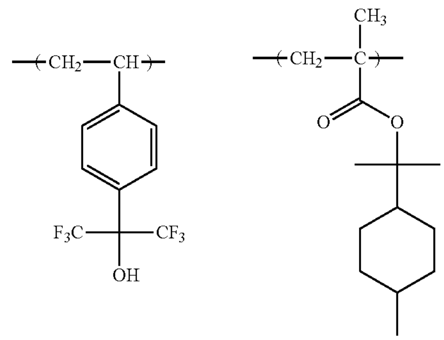
(HR-44)
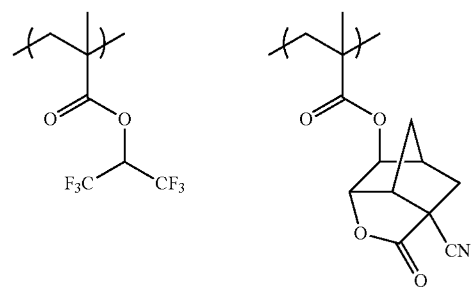
(HR-45)
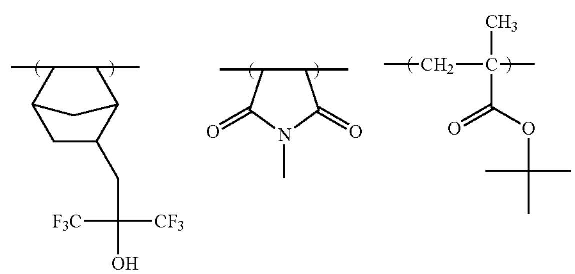
(HR-46)
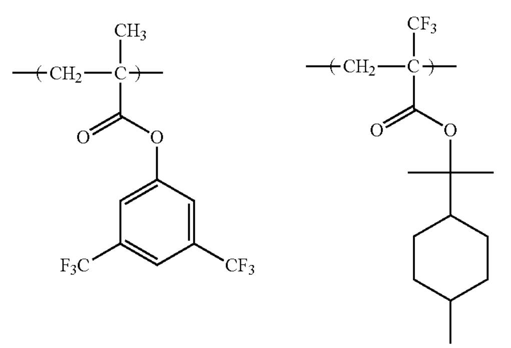
(HR-47)
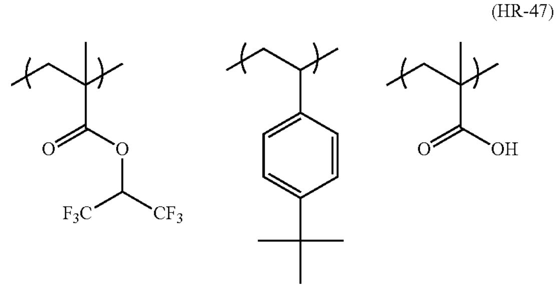

-continued
(HR-48)
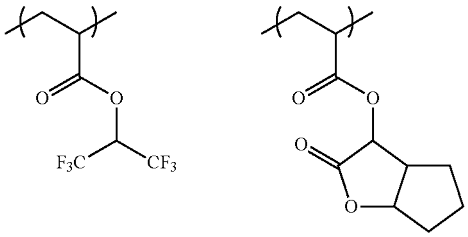
(HR-49)
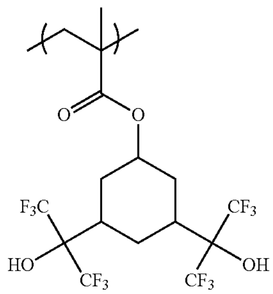
(HR-50)
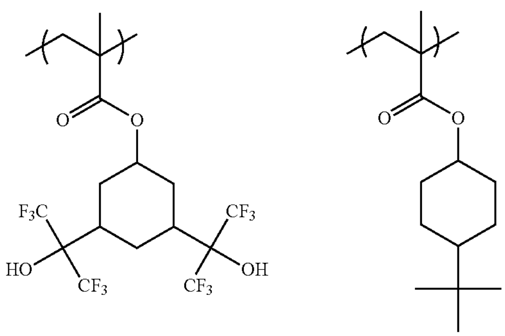
(HR-51)
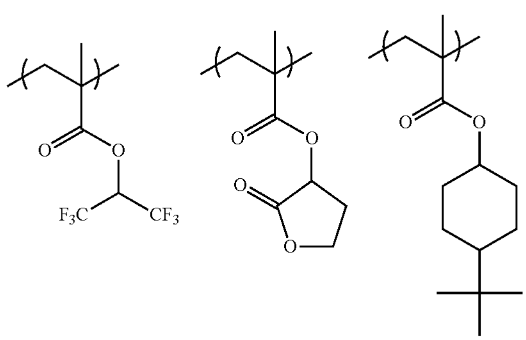
(HR-52)
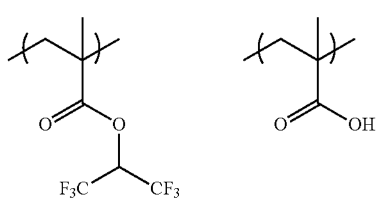
-continued
(HR-53)
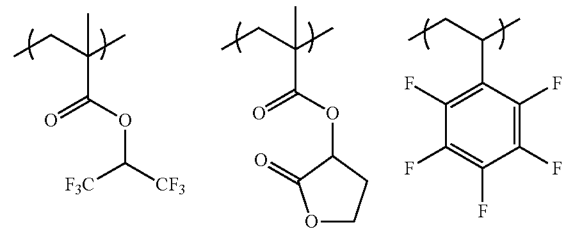
(HR-54)
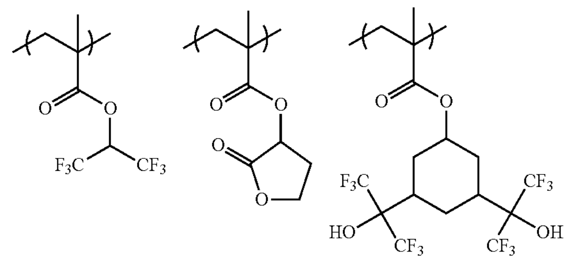
(HR-55)
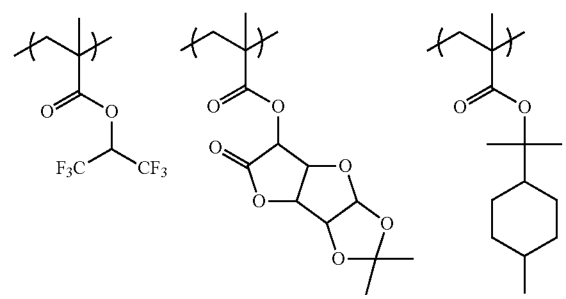
(HR-56)
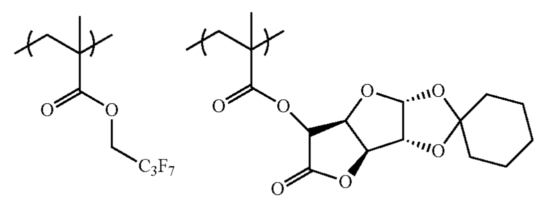
(HR-57)
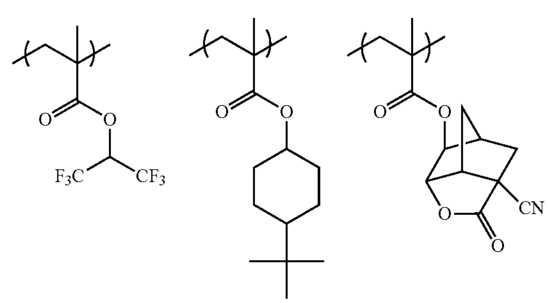

-continued
(HR-58)
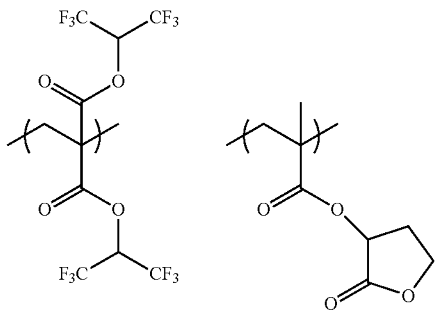
(HR-59)
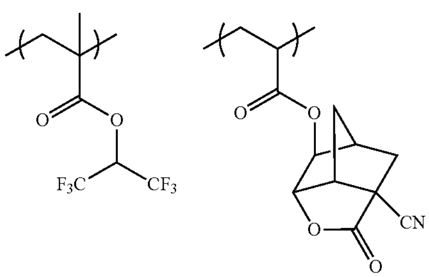
(HR-60)
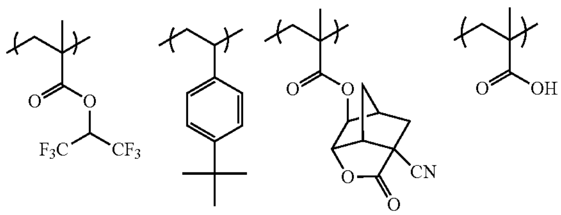
(HR-61)
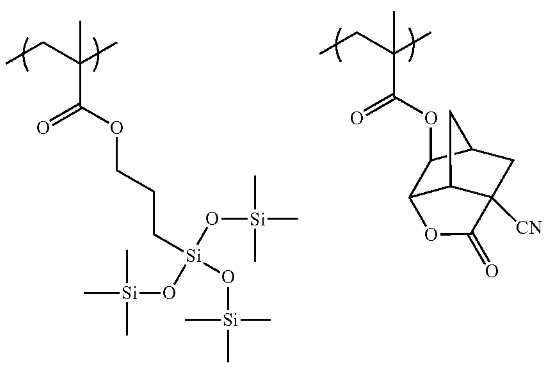
(HR-62)
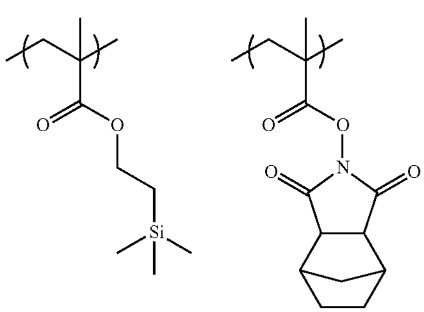
-continued
(HR-63)
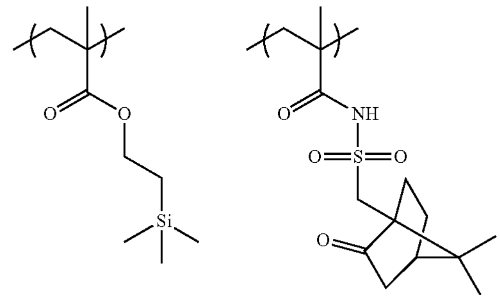
(HR-64)
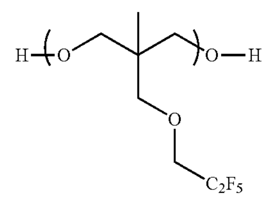
(HR-65)
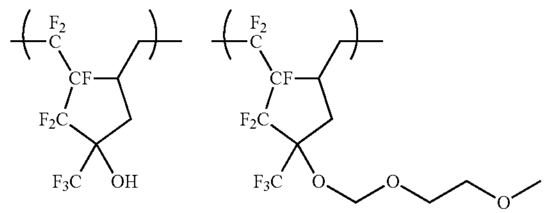
(HR-66)
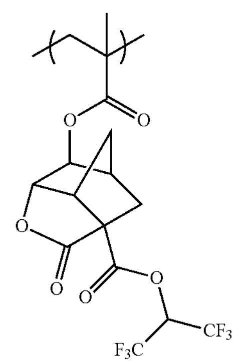
(HR-67)
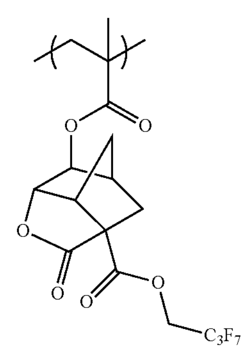

-continued
(HR-68)
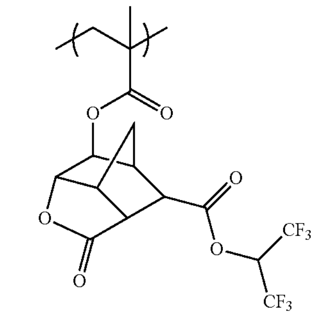
(HR-69)
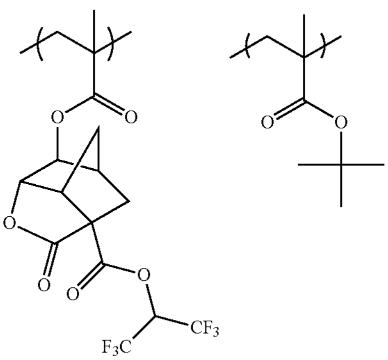
(HR-70)
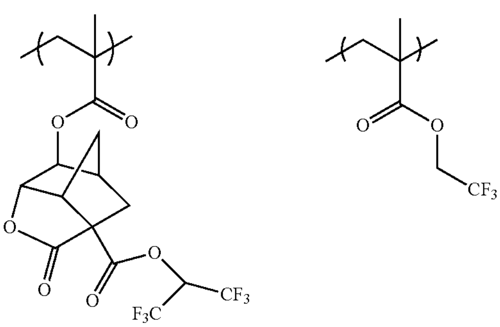
(HR-71)
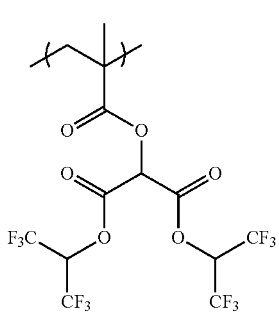
-continued
(HR-72)
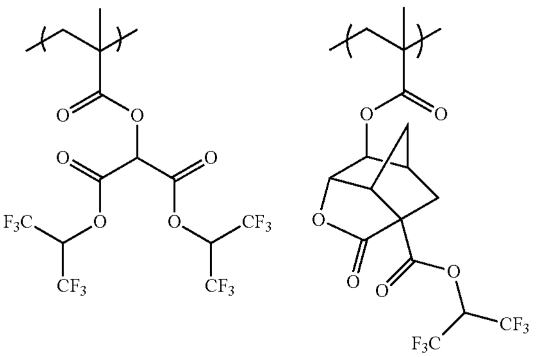
(HR-73)
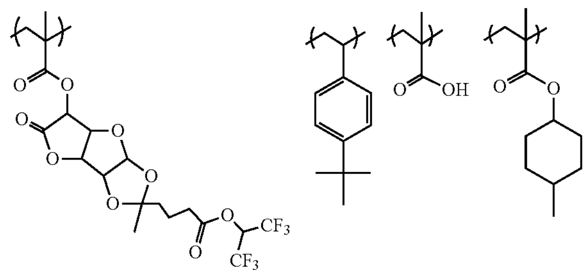
(HR-74)
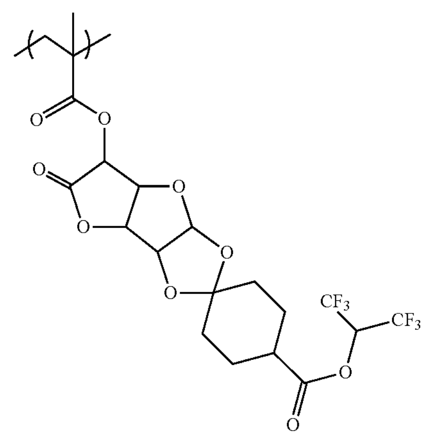
(HR-75)
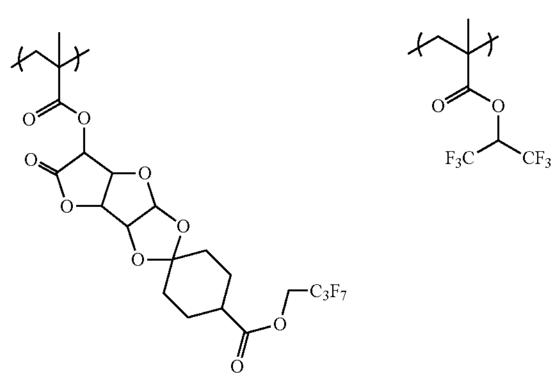

-continued
(HR-76)
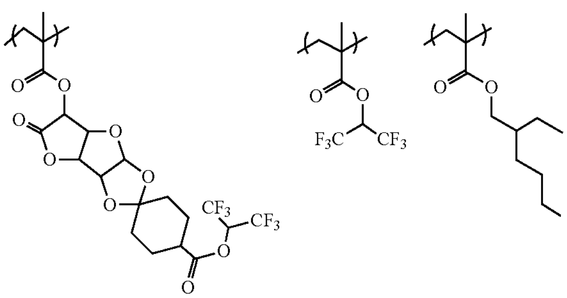
(HR-77)
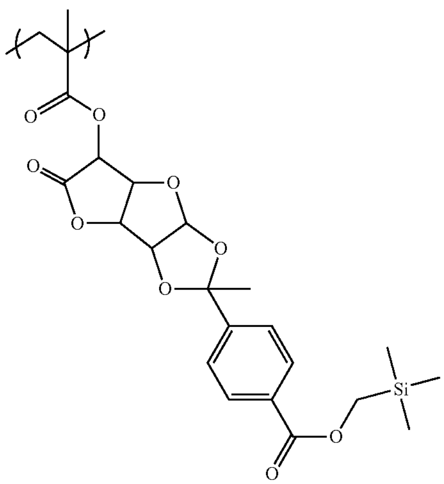
(HR-78)
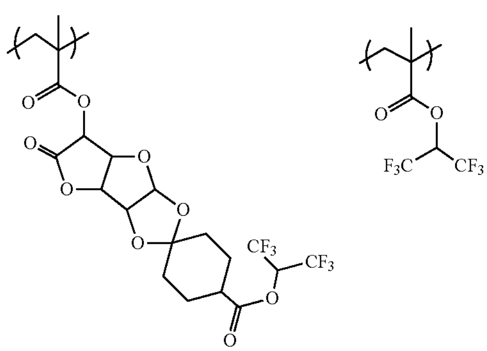
(HR-79)
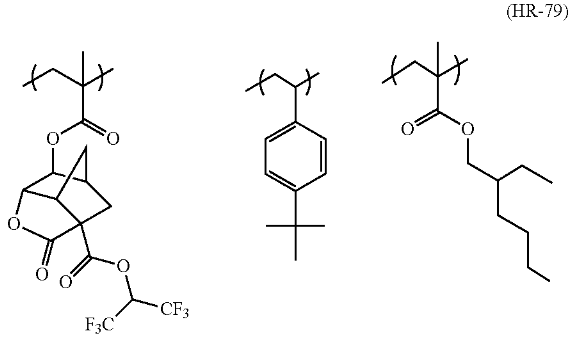
-continued
(HR-80)
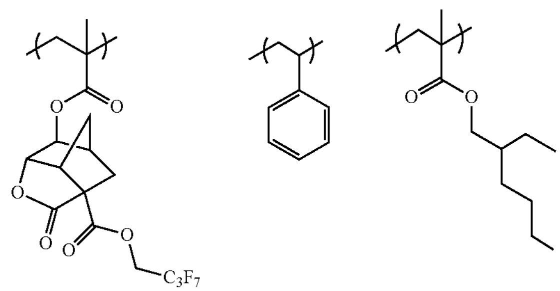
(HR-81)
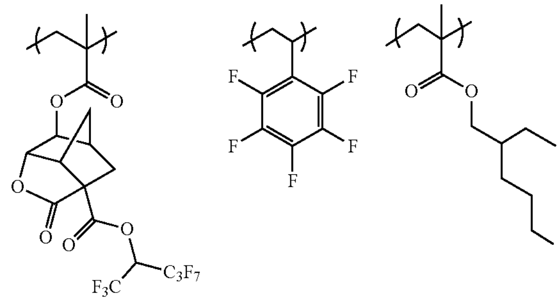
(HR-82)
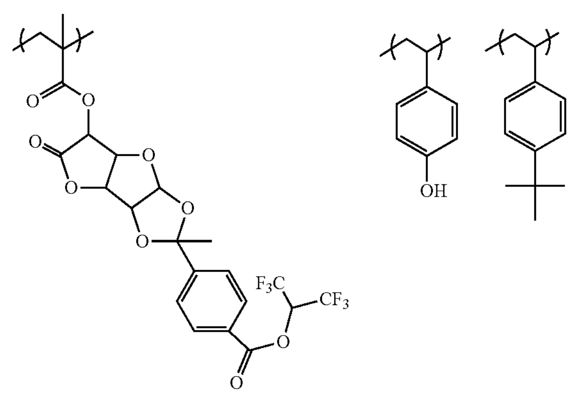
(HR-83)
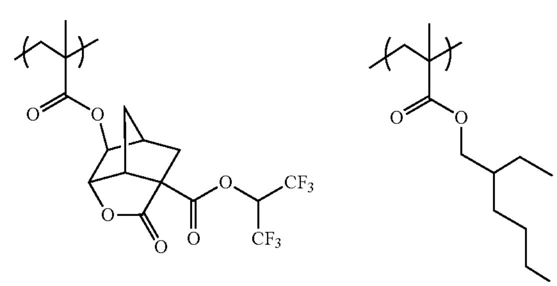

-continued
(HR-84)
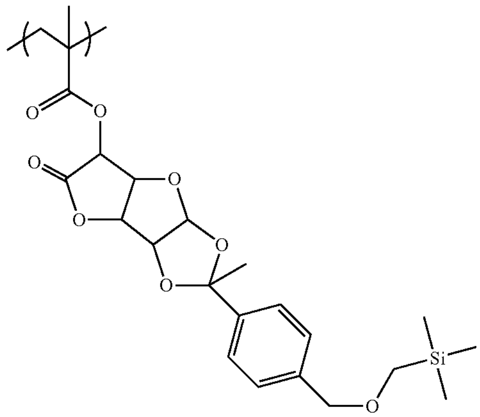
(HR-85)
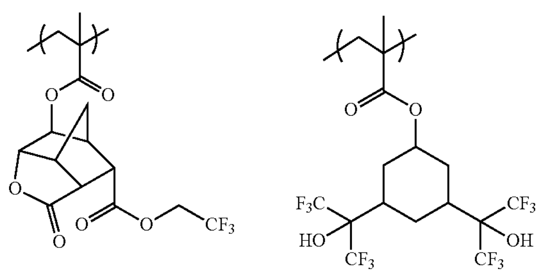
(HR-86)
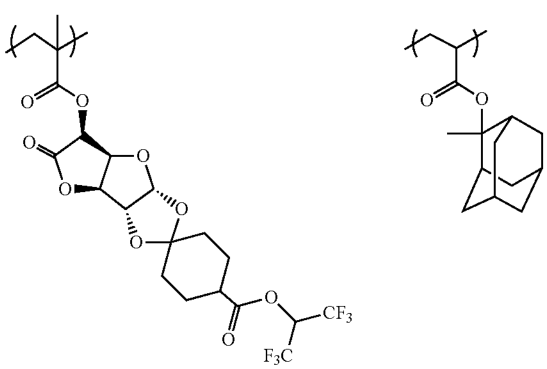
(HR-87)
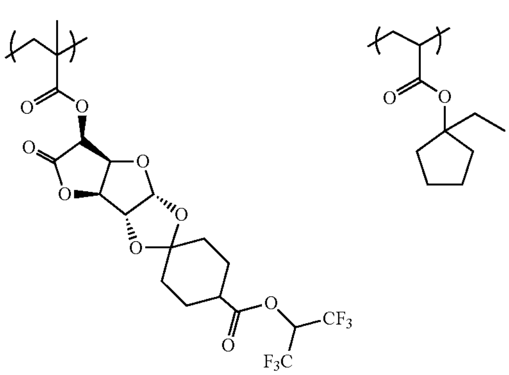
-continued
(HR-88)
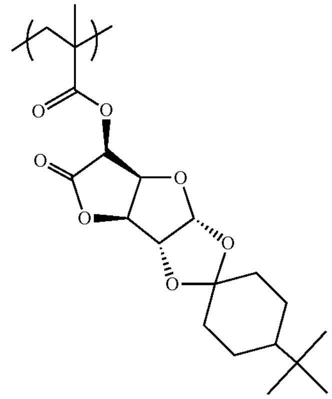
HR-89)
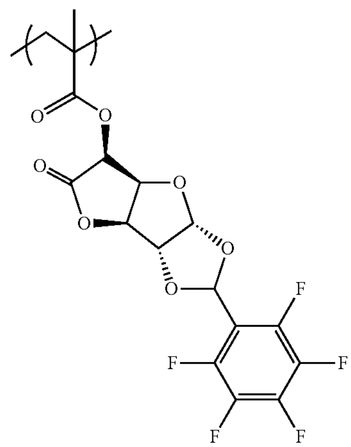
(HR-90)
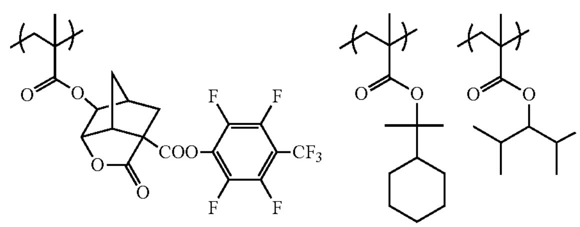
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6600 | 1.6 |
| HR-20 | 30/70 | 6500 | 1.5 |

TABLE 1-continued

| Resin | Composition | Mw | Mw/Mn |
|---|---|---|---|
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |

TABLE 2-continued

| Resin | Composition | Mw | Mw/Mn |
|---|---|---|---|
| HR-89 | 100 | 6300 | 1.35 |
| HR-90 | 50/40/10 | 8500 | 1.51 |

When the hydrophobic resin (HR) contains fluorine atoms, the content of the fluorine atoms based on the molecular weight of the hydrophobic resin (HR) is preferably in the range of 5 to 80 mass %, and more preferably 10 to 80 mass %. The repeating unit containing fluorine atoms preferably exists in the hydrophobic resin (HR) in an amount of 10 to 100 mass %, more preferably 30 to 100 mass %.

When the hydrophobic resin (HR) contains silicon atoms, the content of the silicon atoms based on the molecular weight of the hydrophobic resin (HR) is preferably in the range of 2 to 50 mass %, more preferably 2 to 30 mass %. The repeating unit containing silicon atoms preferably exists in the hydrophobic resin (HR) in an amount of 10 to 90 mass %, more preferably 20 to 80 mass %.

The weight average molecular weight of the hydrophobic resin (HR) in terms of standard polystyrene molecular weight is preferably in the range of 1,000 to 100,000, more preferably 1,000 to 50,000, and still more preferably 2,000 to 15,000.

The hydrophobic resin may either be used individually or in combination. The content of the hydrophobic resin (HR) in the composition based on the total solids thereof can be adjusted for enabling the receding contact angle to fall within the abovementioned range, but is preferably in the range of 0.01 to 10 mass %, more preferably 0.1 to 9 mass %, and most preferably 0.5 to 8 mass %.

Impurities such as metals in the hydrophobic resin (HR) should naturally be of low quantity as in the acid-decomposable resin. The content of residual monomers and oligomer components is preferably in the range of 0 to 10 mass %, more preferably 0 to 5 mass %, and still more preferably 0 to 1 mass %. Accordingly, there can be obtained a composition being free from in-liquid foreign matters and a change in sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8, and most preferably 1 to 1.5.

A variety of commercially available products can be used as the hydrophobic resin (HR), and also the resin can be synthesized in accordance with conventional methods (for example, by radical polymerization). As general synthesizing methods, a batch polymerization method in which a monomer species and an initiator are dissolved in a solvent and heated to carry out polymerization and a dropping polymerization method in which a solution of monomer species and initiator is dropped into a hot solvent over a period of 1 to 10 hours can be exemplified. Of these, the dropping polymerization method is preferred. As a reaction solvent, ethers such as tetrahydrofuran, 1,4-dioxane or diisopropyl ether, ketones such as methyl ethyl ketone or methyl isobutyl ketone, ester solvents such as ethyl acetate, amide solvents such as dimethylformamide or dimethylacetamide, and the aforementioned solvent capable of dissolving the composition according to the present invention, such as propylene glycol monomethyl ether acetate, propylene glycol monomethyl ether or cyclohexanone can be exemplified. Preferably, the polymerization is carried out with the use of the same solvent as that used in the composition according to the present invention. This would inhibit particle generation during storage.

The polymerization reaction is preferably carried out in an atmosphere consisting of an inert gas such as nitrogen or argon. In the initiation of polymerization, a commercially available radical initiator (azo initiator, peroxide, etc.) is used as the polymerization initiator. Among the radical initiators, an azo initiator is preferred, and azo initiators having an ester group, a cyano group and a carboxy group are more preferred. As specific preferred initiators, azobisisobutyronitrile, azobisdimethylvaleronitrile, and dimethyl 2,2'-azobis(2-methylpropionate) can be exemplified. The reaction concentration is in the range of 5 to 50 mass %, preferably 30 to 50 mass %. The reaction temperature is generally in the range of 10° to 150° C., preferably 30° to 120° C., and more preferably 60° to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents, and the like. Of these, it is preferred to employ a solvent containing at least an alcohol (especially methanol or the like) or water as the precipitation or re-precipitation solvent.

The amount of precipitation or re-precipitation solvent used can be determined according to intended efficiency, yield, etc. and is generally in the range of 100 to 10,000 parts by mass, preferably 200 to 2,000 parts by mass, and more preferably 300 to 1,000 parts by mass per 100 parts by mass of the polymer solution.

The temperature at which the precipitation or re-precipitation is carried out can be determined according to efficiency and operation easiness, and is generally in the range of about 0° to 50° C., and preferably about room temperature (for example, about 20° to 35° C.). The operation of precipitation or re-precipitation can be carried out by a known method such as a batch or continuous method, with the use of a common mixing vessel such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° C. to 100° C., preferably about 30° C. to 50° C. at ordinary pressure or reduced pressure (preferably at reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d), and separating the precipitated resin (step e).

A liquid immersion exposure may be carried out for the film produced from the composition of the present invention. Namely, the film may be exposed to actinic rays or radiation under the conditions that the space between the film and a lens is filled with a liquid whose refractive index is higher than that of air. Any liquid whose refractive index is higher than that of air can be employed as the immersion liquid. However, pure water is especially preferred.

The liquid for liquid immersion for use in the liquid immersion exposure will now be described.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferred to use water from not only the above viewpoints but also the viewpoints of easy procurement and easy handling.

For the attainment of further wavelength shortening, use can be made of a medium whose refractive index is 1.5 or higher. Such a medium may be either an aqueous solution or an organic solvent.

In the use of water as a liquid for liquid immersion, a slight proportion of additive (liquid) that would not dissolve the resist film on a wafer and would be negligible with respect to its influence on an optical coat for an under surface of lens element may be added in order to not only decrease the surface tension of water but also increase a surface activating power.

The additive is preferably an aliphatic alcohol with a refractive index approximately equal to that of water, for example, methyl alcohol, ethyl alcohol, isopropyl alcohol, etc. The addition of an alcohol with a refractive index approximately equal to that of water is advantageous in that even when the alcohol component is evaporated from water to cause a change of content concentration, the change of refractive index of the liquid as a whole can be minimized. On the other hand, when a substance being opaque in 193 nm rays or an impurity whose refractive index is greatly different from that of water is mixed therein, the mixing would invite a distortion of optical image projected on the resist film. Accordingly, it is preferred to use distilled water as the liquid immersion water. Furthermore, use may be made of pure water having been filtered through, for example, an ion exchange filter.

Desirably, the electrical resistance of the water is 18.3 MQcm or higher, and the TOC (organic matter concentration) thereof is 20 ppb or below. Prior deaeration of the water is also desired.

Raising the refractive index of the liquid for liquid immersion would enable an enhancement of lithography performance. From this viewpoint, an additive suitable for refractive index increase may be added to the water. Alternatively, heavy water ($D_2O$) may be used in place of water.

For the prevention of direct contact of a film with a liquid for liquid immersion, a film that is highly insoluble in the liquid for liquid immersion (hereinafter also referred to as a "top coat") may be provided between the film formed by the composition according to the present invention and the liquid for liquid immersion. The functions to be fulfilled by the top coat are applicability to an upper layer portion of the film, transparency in radiation of especially 193 nm, and high insolubility in the liquid for liquid immersion. Preferably, the top coat does not mix with the film and is uniformly applicable to an upper layer of the film.

From the viewpoint of transparency in radiation of 193 nm, the top coat preferably consists of a polymer not abundantly containing an aromatic moiety. As such, a hydrocarbon polymer, an acrylic ester polymer, polymethacrylic acid, polyacrylic acid, polyvinyl ether, a siliconized polymer, and a fluoropolymer can be exemplified. The aforementioned hydrophobic resins (HR) also find appropriate application in the top coat. From the viewpoint of contamination of an optical lens by leaching of impurities from the top coat into the liquid for liquid immersion, it is preferred to reduce the amount of residual monomer components of the polymer contained in the top coat.

At the detachment of the top coat, use may be made of a developer, or a separate peeling agent may be used. The peeling agent preferably consists of a solvent having low permeation into the film. Detachability by a developer containing an organic solvent is preferred from the viewpoint of simultaneous attainment of the detachment step with the development processing step for the resist film.

Preferably, the refractive index difference between the top coat and the liquid for liquid immersion is nil or slight. If so, the resolving power can be enhanced. When the exposure light source is an ArF excimer laser (wavelength: 193 nm), it is preferred to use water as the liquid for liquid immersion. From the viewpoint of making the relative index be close to that of immersion liquid, the top coat preferably contains fluorine atoms. Further, from the viewpoint of transparency and refractive index, it is preferred for the top coat to be a thin film.

Preferably, the top coat does not mix with the film and also does not mix with the liquid for liquid immersion. From this viewpoint, when the liquid for liquid immersion is water, it is preferred for the solvent used in the top coat to be highly insoluble in the solvent used in the actinic ray-sensitive or radiation-sensitive resin composition and be a non-water-soluble medium. When the liquid for liquid immersion is an organic solvent, the top coat may be soluble or insoluble in water.

[F] Surfactant

The composition according to the present invention may further contain one or more surfactants. The composition according to the present invention when containing the above surfactant would, in the use of an exposure light source of 250 nm or below, especially 220 nm or below, realize favorable sensitivity and resolving power and produce a resist pattern with less adhesion and development defects.

It is especially preferred to use a fluorinated and/or siliconized surfactant as the surfactant.

As fluorinated and/or siliconized surfactants, there can be mentioned, for example, those described in section [0276] of US Patent Application Publication No. 2008/0248425. Further, as useful commercially available surfactants, fluorinated surfactants or siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOAGOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS) can be exemplified. Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). In particular, polymers each having a fluoroaliphatic group derived from such a fluoroaliphatic compound may be used as the surfactant. The fluorinated aliphatic compound can be synthesized by the process described in JP-A-2002-90991.

The polymer having a fluorinated aliphatic group is preferably a copolymer from a monomer having a fluorinated aliphatic group and a poly(oxyalkylene) acrylate and/or poly(oxyalkylene) methacrylate, in which copolymer may have an irregular distribution or may result from block copolymerization.

As the poly(oxyalkylene) group, a poly(oxyethylene) group, a poly(oxypropylene) group, and a poly(oxybutylene) group can be exemplified. Further, use can be made of a unit having alkylene groups of different chain lengths in a single chain, such as poly(oxyethylene-oxypropylene-oxyethylene block concatenation) or poly(oxyethylene-oxypropylene block concatenation).

Moreover, the copolymer from a monomer having a fluorinated aliphatic group and a poly(oxyalkylene) acrylate (or methacrylate) is not limited to two-monomer copolymers and may be a three or more monomer copolymer obtained by simultaneous copolymerization of two or more different monomers having a fluorinated aliphatic group, two or more different poly(oxyalkylene) acrylates (or methacrylates), etc.

For example, as a commercially available surfactant, there can be mentioned Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_6F_{13}$ group, poly(oxyethylene) acrylate (or methacrylate) and poly(oxypropylene) acrylate (or methacrylate), a copolymer from an acrylate (or methacrylate) having a $C_8F_{17}$ group and a poly(oxyalkylene) acrylate (or methacrylate), a copolymer from an acrylate (or methacrylate) having a $C_8F_{17}$ group, poly(oxyethylene) acrylate (or methacrylate) and poly(oxypropylene) acrylate (or methacrylate), or the like.

Further, use may be made of surfactants other than the fluorinated and/or siliconized surfactants, described in section [0280] of US Patent Application Publication No. 2008/0248425.

These surfactants may be used either individually or in combination.

When the composition according to the present invention contains the surfactant, the total amount thereof used based on the total solids of the composition is preferably in the range of 0.0001 to 2 mass %, more preferably 0.0001 to 1.5 mass %, and most preferably 0.0005 to 1 mass %.

[G] Other Additive

The composition according to the present invention may further contain a dissolution inhibiting compound, a dye, a plasticizer, a photosensitizer, a light absorber, a compound capable of increasing the solubility in a developer (for example, a phenolic compound of 1000 or less molecular weight or a carboxylated alicyclic or aliphatic compound of 1000 or less molecular weight), etc.

The composition according to the present invention may further contain a dissolution inhibiting compound. Here the “dissolution inhibiting compound” means compound having 3000 or less molecular weight that is decomposed by the action of an acid to increase the solubility in an alkali developer.

From the viewpoint of preventing lowering of the transmission at the wavelength of 220 nm or shorter, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group and alicyclic structure can be the same as described earlier.

When the composition according to the present invention is exposed to a KrF excimer laser or irradiated with electron beams, preferred use is made of one having a structure resulting from substitution of the phenolic hydroxy group of a phenol compound with an acid-decomposable group. The phenol compound preferably contains 1 to 9 phenol skeletons, more preferably 2 to 6 phenol skeletons.

When the composition according to the present invention contains the dissolution inhibiting compound, the total amount thereof used based on the total solids of the composition is preferably in the range of 3 to 50 mass %, and more preferably 5 to 40 mass %.

Specific examples of the dissolution inhibiting compound will be shown below.

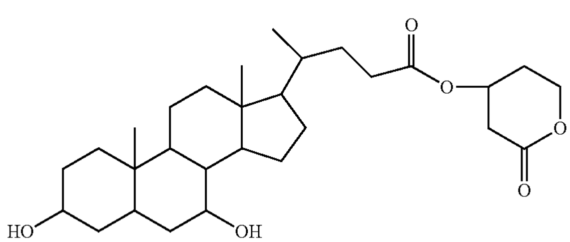

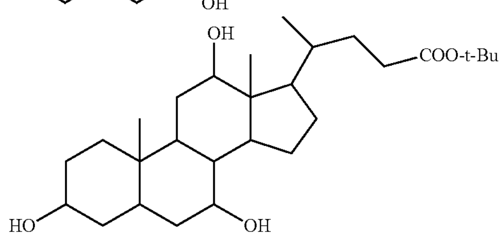

-continued

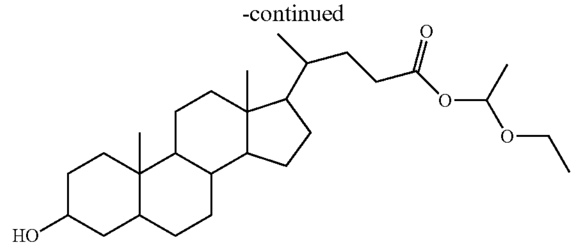

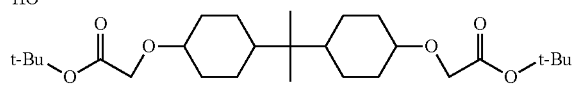

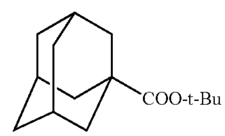

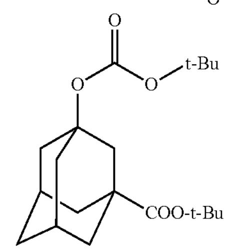

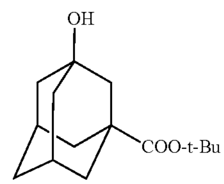

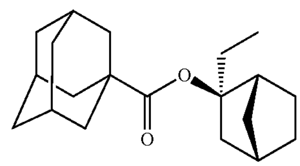

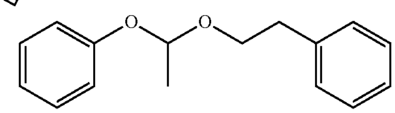

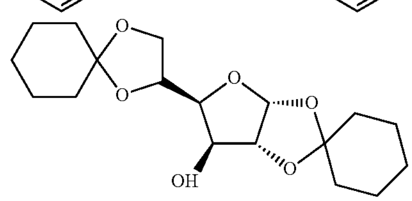

The above phenolic compound of 1000 or less molecular weight can be easily synthesized by persons of ordinary skill in the art while consulting the processes described in, for example, JP-As 4-122938 and 2-28531, U.S. Pat. No. 4,916,210, and EP 219294.

As the nonlimiting examples of the carboxylated alicyclic or aliphatic compound, a carboxylic acid derivative of steroid structure such as cholic acid, deoxycholic acid or lithocholic acid, an adamantanecarboxylic acid derivative, adamantanedicarboxylic acid, cyclohexanecarboxylic acid, and cyclohexanedicarboxylic acid can be exemplified.

<Method of Forming a Pattern>

The method of forming a pattern according to the present invention comprises (A) forming any of the above described compositions into a film, (B) exposing the film to light and (C) developing the exposed film using a developer containing an organic solvent, thereby forming a negative pattern. This method may further comprise (D) rinsing the negative pattern by use of a rinse liquid.

The method preferably comprises a prebake (PB) operation performed after the film formation but before the exposure operation. The method also preferably comprises a post-exposure bake (PEB) operation performed after the exposure operation but before the development operation.

In both the PB operation and the PEB operation, the baking is preferably performed at 40 to 130° C., more preferably 50 to 120° C. and further more preferably 60 to 110° C. The exposure latitude (EL) and resolving power can be markedly enhanced by carrying out the PEB operation at low temperatures ranging from 60 to 90° C.

The baking time is preferably in the range of 30 to 300 seconds, more preferably 30 to 180 seconds, and further more preferably 30 to 90 seconds.

In the method of forming a pattern according to the present invention, the operation of forming a film of the composition on a substrate, the operation of exposing the film to light, the baking operation and the developing operation can be carried out using generally known techniques.

The light source for use in the above exposure is not limited. As such, there can be mentioned, for example, a KrF excimer laser (wavelength: 248 nm), an ArF excimer laser (wavelength: 193 nm), an $F_2$ excimer laser (wavelength: 157 nm), an EUV exposure apparatus (wavelength: 13 nm), and an electron beam exposure apparatus. Note that, in this specification, examples of "light" include an electron beam.

In the exposure of the film formed from the composition of the present invention, a liquid immersion exposure may be carried out. The resolution can be enhanced by the liquid immersion exposure. Any liquid with a refractive index higher than that of air can be employed as the immersion medium. Preferably, pure water is employed.

In the liquid immersion exposure, the above-mentioned hydrophobic resin may be added to the composition in advance. Alternatively, the formation of the film may be followed by providing thereon a film that is highly insoluble in the immersion liquid (hereinafter also referred to as a "top coat"). The expected performance of the top coat, the method of using the same, etc. are described in Chapter 7 of "Process and Material of Liquid Immersion Lithography" published by CMC Publishing Co., Ltd.

From the viewpoint of the transparency to a laser of 193 nm wavelength, the top coat is preferably formed of a polymer not abundantly containing an aromatic moiety. As such a polymer, there can be mentioned, for example, a hydrocarbon polymer, an acrylic ester polymer, polymethacrylic acid, polyacrylic acid, polyvinyl ether, a siliconized polymer or a fluoropolymer. Any of the above-mentioned hydrophobic resins can be appropriately used as the top coat, and commercially available top coat materials can also be appropriately used.

At the detachment of the top coat after the exposure, use may be made of a developer. Alternatively, a separate peeling agent may be used. The peeling agent is preferably a solvent exhibiting less permeation into the film. Detachability by a developer is preferred from the viewpoint of simultaneously performing the detachment operation and the operation of film development processing.

The substrate for film formation in the present invention is not particularly limited. Use can be made of substrates commonly employed in a semiconductor production process for an IC or the like, a circuit board production process for a liquid crystal, a thermal head or the like and other photoapplication lithography processes. As such substrates, there can be mentioned, for example, inorganic substrates of silicon, SiN, $SiO_2$ and the like, and coated inorganic substrates, such as SOG. Further, according to necessity, an organic antireflection film may be provided between the film and the substrate.

As the developers containing an organic solvent, there can be mentioned, for example, developers containing a polar solvent, such as a ketone solvent, an ester solvent, an alcohol solvent, an amide solvent or an ether solvent, and a hydrocarbon solvent.

As the ketone solvent, there can be mentioned, for example, 1-octanone, 2-octanone, 1-nonanone, 2-nonanone, acetone, methyl amyl ketone (MAK, 2-heptanone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone or propylene carbonate.

As the ester solvent, there can be mentioned, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate (EEP), 3-methoxybutyl acetate, 3-methyl-3-methoxybutyl acetate, methyl formate, ethyl formate, butyl formate, propyl formate, ethyl lactate, butyl lactate, propyl lactate, methyl propionate, ethyl propionate or propyl propionate. In particular, acetic acid alkyl esters, such as methyl acetate, butyl acetate, ethyl acetate, isopropyl acetate and amyl acetate, and propionic acid alkyl esters, such as methyl propionate, ethyl propionate and propyl propionate, are preferred.

As the alcohol solvent, there can be mentioned, for example, an alcohol, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol, such as ethylene glycol, diethylene glycol or triethylene glycol; or a glycol ether, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol.

As the ether solvent, there can be mentioned, for example, not only any of the above-mentioned glycol ethers but also dioxane, tetrahydrofuran or the like.

As the amide solvent, there can be mentioned, for example, N-methyl-2-pyrrolidone, N,N-dimethylacetamide, N,N-dimethylformamide, hexamethylphosphoric triamide or 1,3-dimethyl-2-imidazolidinone.

As the hydrocarbon solvent, there can be mentioned, for example, an aromatic hydrocarbon solvent, such as toluene or xylene, or an aliphatic hydrocarbon solvent, such as pentane, hexane, octane or decane.

Two or more of these solvents may be mixed together before use. Alternatively, each of the solvents may be used in a mixture with a solvent other than those mentioned above and/or water within a proportion not detrimental to full exertion of performance. The water content of the whole developer is preferably below 10 mass %. More preferably, the developer contains substantially no water. Namely, it is preferred for the developer to consist substantially only of an organic solvent. Even if so, the developer can contain any of surfactants to be described hereinafter. Also, even if so, the developer may contain unavoidable impurities from the atmosphere.

The amount of organic solvent used in the developer is preferably in the range of 80 to 100 mass %, more preferably 90 to 100 mass % and further more preferably 95 to 100 mass % based on the whole amount of the developer.

It is especially preferred for the organic solvent contained in the developer to be at least one member selected from among a ketone solvent, an ester solvent, an alcohol solvent, an amide solvent and an ether solvent.

The vapor pressure of the developer containing an organic solvent at 20° C. is preferably 5 kPa or below, more preferably 3 kPa or below and most preferably 2 kPa or below. When the vapor pressure of the developer is 5 kPa or below, the evaporation of the developer on the substrate or in a development cup can be suppressed so that the temperature uniformity within the plane of the wafer can be enhanced to thereby improve the dimensional uniformity within the plane of the wafer.

As particular examples of the developers exhibiting a vapor pressure of 5 kPa or below, there can be mentioned a ketone solvent, such as 1-octanone, 2-octanone, 1-nonanone, 2-nonanone, methyl amyl ketone (MAK: 2-heptanone), 4-heptanone, 2-hexanone, diisobutyl ketone, cyclohexanone, methylcyclohexanone, phenylacetone or methyl isobutyl ketone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, butyl formate, propyl formate, ethyl lactate, butyl lactate or propyl lactate; an alcohol solvent, such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an ether solvent, such as tetrahydrofuran; an amide solvent, such as N-methyl-2-pyrrolidone, N,N-dimethylacetamide or N,N-dimethylformamide; an aromatic hydrocarbon solvent, such as toluene or xylene, and an aliphatic hydrocarbon solvent, such as octane or decane.

As particular examples of the developers exhibiting a vapor pressure of 2 kPa or below, there can be mentioned a ketone solvent, such as 1-octanone, 2-octanone, 1-nonanone, 2-nonanone, methyl amyl ketone (MAK: 2-heptanone), 4-heptanone, 2-hexanone, diisobutyl ketone, cyclohexanone, methylcyclohexanone or phenylacetone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, ethyl lactate, butyl lactate or propyl lactate; an alcohol solvent, such as n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an amide solvent, such as N-methyl-2-pyrrolidone, N,N-dimethylacetamide or N,N-dimethylformamide; an aromatic hydrocarbon solvent, such as xylene, and an aliphatic hydrocarbon solvent, such as octane or decane.

According to necessity, an appropriate amount of surfactant can be added to the developer.

The surfactant is not particularly limited. For example, use can be made of any of ionic and nonionic fluorinated and/or siliconized surfactants. As such fluorinated and/or siliconized surfactants, there can be mentioned, for example, those described in JP-A's S62-36663, S61-226746, S61-226745, S62-170950, S63-34540, H7-230165, H8-62834, H9-54432 and H9-5988 and U.S. Pat. Nos. 5,405,720, 5,360,692, 5,529,881, 5,296,330, 5,436,098, 5,576,143, 5,294,511 and 5,824,451. Nonionic surfactants are preferred. Using a nonionic fluorinated surfactant or siliconized surfactant is more preferred.

The amount of surfactant used is generally in the range of 0.001 to 5 mass %, preferably 0.005 to 2 mass % and further more preferably 0.01 to 0.5 mass % based on the whole amount of the developer.

As the development method, use can be made of, for example, a method in which the substrate is dipped in a tank filled with a developer for a given period of time (dip method), a method in which a developer is puddled on the surface of the substrate by its surface tension and allowed to stand still for a given period of time to thereby effect development (puddle method), a method in which a developer is sprayed onto the surface of the substrate (spray method), or a method in which a developer is continuously discharged onto the substrate being rotated at a given speed while scanning a developer discharge nozzle at a given speed (dynamic dispense method).

With respect to the above various development methods, when the operation of discharging a developer toward a resist film through a development nozzle of a development apparatus is included, the discharge pressure of discharged developer (flow rate per area of discharged developer) is preferably 2 $mL/sec/mm^2$ or below, more preferably 1.5 $mL/sec/mm^2$ or below and further more preferably 1 $mL/sec/mm^2$ or below. There is no particular lower limit of the flow rate. However, from the viewpoint of through-put, it is preferred for the flow rate to be 0.2 $mL/sec/mm^2$ or higher.

Pattern defects attributed to any resist residue after development can be markedly reduced by regulating the discharge pressure of discharged developer so as to fall within the above range.

The detail of the mechanism thereof is not apparent. However, it is presumed that regulating the discharge pressure so as to fall within the above range would lower the pressure of the developer on the resist film, thereby inhibiting inadvertent shaving or crumbling of the resist film and/or resist pattern.

The discharge pressure of developer ($mL/sec/mm^2$) refers to a value at the outlet of the development nozzle of the development apparatus.

For the regulation of the discharge pressure of developer, there can be employed, for example, a method in which the discharge pressure is regulated using a pump or the like, or a method in which the discharge pressure is changed through pressure regulation by supply from a pressure tank.

The development operation may be followed by the operation of discontinuing the development by replacement with a different solvent.

It is preferred for the method of forming a pattern according to the present invention to include a rinse operation (operation of rinsing the film with a rinse liquid containing an organic solvent) to be conducted after the development operation.

The rinse liquid for use in the rinse operation is not particularly limited as long as it does not dissolve the pattern after development, and solutions containing common organic solvents can be used.

As the rinse liquid, there can be mentioned, for example, one containing at least one organic solvent selected from among a hydrocarbon solvent, a ketone solvent, an ester solvent, an alcohol solvent, an amide solvent and an ether solvent. It is preferred for the rinse liquid to be one containing at least one organic solvent selected from among a ketone solvent, an ester solvent, an alcohol solvent and an amide solvent. A rinse liquid containing an alcohol solvent or an ester solvent is more preferred.

The rinse liquid further more preferably contains a monohydric alcohol, most preferably a monohydric alcohol having 5 or more carbon atoms.

The monohydric alcohol may be in the form of a linear chain, a branched chain or a ring. Particular examples of the monohydric alcohols include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. Particular examples of the monohydric alcohols each having 5 or more carbon atoms include 1-hexanol, 2-hexanol, 4-methyl-2-pentanol, 1-pentanol and 3-methyl-1-butanol.

Two or more of these components may be mixed together before use. Also, they may be mixed with other organic solvents before use.

The water content of the rinse liquid is preferably below 10 mass %, more preferably below 5 mass % and further more preferably below 3 mass %. Namely, the amount of organic solvent used in the rinse liquid is preferably in the range of 90 to 100 mass %, more preferably 95 to 100 mass % and most preferably 97 to 100 mass % based on the whole amount of the rinse liquid. Favorable development performance can be attained by controlling the water content of the rinse liquid at below 10 mass %.

The vapor pressure of the rinse liquid at 20° C. is preferably in the range of 0.05 to 5 kPa, more preferably 0.1 to 5 kPa and further more preferably 0.12 to 3 kPa. When the vapor pressure of the rinse liquid is in the range of 0.05 to 5 kPa, not only can the temperature uniformity within the plane of the wafer be enhanced but also the swell attributed to the penetration of the rinse liquid can be suppressed to thereby improve the dimensional uniformity within the plane of the wafer.

An appropriate amount of surfactant may be added to the rinse liquid.

In the rinse operation, the wafer having undergone the development is rinsed using the above rinse liquid. The method of rinse treatment is not particularly limited. For example, use can be made of any of a method in which the rinse liquid is continuously applied onto the substrate being rotated at a given speed (spin application method), a method in which the substrate is dipped in a tank filled with the rinse liquid for a given period of time (dip method) and a method in which the rinse liquid is sprayed onto the surface of the substrate (spray method). Preferably, the rinse treatment is carried out according to the spin application method, and thereafter the substrate is rotated at a rotating speed of 2000 to 4000 rpm to thereby remove the rinse liquid from the top of the substrate.

The method of forming a pattern according to the present invention may include the operation of developing with an alkali developer (positive pattern forming operation) in addition to the operation of developing with a developer containing an organic solvent. The order of the operation of developing with an alkali developer and operation of developing with a developer containing an organic solvent is not particularly limited. However, it is preferred to carry out the development with an alkali developer before the development with a developer containing an organic solvent. The operation of baking is preferably conducted before each of the development operations.

The type of the alkali developer is not particularly limited. However, an aqueous solution of tetramethylammonium hydroxide is generally used. An appropriate amount of alcohol and/or surfactant may be added to the alkali developer.

The alkali concentration of the alkali developer is generally in the range of 0.1 to 20 mass %. The pH value of the alkali developer is generally in the range of 10.0 to 15.0. It is especially preferred to use a 2.38 mass % aqueous tetramethylammonium hydroxide solution as the alkali developer.

When a rinse treatment is conducted after the development using an alkali developer, typically, pure water is used as the rinse liquid. An appropriate amount of surfactant may be added to the rinse liquid.

EXAMPLE

<Resin>

The resins (A-1) to (A-10) shown below were synthesized in the following manner. Further, the resin (CA-1) shown below was prepared.

A-1

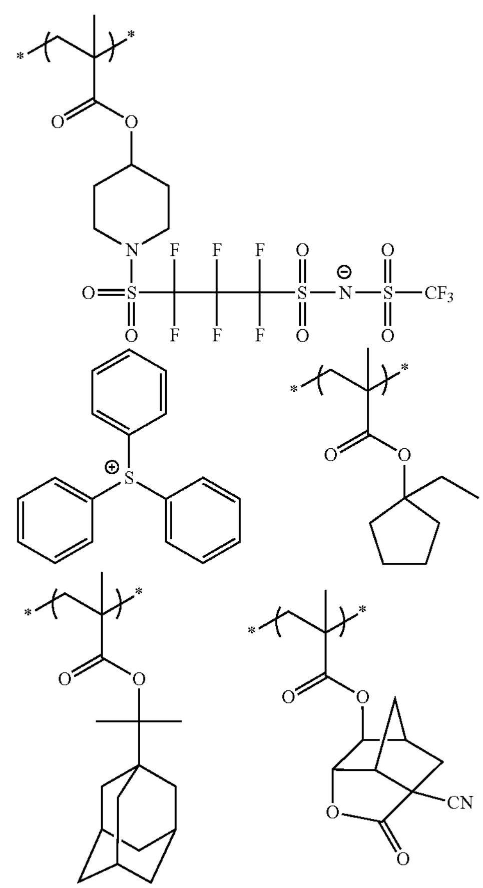

-continued
A-2
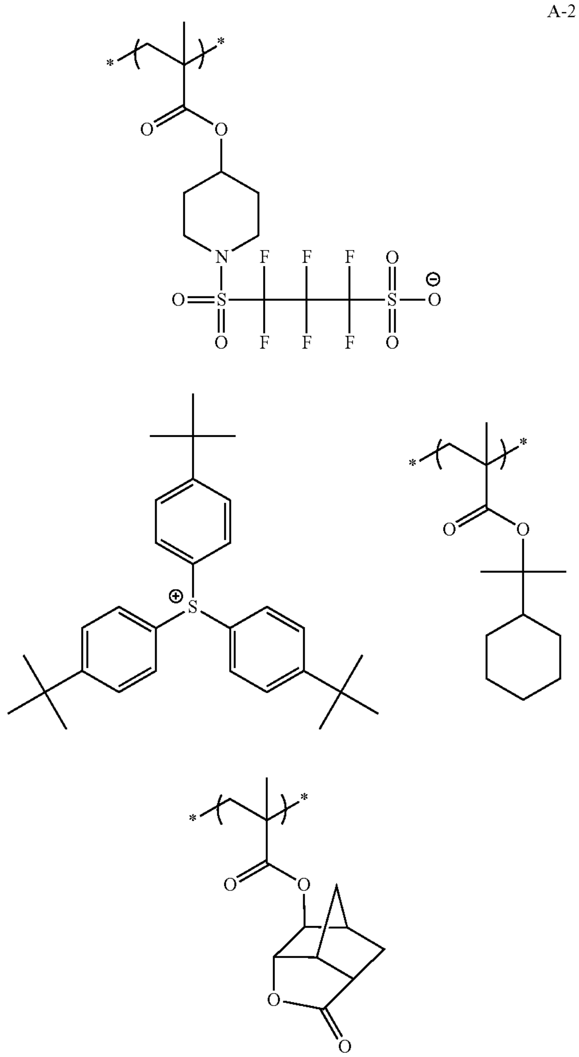
A-3
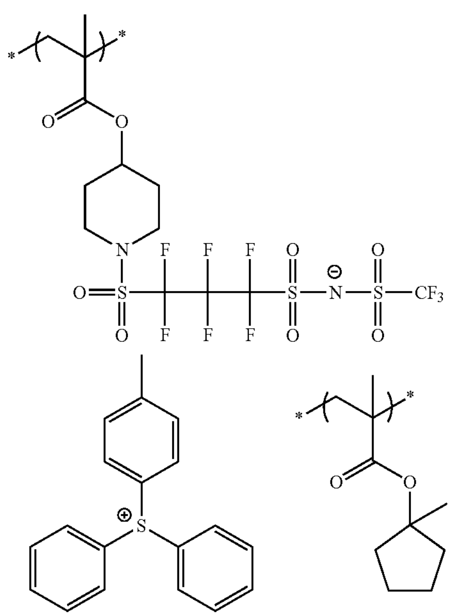
-continued
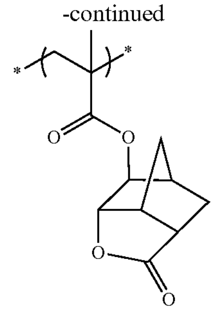
A-4
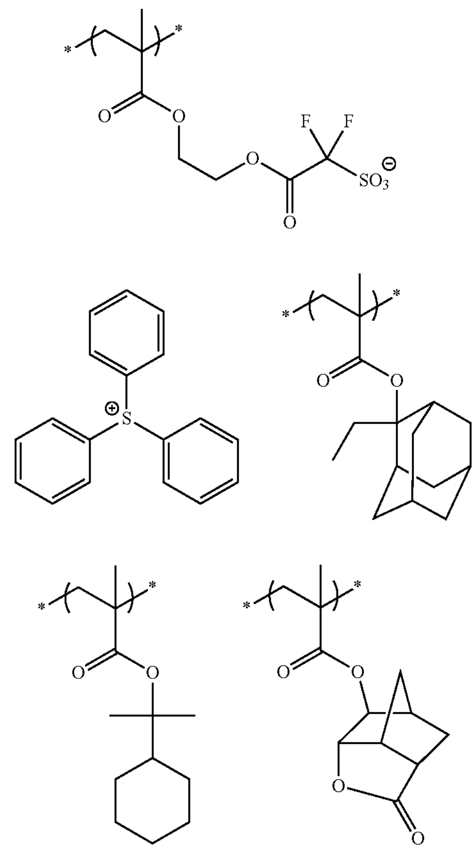
A-5
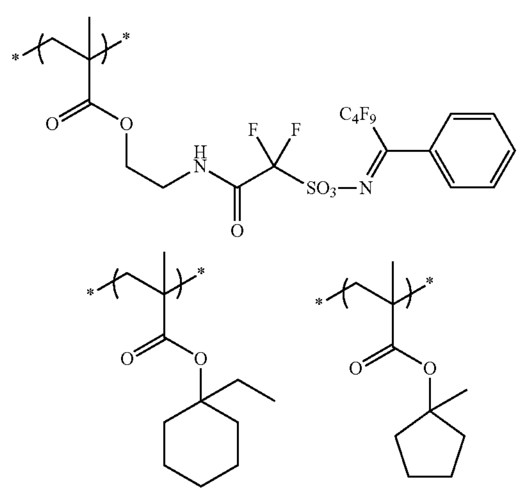

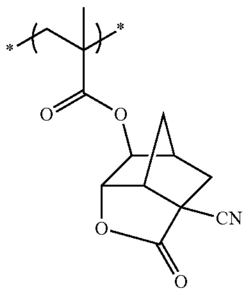
A-6
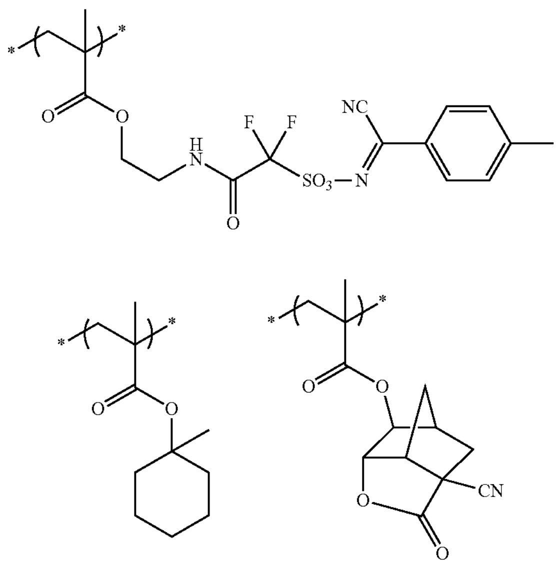
A-7
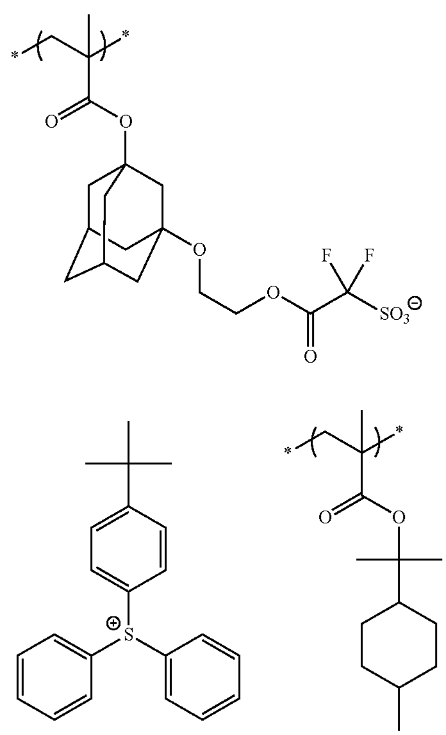
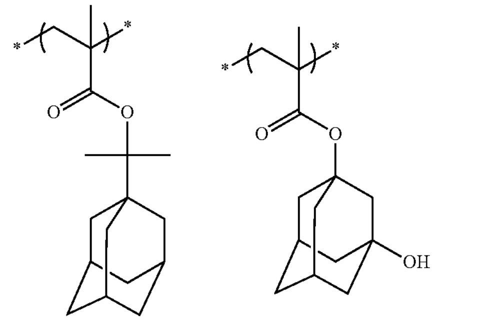
A-8
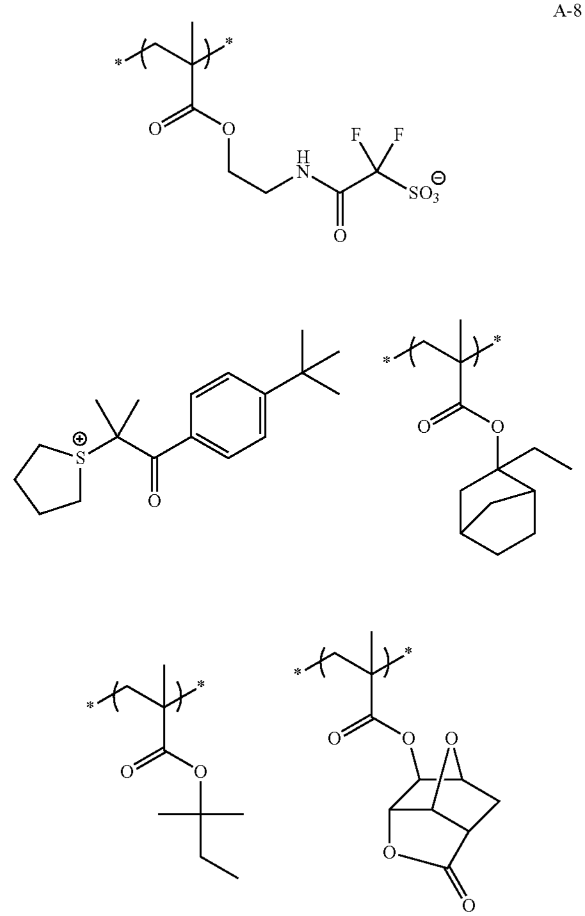
A-9
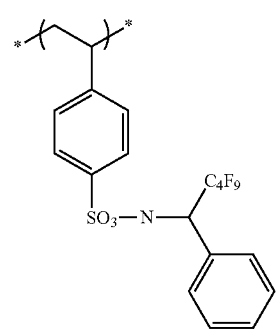

-continued

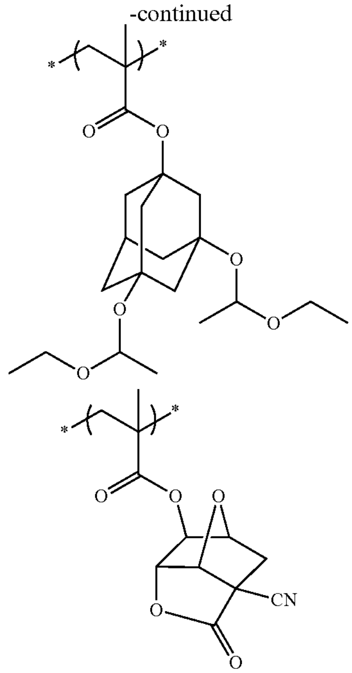

A-10

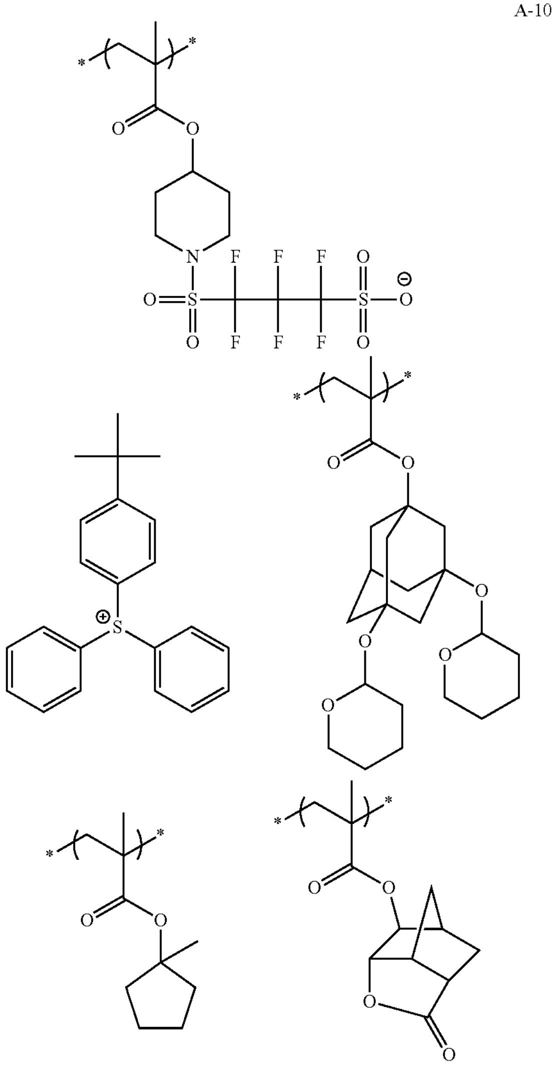

-continued

CA-1

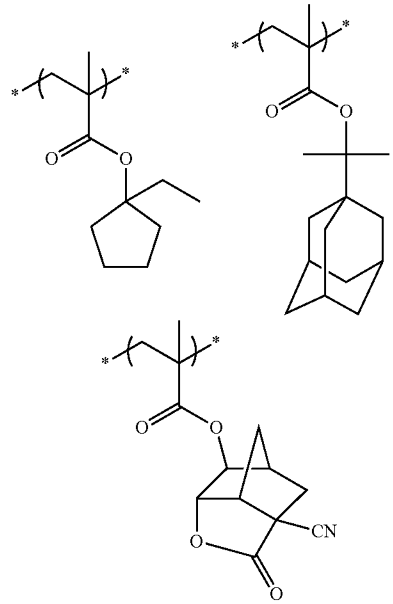

With respect to each of these resins, the weight average molecular weight, the molecular weight dispersity (Mw/Mn), and the component ratio were as given in Table 3 below.

TABLE 3

| No. | Mw | Mw/Mn | Component Ratio | | | |
|---|---|---|---|---|---|---|
| A-1 | 10500 | 1.77 | 5 | 37 | 15 | 43 |
| A-2 | 8100 | 1.78 | 5 | 60 | 35 | |
| A-3 | 8400 | 1.81 | 5 | 55 | 40 | |
| A-4 | 11500 | 1.79 | 10 | 10 | 40 | 40 |
| A-5 | 9000 | 1.84 | 20 | 20 | 30 | 30 |
| A-6 | 6500 | 1.77 | 10 | 50 | 40 | |
| A-7 | 12500 | 1.83 | 5 | 55 | 20 | 20 |
| A-8 | 15100 | 1.86 | 10 | 35 | 30 | 25 |
| A-9 | 8600 | 1.79 | 20 | 50 | 30 | |
| A-10 | 11100 | 1.82 | 10 | 20 | 30 | 40 |
| CA-1 | 10200 | 1.77 | 40 | 10 | 50 | |

Synthetic Example 1: Resin (A-1)

In a nitrogen gas stream, 160 g of cyclohexanone was placed in a three-necked flask, and heated at 80° C. (solvent 1). Separately, the following monomer-A1 (13.58 g), monomer-1 (23.11 g), monomer-2 (12.48 g) and monomer-3 (31.35 g) were dissolved in cyclohexanone (297 g), thereby obtaining a monomer solution. Further, a polymerization initiator V601 (produced by Wako Pure Chemical Industries, Ltd.) was added in an amount of 6.4 mol % based on the total amount of monomers to the solution and dissolved therein. The thus obtained solution was dropped into the solvent 1 over a period of six hours. After the completion of the dropping, reaction was continued at 80° C. for two hours. The reaction liquid was allowed to cool, and dropped into a mixed solvent of 3000 g of heptane and 750 g of ethyl acetate. The thus precipitated powder was collected by filtration and dried. Thus, 62 g of resin (A-1) was obtained. With respect to the thus obtained resin (A-1), the weight average molecular weight was 10,200, the molecular weight dispersity (Mw/Mn) 1.77 and the component ratio determined by $^{13}$C-NMR 5/37/15/43. All of these operations were carried out under a yellow lamp.
monomer-A1
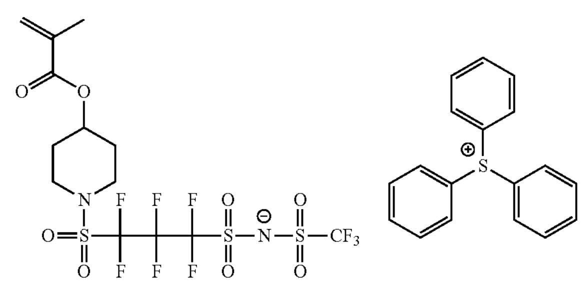
monomer-1
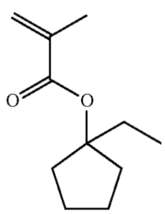
monomer-2
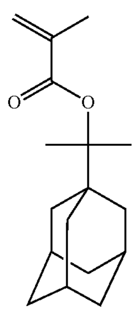
monomer-3
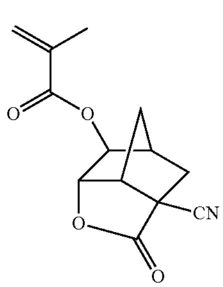
The other resins were synthesized in the same manner as described above.
<Hydrophobic Resin>
The hydrophobic resins (1) to (10) shown below were prepared.
1
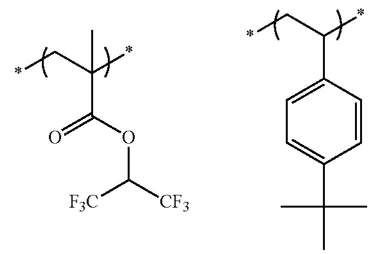
2
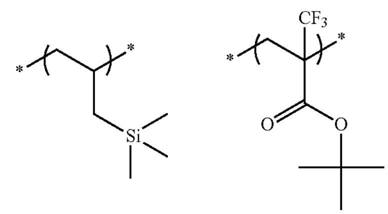
3
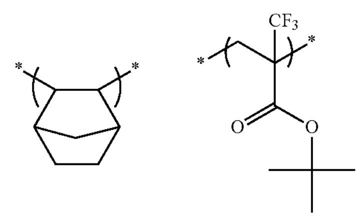
4
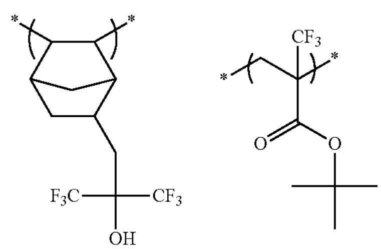
5
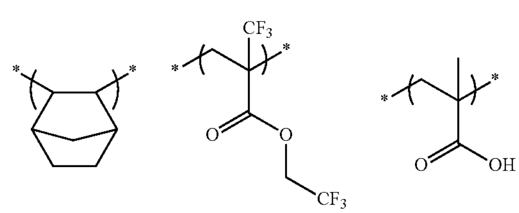
6
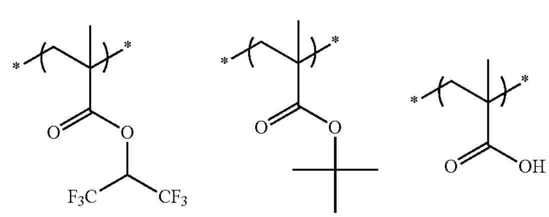

-continued

7

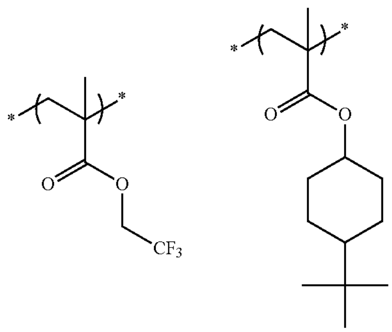

8

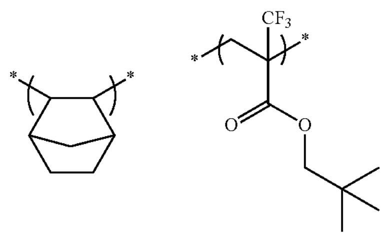

9

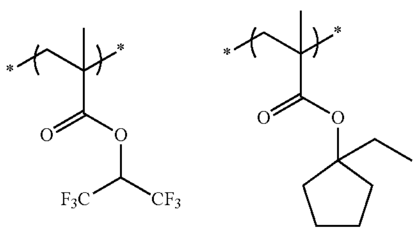

10

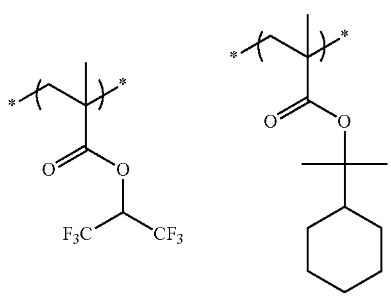

With respect to each of these hydrophobic resins, the weight average molecular weight, the molecular weight dispersity (Mw/Mn), and the component ratio were as given in Table 4 below.

TABLE 4

| No. | Mw | Mw/Mn | Component Ratio | | |
|---|---|---|---|---|---|
| 1 | 4500 | 1.50 | 20 | 80 | |
| 2 | 3800 | 1.52 | 50 | 50 | |
| 3 | 6500 | 1.44 | 25 | 75 | |
| 4 | 5000 | 1.40 | 40 | 60 | |
| 5 | 4000 | 1.35 | 40 | 55 | 5 |
| 6 | 7800 | 1.65 | 37 | 60 | 3 |
| 7 | 10000 | 1.75 | 30 | 70 | |
| 8 | 3500 | 1.21 | 45 | 55 | |
| 9 | 8200 | 1.55 | 20 | 80 | |
| 10 | 7500 | 1.88 | 40 | 60 | |

<Acid Generator>

The following compounds (PAG-1) to (PAG-3) were provided as the acid generators.

PAG-1

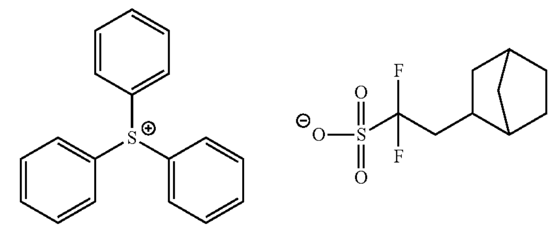

PAG-2

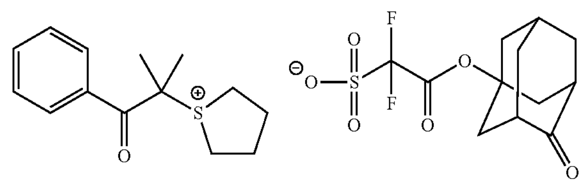

PAG-3

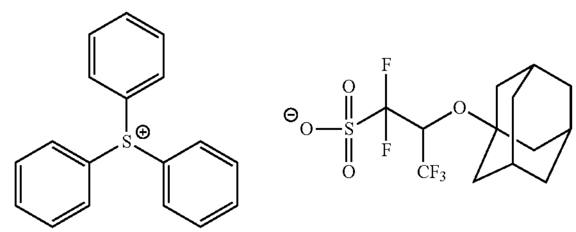

<Basic Compounds>

The following compounds (N-1) to (N-8) were provided as the basic compounds.

N-1

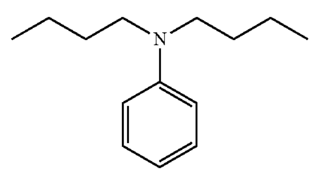

N-2

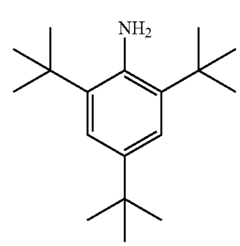

N-3

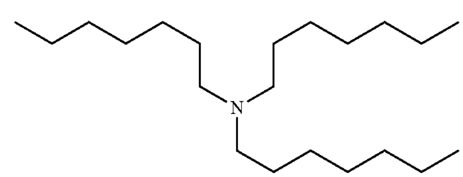

-continued

N-4

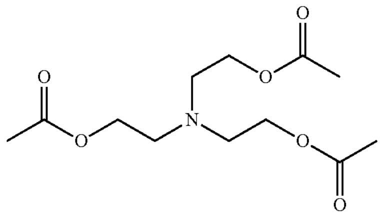

N-5

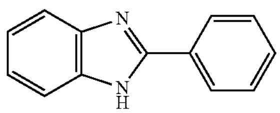

N-6

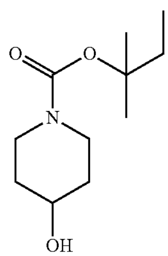

N-7

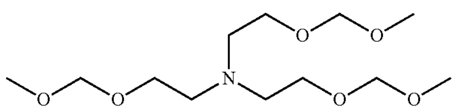

N-8

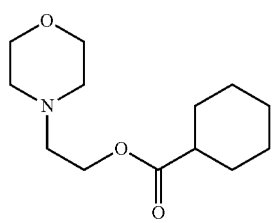

<Additive>

The following compounds (AD-1) to (AD-5) were provided as additives.

AD-1

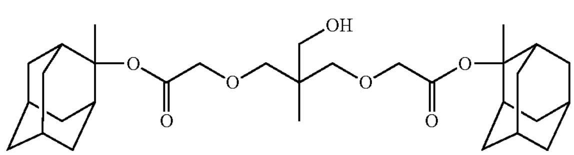

AD-2

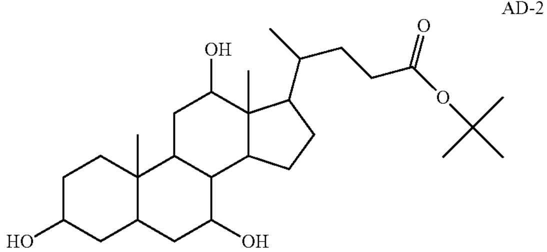

-continued

AD-3

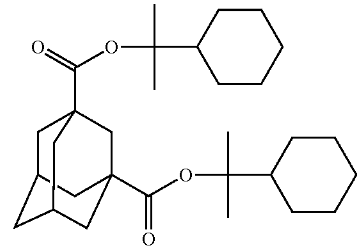

AD-4

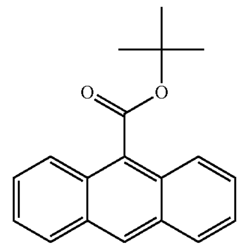

AD-5

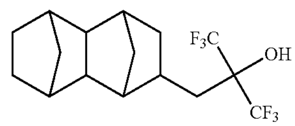

<Surfactant>

The following surfactants were provided.

W-1: Megafac F176 (produced by Dainippon Ink & Chemicals, Inc.; fluorinated),

W-2: Megafac R08 (produced by Dainippon Ink & Chemicals, Inc.; fluorinated and siliconized), W-3: Polysiloxane polymer KP-341 (produced by Shin-Etsu Chemical Co., Ltd.; siliconized)

W-4: Troy Sol S-366 (produced by Troy Chemical Co., Ltd.; fluorinated),

W-5: KH-20 (produced by Asahi Kasei Corp.; fluorinated), and

W-6: PolyFox (Registered Trademark) PF-6320 (produced by OMNOVA Solution, Inc.; fluorinated)

<Solvent>

The following solvents were provided.

(Group a)

SL-1: propylene glycol monomethyl ether acetate,

SL-2: propylene glycol monomethyl ether propionate, and

SL-3: 2-heptanone.

(Group b)

SL-4: ethyl lactate,

SL-5: propylene glycol monomethyl ether, and

SL-6: cyclohexanone.

(Group c)

SL-7: γ-butyrolactone, and

SL-8: propylene carbonate.

<Preparation of Resist Composition>

Resist compositions were prepared by dissolving individual components indicated in Table 5 below in solvents indicated in the table and passing the solutions through a polyethylene filter of 0.03 μm pore size. Separately, an organic antireflection film ARC29SR (produced by Nissan Chemical Industries, Ltd.) was applied onto a silicon wafer and baked at 205° C. for 60 seconds, thereby forming a 86 nm-thick antireflection film. Each of the prepared resist compositions was applied thereonto and baked (PB) at 100° C. for 60 seconds, thereby forming a 100 nm-thick resist film.

Each of the resultant wafers was patternwise exposed through an exposure mask (line/space=1/1) by means of an ArF excimer laser liquid-immersion scanner (manufactured by ASML, XT1700i, NA 1.20, C-Quad, outer sigma 0.981, inner sigma 0.895, XY deflection). Ultrapure water was used as the immersion liquid. Thereafter, the exposed wafer was baked at 85° C. for 60 seconds (PEB). The baked wafer was developed by puddling a developer (butyl acetate) for 30 seconds and rinsed by puddling a rinse liquid (4-methyl-2-pentanol) for 30 seconds. The rinsed wafer was rotated at a rotating speed of 4000 rpm for 30 seconds and baked at 90° C. for 60 seconds and baked at 90° C. for 60 seconds. Thus, a 75 nm (1:1) line-and-space resist pattern was obtained.

TABLE 5

| | Resin 1 | | Resin 2 | | Hydrophobic resin | | Acid generator | | Basic compound 1 | | Basic compound 2 | |
|---|---|---|---|---|---|---|---|---|---|---|---|---|
| Examples | No. | parts by mass | No. | parts by mass | No. | parts by mass | No. | parts by mass | No. | parts by mass | No. | parts by mass |
| 1 | A-1 | 97.7 | | | 1 | 1.1 | | | N-6 | 0.70 | | |
| 2 | A-2 | 94.0 | | | 2 | 1.9 | | | N-6 | 0.50 | N-1 | 0.10 |
| 3 | A-3 | 83.3 | A-8 | 10.0 | 3 | 1.9 | PAG-2 | 2.0 | N-5 | 0.70 | N-3 | 0.10 |
| 4 | A-4 | 97.7 | | | 4 | 1.8 | | | N-5 | 0.50 | | |
| 5 | A-5 | 97.0 | | | 5 | 1.7 | | | N-5 | 0.30 | | |
| 6 | A-6 | 98.1 | | | 6 | 1.5 | | | N-5 | 0.40 | | |
| 7 | A-7 | 92.6 | | | 7 | 2.8 | PAG-1 | 1.0 | N-2 | 0.50 | N-5 | 0.10 |
| 8 | A-8 | 66.2 | CA-1 | 30.0 | 8 | 2.2 | | | N-7 | 0.50 | N-1 | 0.10 |
| 9 | A-9 | 96.5 | | | 9 | 2.5 | | | N-2 | 0.40 | N-6 | 0.10 |
| 10 | A-10 | 96.5 | | | 10 | 1.3 | PAG-3 | 1.0 | N-5 | 0.70 | | |
| Comp. 1 | CA-1 | 90.8 | | | 1 | 1.0 | PAG-3 | 6.0 | N-1 | 1.20 | | |

| | Additive | | Surfactant | | Solvent | | | | | |
|---|---|---|---|---|---|---|---|---|---|---|
| Examples | No. | parts by mass | No. | parts by mass | Solvent 1 | parts by mass | Solvent 2 | parts by mass | Solvent 3 | parts by mass |
| 1 | | | W-2 | 0.50 | SL-1 | 1570 | SL-6 | 800 | SL-7 | 30 |
| 2 | AD-1 | 3.5 | | | SL-1 | 1830 | SL-5 | 500 | SL-7 | 70 |
| 3 | AD-2 | 1.0 | W-6 | 1.00 | SL-1 | 900 | SL-6 | 1500 | | |
| 4 | | | | | SL-1 | 1769 | SL-4 | 531 | SL-7 | 100 |
| 5 | AD-4 | 1.0 | | | SL-1 | 1849 | SL-3 | 531 | SL-8 | 20 |
| 6 | | | | | SL-6 | 1750 | SL-1 | 650 | | |
| 7 | AD-3 | 2.5 | W-4 | 0.50 | SL-1 | 1900 | SL-4 | 500 | | |
| 8 | | | W-3 | 1.00 | SL-2 | 1938 | SL-6 | 442 | SL-8 | 20 |
| 9 | AD-5 | 0.5 | | | SL-2 | 1869 | SL-4 | 531 | | |
| 10 | | | W-5 | 0.50 | SL-2 | 1869 | SL-6 | 531 | | |
| Comp. 1 | | | W-1 | 1.00 | SL-1 | 1800 | SL-6 | 600 | | |

<Evaluation Method>

[Limiting Resolving Power (Space Width)]

The optimum exposure amount was defined as the exposure amount that reproduced a 75 nm (1:1) line and space mask pattern. The applied exposure amount was increased from the optimum exposure amount to thereby cause the thus formed space width to be finer. The "limiting resolving power" was defined as the space width (nm) in which a line pattern was resolved without bridging and without the occurrence of development residue. The smaller the value of the limiting resolving power, the finer the pattern resolved, that is, the higher the resolving power.

[Line Width Roughness (LWR)]

Each of the 75 nm (1:1) line-and-space resist patterns was observed by means of a critical dimension scanning electron microscope (SEM model S-9380II, manufactured by Hitachi, Ltd.). The distance between actual edge and a reference line on which edges were to be present was measured at 50 points of equal intervals within 2 μm in the longitudinal direction of the pattern. The standard deviation of measured distances was determined, and 3σ (nm) was computed therefrom. This 3σ was denoted as LWR. The smaller the value thereof, the higher the performance exhibited.

[Exposure Latitude (EL)]

The optimum exposure amount was defined as the exposure amount that formed a 75 nm (1:1) line-and-space resist pattern. The exposure amount width in which when the exposure amount was varied, the pattern size allowed ±10% of the size was measured. The exposure latitude is the quotient of the value of the exposure amount width divided by the optimum exposure amount, the quotient expressed by a percentage. The greater the value of the exposure latitude, the less the change of performance by exposure amount changes and the better the exposure latitude (EL).

[Bridge Defect (Pattern Shape)]

The 75 nm (1:1) line and space resist pattern formed with the optimum exposure amount and the optimum focus was observed by means of a critical dimension scanning electron microscope (SEM model S9380II manufactured by Hitachi, Ltd.). The evaluation marks o (good), Δ (fair) and x (insufficient) were given for the level at which no bridge defect was found, at which while any bridge defect was not found, a slightly T-top shape resulted, and at which bridge defects were found, respectively.

The evaluation results are summarized in Table 6 below.

TABLE 6

| | Performances | | | |
|---|---|---|---|---|
| Examples | Limiting resolving power (nm) | LWR (nm) | EL (%) | Bridge defect |
| 1 | 23.1 | 5.5 | 19.5 | ○ |
| 2 | 22.8 | 5.6 | 16.9 | ○ |
| 3 | 24.1 | 5.6 | 16.1 | ○ |
| 4 | 23.1 | 5.4 | 17.1 | ○ |
| 5 | 24.4 | 4.9 | 18.0 | ○ |
| 6 | 24.1 | 4.8 | 18.5 | ○ |
| 7 | 25.1 | 5.6 | 16.9 | ○ |
| 8 | 24.6 | 5.7 | 18.0 | ○ |
| 9 | 20.8 | 4.8 | 19.2 | ○ |
| 10 | 21.2 | 5.3 | 16.6 | ○ |
| Comp. 1 | 31.2 | 6.2 | 7.5 | Δ |

As apparent from the results of Table 6, the compositions of the working examples excelled in the limiting resolving power, roughness characteristic, exposure latitude (EL), and bridge defect performance.

Further, the results of Table 6 have proved the following.

(1) It is apparent from a comparison of Examples 5, 6 and 9 with other Examples that the roughness characteristic can be enhanced by using the resin containing the repeating unit (R) in which a nonionic structural moiety has been introduced.

(2) It is apparent from a comparison of Examples 9 and 10 with other Examples that a strikingly excellent limiting resolving power can be attained by using the resin containing the repeating unit in which a group that is configured to decompose when acted on by an acid to thereby produce an alcoholic hydroxyl group has been introduced.

The invention claimed is:

1. A method of forming a negative pattern, comprising:

(1) forming an actinic-ray- or radiation-sensitive resin composition into a film, (2) exposing the film to light, and (3) developing the exposed film with a developer containing a polar solvent as an organic solvent, the actinic-ray- or radiation-sensitive resin composition comprising:

(A) a resin containing a repeating unit with a structural moiety that is configured to decompose when exposed to actinic rays or radiation to thereby generate an acid of any general formulae (III) to (VII) below, and (B) a solvent, wherein said resin (A) further contains a repeating unit with an acid decomposable group, and wherein an amount of the organic solvent used in the developer is in the range of 80 to 100 mass %, (III)

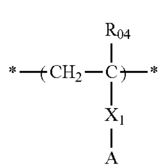

-continued (IV)

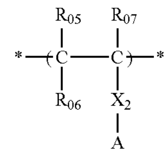

(V)

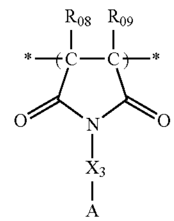

(VI)

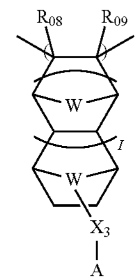

(VII)

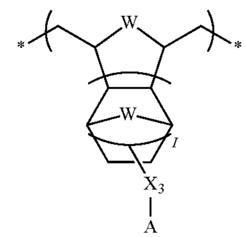

in which each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group, $R_{06}$ represents a cyano group, a carboxyl group, —CO—$OR_{25}$ or —CO—$N(R_{26})(R_{27})$, provided that when $R_{06}$ is —CO—$N(R_{26})(R_{27})$, $R_{26}$ and $R_{27}$ may be bonded to each other to thereby form a ring in cooperation with N atom, each of $X_1$ to $X_3$ independently represents a single bond, or an arylene group, an alkylene group, a cycloalkylene group, —O—, —$SO_2$—, —CO—, —$N(R_{33})$— or a bivalent connecting group composed of a combination of these, $R_{25}$ represents an alkyl group, a cycloalkyl group, an alkenyl group, a cycloalkenyl group, an aryl group or an aralkyl group, each of $R_{26}$, $R_{27}$ and $R_{33}$ independently represents a hydrogen atom, an alkyl group, a cycloalkyl group, an alkenyl group, a cycloalkenyl group, an aryl group or an aralkyl group, W represents —O—, —S— or a methylene group, l is 0 or 1, and A represents a structural moiety that is configured to decompose when exposed to actinic rays or radiation to thereby generate an acid, wherein the structural moiety has a nonionic structure.

2. The method according to claim 1, wherein the structural moiety has an oxime structure.

3. The method according to claim 1, wherein the structural moiety has a structure that generates an acid group on a side chain of the resin when exposed to actinic rays or radiation.

4. The method according to claim 1, wherein said acid decomposable group is a group that is configured to decompose when acted on by an acid to thereby produce an alcoholic hydroxyl group.

5. The method according to claim 1, wherein said repeating unit with an acid decomposable group is represented by general formula (AI) below, (AI)

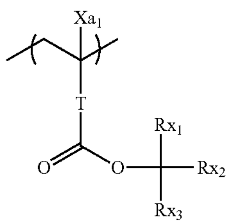

in which $Xa_1$ represents a hydrogen atom, a methyl group, or a group represented by $—CH_2—R_9$ in which $R_9$ represents a hydroxyl group or a monovalent organic group, T represents a single bond or a bivalent connecting group, and each of $Rx_1$ to $Rx_3$ independently represents a linear or branched alkyl group or a monocyclic or polycyclic cycloalkyl group, provided that at least two of $Rx_1$ to $Rx_3$ may be bonded to each other to thereby form a monocyclic or polycyclic cycloalkyl group.

6. The method according to claim 1, wherein the composition further comprises a hydrophobic resin.

7. The method according to claim 6, wherein a content of the hydrophobic resin in the composition based on total solids thereof is in the range of 0.01 to 10 mass %.

8. The method according to claim 6, wherein the hydrophobic resin contains at least one of fluorine atom and silicon atom.

9. The method according to claim 1, wherein the exposure is performed through an immersion liquid.

10. The method according to claim 1, wherein the developer containing a polar solvent as an organic solvent is a developer containing an ester solvent.

11. The method according to claim 10, wherein the ester solvent is a butyl acetate.

12. The method according to claim 1, further comprising:

(4) rinsing the developed film with a rinse liquid containing an organic solvent.

13. The method according to claim 1, wherein said resin (A) further contains a repeating unit containing a lactone structure.

14. The method according to claim 13, wherein said repeating unit containing a lactone structure is represented by the following general formula (AII'):

(AII')

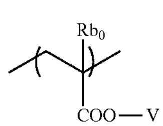

wherein, $Rb_0$ represents a hydrogen atom, a halogen atom or an alkyl group having 1 to 4 carbon atoms, and V represents any of the groups of general formulae (LC1-1) to (LC1-17),

LC1-1

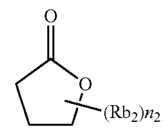

LC1-2

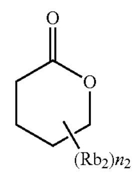

LC1-3

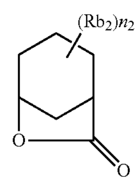

LC1-4

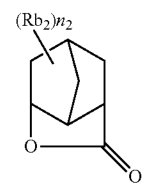

LC1-5

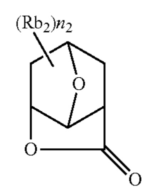

LC1-6

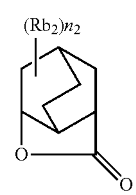

LC1-7

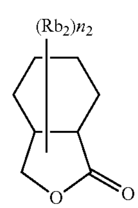

LC1-8

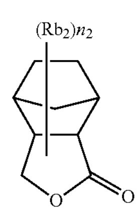

-continued

LC1-9

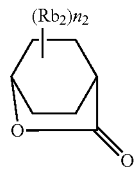

LC1-10

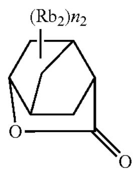

LC1-11

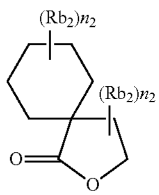

LC1-12

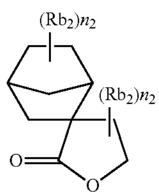

LC1-13

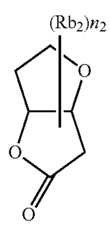

LC1-14

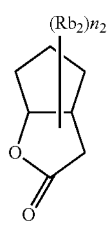

LC1-15

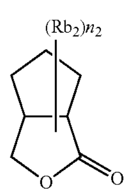

LC1-16

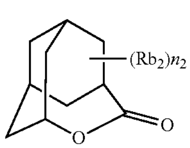

-continued

LC1-17

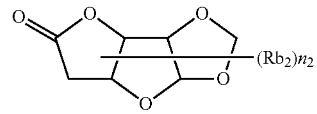

wherein, $Rb_2$ represents a substituent, and n2 is an integer of 0 to 2.

15. The method according to claim 1, wherein said resin (A) further contains a repeating unit containing a hydroxyl group or a cyano group, represented by any of general formulae (Alla) to (AIId) below, (AIIa)

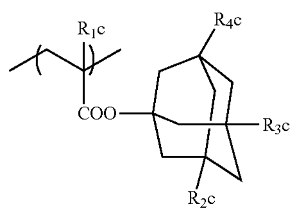

(AIIb)

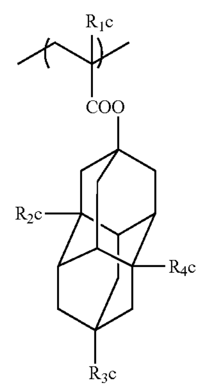

(AIIc)

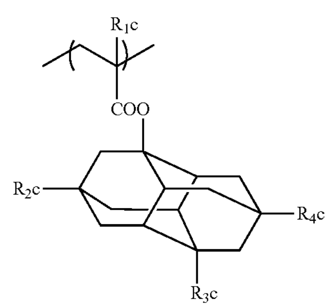

(AIId)

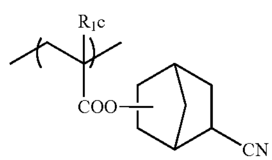

wherein, $R_1C$ represents a hydrogen atom, a methyl group, a trifluoromethyl group or a hydroxymethyl group, and each of $R_{2C}$ to $R_{4C}$ independently represents a hydrogen atom, a hydroxyl group or a cyano group, with the proviso that at least one of the $R_{2C}$ to $R_{4C}$ represents a hydroxy group or a cyano group.

16. The method according to claim 1, wherein the content ratio of the resin based on the total solid content of the whole composition is in the range of 60 to 95 mass %.

17. A method of forming a negative pattern, comprising:

(1) forming an actinic-ray- or radiation-sensitive resin composition into a film, (2) exposing the film to light, and (3) developing the exposed film with a developer containing a polar solvent as an organic solvent, wherein said polar solvent contains at least an ester solvent or a ketone solvent, the actinic-ray- or radiation-sensitive resin composition comprising:

(A) a resin containing a repeating unit with a structural moiety that is configured to decompose when exposed to actinic rays or radiation to thereby generate an acid of any general formulae (III) to (VII) below, and (B) a solvent, wherein said resin (A) further contains a repeating unit with an acid decomposable group, and wherein an amount of the organic solvent used in the developer is in the range of 80 to 100 mass %, (III)

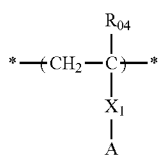

(IV)

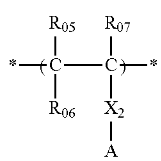

(V)

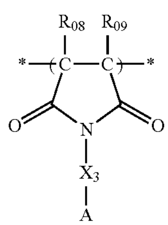

(VI)

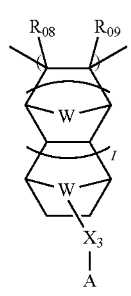

(VII)

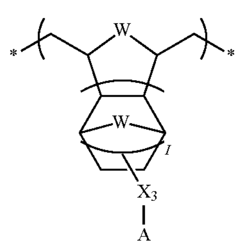

in which each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group, $R_{06}$ represents a cyano group, a carboxyl group, —CO—$OR_{25}$ or —CO—$N(R_{26})(R_{27})$, provided that when $R_{06}$ is —CO—$N(R_{26})(R_{27})$, $R_{26}$ and $R_{27}$ may be bonded to each other to thereby form a ring in cooperation with N atom, each of $X_1$ to $X_3$ independently represents a single bond, or an arylene group, an alkylene group, a cycloalkylene group, —O—, —$SO_2$—, —CO—, —$N(R_{33})$— or a bivalent connecting group composed of a combination of these, $R_{25}$ represents an alkyl group, a cycloalkyl group, an alkenyl group, a cycloalkenyl group, an aryl group or an aralkyl group, each of $R_{26}$, $R_{27}$ and $R_{33}$ independently represents a hydrogen atom, an alkyl group, a cycloalkyl group, an alkenyl group, a cycloalkenyl group, an aryl group or an aralkyl group, W represents —O—, —S— or a methylene group, l is 0 or 1, and A represents a structural moiety that is configured to decompose when exposed to actinic rays or radiation to thereby generate an acid.

18. The method according to claim 17, wherein the structural moiety has a nonionic structure.

19. The method according to claim 18, wherein the structural moiety has an oxime structure.

20. The method according to claim 17, wherein the structural moiety has an ionic structure.

21. The method according to claim 20, wherein the structural moiety has an onium salt structure.

22. The method according to claim 17 wherein the structural moiety has a structure that generates an acid group on a side chain of the resin when exposed to actinic rays or radiation.

23. The method according to claim 17, wherein said acid decomposable group is a group that is configured to decompose when acted on by an acid to thereby produce an alcoholic hydroxyl group.

24. The method according to claim 17, wherein said repeating unit with an acid decomposable group is represented by general formula (AI) below, (AI)

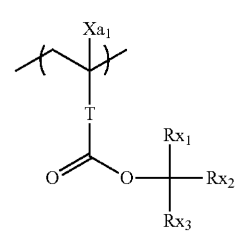

in which $Xa_1$ represents a hydrogen atom, a methyl group, or a group represented by —$CH_2$—$R_9$ in which $R_9$ represents a hydroxyl group or a monovalent organic group, T represents a single bond or a bivalent connecting group, and each of $Rx_1$ to $Rx_3$ independently represents a linear or branched alkyl group or a monocyclic or polycyclic cycloalkyl group, provided that at least two of $Rx_1$ to $Rx_3$ may be bonded to each other to thereby form a monocyclic or polycyclic cycloalkyl group.

25. The method according to claim 17, wherein the composition further comprises a hydrophobic resin.

26. The method according to claim 25, wherein a content of the hydrophobic resin in the composition based on total solids thereof is in the range of 0.01 to 10 mass %.

27. The method according to claim 25, wherein the hydrophobic resin contains at least one of fluorine atom and silicon atom.

28. The method according to claim 17, wherein the exposure is performed through an immersion liquid.

29. The method according to claim 17, wherein the developer containing a polar solvent as an organic solvent is a developer containing an ester solvent.

30. The method according to claim 29, wherein the ester solvent is a butyl acetate.

31. The method according to claim 17, further comprising:

(4) rinsing the developed film with a rinse liquid containing an organic solvent.

32. The method according to claim 17, wherein said resin (A) further contains a repeating unit containing a lactone structure.

33. The method according to claim 32, wherein said repeating unit containing a lactone structure is represented by the following general formula (AII'):

(AII')

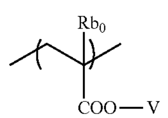

wherein, $Rb_0$ represents a hydrogen atom, a halogen atom or an alkyl group having 1 to 4 carbon atoms, and V represents any of the groups of general formulae (LC1-1) to (LC1-17),

LC1-1

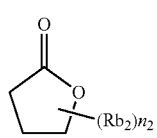

LC1-2

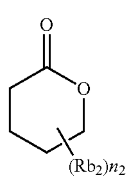

LC1-3

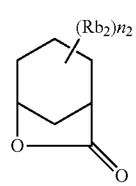

-continued

LC1-4

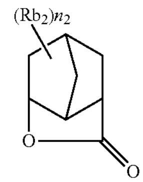

LC1-5

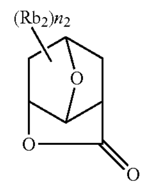

LC1-6

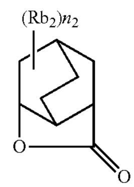

LC1-7

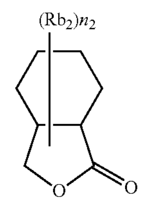

LC1-8

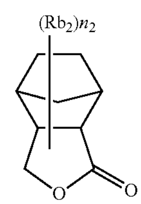

LC1-9

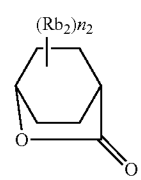

LC1-10

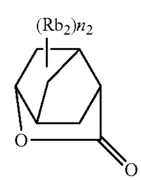

LC1-11

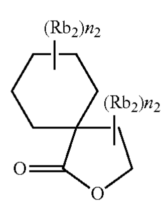

-continued

LC1-12

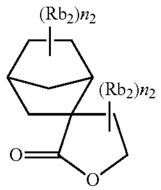

LC1-13

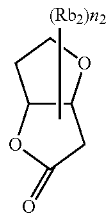

LC1-14

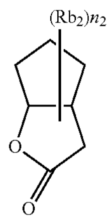

LC1-15

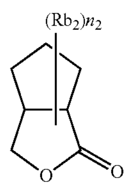

LC1-16

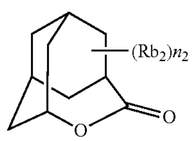

LC1-17

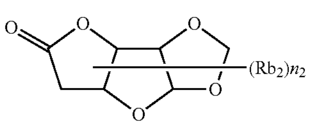

wherein, $Rb_2$ represents a substituent, and $n_2$ is an integer of 0 to 2.

34. The method according to claim 17, wherein said resin (A) further contains a repeating unit containing a hydroxyl group or a cyano group, represented by any of general formulae (AIIa) to (AIId) below, (AIIa)

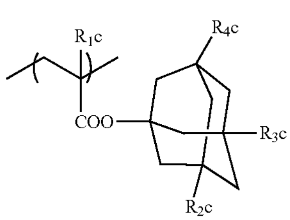

-continued (AIIb)

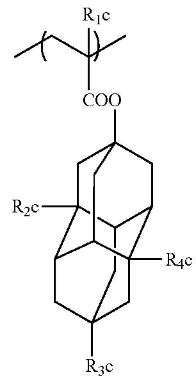

(AIIc)

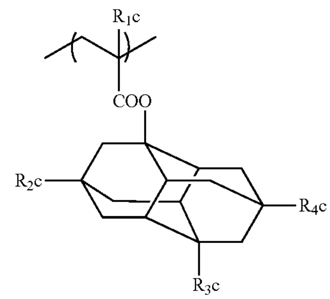

(AIId)

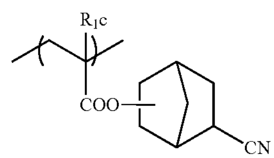

wherein, $R_1C$ represents a hydrogen atom, a methyl group, a trifluoromethyl group or a hydroxymethyl group, and each of $R_{2C}$ to $R_{4C}$ independently represents a hydrogen atom, a hydroxyl group or a cyano group, with the proviso that at least one of the $R_{2C}$ to $R_{4C}$ represents a hydroxy group or a cyano group.

35. The method according to claim 17, wherein the content ratio of the resin based on the total solid content of the whole composition is in the range of 60 to 95 mass %.

36. The method according to claim 17, wherein, in general formulae (III) to (VII), A represents the structural moiety expressed by either general formula (ZI) below or general formula (ZII) below,

ZI

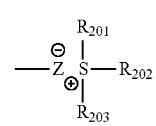

ZII

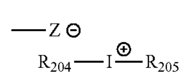

in general formula (ZI), each of $R_{201}$, $R_{202}$ and $R_{203}$ independently represents an organic group, and $Z^-$ represents an acid anion generated by the decomposition upon exposure to actinic rays or radiation, in general formula (ZII), each of $R_{204}$ to $R_{205}$ independently represents an aryl group, an alkyl group or a cycloalkyl group, and $Z^{-}$ represents an acid anion generated by the decomposition upon exposure to actinic rays or radiation.

* * * * *